United States Patent [19]

Fujioka et al.

[11] Patent Number: 5,589,007

[45] Date of Patent: Dec. 31, 1996

[54] PHOTOVOLTAIC ELEMENTS AND PROCESS AND APPARATUS FOR THEIR FORMATION

[75] Inventors: Yasushi Fujioka; Shotaro Okabe, both of Nara; Masahiro Kanai, Soraku-gun; Hideo Tamura; Atsushi Yasuno, both of Nara; Akira Sakai, Soraku-gun; Tadashi Hori, Tsuzuki-gun, all of Japan

[73] Assignee: Canon Kabushiki Kaisha, Tokyo, Japan

[21] Appl. No.: 523,169

[22] Filed: Sep. 5, 1995

Related U.S. Application Data

[63] Continuation of Ser. No. 187,550, Jan. 28, 1994, abandoned.

[30] Foreign Application Priority Data

Jan. 29, 1993 [JP] Japan ..................................... 5-013478
Jan. 29, 1993 [JP] Japan ..................................... 5-013562
Jan. 29, 1993 [JP] Japan ..................................... 5-013563

[51] Int. Cl.$^6$ .......................... H01L 31/075; H01L 31/20
[52] U.S. Cl. ......................... 136/249; 136/258; 118/718; 118/719; 118/723 R; 118/723 MW; 118/723 E; 257/53; 257/55; 257/458; 437/4; 437/101; 437/108; 437/109
[58] Field of Search ...................... 136/249 TJ, 258 AM; 437/4, 101, 108–109, 113; 257/53, 55, 458; 118/718–719, 723 R, 723 MW, 723 E

[56] References Cited

U.S. PATENT DOCUMENTS

| | | | |
|---|---|---|---|
| 4,400,409 | 8/1983 | Izu et al. ................................... | 437/173 |
| 4,563,240 | 1/1986 | Shibata et al. ........................... | 156/643 |
| 4,566,403 | 1/1986 | Fournier .................................. | 118/718 |
| 4,937,205 | 6/1990 | Nakayama et al. ....................... | 437/17 |
| 4,951,602 | 8/1990 | Kanai ........................................ | 118/719 |
| 5,126,169 | 6/1992 | Ishihara et al. ....................... | 427/255.1 |
| 5,180,434 | 1/1993 | DiDio et al. ............................ | 118/718 |
| 5,192,717 | 3/1993 | Kawakami et al. ..................... | 437/233 |
| 5,256,576 | 10/1993 | Guha et al. ............................. | 437/4 |
| 5,266,116 | 11/1993 | Fujioka et al. ......................... | 118/718 |

FOREIGN PATENT DOCUMENTS

| | | | |
|---|---|---|---|
| 0304145A2 | 2/1989 | European Pat. Off. ........ | H01L 31/06 |
| 0475666A2 | 3/1992 | European Pat. Off. ........ | H01L 31/75 |
| 3-30419 | 2/1991 | Japan .......................... | H01L 21/205 |
| 3-30420 | 2/1991 | Japan .......................... | H01L 21/205 |
| 3-30421 | 2/1991 | Japan .......................... | H01L 21/205 |
| 3-110798 | 5/1991 | Japan ............................ | H01L 1/46 |
| 4-299576 | 10/1992 | Japan ..................................... | 437/113 |

OTHER PUBLICATIONS

Ultra LSI Process Data Handbook (Science Forum, 1990 Issue).
Lecture Draft Collections 30p–M–6 in 1988 35th Joint Lecture Meeting Concerned with Applied Physics.
"Handbook of Vacuum Techniques," (Tohru Kanamochi, Nikkan Kogyo Shinbun, 1990).
Proceedings of Applied Physics Scientific Lecture, 1991 10p–PF–5 and 10p–PF–12.
Proceedings of Applied Physics Related Association Lecture 1992, 28p–ZV–9.

*Primary Examiner*—Aaron Weisstuch
*Attorney, Agent, or Firm*—Fitzpatrick, Cella, Harper & Scinto

[57] ABSTRACT

A photovoltaic element comprises a first non-monocrystalline silicon-containing semiconductor layer of a first-conductivity type, a first i-type non-monocrystalline silicon-containing semiconductor layer formed by microwave plasma CVD, a second i-type non-monocrystalline silicon-containing semiconductor layer formed by high-frequency plasma CVD, and a second non-monocrystalline silicon-containing semiconductor layer of a conductivity type opposite to the first-conductivity type, wherein the second semiconductor layer is formed by plasma doping.

21 Claims, 25 Drawing Sheets

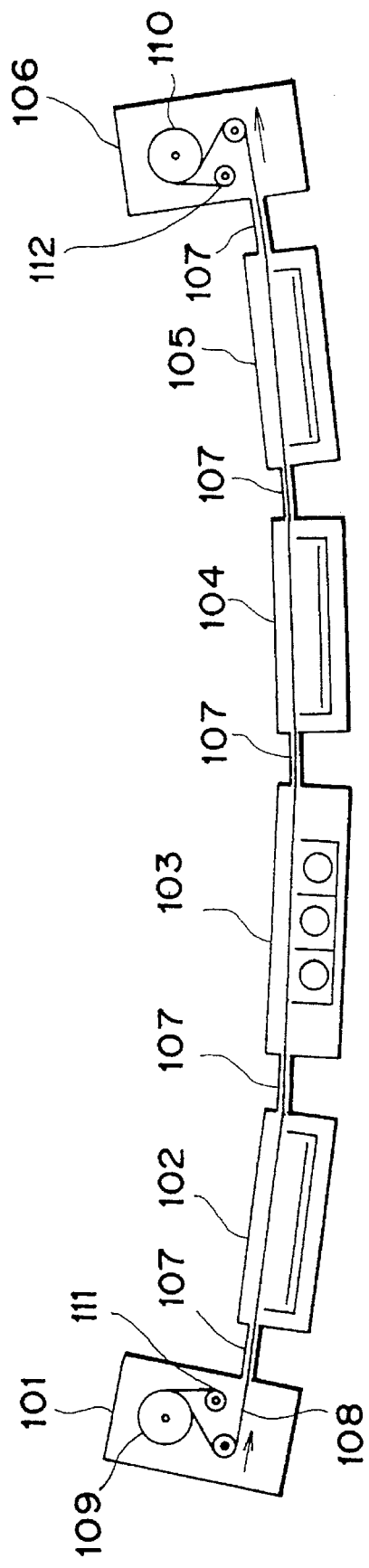

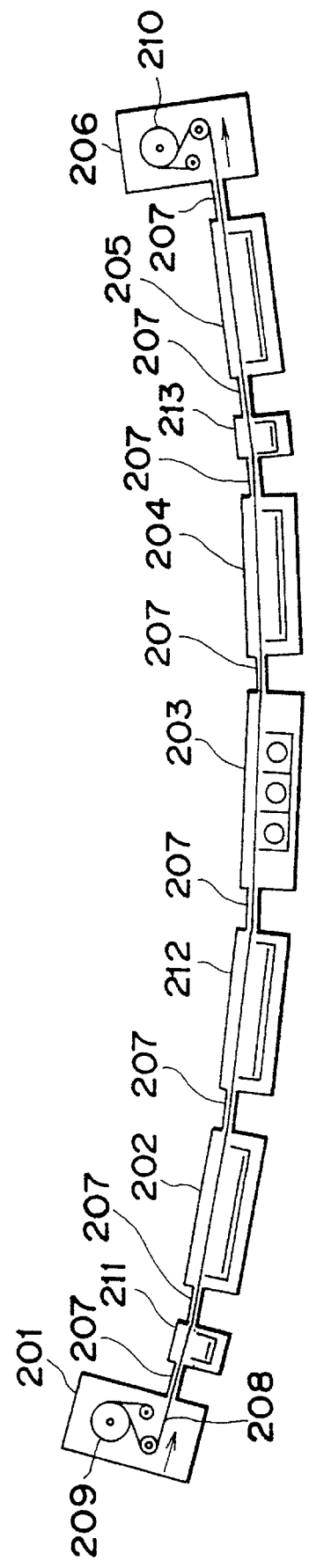

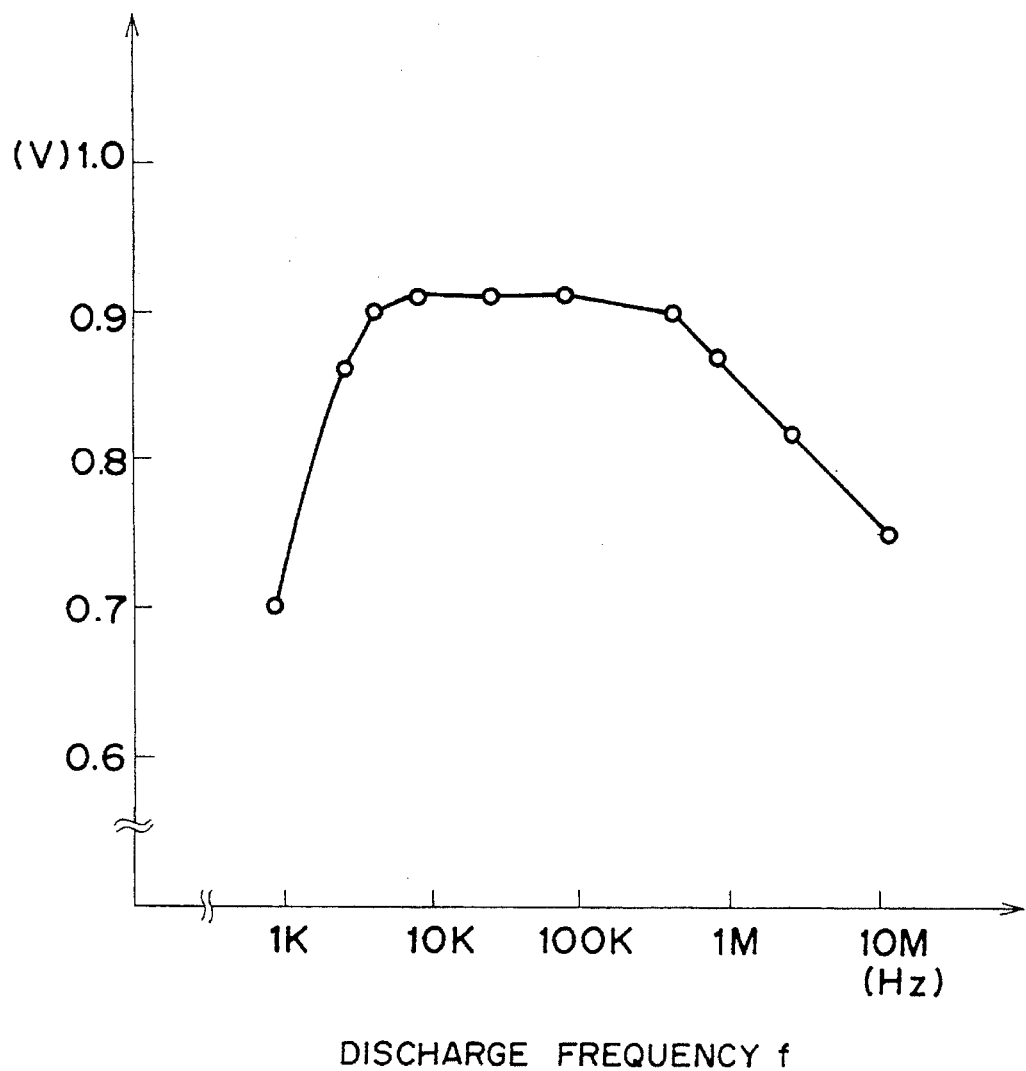

PHOTOVOLTAIC ELEMENTS AND PROCESS AND APPARATUS FOR THEIR FORMATION

This application is a continuation of application Ser. No. 08/187,550 filed Jan. 28, 1994, now abandoned.

BACKGROUND OF THE INVENTION

1. Field of the Invention

This invention relates to functional deposited films, and a process for their formation and an apparatus for their continuous formation. More particularly, it relates to non-monocrystalline semiconductors formed by plasma-assisted CVD on a belt substrate (beltlike substrate, hereinafter referred to also as "strip substrate"), used in photoelectric transducers such as solar cells, and a process for their formation and an apparatus for their continuous formation.

2. Related Background Art

In recent years, the problems of environmental pollution have become serious. Power generation systems making use of photoelectric transducers that utilize energy of light such as sunlight do not cause the problems of disposal of radioactive contamination substances resulting from atomic power generation and the problems of environmental pollution due to power generation, e.g., the problem that may occur as the atmosphere becomes warmer because of thermal power generation. In addition, the sun shines everywhere on the earth and hence provides a less localized energy source, so that a relatively high power generation efficiency can be achieved without requiring any complicated and large-scale equipment. Thus, such systems have attracted attention as clean power generation systems that can cope with a future increase in the demand for power supply without causing any destruction of the earth's environment, and a variety of research and development studies have been made so that the systems can be put into practical use.

With regard to the power generation systems making use of solar cells, the solar cells used are required to have a sufficiently high photoelectric conversion efficiency, have a superior stability in their characteristics and be feasible for mass production, in order for them to be established as a system for meeting the demand for power supply.

In order to provide all the electric power necessary for typical homes, it is considered necessary to provide an amount of solar cells having an output of about 3 kW per household. Assuming that the solar cells have a photoelectric conversion efficiency of, e.g., about 10%, the solar cells must have an area of about 30 $m^2$ in order to obtain the necessary output. Thus, in order to provide electric power necessary for, e.g., 100,000 homes, the solar cells must have an area of as large as 3,000,000 $m^2$.

Under such circumstances, solar cells that can be produced by using a readily available gaseous starting material such as silane and decomposing it by glow discharge so that an amorphous silicon or the like semiconductor thin film is deposited on a relatively inexpensive substrate such as a glass or metal sheet have attracted attention because of their good mass productivity and their possibility of production at a low cost compared with solar cells produced using monocrystalline silicon or the like. Thus, various proposals have been made for their production process and apparatus.

In this connection, U.S. Pat. No. 4,400,409 discloses a continuous plasma-assisted CVD apparatus employing a roll-to-roll system. It discloses that this apparatus is provided with a plurality of glow discharge regions, where a sufficiently long, flexible belt substrate with a desired width is disposed along the path on which the substrate passes successively through the respective glow discharge regions in order, and the substrate is lengthwise continuously transported while desired-conductivity type semiconductor layers are formed by deposition in the respective glow discharge regions, so that large-area devices having semiconductor junctions can be continuously formed. Thus, this roll-to-roll system can be said to be feasible for mass production of large-area semiconductor elements.

Meanwhile, a plasma-assisted process making use of microwaves has recently attracted interest. Since the microwaves have a high frequency, the energy density can be made higher than in the case when conventional high-frequency waves with a radio frequency are used. Hence, the process is suited for generating plasma with a good efficiency and maintaining it.

For example, Japanese Patent Application Laid-Open No. 3-30419 discloses a deposited film forming method and apparatus of a roll-to-roll type making use of microwave plasma-assisted CVD. It discloses that generating plasma by the use of microwaves makes it possible to form deposited films even under a low pressure, so that not only any polymerization of active species that causes a lowering of film characteristics of deposited films can be prevented to obtain deposited films with a high quality, but also any powder of a polysilane or the like can be prevented from being generated in the plasma and also the film forming rate can be dramatically improved.

This publication also discloses an apparatus so constructed that an i-type semiconductor layer is formed by microwave plasma-assisted CVD and n-type and p-type semiconductor layers are formed by high-frequency plasma-assisted CVD so that photovoltaic elements having a pin structure can be continuously formed by the roll-to-roll system. In the case of photovoltaic elements comprising a non-monocrystalline semiconductor, a pin (or nip) layer structure is commonly employed. In such a layer structure, the i-type semiconductor layer is required to have a certain thickness in order to absorb incident light and on the other hand the n-type and p-type semiconductor layers are only required to have a very small thickness of about $\frac{1}{10}$ of the i-type semiconductor layer. Hence, in the roll-to-roll system, the n-type and p-type semiconductor layers can be formed by high-frequency plasma-assisted CVD having a relatively low film forming rate. To form very thin semiconductor layers with good reproducibility by microwave plasma-assisted CVD having a very low film forming rate requires reasonable skill, and the very thin semiconductor layers can be more readily formed with good reproducibility by high-frequency plasma-assisted CVD having a relatively low film forming rate. In the roll-to-roll system, when microwave plasma-assisted CVD having a relatively high film forming rate is employed to form the i-type semiconductor layer, the transport speed of the belt substrate can be made higher than when high-frequency plasma-assisted CVD is employed. When the transport speed of the belt substrate is made higher, the time necessary for film formation is constant in the formation of the n-type and p-type semiconductor layers, and hence film-forming chambers must be made longer in proportion to the transport speed in the direction in which the belt substrate is transported. However, there is a limit when a thin and homogeneous non-monocrystalline semiconductor layer is formed in a long film-forming chamber in a large area with good reproducibility, tending to inevitably cause non-uniformity in layer thickness whereby the layer thickness is excessively smaller or larger than a prescribed layer thickness, or to cause irregularity in the characteristics such as conductivity. In particular, an impurity-doped layer (p-type or n-type) provided on the light-incident side of the i-type semiconductor layer must be made as thin as possible. It, however, is difficult to form a thin and homogeneous large-area impurity-doped layer in a long film-forming chamber by conventional high-frequency plasma-assisted CVD, causing non-uniformity or irregularity in the characteristics of photovoltaic elements thus fabricated.

In photovoltaic elements such as solar cells, unit modules of a photovoltaic element are often connected in series or in parallel to form a unit so that the desired current and voltage can be obtained. It is required for the unit modules to have less non-uniformity or irregularity in characteristics such as output voltage and output current between unit modules, and, at the stage of forming the unit modules, it is required to have a uniformity in the electrical characteristics of semiconductor multi-layer deposited films, which is the most important characterization factor. In order to simplify the step of assembling the modules, it should be possible to form semiconductor multi-layer deposited films having superior characteristics over a large area. This can bring about an improvement in mass productivity of photovoltaic elements such as solar cells and also a great decrease in production cost. In this regard, any conventional apparatus for continuously forming semiconductor multi-layer deposited films in which the i-type semiconductor layer is formed by microwave plasma-assisted CVD and the n-type and p-type semiconductor layers by high-frequency plasma-assisted CVD tend to cause non-uniformity or irregularity in the characteristics of semiconductor multi-layer deposited films for the photovoltaic elements fabricated, and have been problematic.

As a method for forming n-type and p-type semiconductor layers, ion implantation is also conventionally known in the art. The ion implantation method enables control of layer while the strength at which impurity ions are implanted is controlled by the accelerating voltage. However, ion implantation apparatuses with which impurity ions are implanted are commonly comprised of a system for generating ions, a system for extracting ions in the form of a beam, a system for causing the beam to scan, and so forth, resulting in a complicated structure and an expensive apparatus. Hence, they are not suited for forming the non-monocrystalline semiconductor photovoltaic elements with good productivity at a low cost, and have not been employed as means for forming impurity-doped layers.

Meanwhile, as a method for forming very shallow junctions required in ultra LSIs and so forth, plasma doping has recently attracted attention, and it enables incorporation of impurities by the use of a plasma of impurity gases, as reported in Ultra LSI Process Data Handbook (Science Forum, 1990 issue) and so forth. Lecture Draft Collections 30p-M-6 in 1988 35th Joint Lecture Meeting Concerned with Applied Physics also discloses that amorphous silicon films can be doped with impurities by plasma doping in which i-type amorphous silicon films are exposed to a high-frequency plasma of impurity gases. However, there has been no disclosure as to the application of such plasma doping to the formation of impurity-doped layers of photovoltaic elements such as solar cells. It has been unknown how plasma doping may be carried out to form good photovoltaic elements, when the photovoltaic elements in which i-type semiconductor layers are formed by microwave plasma-assisted CVD are fabricated.

In addition, amorphous silicon solar cells may experience a phenomenon in which the characteristics deteriorate as a result of irradiation with light (the Staebler-Wronski effect), which does not occur in crystalline solar cells. This is an important subject for achieving a cost decrease on the basis of efficiency improvement techniques and large-area production techniques and also for putting the solar cells into practical use so that they can be used as power supply means.

With regard to elucidation of the mechanism of this deterioration by light and a countermeasure therefor, a large number of approaches have been made from the viewpoint of semiconductor materials, e.g., to decrease impurities, from the viewpoint of devices, e.g., to employ a tandem device structure, and from the viewpoint of a treatment for the recovery of characteristics, e.g., to carry out annealing. In particular, the employment of the tandem device structure makes it possible to decrease the thickness of the i-type semiconductor layer, prevent the deterioration by light, and also achieve a higher efficiency by superposing solar cells having different band gaps, and hence in recent years has attracted attention.

Among tandem device structures, triple-layer tandem devices are advantageous over double-layer tandem devices in that incident light spectra can be utilized in a broader wavelength region, a higher photoelectric conversion efficiency can be obtained, and also a higher output voltage can be obtained. The triple-layer tandem devices, however, are comprised of a large number of layers (9 layers or more), and there has been a problem of how semiconductor multi-layer deposited films having this multi-layer construction can be formed with good reproducibility, at a high rate, and in a continuous manner.

SUMMARY OF THE INVENTION

As discussed above, the apparatus for continuously forming a semiconductor multi-layered film by the roll-to-roll method described above has the problem that any non-uniformity or irregularity tends to occur in the characteristics of photovoltaic elements fabricated when i-type semiconductor layers with a large layer thickness are formed by the microwave plasma-assisted CVD process feasible for high-rate film formation. Accordingly, an object of the present invention is to solve such a problem in order to provide a semiconductor multi-layered film for a photovoltaic element with superior characteristics so that a photovoltaic element free from non-uniformity or irregularity in characteristics over a large area can be provided, and to provide a process for their formation and an apparatus capable of forming them at a high rate, and in a continuous manner.

Another object of the present invention is to provide a semiconductor multi-layered film for a triple-layer tandem photovoltaic element capable of preventing the deterioration by light and obtaining a high photoelectric conversion efficiency and a high output voltage, and to provide an apparatus for forming them with a good reproducibility, at a high rate, and in continuous manner.

The present invention provides a photovoltaic element comprising a first semiconductor of a first-conductivity type, a first i-type semiconductor formed by microwave plasma, a second i-type semiconductor formed by high-frequency plasma and a second semiconductor of a conductivity type opposite to the first conductivity type; the second semiconductor being formed by plasma doping.

The present invention also provides a photovoltaic element fabrication process that forms a silicon non-monocrystalline semiconductor multi-layered film on a substrate, comprising the steps of forming an n- or p-type semiconductor layer by high-frequency plasma-assisted CVD, forming an i-type semiconductor layer by microwave plasma-assisted CVD, forming an i-type semiconductor layer by high-frequency plasma-assisted CVD, and forming a p- or n-type semiconductor layer by plasma doping.

The present invention also provides a photovoltaic element fabrication apparatus capable of continuously forming a silicon non-monocrystalline semiconductor multi-layered film on a belt-like substrate (hereinafter simply referred to as "belt substrate"), comprising an unwind chamber from which the belt substrate is unwound, a film-forming chamber in which an n- or p-type semiconductor layer is formed by high-frequency plasma-assisted CVD, a film-forming chamber in which an i-type semiconductor layer is formed by microwave plasma-assisted CVD, a film-forming chamber in which an i-type semiconductor layer is formed by high-frequency plasma-assisted CVD, a film-forming chamber in which a p- or n-type semiconductor layer is formed by plasma doping, and a wind-chamber in which the belt substrate is wound up; all of the chambers being arranged in this order in the direction of transport of the belt substrate, each of the chambers being connected with its adjoining chamber via a gas gate, and the belt substrate being continuously transported through the respective film-forming chambers so that the silicon non-monocrystalline semiconductor multi-layered film is continuously formed thereon.

In the apparatus of the present invention capable of continuously forming a semiconductor multi-layered film, a film-forming chamber in which an i-type semiconductor layer is formed by high-frequency plasma-assisted CVD may preferably be further provided via a gas gate, between the film-forming chamber in which an n- or p-type semiconductor layer is formed by high-frequency plasma-assisted CVD and the film-forming chamber in which an i-type semiconductor layer is formed by microwave plasma-assisted CVD which are provided via a gas gate.

In the apparatus of the present invention capable of continuously forming a semiconductor multi-layered film, a hydrogen plasma treatment chamber may also preferably be further provided via a gas gate, between the film-forming chamber in which an i-type semiconductor layer is formed by high-frequency plasma-assisted CVD and the film-forming chamber in which a p- or n-type semiconductor layer is formed by plasma doping which are provided via a gas gate.

In the apparatus of the present invention capable of continuously forming a semiconductor multi-layered film, a glow discharge cleaning chamber may also preferably be further provided via a gas gate, between the unwind chamber from which the belt substrate is unwound and the film-forming chamber in which an n- or p-type semiconductor layer is formed by high-frequency plasma-assisted CVD.

In the apparatus of the present invention capable of continuously forming a semiconductor multi-layered film, discharge frequency in the film-forming chamber in which a p- or n-type semiconductor layer is formed by plasma doping may preferably be set at from 5 kHz to 500 kHz.

BRIEF DESCRIPTION OF THE DRAWINGS

FIG. 1 is a diagrammatic cross section view of an example of the apparatus of the present invention, capable of continuously forming a semiconductor multi-layered film.

FIG. 2 is a diagrammatic cross section view of another example of the apparatus of the present invention, capable of continuously forming a semiconductor multi-layered film.

FIGS. 3A and 3B show the relationship between the discharge frequency f during plasma doping and the open-circuit voltage Voc of the resulting photovoltaic elements. FIGS. 3A and 3B are concerned with photovoltaic elements fabricated using the apparatus of FIG. 1 and the apparatus of FIG. 21, respectively.

DESCRIPTION OF THE PREFERRED EMBODIMENTS

The present invention will be described below in detail with reference to the accompanying drawings.

Figure 21:
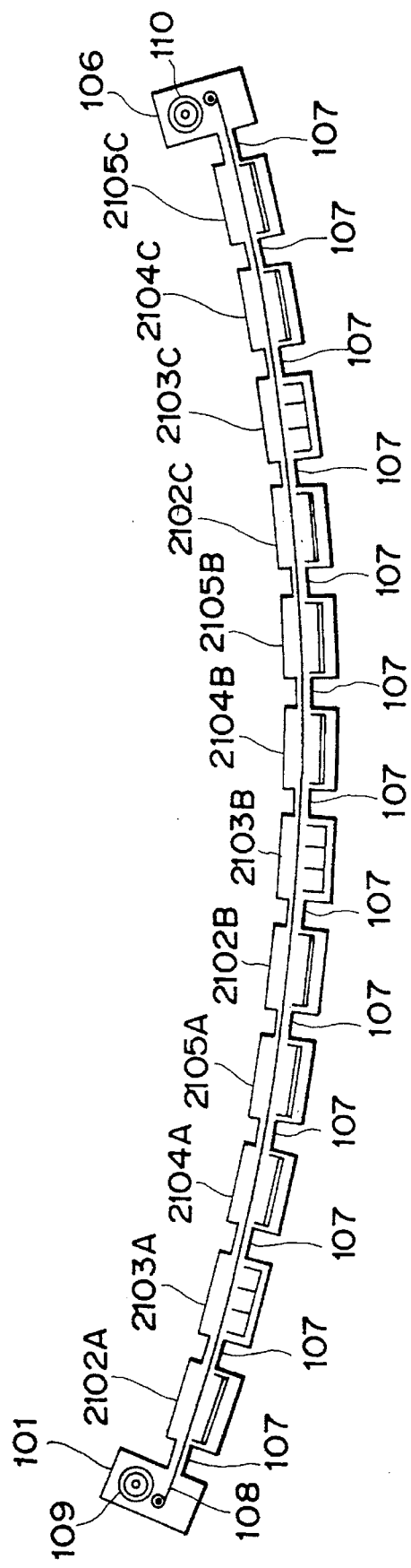
FIG. 21 is a diagrammatic cross section view of still another example of the apparatus of the present invention capable of continuously forming a semiconductor multi-layered film.
Figure 23:
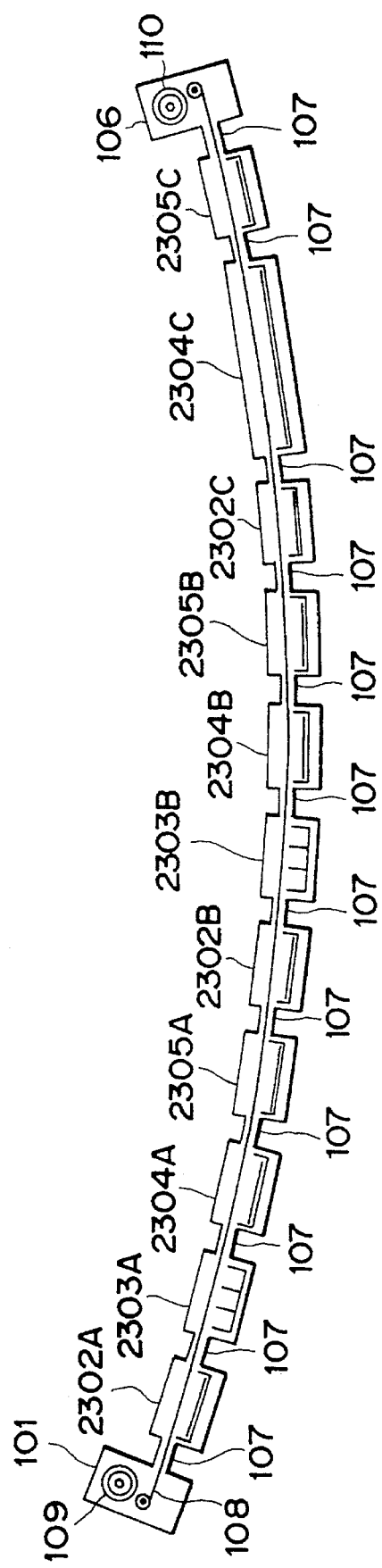
FIG. 23 is a diagrammatic cross section view of a still further example of the apparatus of the present invention, capable of continuously forming a semiconductor multi-layered film.

FIGS. 1, 21, and 23 are diagrammatic cross sections to show basic examples of the apparatus of the present invention, capable of continuously forming a semiconductor multi-layered film. In FIG. 1, the apparatus of the present invention, capable of continuously forming a semiconductor multi-layered film, is basically comprised of a belt substrate unwind chamber 101, a film-forming chamber 102 in which an n- or p-type semiconductor layer is formed by high-frequency plasma-assisted CVD, a film-forming chamber 103 having three film-forming sub-chambers in its interior in which an i-type semiconductor layer is formed by microwave plasma-assisted CVD, a film-forming chamber 104 in which an i-type semiconductor layer is formed by high-frequency plasma-assisted CVD, a film-forming chamber 105 is in which a p- or n-type semiconductor layer is formed by plasma doping, and a belt substrate wind-up chamber 106. Each of the chambers is connected with its adjoining chamber via a gas gate. In the apparatus shown in FIG. 21, three sets of the film-forming sections of the apparatus shown in FIG. 1 are provided. In the apparatus shown in FIG. 23, two sets of the film-forming sections of the apparatus shown in FIG. 1 are provided and the third-set microwave plasma-assisted CVD film-forming chamber of the same is not provided.

In the apparatus of the present invention, the belt substrate 108 is unwound from a bobbin 109 provided in the belt substrate unwind chamber 101, and is transported and passed through the four film-forming chambers each connected with a gas gate, until it is wound up on a bobbin 110 provided in the belt substrate wind-up chamber 106, in the course of which non-monocrystalline semiconductor multi-layer deposited films of a nip or pin structure or a nipnipnip or pinpinpin structure can be formed on the surface of the substrate.

The present invention has been accomplished based on the following findings obtained as a result of extensive studies made by the present inventors and on studies further made thereafter.

The present inventors have hitherto employed as an apparatus of conventionally known construction, i.e. an apparatus of roll-to-roll type as shown in FIG. 1 in which the film-forming chamber 104 is not used, and have formed n- and p-type semiconductor layers by high-frequency plasma-assisted CVD to fabricate photovoltaic elements comprised of amorphous silicon, having a nip or pin structure.

In such a conventional apparatus, the film forming rate of films formed in the i-type semiconductor film-forming chamber 103 is by microwave plasma-assisted CVD is a high as about 8 nm/sec or more and hence it has been possible to form semiconductor multi-layered deposited films for photovoltaic elements at a high rate. Then, since it had become possible to form the films at a high rate, it became possible to make the transport speed of the belt substrate higher, so that it has been possible to form about 300 nm thick i-type semiconductor layers for single type photovoltaic elements even when the transport speed of the belt substrate has been up to about 100 cm/min, since three film-forming sub-chambers each with a length of about 20 cm are provided in the i-type semiconductor layer film-forming chamber 103.

In the apparatus shown in FIG. 23, the film forming rate of films formed in the i-type semiconductor layer film-forming chambers 2303A and 2303B by microwave plasma-assisted CVD is as high as about 8 nm/sec or more and hence it has been possible to form semiconductor multi-layer deposited films for triple-layer tandem photovoltaic elements at a high rate. The uppermost i-type semiconductor layer of an element of nip structure has been formed by high-frequency plasma-assisted CVD having a relatively low film forming rate. Such a slow film forming rate of the i-type semiconductor layer, however, has not hindered the semiconductor multi-layer deposited films from being formed at a high rate as a whole, because the i-type semiconductor layer of the uppermost element in a triple-layer tandem photovoltaic element is exposed to the most intense light among the three elements connected in series and hence the i-type semiconductor layer of the device may have the smallest layer thickness among the i-type semiconductor layers of the three elements. Then, since it has become possible to form the films at a high rate, it has been possible to make the transport speed of the belt substrate higher, so that it has been possible to form about 300 nm thick i-type semiconductor layers even when the transport speed of the belt substrate has been made higher up to about 100 cm/min, since three film-forming sub-chambers each with a length of about 20 cm are provided in the i-type semiconductor layer film-forming chamber 2303B.

For impurity-doped layers on the light-incident side of i-type semiconductor layer of photovoltaic elements, silicon-based materials with a wide band gap such as amorphous silicon carbide, and microcrystalline silicon having a low absorbance of short-wave light are commonly used so that the light can be prevented from being absorbed in these layers. The present inventors have employed at the light incident side impurity-doped layers of microcrystalline silicon that can have a conductivity higher by as many as 3 orders than that of amorphous silicon. When it is attempted to use high-frequency plasma-assisted CVD to form impurity-doped microcrystalline silicon layers with a high conductivity, there is the following problem. That is, if it is attempted to increase the film forming rate by increasing the flow rate of the starting material gases containing silicon atoms, the proportion of the amount of high-frequency power to the flow rate of starting material gases may decrease, making it impossible to form microcrystalline films, so that the films become amorphous and experience an abrupt decrease in conductivity, resulting in a lowering of device characteristics.

On the other hand, if the high-frequency power is increased to increase the film forming rate, the distribution of film forming rate or conductivity in film forming regions becomes larger, making it impossible to uniformly form very thin layers over the whole film forming regions and also making it necessary to use enormous high-frequency power in order to make the films microcrystalline, so that it becomes necessary to use a very large power source. It also becomes difficult to uniformly apply the power. There is another problem that abnormal discharge tends to occur.

For the reasons as stated above, there is a limit to the formation of highly conductive, very thin microcrystalline silicon layers at a high rate by high-frequency plasma-assisted CVD. Thus, in order to uniformly form very thin layers of about 10 nm thick, it has been necessary to form the layers at a film forming rate of about 10 nm/min or less.

Accordingly, in the conventional roll-to-roll apparatus, when the i-type semiconductor layers are formed by microwave plasma-assisted CVD, it has been necessary to provide a film-forming chamber 105 that is sufficiently long in the direction of transfer of the belt substrate, in order to form the light-incident side impurity-doped semiconductor layers by high-frequency plasma-assisted CVD.

In such a long film-forming chamber 105, it has been very difficult to form very thin impurity-doped layers of about 10 nm thick with a good quality and in a uniform fashion. To determine approaches to better film forming conditions, the present inventors examined the correspondence of the flow rate of a silicon starting material gas with the characteristics of photovoltaic elements fabricated, while changing the flow rate. In the course of this examination, the present inventors decreased the flow rate of silicon starting material gas $SiH_4$ fed into the film-forming chamber 105 until it reached 0 (zero), and have discovered that the photovoltaic elements can be formed even when it is zero. More specifically, they have discovered that the impurity-doped layers are formed on the i-type semiconductor layers even by the use of a plasma gas not containing a starting material gas having silicon atoms and the photovoltaic elements of nip or pin structure can still be fabricated. This is a fact quite unexpected from the conventional idea that impurity-doped layers are formed by depositing silicon films doped with impurities.

Secondary ion mass spectroscopy (SIMS) analysis of the distribution of silicon atoms and impurity atoms in the layer thickness direction of the thus fabricated photovoltaic elements was conducted, and it has been ascertained that impurity-doped layers with a high density are formed on the i-type semiconductor layers in a very small layer thickness of about 10 nm even when the surfaces of i-type semiconductor layers are exposed to plasma without flowing $SiH_4$. Secondary ion mass spectroscopy (SIMS) was also performed to analyze any non-uniformity or irregularity in layer thickness according to the position of the respective impurity-doped layers on the i-type semiconductor layers of the photovoltaic elements thus fabricated, and it has been ascertained that the layer thickness of the impurity-doped layer has a higher uniformity when no $SiH_4$ is fed than when $SiH_4$ is fed in the amount necessary for the films with a given layer thickness to be formed by deposition.

The reason why the impurity-doped layers are formed in this way without feeding the silicon starting materials gas $SiH_4$ is presumably not that silicon non-monocrystalline semiconductors containing impurities have been deposited but that impurity-doping gases such as $B_2H_6$ and $PH_3$ ionized by plasma turn into impurity ions, which are then implanted into very thin regions in the vicinity of the surfaces of the i-type semiconductor layers, where what is called plasma doping takes place.

Figure 3B:
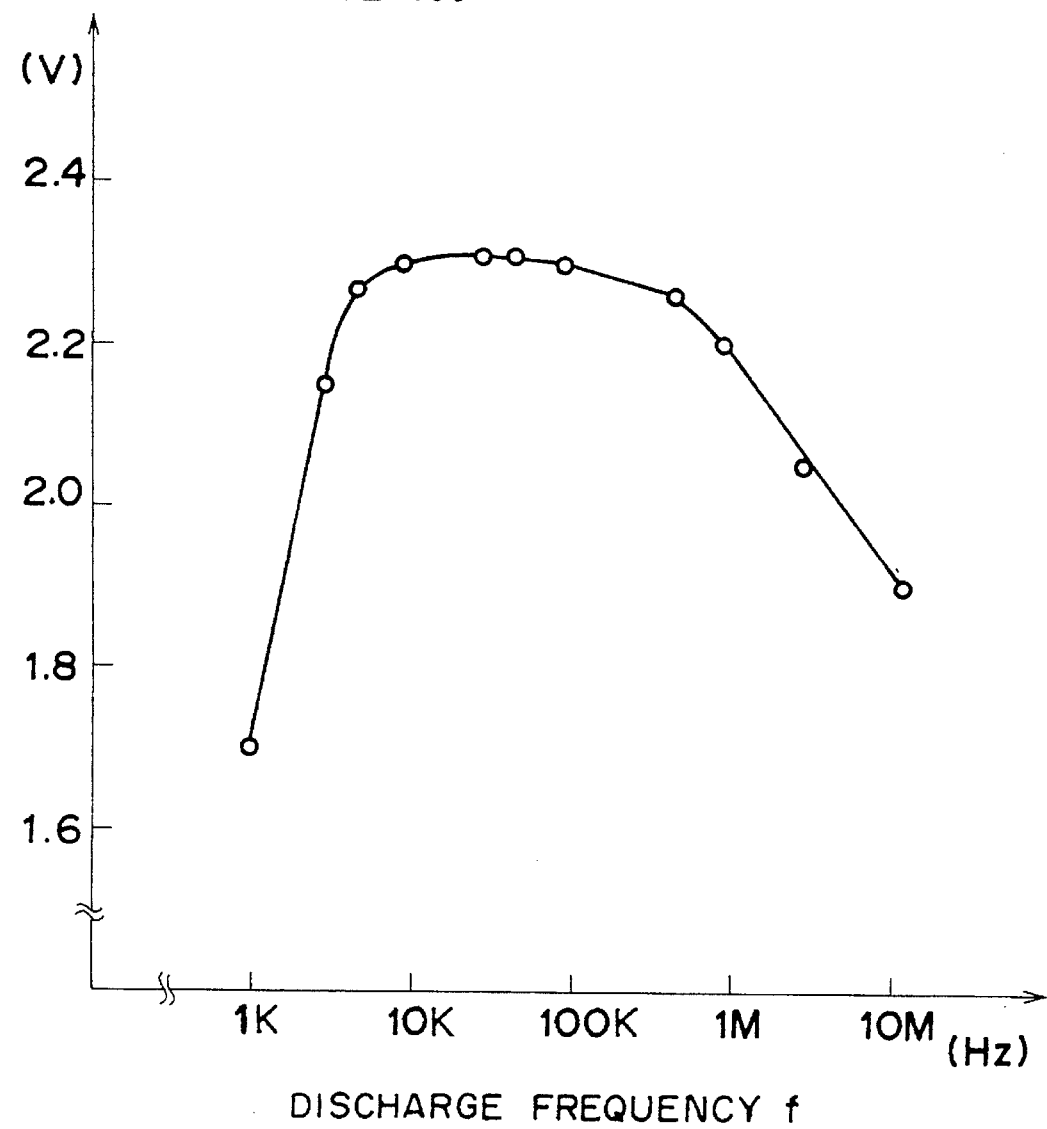

Next, the present inventors examined the relationship between the discharge frequency during plasma doping and the characteristics of resulting photovoltaic elements while keeping the discharge power constant and changing the discharge frequency in the range of from 1 kHz to 13.56 MHz when the plasma doping was carried out on such i-type semiconductor layers of photovoltaic elements. As a result, they have discovered that there is a relationship as shown in FIG. 3A (FIG. 3B is concerned with photovoltaic elements fabricated using the apparatus of FIG. 21), between the discharge frequency during plasma doping and the open-circuit voltage Voc of the resulting photovoltaic elements, where a decrease in open-circuit voltage of the photovoltaic elements fabricated is seen when the discharge frequency is lower than about 5 kHz and higher than about 500 kHz, and photovoltaic elements with a high open-circuit voltage and a high quality can be fabricated without non-uniformity or irregularity over a large area when the discharge frequency is within the range of frequencies of from about 4 kHz to about 500 kHz.

In the apparatus shown in FIG. 1, the present inventors further carried out plasma doping on i-type semiconductor layers deposited in a very small layer thickness of about 30 nm or less by high-frequency plasma-assisted CVD on the i-type semiconductor layers formed by microwave plasma-assisted CVD using the film-forming chamber 104. As a result, they have discovered that the characteristics such as open-circuit voltage and fill factors of the photovoltaic elements can be more improved than in the case when the plasma doping is directly carried out on the i-type semiconductor layers formed by microwave plasma-assisted CVD. In general, when i-type semiconductor layers of photovoltaic elements comprising amorphous silicon are formed in a layer thickness slightly larger within the range of practical use, the short-circuit voltage slightly increases but their open-circuit voltage and fill factors are not improved. Hence, this change the present inventors have discovered can be considered not due to the changes in layer thickness of the i-type semiconductor layers. The same was found to also apply to the devices fabricated using the fabrication apparatus shown in FIGS. 21 and 23.

The present invention is based on the foregoing findings, and an apparatus capable of fabricating high-quality photovoltaic elements without non-uniformity or irregularity over a large area has been developed. Namely, in the conventional apparatus for continuously forming semiconductor multi-layer deposited films according to the roll-to-roll method in which i-type semiconductor layers are formed by microwave plasma-assisted CVD and n- or p-type semiconductor layers are formed by high-frequency plasma-assisted CVD, the previously noted problems that it is difficult for the impurity-doped layer on the i-type semiconductor layer to be thinly and homogeneously formed in a large area and non-uniformity or irregularity in characteristics tends to occur in the photovoltaic elements fabricated have been solved by further depositing on the i-type semiconductor layer formed by microwave plasma-assisted CVD the i-type semiconductor layer formed by high-frequency plasma-assisted CVD. Thus, it has been made possible to fabricate high-quality photovoltaic elements at a higher speed and in a continuous manner, without non-uniformity or irregularity over a large area.

Additional description is now made of each film forming chamber constituting an apparatus according to the present invention and a strip substrate used.

i-type semiconductor layer forming chamber using a microwave plasma CVD technique An i-type semiconductor layer forming chamber using a microwave plasma CVD technique employed in the apparatus according to the present invention means a film forming chamber for continuously forming, on continuously moving strip substrates substantially intrinsic silicon non-single-crystal semiconductor layers by means of the microwave plasma CVD technique.

A plurality of i-type semiconductor layer forming chambers using the microwave plasma CVD technique employed in the apparatus according to the present invention may be provided for complying with a faster moving speed of the strip substrates without enlarging the dimension of the individual film forming chamber more than necessary, or for forming a single layer in a plurality of depositions.

In the apparatus according to the present invention, the film forming chamber using the microwave plasma CVD technique must be provided with microwave power for forming the plasma.

Exemplified means for applying the microwave power include: a microwave introducing window formed of a microwave transmissive member as disclosed in Japanese Patent Application Laid-Open No. 3-30419; a microwave leakage waveguide as disclosed in Japanese Patent Application Laid-Open No. 3-30420; a microwave radiation antenna as disclosed in Japanese Patent Application Laid-Open No. 3-30421; and mean for establishing an ECR condition by combining these with a magnetic field generating device.

Described in detail below is a case where the microwave introducing window formed of the microwave transmissive member is used as the microwave power application means.

The microwave transmissive member is disposed at a tip portion of the microwave introducing window to separate a vacuum atmosphere in the film forming chamber from the outside atmosphere in which said microwave introducing window is disposed, and is so designed as to be capable of resisting a pressure difference between the interior and the exterior thereof. More specifically, it is preferable that the cross-sectional configuration relative to the propagation direction of the microwave is circular, rectangular, oval flat plate, bell-jar shaped, doublet shaped, or conical.

It is preferable that the thickness of the microwave transmissive member relative to the propagation direction of the microwave is designed in consideration of the dielectric constant of the material used, such that reflection of the microwaves is minimized. For example, a suitable thickness is approximately equal to half of the wavelength of the microwave in the case of the flat shape. In addition, as the material therefor, it is preferable to use one that is capable of transmitting the microwave energy radiated from the microwave introducing window into the film forming chamber with a minimum loss and that is air-tight to avoid flowing of the atmospheric air into the film forming chamber. More specifically, it may be glass or fine ceramics of quartz, alumina, silicon nitride, beryllia, magnesia, zirconia, boron nitride, and silicon carbide.

It is preferable that the microwave transmissive member is cooled uniformly to avoid heat deterioration (cracking or destruction) as a result of being heated by the microwave energy and/or the plasma energy.

A specific cooling means may be a flow of cooling air towards the surface of the microwave transmissive member facing to the atmosphere. Alternatively, the microwave introducing window itself may be cooled with a cooling medium such as air, water, oil, and Freon, and the microwave transmissive member may be cooled through the portion thereof contacting with the microwave introducing window. By cooling the microwave transmissive member to a sufficiently low temperature, a plasma of high electron density can be generated without causing destruction such as cracks in the microwave transmissive member due to the heat being generated even when the microwave power is introduced at a relatively high level into the film forming chamber.

In addition, film deposition is caused at the portion where the microwave transmissive member contacts the microwave plasma, as similarly on the surface of the strip substrate. Accordingly, the microwave power that should be radiated from the microwave introducing window is absorbed by or reflected from the deposited film while being dependent on the type and properties of the film deposited. This reduces the amount of the microwave energy to be applied to the film forming chamber formed by the strip member. To maintain the microwave plasma becomes difficult and besides, decrease of the film forming speed and change of characteristics of the deposited film may be caused when the amount of change is increased significantly as compared with that just after the electric discharge. In such a case, the initial condition can be restored by means of removing the film deposited on the microwave transmissive member through mechanical methods or the like such as dry etching, wet etching, blasting, and so on. In particular, the dry etching is suitably used as a method for removing the deposited film while maintaining the vacuum condition.

An entire microwave applicator means may be taken out of the film forming chamber with the vacuum condition in the reaction chamber maintained according to a loadlock technique. The film deposited on the microwave transmissive member is then removed through wet etching, mechanical removal or the like. The separated film may be reused or replaced by a fresh one.

Further, a technique may be used where, along the surface of the microwave transmissive member at the side of the film forming chamber, a sheet made of a material having similar microwave transmissive properties to the microwave transmissive member may be continuously traveled, permitting the deposited film to be formed and attached on the surface of the sheet, thereby discharging it out of the microwave plasma region.

In addition, as disclosed in Japanese Patent Application Laid Open No. 3-110798, a metal or a microwave reflecting member that vertically and finely divides the microwave electric field may be disposed on the microwave transmissive member at the side of the film forming chamber to make it difficult to generate the plasma in the divided portions while applying the microwave power to the film forming chamber. As a result of this, the distance between the plasmas in the film forming chamber and the microwave introducing window is elongated to avoid attachment of the film on the microwave introducing window.

The microwave introducing window is one having a structure with which a deposition film forming source gas introduced into the film forming chamber is changed into plasma and maintained with the microwave power supplied from the microwave power source applied to the film forming chamber.

More specifically, there is advantageously used a microwave transmitting waveguide provided with the microwave transmissive member at the tip thereof in such a condition that air-tightness can be ensured. The microwave introducing window may be under the same standard as the microwave transmitting waveguide and alternatively, may be under the other standard. In addition, the dimension and the shape or the like of the microwave introducing window is preferably determined such that the transmission mode of the microwaves within the microwave introducing window becomes a single mode for ensuring an effective transmission of the microwave power within the film forming chamber and for generating, maintaining, and controlling a stable microwave plasma. It is noted that the mode where a plurality of modes are transmitted may also be used by means of adequately selecting the microwave plasma generating conditions such as the source gas used, pressure, and microwave power. The transmission mode for the case where a single mode is directed may be, for example, $TE_{10}$ mode, $TE_{11}$ mode, $eH_1$ mode, $TM_{11}$ mode, and $TM_{01}$ mode. Preferably, $TE_{10}$ mode, $TE_{11}$ mode, and $eH_1$ mode are selected. The microwave introducing window is connected to a waveguide that is capable of transmitting the above mentioned transmission modes. Preferably, the transmission mode in the waveguide is preferable to be coincident with the transmission mode in the microwave applicator means. The type of the waveguide is selected according to the frequency band of the microwaves and the mode used. At least the cutoff frequency thereof is preferably smaller than the frequency used. More specifically, available waveguides include a rectangular waveguide, a circular waveguide, or an oval waveguide standardized by JIS, EIAJ, IEC, or JAN, as well as one having a rectangular cross section of 96 mm and 27 mm in width and height, respectively, in the inner dimension for the microwaves of 2.45 GHz.

The microwave power supplied from the microwave power source is effectively applied to the film forming chamber through the microwave introducing window, so that problems relating to the reflected waves due to so-called microwave introducing window can be readily avoided. Relatively stable discharge can be maintained in the microwave circuit without using a microwave matching circuit such as a three stub tuner or an E-H tuner. However, it is preferable to provide a microwave matching circuit for protecting the microwave power source when a strong reflected wave is generated before and after the electric discharge as a result of abnormal discharge.

In the apparatus according to the present invention, the microwave application direction of the means for applying the microwave power to the film forming chamber according to the plasma CVD technique may be any one of the directions such as a direction orthogonal to the semiconductor coated surface of the strip substrate, a direction parallel with the semiconductor coated surface of the strip substrate and orthogonal to the moving direction, and a direction orthogonal to the semiconductor coated surface of the strip substrate and parallel with the moving direction. The microwave power may be applied simultaneously in two or more directions. However, it is preferable that the power is applied in the direction parallel with the semiconductor coated surface of the strip substrate and orthogonal to the moving direction.

The number of the means for applying the microwave power to the film forming chamber according to the plasma CVD technique may be any number as long as the plasma is generated within the film forming chamber. With a wide plasma forming space, it is preferable that a plurality of means are provided. If the microwave power is applied in the direction parallel to the semiconductor coated surface of the strip substrate and orthogonal to the moving direction, uniform plasma can be generated on the strip substrate only by means of introducing the microwave from one side of the strip substrate when the width of the strip substrate is relatively small. However, when the width of the strip substrate is large, the microwaves are preferably introduced thereinto from both sides of the strip substrate.

When a plurality of microwave applying means are arranged, the microwave power is applied to these microwave applying means by means of, for example, providing individual power sources for each of the individual means or alternatively, the microwave power supplied from a few microwave power supplies may be divided by a power divider and supplied to each.

To arrange a plurality of microwave applying means opposed to each other in the film forming chamber according to the microwave plasma CVD technique of the apparatus of the present invention, they should be arranged such that no adverse effect is caused such as damage to the microwave power source or abnormal oscillation of the microwaves as a result of the microwave power radiated from one microwave applying means being received by the other microwave applying means and the received microwave power reaching the microwave power source connected to the other microwave applying means.

More specifically, the microwave applying means are so arranged that the direction of the electric field is not parallel with the other of the microwaves propagating within the microwave applying means. That is, the waveguide is so arranged that the longitudinal side or the surface including a longitudinal axis is not parallel with the others connected to the microwave applying means.

In the apparatus according to the present invention, the strip substrate should be passed through the film forming chamber designated to perform the microwave plasma CVD technique in order to form the semiconductor layers continuously. The shape of the strip substrate in the film forming chamber may be a plan or shape as disclosed in U.S. Pat. No. 4,566,403 and an Ω shape as disclosed in Japanese Patent Application Laid-Open No. 3-30419.

In the apparatus according to the present invention, the source gas is released into the film forming chamber through a gas introducing pipe that is disposed in the film forming chamber where the strip substrate is passed and is provided with one or more gas releasing holes formed in the tip thereof. The gas is made into plasma by the microwave power applied to the microwave plasma region. As a material of the gas introducing pipe, one that is suitably used is one that is not damaged in the microwave plasma environment. More specifically, a heat resistant metal such as stainless steel, Ni, Ti, W or a metal subject to, for example, thermal spraying of ceramics such as alumina and silicon nitride are usable.

Introduction of the source gas may be initiated at any position of the film forming chamber. However, it is preferable that the source gas is introduced into the film forming chamber at a plurality of positions along the width direction of the strip substrate such that the plasma is formed on the strip substrate uniformly at least in the width direction thereof.

In the apparatus according to the present invention, a vacuum pump is used as the means for reducing the pressure within the film forming chamber to a pressure suitable for the formation of semiconductor layers according to the microwave plasma CVD method. In the microwave plasma CVD method, the plasma is allowed to be maintained at a pressure lower than that in a high frequency plasma CVD method. Therefore, a deposited film of high quality can be formed rapidly by means of lowering the pressure upon forming the deposited film. In this respect, it is preferable to reduce the pressure through a vacuum pump suitable for achieving the higher vacuum in the film forming chamber as in the high frequency CVD method. Specific examples of the vacuum pump suitable for achieving such high vacuum include turbomolecular pumps, oil diffusion pumps, cryopumps, and pumps obtained by combining these pumps with rotary pumps or mechanical booster pumps. Preferably, a pump formed of a combination of a turbomolecular pump or an oil diffusion pump and a rotary pump or a mechanical booster pump is used.

A plurality of discharge pipes (outlet) for exhausting the air within the film forming chamber according to the microwave plasma CVD may be provided for the purpose of discharging a large volume of source gas and the decomposed gas of the source gas; discharging the gas in each plasma space without causing counter diffusion of the gas when the film forming chamber is partitioned into a plurality of plasma spaces; for flowing the source gas in two or more directions within the film forming chamber; or for separating means for rough vacuum pumping in a low vacuum condition from means for discharging the gas in a high vacuum condition.

In addition, the discharge pipe (outlet) for discharging the air within the reaction chamber according to the microwave plasma CVD is preferably provided with a metal mesh or a metal plate where small holes are so formed with many openings that the microwaves are not transmitted, for passing the gas therethrough while avoiding the leakage of the microwaves in order to prevent the microwave power applied to the film forming chamber from being leaked outside of the plasma forming space to unstabilize the plasma, or to prevent noise from entering external electronic devices.

In the apparatus according to the present invention, the film forming chamber based on the microwave plasma CVD is preferably provided with temperature controlling means for controlling the strip substrate on which the semiconductor layers are formed while traveling within the film forming chamber to a temperature suitable for the semiconductor film formation.

Under the low pressure suitable for the microwave plasma CVD, cooling efficiency of the substrate due to, for example, convection of the gas is small. Accordingly, the strip substrate is heated as a result of being exposed to the high-density plasma generated by the microwaves in the process of forming the semiconductor layers. The strip substrate may thus be heated at a desired temperature. In this respect, the strip substrate should be heated to a temperature suitable for forming the semiconductor layers before entering the plasma forming space. The temperature controlling means is preferably arranged to keep the strip substrate at a constant temperature in the plasma forming space. For example, with a high microwave power applied, a heater for heating the strip substrate is provided before the plasma forming space while passing through a gas gate and cooling means is provided for maintaining the strip substrate at a constant temperature that has been further heated by the plasma in the plasma forming space.

Since the semiconductor layers are formed on the surface of the strip substrate within the film forming chamber, the temperature control of the deposited film is preferably made from the backside.

In addition, the strip substrate is continuously moved in the film forming chamber, so that it is preferable for heating the strip substrate to use heater means based on radiation such as a radiant heater that is capable of heating the substrate without being contacted therewith. As temperature measuring means for controlling the temperature of the strip substrate, it is preferable to use a movable surface thermometer using a thermocouple that is capable of measuring the temperature of a traveling surface, that has a small heat capacity, and is high in response. Alternatively, a radiation thermometer can also be advantageously used that is capable of measuring the temperature without contacting the surface.

Discharge Chamber Unit

Figure 4:
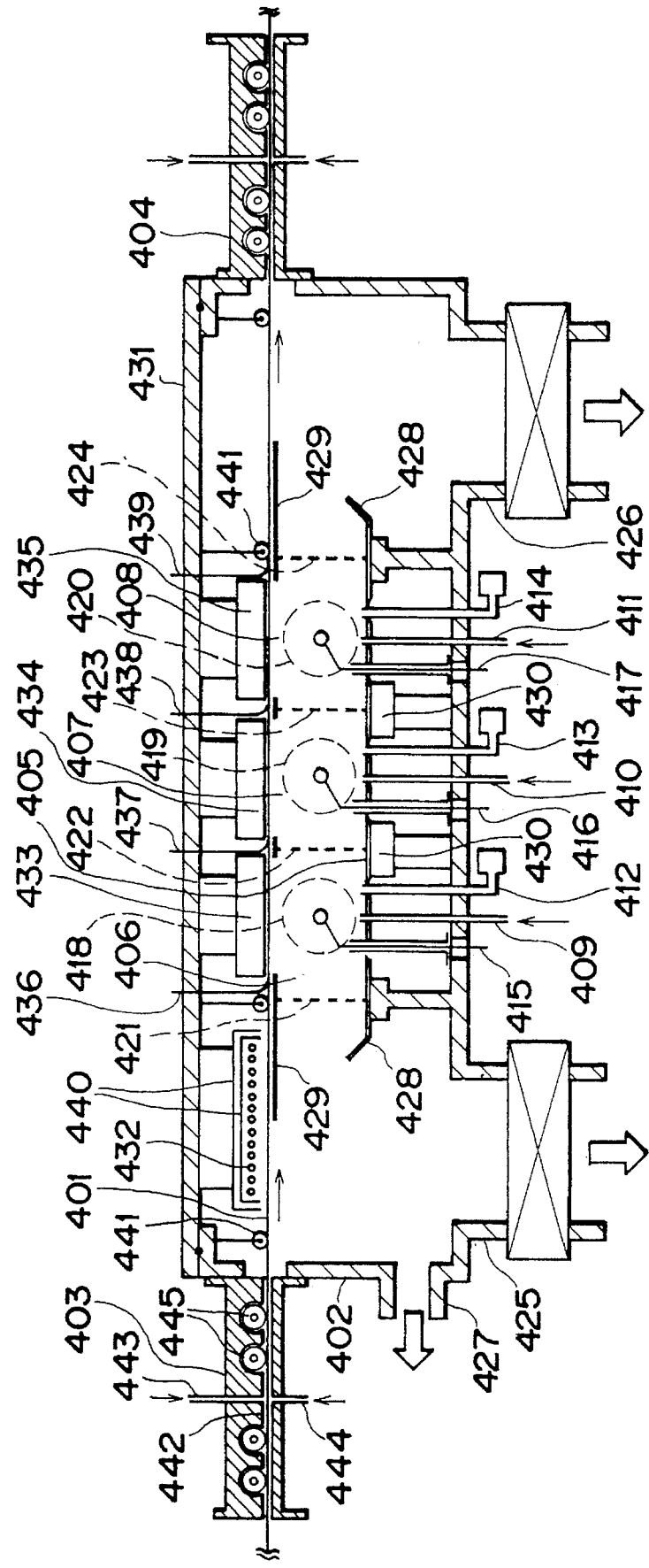
FIG. 4 is a diagrammatic cross section view of an example of the microwave plasma-assisted CVD film-forming chamber in the apparatus of the present invention.

FIG. 4 is a diagrammatic sectional view showing a preferred embodiment of the film forming chamber based on the microwave plasma CVD method in the apparatus according to the present invention.

In FIG. 4, a strip substrate 401 enters a vacuum cavity 402 from a gas gate 403, travels from left to right in the figure and exits to a gas gate 404.

A box-shaped film forming chamber unit 405 is removably disposed in the vacuum cavity 402. The interior of the film forming chamber unit 405 is partitioned by perforated partitions 421, 422, 423, and 424 into film forming chambers 406, 407, and 408, within which the plasma is generated to form a silicon based non-single-crystal semiconductor on the surface (underside) of the strip substrate moving in the upper portion of the film forming chambers.

A plurality of film forming chambers for forming i-type semiconductor layers are provided for the purpose of forming i-layers which are different from each other in film characteristics such as the band gap in the direction of the film thickness. For example, i-type semiconductor layers varying to 1.7 eV, 1.6 eV, and 1.5 eV in the direction of the film thickness can be formed by means of forming the deposited films with band gaps of 1.7 eV, 1.6 eV, and 1.5 eV in the three film forming chambers 406, 407, 408, respectively. In addition, it is possible to vary characteristic profiles in the direction of the film thickness by means of varying the film forming speed in the individual film forming chambers or by means of moving, in the moving direction of the strip substrate, the perforated partitions 422 and 423 into the film forming chambers, thereby varying film thickness of the deposited films formed in the individual film forming chambers.

Further, it is also possible to vary the characteristic profiles in the direction of the film thickness by means of varying the opening ratio of the perforated partitions 422 and 423. A decrease of the opening ratio of the partition makes it possible to vary intermittently the characteristics of the film formed in the direction of the film thickness by means of restricting mixing the source gases in the respective film forming chambers with each other and allowing the formulation of the source gas to be changed intermittently by the film forming chamber. On the other hand, an increase of the opening ratio of the partition permits the source gases in the respective film forming chamber to be mixed with each other at or around the partitions, thereby varying continuously the formulation of the source gas in the film forming chambers to vary continuously the characteristics of the film formed in the direction of the film thickness.

The film forming chamber 406, 407, and 408 have respectively bottom surfaces where a plurality of holes are opened, to which are introduced source gas introducing pipes 409, 410, and 411 connected to a source gas supply system which is not shown, pressure measuring pipes 412, 413, and 414 connected to a pressure gage, and bias electrodes 415, 416, and 417 connected to a bias power supply (not shown) through a coaxial structure, respectively, for introducing the source gas to the film forming chambers, measuring the pressure, and applying direct current or radio frequency bias power, respectively.

Microwave introducing windows 418, 419, and 420 are arranged along the side walls of the film forming chambers and connected a microwave power supply (not shown). On the side walls of the film forming chambers, opening portions are formed that correspond to the microwave introducing windows, respectively, to apply the microwave power to the film forming chambers.

The source gas introducing pipes 409, 410, and 411 are provided with a plurality of nozzles in the transverse direction of the strip substrate to introduce generally uniformly the source gas in the transverse direction of the strip substrate. The bias electrodes 415, 416, and 417 are provided with connecting members at the coaxial structure portions in the vacuum cavity. They are elongated, in the transverse direction of the strip substrate, at a position ahead of the center of the microwave introducing windows within the film forming chamber. They can be separated into T-shaped electrode portions made of metal such as SUS and Ni and leading portions connected to a current introducing terminal at the wall of the vacuum cavity.

Each film forming chamber is partitioned by perforated metal partitions 421, 422, 423, and 424. The gas in the film forming chamber is discharged out of the film forming chamber unit 405 through small holes formed in generally the entire surface of each perforated partition. This gas is discharged together with the gas incoming from the gas gates 403 and 404 out of the vacuum chamber 402 from exhaust pipes 425 and 426 connected to a high-vacuum pump (not shown) through the gate valve. The vacuum cavity 402 is provided with an exhaust pipe 427 for the rough vacuum pumping, connected to the other low-vacuum pumps of the exhaust pipes 425 and 426.

The holes formed in the perforated metal partitions 421, 422, 423, and 424 are small enough that the microwaves introduced into the film forming chambers are not transmitted therethrough and are large enough that the gas can sufficiently pass through. The holes are formed in generally the entire surface. A powder receiving plate 428 is disposed in the outside of the perforated partitions 421 and 424. In the case where the powder and the silicon film formed in the film forming chamber pass through the holes of the perforated partition, they are captured and trapped there, prevented from falling down to the exhaust pipes 425 and 426.

Plasma leak guards 429 are disposed at both ends in the transverse direction, i.e., the inlets and outlets of the film forming chamber unit 405 for the strip substrate 401 to prevent the plasma in the film forming chamber from leaking to the outside. The film thickness of the semiconductor films formed in the film forming chambers 406 and 408 can be adjusted by means of adjusting, in the moving direction of the strip substrate, the portion of the length of the plasma leak guard 429 disposed between the inlet and the outlet of the strip substrate 401 corresponding to the position upward of the reaction chambers 406 and 408.

The film forming chamber unit 405 is mounted on a film forming chamber temperature control device 430 to carry out temperature control by heating and cooling. The film forming chamber temperature control device 430 allows baking by means of heating the film forming chamber unit 405 before forming the films and restriction and control of the temperature change of the wall of the film forming chamber due to the plasma by means of cooling or heating during the film formation.

Figure 5:
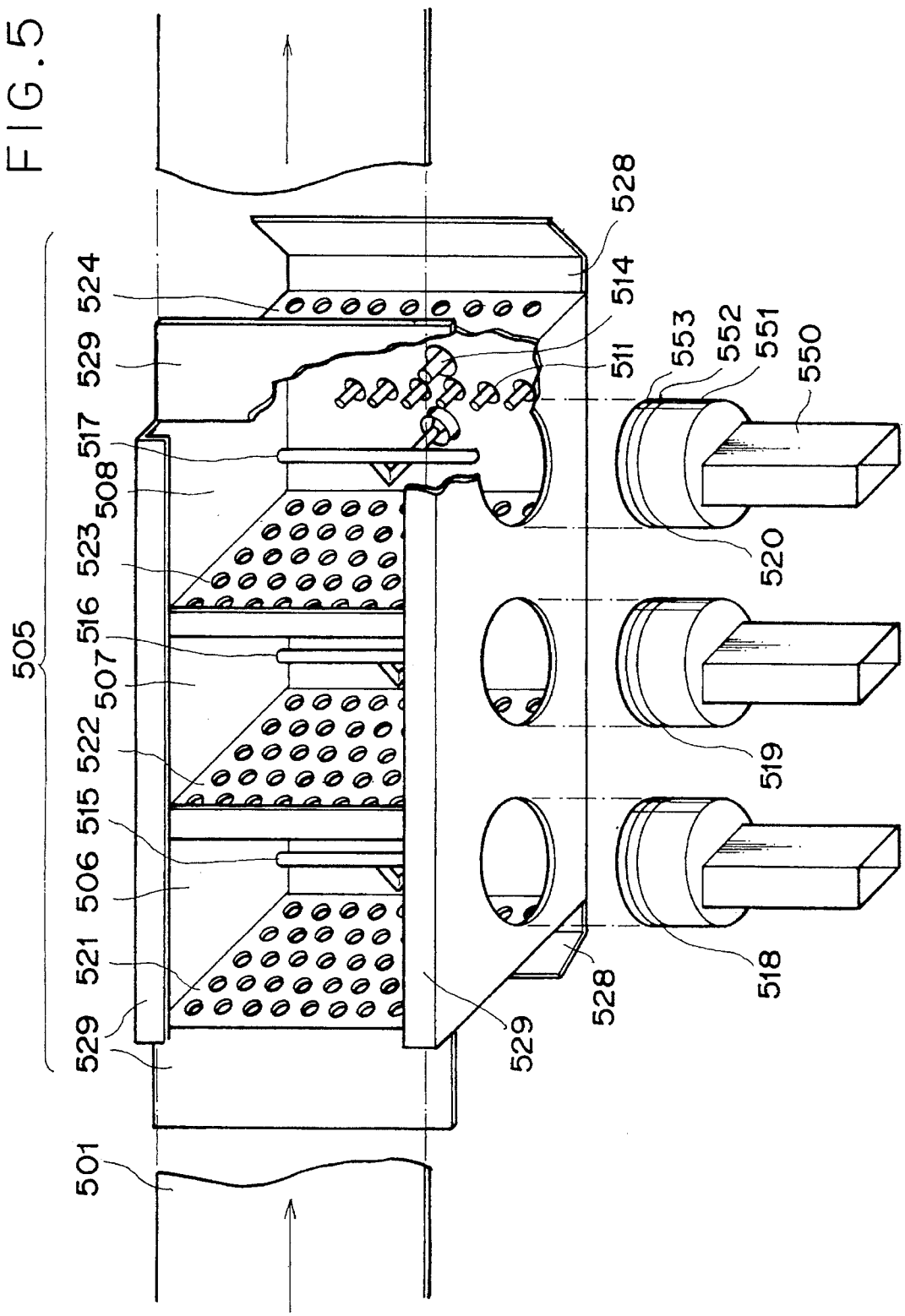
FIG. 5 is a diagrammatic cross section view of a film-forming chamber unit.

FIG. 5 shows a diagrammatic representation of the film forming chamber unit in FIG. 4 in the diagonally upward perspective.

In FIG. 5, a part of the wall of the film forming chamber unit and the strip substrate are cut, and the microwave introducing window is illustrated as being slightly displaced from the original position thereof. Reference numerals 501 through 529 in the figure correspond to the reference numerals 401 through 429, respectively, in FIG. 4 and represent the equivalent parts.

As clearly seen from FIGS. 4 and 5, the film forming chamber unit opens at an upper lid 431 of the vacuum cavity when no strip substrate is passed. It can be removed upward from the vacuum cavity by means of removing the electrode portions in the film forming chamber of the bias electrodes. When a large amount of silicon film is attached to the inner wall thereof, it can be removed from the vacuum chamber and be readily cleaned through chemical or physical means such as by etching or blasting.

Microwave Introducing Window

In the film forming chamber based on the microwave plasma CVD method shown in FIGS. 4 and 5, the microwave introducing window for applying the microwaves into the film forming chamber is a means for effectively introducing the microwave power supplied through an isolator, a power monitor, and a matching device or the like from a microwave power source (not shown) into the film forming chambers as shown in FIG. 5.

The continuous microwaves of 2.45 GHz supplied by a rectangular waveguide 550 are converted from a rectangular $TE_{10}$ mode to a circular $TE_{11}$ mode by a mode converter 551 having a cavity resonance structure. The microwaves are directed to the film forming chamber under a reduced pressure through microwave introducing windows 518, 519, and 520 where discs 552 and 553 of alumina ceramic are overlapped together, having thicknesses corresponding to a half and a quarter of the wavelength of the microwaves.

The air tightness of the film forming chamber is maintained with the disc 552 having the thickness of ½ wavelength at the side of the mode converter, by two discs of the alumina ceramic overlapped with each other. The periphery thereof is cooled with water and actively cooled with a VORTEX COOLER (registered trademark) from the atmospheric side. In addition, the surface of the disc 552 having the thickness of ½ wavelength at the atmospheric side is provided with two small cylindrical discs made of the alumina ceramic (not shown) to ensure matching for increasing the application efficiency of the microwave power to the film forming chamber. The silicon film is deposited on the surface of the disc 553 having the thickness of ¼ wavelength, nearest the film forming chamber. When a large amount of film is attached thereto, only the disc having the thickness of ¼ wavelength can be removed and readily cleaned through mechanical methods or the like such as dry etching, wet etching, blasting, etc.

Temperature Control Mechanism for the Strip Substrate

In the film forming chamber of the microwave plasma CVD apparatus shown in FIG. 4, above the upper surface (backside) of the strip substrate 401 in the vacuum cavity 402, a radiant heater 432 and substrate temperature controlling devices 433, 434, 435 fixed to the lid 431 of the vacuum cavity 402 which can be freely opened and closed. The temperature of strip substrate 401 is controlled from the backside while the temperature is measured by using thermocouples 436, 437, 438, and 439 of thin plate shape for surface temperature measurement, each of which contacts the backside of the strip substrate and is small in heat capacity and large in contacting area.

The temperature of the strip substrate 401 is low as it passes through the gas gate 403. However, it is heated by the radiant heater 432 disposed before the discharge chamber 406 to a predetermined temperature suitable for the film formation before the strip substrate reaches the discharge chamber 406. Temperature control is made during the formation of the deposited film to achieve a constant temperature by means of the substrate temperature controlling devices 433, 434, 435, and 436 disposed in the discharge chambers 406, 407, and 408.

The radiant heater 432 has a structure such that a plurality of infrared lamps are arranged in the direction orthogonal to the moving direction of the strip substrate, each of the lamps being formed into a bar having a length sufficient for uniformly heating the width of the strip substrate. The radiant heater comprises a reflector 440 of a double-structure to improve the heating efficiency by means of collecting the radiation from the lamps to the side of the strip substrate. The radiant heater prevents the lid 431 of the vacuum cavity from being heated. In addition, electric wiring to supply the power to the radiant heater 432 is covered with a cover (not shown) to avoid sparks or leaks if the plasma should leak out of the discharge chamber unit 405 and contact the electric wiring.

The temperature controlling devices 433, 434, and 435 are for controlling the temperature of the strip substrate in the film forming chamber. They restrict changes of the temperature due to cooling by the source gas introduced into the film forming chamber or heating by the high energy plasma of the strip substrate 401 heated to a predetermined temperature by the radiant heater 432. They also maintain and control predetermined temperature of the strip substrate with the deposited film thereon.

Supporting Mechanism for the Strip Substrate

In the film forming chamber of the microwave plasma CVD apparatus shown in FIG. 4, supporting rollers 441 are disposed to rotatably support the strip substrate at several positions along the upper surface (backside) of the strip substrate 401 in the vacuum cavity 402. They support the strip substrates 401 from the backside such that the substrates are stretched linearly in the vacuum cavity.

Disposed within the supporting roller 441 is a permanent magnet (not shown) which has a high Curie point and generates a magnetic force not affecting the plasma. The permanent magnet serves to hermetically contact the supporting roller 441 with the strip substrate when the strip substrate is made of the magnetic material such as ferritic stainless steel.

In addition, since the surface of the supporting roller 441 is formed of a conductive material such as stainless steel and is electrically grounded the conductive strip substrate 401 is electrically grounded.

Film Forming Chamber Based on the High Frequency Plasma CVD Technique

In the present invention, the film forming chamber based on high frequency plasma CVD means the film forming chamber for continuously forming the silicon non-single-crystal semiconductor on a continuously traveling strip substrate, by using the high frequency plasma CVD technique.

In the present invention, the film forming chamber based on high frequency plasma CVD is provided for forming an impurity doped layer on the strip substrate and an i-type semiconductor layer laminated on the i-type semiconductor layer produced by microwave plasma CVD. It is preferred that the film forming chamber for forming the i-type semiconductor layer by high frequency plasma CVD is disposed between the chamber for forming the impurity doped layer on the strip substrate and the chamber for forming the i-type semiconductor layer formed by the microwave plasma CVD method.

When forming a photoelectromotive element, to form the i-type semiconductor layer by the microwave plasma CVD technique, the impurity doped semiconductor layer under the i-type semiconductor layer may be slightly sputter-etched upon initiation of the discharge for forming the i-type semiconductor layer, because the plasma generated by the microwave plasma CVD method is of a high energy level.

The impurities are doped in the i-type semiconductor layer when the impurity doped layer is sputter-etched during formation of the i-type semiconductor layer, which varies the characteristics of the i-type semiconductor layer and causes variation of the characteristics of the photoelectromotive elements thus formed. To avoid the sputter-etching of the impurity doped layer due to the microwave plasma, it is preferable that an additional film forming chamber is disposed for forming the i-type semiconductor layer between the impurity doped layer and the i-type semiconductor layered formed by the microwave plasma CVD by using a plasma of low energy level according to the high frequency plasma CVD, thereby forming the thin i-type semiconductor layer on the impurity doped layer by the high frequency plasma CVD technique and thus avoiding direct exposure of the impurity doped layer to the microwave plasma.

In the apparatus according to the present invention, a plurality of film forming chambers based on the high frequency plasma CVD method may be connected to each other to comply with the faster moving speed of the strip substrate without enlarging the length dimension of a single forming chamber beyond a predetermined limit, or to form a single layer in a plurality of film forming steps.

In the apparatus according to the present invention, as means for applying the high frequency power to the film forming chamber based on the high frequency plasma CVD, exemplified ones include a capacitive coupling system using discharge electrodes and an inductive coupling system using high frequency coils. Preferably, the capacitive coupling system using parallel plate electrodes is used.

In the apparatus according to the present invention, the film forming chamber based on high frequency plasma CVD is preferably provided with temperature controlling means for controlling the strip substrate on which the semiconductor layers are formed while traveling within the film forming chamber to a temperature suitable for the semiconductor film formation.

To maintain the temperature of the strip substrate during formation of the semiconductor film, the strip substrate should be heated to a temperature suitable for forming the semiconductor layers before entering the plasma forming space. The temperature controlling means is preferably arranged to keep the strip substrate at that temperature in the plasma forming space.

Since the semiconductor layers are formed on the surface of the strip substrate within the film forming chamber, the temperature control of the formed film is preferably made from the backside.

In addition, the strip substrate is continuously moved in the film forming chamber, so that it is preferable for heating the strip substrate to use a heater means based on radiation such as a lamp heater that is capable of heating the substrate without being in contact therewith. As a temperature measuring means for controlling the temperature of the strip substrate, it is preferable to use a movable surface thermometer using a thermocouple that is capable of measuring the temperature of a traveling surface, has a small heat capacity, and is high in response. Alternatively, a radiation thermometer can also be used advantageously that is capable of measuring the temperature without contacting the surface.

Discharge Chamber

Figure 6:
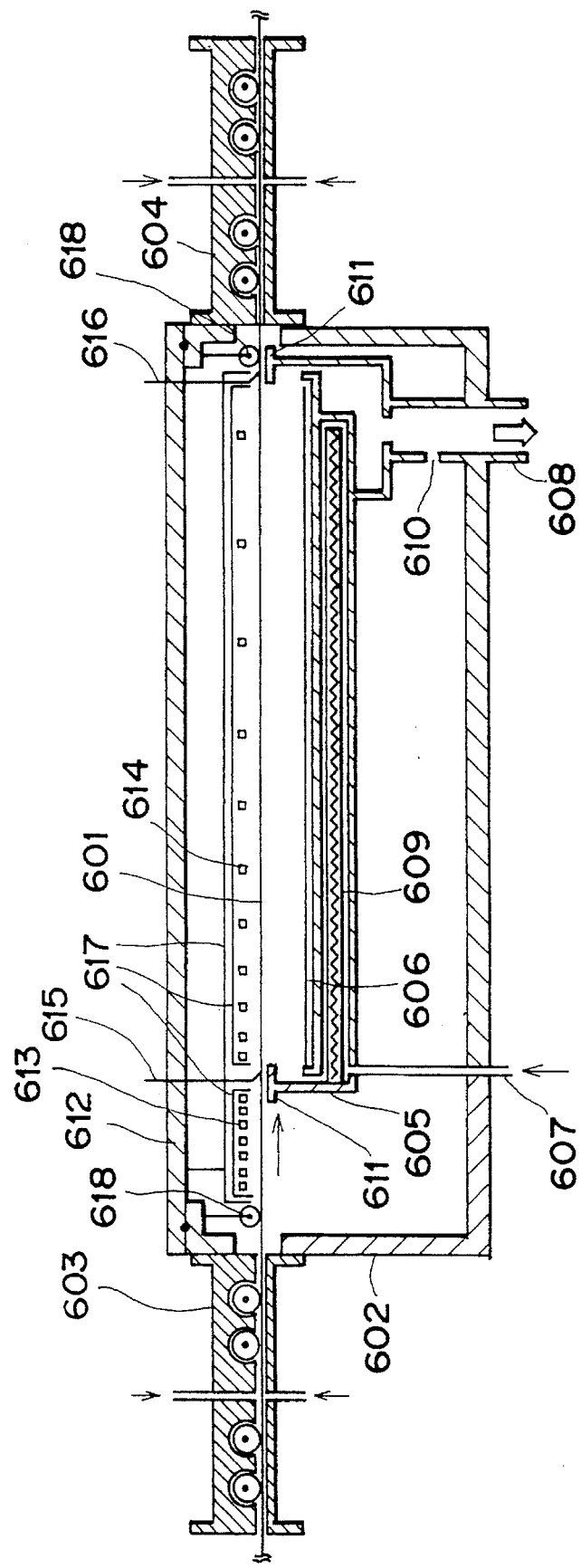
FIG. 6 is a diagrammatic cross section view of an example of the high-frequency plasma-assisted CVD film-forming chamber in the apparatus of the present invention.

FIG. 6 is a diagrammatic sectional view showing a preferred embodiment of a film forming chamber based on the high frequency plasma CVD method in the apparatus according to the present invention.

In FIG. 6, a strip substrate 601 enters a vacuum cavity 602 from a gas gate 603, travels from left to right in the figure and exits via a gas gate 604.

A discharge chamber 605 is provided within the vacuum cavity 602. The high frequency power is applied between the strip substrate 601 which is electrically grounded and a discharge electrode 606 from a high frequency power supply (not shown), whereby plasma is generated within the discharge chamber 605. This results in formation of the silicon non-single-crystal semiconductor on the lower surface (front surface) of the strip substrate. In the discharge chamber 605, there are disposed a source gas introducing pipe 607 connected to a source gas supply system (not shown) and an exhaust pipe 608 connected to an exhaust device (not shown) to form a flow of gas parallel with the moving direction of the strip substrate.

A block heater 609 is disposed in the incoming path of the source gas to heat the source gas before plasma decomposition and to heat the discharge chamber 605. In this way, it is intended to promote decomposition of the source gas at and around a flowing portion and reduce the amount of polysilane powder adhered to the inner wall of the discharge chamber 605. A discharge chamber external exhaust outlet 610 is provided in the exhaust path of the exhaust gas. It is thus ensured that the gases present outside the discharge chamber 605 (such as the gate gas incoming from the gas gate and gas emitted from the inner wall of the vacuum cavity 602) are exhausted to the exhaust pipe 608 without being passed through the discharge chamber 605, thereby avoiding incorporation of the impurities into the deposited films.

Plasma leak guards 611 are disposed at both ends in the traverse direction, at the inlets and outlets of the upper portion of the discharge chamber 605 for the strip substance 601 to prevent the plasma in the discharge chamber 605 from leaking to the outside.

Temperature Control Mechanism for the Strip Substrate

In the film forming chamber using high frequency plasma CVD shown in FIG. 6, above the upper surface (backside) of the strip substrate 601 in the vacuum cavity 602, a lid 612 of the vacuum cavity 602 that is freely opened and closed is mounted. Radiant heaters 613 and 614 are attached thereto. The strip substrate 601 is heated from the backside to a predetermined temperature while the temperature is monitored by using thermocouples 615 and 616 contacting the backside of the strip substrate. The temperature of the strip substrate 601 is reduced as it passes through the gas gate 603. However, it is heated by the radiant heater 613 disposed before the discharge chamber 605 to a predetermined temperature suitable for the film formation before the strip substrate reaches the discharge chamber 605. Temperature is maintained during the formation of the deposited film to achieve the constant temperature by using the radiant heater 614 disposed in the discharge chamber 605.

Each of the radiant heaters 613 and 614 has a structure such that a plurality of infrared lamps are arranged in the direction orthogonal to the moving direction of the strip substrate, and each of the lamps is formed into a bar having a length sufficient for heating uniformly the width of the strip substrate. The distance between the adjacent lamps is small in front of the discharge chamber 605 and becomes larger and larger toward the backend of the discharge chamber 605. In addition, each of the radiant heaters 613 and 614 comprises a reflector 617 of a double-structure to improve the heating efficiency by directing the radiation from the lamp to the side of the strip substrate. The radiant heater prevents the lid 612 of the vacuum cavity from being heated. In addition, electric wiring to supply the power to the radiant heaters 613 and 614 is covered with a cover (not shown) to avoid sparks or leakage if the plasma leaks out of the discharge chamber 605 and contacts the electric wiring.

Supporting Mechanism for the Strip Substrate

In the film supporting chamber based on high frequency plasma CVD shown in FIG. 6, supporting rollers 618 are disposed to rotatably support the backside of the strip substrate at and around the inlet and the outlet of the vacuum cavity 605 inside the vacuum cavity 602. They support the strip substrates 601 from the underside such that the substrates are stretched linearly in the vacuum cavity and the distance between strip substrate and the discharge electrode 606 is kept constant.

Disposed within the supporting roller 618 is a permanent magnet (not shown) which has a high Curie point and generates a magnetic force not affecting the plasma. The permanent magnet serves to hermetically contact the supporting roller 618 with the strip substrate when the strip substrate 601 is made of a magnetic material such as ferritic stainless steel.

In addition, the surface of the supporting roller 618 is formed of a conductive material such as stainless steel and is electrically grounded, thereby electrically grounding the conductive strip substrate 601.

Film Forming Chamber Based on Plasma Doping

In the present invention, the film forming chamber based on plasma doping means a film forming chamber (discharge treating chamber) for exposing the surface of the i-type semiconductor layer on the continuously moving strip substrate to a glow discharge plasma of gases containing impurity elements, thereby continuously forming an impurity doped layer by plasma doping.

The gas containing the impurity elements used for the plasma doping may be a gas containing dopant impurity elements, such as $B_2H_6$, $BF_3$, $PH_3$, or the like; diluted hydrogen, He, or the like and, along with these gases, a gas containing Si atoms such as $SiH_4$, $Si_2H_6$, and $SiF_4$ for stabilizing the discharge may be contained at a sufficiently small amount to form a semiconductor layer of a desired film thickness by deposition.

The plasma doping according to the present invention is preferably performed at a frequency ranging from 5 kHz to 500 kHz. The structure of the film forming chamber based on the plasma doping may be similar to the film forming chamber based on the high frequency plasma CVD method, an example of which is shown in FIG. 6. The power supply connected to the discharge electrode is preferably a low frequency power supply of from 5 kHz to 500 kHz.

In the present invention, a plurality of film forming chambers of the type described may be connected to each other to comply with the faster moving speed of the strip substrate without enlarging the length dimension of a single film forming chamber beyond a predetermined limit, or to form a single layer in a plurality of film forming steps.

In the apparatus according to the present invention, the film forming chamber based on plasma doping is preferably provided with temperature controlling means for heating and baking the film forming chamber or for controlling the strip substrate on which the semiconductor layers are formed while traveling within the film forming chamber to a temperature suitable for the semiconductor film formation.

Since the semiconductor layers are formed on the surface of the strip substrate within the film forming chamber, the temperature control of the formed film is preferably made from the backside.

In addition, the strip substrate is continuously moved in the film forming chamber, so that it is preferable for heating the strip substrate to use heater means based on radiation such as a lamp heater that is capable of heating the substrate without being in contact therewith. As temperature measuring means for controlling the temperature of the strip substrate, it is preferable to use a movable surface thermometer using a thermocouple pair that is capable of measuring the temperature of a traveling surface, has a small heat capacity, and is high in response. Alternatively, a radiation thermometer can also be used advantageously that is capable of measuring the temperature without contacting the surface.

Glow Discharge Cleaning Chamber

In the present invention, a glow discharge cleaning chamber means a discharge chamber for exposing the continuously traveling strip substrate to a glow discharge plasma of an inert gas such as Ar and He or of hydrogen gas, thereby continuously removing absorbed gases and water from the strip substrate.

To remove the materials such as the absorbed gas on the inner wall of the vacuum cavity or on the substrate surface by using a plasma of an inert gas or hydrogen gas is commonly known as discharge cleaning and is described in, for example, "Handbook of Vacuum Techniques" (Tohru KANAMOCHI, Nikkan Kogyo Shinbun, 1990).

In a roll-to-roll system, the longitudinal strip substrate is typically containing in an unwinding chamber wound as a coil and is fed continuously to the semiconductor film forming chamber. In forming a photoelectromotive element having a pin or nip structure, as well as pin pin pin or nip nip nip structure according to the roll-to-roll system, the unwound strip substrate is first fed to a chamber for forming an impurity doped layer, and the surface of the substrate is exposed to the plasma.

Since the strip substrate is contained in a vacuum cavity and is wound as a coil, the absorbed gas and water attached to the surface cannot be readily removed by eliminating the air therefrom. The absorbed gas and water attached to the surface of the strip substrate before the latter is placed in vacuum cavity may be present after unwinding.

In this respect, upon forming the first impurity doped layer, the absorbed gas and water remaining on the surface of the strip substrate are emitted into the plasma, which may be incorporated as contaminant impurities in the semiconductor film to be formed, thereby degrading the characteristics of the film.

The glow discharge cleaning chamber according to the present invention is provided in a roll-to-roll semiconductor laminated film forming device to ensure continuous discharge cleaning of the strip substrate just after it is unwound and fed to the first film forming chamber. It is also provided to avoid contamination of the impurities into the semiconductor film, thereby providing a semiconductor film of high quality containing less impurities.

In the present invention, a plurality of the cleaning chambers may be provided for complying with a faster moving speed of the strip substrates without increasing the length of an individual chamber more than necessary, or for cleaning under a plurality of cleaning conditions.

The structure thereof may be similar to the film forming chamber based on the high frequency plasma CVD method exemplified in FIG. 6 or the reaction chamber based on the microwave plasma CVD method exemplified in FIG. 4. However, in consideration of simplicity of the structure, it is preferable that the structure be similar to the film forming chamber based on the high frequency plasma CVD method exemplified in FIG. 6.

Hydrogen Plasma Treatment Chamber

In the present invention, a hydrogen plasma treatment chamber means a discharge chamber for exposing the i-type semiconductor layer on the continuously traveling strip substrate to a glow discharge plasma of hydrogen gas, thereby carrying out continuous hydrogen plasma treatment.

An amorphous silicon film is known to be improved in quality if subjected to hydrogen plasma treatment after formation of the film. This is disclosed in, for example, Proceedings of Applied Physics Scientific Lecture, 1991 10p-PF-5 and 10p-PF-12, as well as Proceedings of Applied Physics related Association Lecture 1992, 28p-ZV-9.

The present inventors have conducted this hydrogen plasma treatment on the surface of an i-type semiconductor layer after formation thereof and before formation of the impurity doped layer in the formation of a photoelectromotive element. It has been observed that the open circuit voltage of the photoelectromotive element produced is improved as compared with a case where hydrogen plasma treatment is not performed. It has also been found that the hydrogen plasma treatment carried out after formation of the i-type semiconductor layer and before formation of the impurity doped layer is effective for the formation of a photoelectromotive element of high quality.

The hydrogen plasma treatment chamber according to the present invention is so designed that the hydrogen plasma treatment can be made continuously in the roll-to-roll system.

In the present invention, a plurality of said treatment chambers may be provided for complying with a faster moving speed of the strip substrates without increasing the length dimension of an individual chamber more than necessary, or for treating under a plurality of treatment conditions.

The structure thereof may be similar to the film forming chamber based on the high frequency plasma CVD method exemplified in FIG. 6 or the film forming chamber based on the microwave plasma CVD method exemplified in FIG. 4. However, in consideration of simplicity and size reduction of the structure, it is preferable that the structure be similar to the film forming chamber based on the high frequency plasma CVD method exemplified in FIG. 6.

Heating Chamber

It is preferable that, after formation of a p-type or n-type semiconductor by the high frequency plasma CVD method, the i-type semiconductor by the microwave plasma CVD method, the i-type semiconductor by the high frequency plasma CVD method, and the n-type (or p-type) semiconductor by plasma doping, the semiconductor thus formed is annealed at a temperature equal to or lower than 350° C. in, for example, a heating chamber having a heating means. The annealing improves the characteristics and properties at the interface between the i-type layer formed by the high frequency plasma CVD technique and the i-type layer formed by the microwave plasma CVD technique and the plasma doped surface because of the hydrogen diffusion or the like from the i-type layer formed by the high frequency plasma CVD method. Thus, the resultant product has superior properties and characteristics to those not subjected to the annealing.

Unwinding Chamber for the Strip Substrate

In the present invention, an unwinding chamber for the strip substrate means a vacuum chamber for use in containing the strip substrate before film formation and feeding the strip substrate continuously to the film forming chamber.

Figure 7:
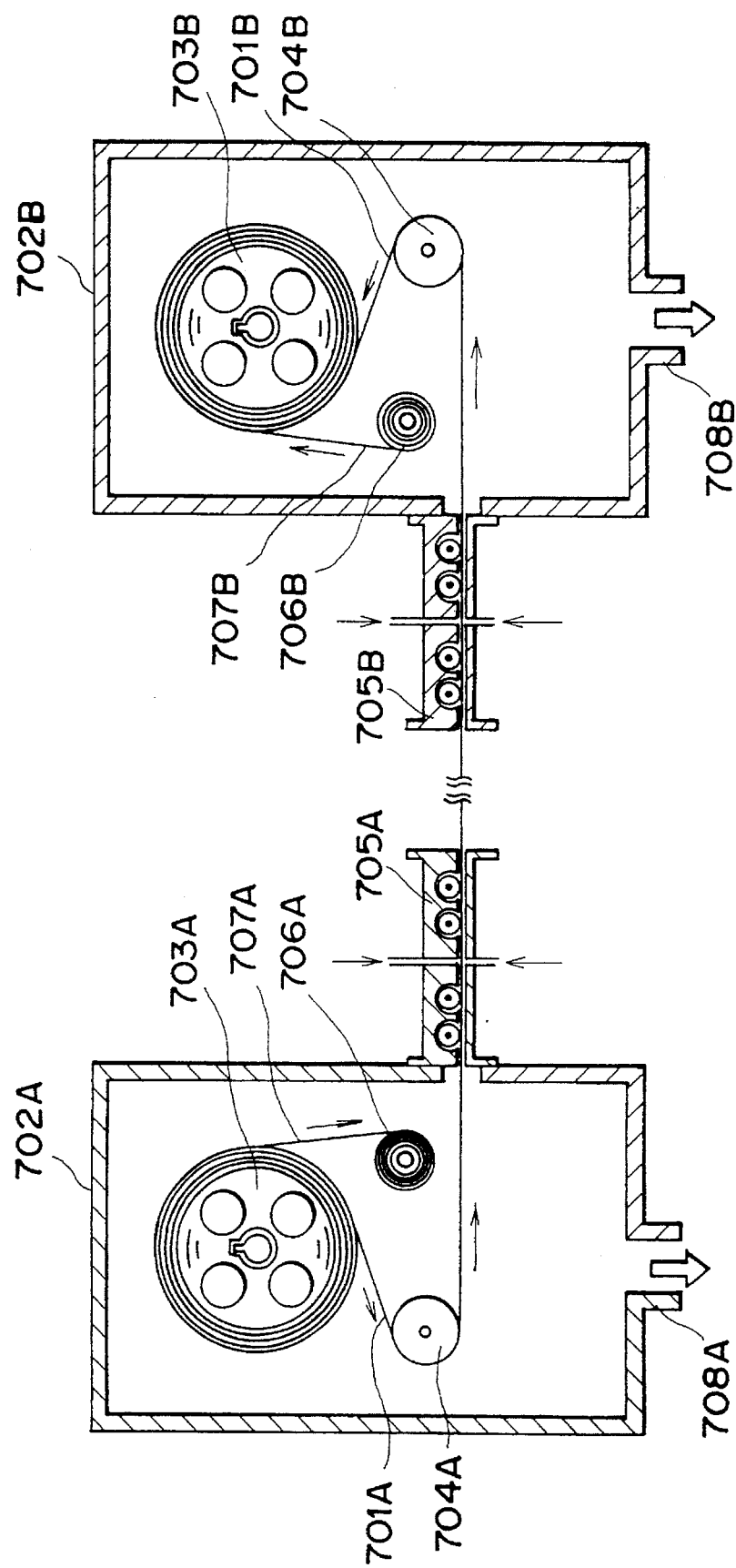
FIG. 7A is a diagrammatic cross section view of an example of the belt substrate unwind chamber in the apparatus of the present invention.
FIG. 7B is a diagrammatic cross section view of an example of the belt substrate wind-up chamber.

FIG. 7A is a diagrammatic sectional representation showing an example of the unwinding chamber for the strip substrate in the apparatus according to the present invention.

In FIG. 7A, a strip substrate 701 is wound as a coil on a bobbin 703A in a vacuum chamber 702A and contained therein. The strip substrate is unwound from the bobbin 703A by an unwinding mechanism in the unwinding chamber for the strip substrate. The substrate is then flattened by a roller 704A with the film forming surface (front face) facing downwardly, moved and supplied to the film forming chamber (not shown). The bobbin 703A is connected to a tension adjusting mechanism (not shown) for applying a certain tension to the strip substrate 701A. By applying tension to the strip substrate 701A, slack or looseness thereof is avoided. In addition, a film winding bobbin 706A is connected to a winding mechanism (not shown) to wind, along the path of the strip substrate, a soft thin protection film 707A made of a resin sheet of, for example, polyethylene, polyethylene terephthalate, polyimide, or polyamide; non-woven fabric cloth; paper, or one on which thin metal film is deposited thereon such as A1, the protection film being wound together with the strip substrate to prevent the face and back of the strip substrate from being rubbed with each other and damaged. In addition, the roller 704A is provided with a steering mechanism (not shown) to alter slightly the traveling direction of the strip substrate by means of slightly changing the direction of the rotation axis of the roller 704A from the outside of the vacuum chamber 702A. As a result of this, it becomes possible to supply the strip substrate to a gas gate 705A at a constant position relative to the transverse direction thereof even when the position of the strip substrate wound on the bobbin 703A is not registered.

In addition, the interior of the vacuum chamber 702A is subjected to a vacuum by means of an exhaust pipe 708A connected to a vacuum exhaust device (not shown).

Winding Chamber for the Strip Substrate

In the present invention, the winding chamber for the strip substrate means a vacuum chamber for continuously collecting from the film forming chamber the strip substrate on which the laminated semiconductor film is formed and containing the collected substrate.

FIG. 7B is a diagrammatic sectional representation showing an example of the winding chamber for the strip substrate in the apparatus according the present invention.

The winding chamber for the strip substrate is similar in structure to the unwinding chamber for the strip substrate except that the rotation direction of the bobbin and the roller is reversed.

In FIG. 7B, a strip substrate 701B on which the laminated semiconductor film is formed is supplied to a vacuum chamber 702B from a gas gate 705B and is wound on a bobbin 703B connected to a rotation mechanism (not shown) through a roller 704B.

In addition, a film winding bobbin 706B supplies to the bobbin 703B a soft thin protection film 707B made of a resin sheet of, for example, polyethylene, polyethylene terephthalate, polyimide or polyamide; non-woven fabric cloth; paper or one on which a thin metal film is deposited thereon such as At, the protection film being wound together with the strip substrate to prevent the face and back of the strip substrate from being rubbed with each other and damaged. In addition, the roller 704B is provided with a steering mechanism (not shown) to alter slightly the traveling direction of the strip substrate by means of slightly changing the direction of the rotation axis of the roller 704B from the outside of the vacuum chamber 702B. As a result of this, it becomes possible to wind the strip substrate 701B on the bobbin 703B at a constant position relative to the transverse direction thereof even when the position of the strip substrate supplied from the bobbin 705B is not registered.

In addition, an exhaust pipe 708B provided for vacuum exhausting of the interior of the vacuum chamber 702B is connected to a vacuum exhaust device (not shown).

A steering mechanism is described more in detail with reference to the drawing.

In the winding chamber for the strip substrate, a transverse displacement sensing mechanism and a steering mechanism for correcting the transverse displacement are provided in the vacuum chamber to prevent the strip substrate from being displaced in a direction at a right angle to the traveling direction during movement.

Figure 8:
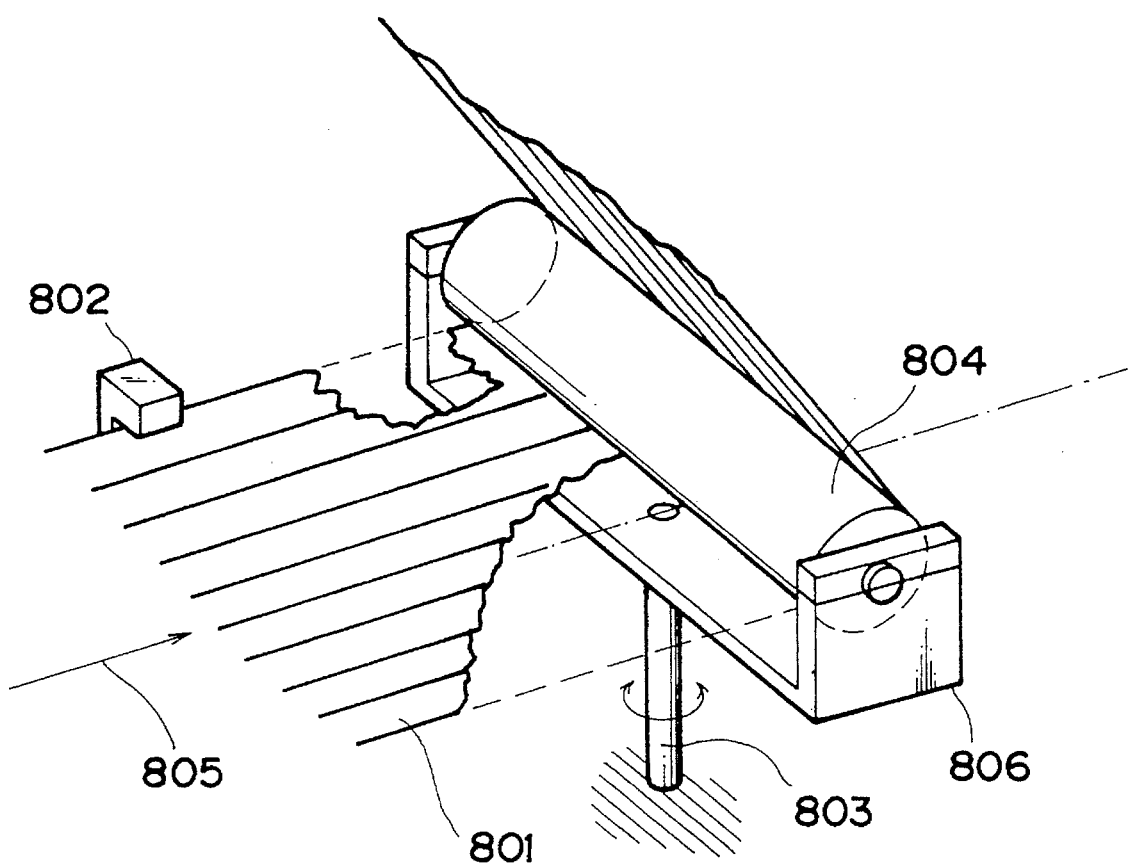
FIG. 8 is a diagrammatic cross section view of a steering mechanism.

FIG. 8 is a diagrammatic representation for use in describing the transverse displacement sensing mechanism and the steering mechanism. For the purpose of facilitating an understanding of the present invention, a part of the strip present invention, a part of the strip substrate is illustrated as being broken.

In FIG. 8, the traveling direction of a strip substrate 801 is shifted upward by a roller 804. The roller 804 is connected to a rotation mechanism 803 through a bearing 806 and is rotatable on the axis orthogonal to the rotation axis of the roller 804, which serves as the steering mechanism. This rotation mechanism 803 has a rotation axis projected outside the vacuum chamber. The axis is connected to servomotor having a reduction gear (not shown). The rotation angle thereof can thus be controlled from the outside.

In FIG. 8, a mechanism for steering is described for the case where the strip substrate 801 is shifted to the left of the traveling direction 805. First, the position of the winding bobbin, the rotation mechanism 803, and the bearing 806 is adjusted prior to the initiation of movement of the strip substrate. In this even, the adjustment is so made that the tensions applied to the right and left of the roller 804 are identical to each other and the strip substrate 801 is aligned and wound on the winding bobbin. The position of the strip substrate is set at a transverse displacement of the transverse displacement sensing mechanism=0 and a rotation angle of the rotation mechanism=0. Next, the strip substrate 801 is moved. When it is displaced to the left, the transverse displacement sensing mechanism 802 senses the amount of the transverse displacement to the left of the strip substrate 801. In addition, according to the amount of the transverse displacement, the rotation mechanism 803 is rotated at a small angle to move the right side of the roller 804 to the traveling direction and the left side thereof to the opposite direction to the traveling direction relative to the traveling direction 805 of the strip substrate. Depending on this rotation, the tension applied to the strip substrate is increased at the right-hand side of the roller 804 while decreased at the left-hand side thereof. As a result, the strip substrate 801 gradually returns to the right of the roller 804 applying the higher tension. Finally, the strip substrate is turned back to the original position when the amount of the transverse displacement=0 and the rotation angle=0. If it is displaced to the right, the roller 804 should be rotated in the reverse direction to shift the strip substrate to the left, thereby turning the same to the original position. The above mentioned operation is automatically carried out by a feedback mechanism (not shown) to connect the steering mechanism and the transverse displacement sensing mechanism. The strip substrate is always subjected to the position control within a predetermined range relative to the transverse direction, and is wound on the winding bobbin with the transverse position being registered.

Gas Gate

In the present invention, a gas gate means connecting means between the film forming chambers connects the adjacent film forming chambers through a slit-like separation path, and introduces gases such as Ar, He, or $H_2$ into the separation path to form a flow of the gas towards the film forming chambers, thereby moving the strip substrate between the adjacent film forming chambers and separating the reaction gases.

FIGS. 4, 6, 7A and 7B are diagrammatic sectional representations showing an example of various film forming chambers and gas gates connecting them in the present invention. The gas gates illustrated in FIGS. 4, 6, 7A, and 7B are basically identical in structure.

In FIG. 4, the gas gate 403 comprises a slit-like separation path 442 for passing the strip substrate 401 and separating the reaction gases. Above and below the strip substrate at an approximately center of the separation path 442, a plurality of gas introducing inlets are provided in the direction of the width of the strip substrate. Gate gas introducing pipes 443 and 444 are connected to the inlets, which are in turn connected to a gate gas supplying system (not shown), to introduce the gate gas for separating the reaction gases from upper and lower portions of the strip substrate 401. In addition, in the separation path 442, the strip substrate 401 is rotatably supported by a plurality of supporting rollers 445 at the backside thereof such that the surface thereof does not contact the lower wall of the separation path 442 and a certain small gap is kept therebetween.

Disposed within the supporting roller 445 is a permanent magnet (not shown) which has a high Curie point and generates a magnetic force not affecting the plasma. The permanent magnet serves to hermetically contact the supporting roller 445 with the strip substrate when the strip substrate 401 is made of a magnetic material such as ferritic stainless steel.

To avoid corrugation or vibration of the strip substrate during movement, causing the surface of the strip substrate where the semiconductor film is formed to contact the lower portion of the inner wall of the separation path, the slit-like separation path 442 is preferably large in the direction of thickness of the strip substrate and small in the traveling direction of the strip substrate. However, to avoid contamination of the source gas within the film forming chamber associated therewith, the separation path is preferably narrow in the direction of thickness of the strip substrate and wide in the traveling direction of the strip substrate. In this respect, the inner dimension of the slit-like separation path 442 in the traveling direction of the strip substrate is slightly larger than the width of the strip substrate and is practically constant at any position. However, the inner dimension of the direction of thickness of the strip substrate is narrower as the pressure difference is larger in the associated film forming chambers and as the allowable range of incorporation of the impurity gas is narrower. For example, the i-type semiconductor layer forming chamber based on the microwave CVD method is low in internal pressure, and the allowable range of the contamination is relatively narrow, so that in the case of the gas gate connecting the impurity doped layer forming chamber based on the high frequency plasma CVD in which the impurity gases are introduced at a relatively high internal pressure, the inner dimension of the separation path in the direction of thickness of the strip substrate is so narrow that the strip substrate is barely allowed to pass. On the other hand, in the case of the gas gates connecting the film forming chamber based on the high frequency plasma CVD with the winding or unwinding chambers for the strip substrate where less or no pressure difference is caused, the inner dimension of the separation path in the direction of thickness of the strip substrate is relatively wide such that the strip substrate can readily be moved. This is set at approximately 1 mm to 5 mm.

Belt substrate

The belt substrate suitably used in the apparatus of the present invention is preferably made of a material that causes less deformation or strain at the temperature required when semiconductor layers are formed thereon and has the desired strength and conductivity. Specifically, this includes thin sheets of stainless steel, aluminum and alloys thereof, iron and alloys thereof, copper and alloys thereof, and composites of these; these materials subjected to surface coating by sputtering, vacuum deposition, plating or the like to cover their surfaces with a thin film formed of a different material and/or an insulating thin film formed of $SiO_2$, $Si_3N_4$, $Al_2O_3$, AlN or the like; and heat-insulating resin sheets made of polyimide, polyamide, polyethylene terephthalate, epoxy or the like, or composites of any of these with glass fiber, carbon fiber, boron fiber, metal fiber or the like whose surfaces have been made conductive by plating, depositing, sputtering, or coating of a single metal, an alloy, a transparent conductive oxide (TCO), or the like.

Even when the belt substrate is made of a conductive material such as a metal, a layer formed of a different kind of metal may be provided on the surface on which the semiconductor layers are formed, for the purposes of, e.g., improving reflectance of long-wave light which reaches the substrate, preventing mutual diffusion and improving adhesion between the substrate material and the semiconductor layers, and making the substrate surface smooth.

When such a metal layer is formed as a light reflecting layer, it is suitable to use a metal having a high reflectance in the visible to infrared regions, as exemplified by Ag, Al, Cu, and AlSi.

On such a metal layer, a transparent conductive layer may be further provided for the purposes of, e.g., preventing the metal from diffusing from the metal layer to the semiconductor layers and improving light reflectance.

Materials for such a transparent conductive layer most suitable include transparent conductive oxides such as ZnO, $SnO_2$, $In_2O_3$, and ITO.

With regard to the surface properties of the belt substrate, it may have what is called a smooth surface, or may have a finely irregular surface. When a substrate having a finely irregular surface is used, it may preferably have a surface roughness which causes no faults in the semiconductor layers formed thereon, and also controlled within the range such that what is called the "light entrapping effect" causes an increase in the path length of incident light.

The belt substrate should have a thickness as thin as possible in view of cost, storage space and so forth, so long as it has a thickness within the range sufficient to provide a strength high enough to maintain its flat form during its transport. More specifically, it should preferably have a thickness of from 0.01 mm to 5 mm, more preferably from 0.02 mm to 2 mm, and most preferably from 0.05 mm to 1 mm.

With regard to the width of the belt substrate, it preferably is of a size sufficient for maintaining uniformity of the plasma formed in each film-forming chamber and forming the resulting photovoltaic devices into modules. More specifically, the belt substrate should preferably have a width of from 5 cm to 100 cm, and more preferably from 10 cm to 80 cm.

With regard to the length of the belt substrate, there are no particular limitations on it. The belt substrate may have a length large enough to be wound up into a roll, or a continuous belt substrate may be made by welding or the like.

The belt substrate as describe above should be placed in the apparatus of the present invention wound around a cylindrical bobbin into a coil in a diameter within a range such that it does not undergo plastic deformation.

Examples of the apparatus of the present invention, constituted of the respective film-forming chambers described above, will be illustrated with reference to the accompanying drawings. The present invention is by no means limited by these apparatus examples.

Apparatus Example 1

FIG. 1 is a diagrammatic illustration of a basic example of the apparatus of the present invention capable of continuously forming semiconductor multi-layer deposited films. In FIG. 1, the apparatus of the present invention capable of continuously forming multi-layer semiconductor films is comprised of the belt substrate unwind chamber 101, the film-forming chamber 102 in which an n- or p-type semiconductor layer is formed by high-frequency plasma-assisted CVD, the film-forming chamber 103 in which an i-type semiconductor layer is formed by microwave plasma-assisted CVD, the film-forming chamber 104 in which an i-type semiconductor layer is formed by high-frequency plasma-assisted CVD, the film-forming chamber 105 in which a p- or n-type semiconductor layer is formed by plasma doping, and the belt substrate wind-up chamber 106.

Here, a series of film-forming chambers are provided in an overall convex shape in the direction of gravity, e.g., in the shape of a catenary curve or a circular arc, along the shape of the belt substrate that hangs by its own weight. The belt substrate is stretched without looseness under a slight tension so that it can be kept in a given shape in the course of film formation and at the same time any stress applied to the belt substrate and semiconductor layers formed thereon can be relaxed during transport of the belt substrate. Thus, faults in the films can be prevented from being caused by deformation or stress of the substrate.

In the apparatus shown in FIG. 1, the belt substrate 108 is unwound from the bobbin 109 provided in the belt substrate unwind chamber 101, and is transported while being passed through the four film-forming chambers each connected with the gas gate 107, until it is wound up on the bobbin 110 provided in the belt substrate wind-up chamber 106, in the course of which multi-layer non-monocrystalline semiconductor films of nip or pin structure are continuously formed on the surface of the substrate.

The belt substrate 108 fed from the belt substrate unwind chamber 101 (i) first enters the film-forming chamber 102 in which an n- or p-type semiconductor layer is formed by high-frequency plasma-assisted CVD, i.e. where an n- or p-type silicon non-monocrystalline semiconductor layer is formed on the surface of the substrate by high-frequency plasma-assisted CVD, (ii) next enters the film-forming chamber 103 in which an i-type semiconductor layer is formed by microwave plasma-assisted CVD, i.e. where an i-type silicon non-monocrystalline semiconductor layer is formed on the n- or p-type layer by microwave plasma-assisted CVD, (iii) subsequently enters the film-forming chamber 104 in which an i-type semiconductor layer is formed by high-frequency plasma-assisted CVD, i.e. where an i-type silicon non-monocrystalline semiconductor layer is formed on the microwave CVD i-type layer formed by high-frequency plasma-assisted CVD, (iv) and then enters the film-forming chamber 105 in which a p- or n-type semiconductor layer is formed by plasma doping, i.e. where a p- or n-type silicon non-monocrystalline semiconductor layer is formed on the surface of the i-type layer by plasma doping. Finally, the belt substrate with these layers is taken up in the belt substrate wind-up chamber 106.

Apparatus Example 2

FIG. 2 is a diagrammatic illustration of another example of the apparatus of the present invention, capable of continuously forming semiconductor multi-layer deposited films. In FIG. 2, the apparatus of the present invention capable of continuously forming multi-layer semiconductor films is comprised of a belt substrate unwind chamber 201, a glow discharge cleaning chamber 211, a film-forming chamber 202 in which an n- or p-type semiconductor layer is formed by high-frequency plasma-assisted CVD, a film-forming chamber 212 in which an i-type semiconductor layer is formed by high-frequency plasma-assisted CVD, a film-forming chamber 203 in which an i-type semiconductor layer is formed by microwave plasma-assisted CVD, a film-forming chamber 204 in which an i-type semiconductor layer is formed by high-frequency plasma-assisted CVD, a hydrogen plasma treating chamber 213, a film-forming chamber 205 in which a p- or n-type semiconductor layer is formed by plasma doping, and a belt substrate wind-up chamber 206.

Here, a series of film-forming chambers are provided in an overall convex shape in the direction of gravity, e.g., in the shape of a catenary curve or a circular arc, along the shape of the belt substrate that hangs by its own weight. The belt substrate is stretched without looseness under a slight tension so that it can be kept in a given shape in the course of film formation and at the same time any stress applied to the belt substrate and semiconductor layers formed thereon can be relaxed during transport of the belt substrate. Thus, faults in the films can be prevented from being caused by deformation or stress of the substrate.

The glow discharge cleaning chamber 211 and the hydrogen plasma treating chamber 213, in which no semiconductor layer is formed, are made shorter in the direction of movement of the belt substrate than other film-forming chambers.

In the apparatus shown in FIG. 2, the belt substrate 208 is unwound from the bobbin 209 provided in the belt substrate unwind chamber 201, and is transported while being passed through the seven chambers each connected with the gas gate 207, until it is wound up on the bobbin 210 provided in the belt substrate wind-up chamber 206, in the course of which multi-layer non-monocrystalline semiconductor films of a nip or pin structure are continuously formed on the surface of the substrate.

The belt substrate 208 fed from the belt substrate unwind chamber 201 (i) first enters the glow discharge cleaning chamber 211, where its surface is cleaned by glow discharge, (ii) next enters the film-forming chamber 202 in which an n- or p-type semiconductor layer is formed by high-frequency plasma-assisted CVD, i.e. where an n- or p-type silicon non-monocrystalline semiconductor layer is formed on the surface of the substrate by high-frequency plasma-assisted CVD, (iii) next enters the film-forming chamber 212 in which an i-type semiconductor layer is formed by high-frequency plasma-assisted CVD, i.e. where an i-type silicon non-monocrystalline semiconductor layer is formed on the high-frequency plasma CVD n- or p-type layer by high-frequency plasma-assisted CVD, (iv) next enters the film-forming chamber 203 in which an i-type semiconductor layer is formed by microwave plasma-assisted CVD, i.e. where an i-type silicon non-monocrystalline semiconductor layer is formed on the high-frequency CVD i-type layer by microwave plasma-assisted CVD, (v) subsequently enters the film-forming chamber 204 in which an i-type semiconductor layer is formed by high-frequency plasma-assisted CVD, i.e. where an i-type silicon non-monocrystalline semiconductor layer is formed on the high-frequency CVD i-type layer by high-frequency plasma-assisted CVD, (vi) next enters the hydrogen plasma treating chamber 213, where the surface of the i-type layer is treated with hydrogen plasma, (vii) and then enters the film-forming chamber 205 in which a p- or n-type semiconductor layer is formed by plasma doping, i.e. where a p- or n-type silicon non-monocrystalline semiconductor layer is formed on the surface of the i-type layer by plasma doping. Finally, the belt substrate with these layers is taken up in the belt substrate wind-up chamber 206.

Apparatus Example 3

The FIG. 2 apparatus from which the glow discharge cleaning chamber 211 and the gas gate with which it is connected have been removed can be considered as a distinct apparatus example of the present invention.

In this instance, the apparatus is the same as that of Apparatus Example 2 except that the belt substrate is not cleaned by glow discharge.

Apparatus Example 4

The FIG. 2 apparatus from which the film-forming chamber 212 in which an i-type semiconductor layer is formed by high-frequency plasma-assisted CVD and the gas gate with which it is connected have been removed can be considered as another distinct apparatus example of the present invention.

In this instance, the apparatus is the same as that of Apparatus Example 2 except that the i-type semiconductor layer is not formed on the n- or p-type semiconductor layer by high-frequency plasma-assisted CVD.

Apparatus Example 5

The FIG. 2 apparatus from which the hydrogen plasma treating chamber 213 and the gas gate with which it is connected have been removed can be considered as yet another distinct apparatus example of the present invention.

In this instance, the apparatus is the same as that of Apparatus Example 2 except that the surface of the i-type semiconductor layer is not treated with hydrogen plasma before the p- or n-type semiconductor layer is formed.

Apparatus Example 6

The FIG. 2 apparatus from which the glow discharge cleaning chamber 211, the film-forming chamber 212 in which an i-type semiconductor layer is formed by high-frequency plasma-assisted CVD, and the gas gates with which they are connected have been removed can be considered as still another distinct apparatus example of the present invention.

In this instance, the apparatus is the same as that of Apparatus Example 2 except that the belt substrate is not cleaned by glow discharge and the i-type semiconductor layer is not formed on the n- or p-type semiconductor layer by high-frequency plasma-assisted CVD.

Apparatus Example 7

The FIG. 2 apparatus form which the glow discharge cleaning chamber 211, the hydrogen plasma treating chamber 213, and the gas gates with which they are connected have been removed can be considered as another distinct apparatus example of the present invention.

In this instance, the apparatus is the same as that of Apparatus Example 2 except that the belt substrate is not cleaned by glow discharge and the surface of the i-type semiconductor layer is not treated with hydrogen plasma before the p- or n-type semiconductor layer is formed.

Apparatus Example 8

The FIG. 2 apparatus from which the film-forming chamber 212 in which an i-type semiconductor layer is formed by high-frequency plasma-assisted CVD, the hydrogen plasma treating chamber 213, and the gas gates with which they are connected have been removed can be considered as yet another apparatus example of the present invention.

In this instance, the apparatus is the same as that of Apparatus Example 2 except that the i-type semiconductor layer is not formed on the n- or p-type semiconductor layer by high-frequency plasma-assisted CVD and the surface of the i-type semiconductor layer is not treated with hydrogen plasma before the p-or n-type semiconductor layer is formed.

Apparatus Example 9

FIG. 21 is a diagrammatic illustration of another basic example of the apparatus of the present invention, capable of continuously forming multi-layer semiconductor films. In FIG. 21, the apparatus of the present invention, capable of continuously forming multi-layer semiconductor films is comprised of a belt substrate unwind chamber 101, a film-forming chamber 2102A in which an n- or p-type semiconductor layer is formed by high-frequency plasma-assisted CVD, a film-forming chamber 2103A in which an i-type semiconductor layer is formed by microwave plasma-assisted CVD, a film-forming chamber 2104A in which an i-type semiconductor layer is formed by high-frequency plasma-assisted CVD, a film-forming chamber 2105A in which a p- or n-type semiconductor layer is formed by plasma doping, a film-forming chamber 2102B in which an n- or p-type semiconductor layer is formed by high-frequency plasma-assisted CVD, a film-forming chamber 2103B in which an i-type semiconductor layer is formed by microwave plasma-assisted CVD, a film-forming chamber 2104B in which an i-type semiconductor layer is formed by high-frequency plasma-assisted CVD, a film-forming chamber 2015B in which a p- or n-type semiconductor layer is formed by plasma doping, a film-forming chamber 2102C in which an n- or p-type semiconductor layer is formed by high-frequency plasma-assisted CVD, a film-forming chamber 2103C in which an i-type semiconductor layer is formed by microwave plasma-assisted CVD, a film-forming chamber 2104C in which an i-type semiconductor layer is formed by high-frequency plasma-assisted CVD, a film-forming chamber 2105C in which a p- or n-type semiconductor layer is formed by plasma doping, and a belt substrate wind-up chamber 106.

In the apparatus shown in FIG. 21, the belt substrate 108 is unwound from the bobbin 109 provided in the belt substrate unwind chamber 101, and is transported while being passed though the twelve film-forming chambers each connected with the gas gate 107, until it is wound up on the bobbin 110 provided in the belt substrate wind-up chamber 106, in the course of which multi-layer non-monocrystalline semiconductor films of a nipnipnip or pinpinpin structure are continuously formed on the surface of the substrate.

The belt substrate 108 fed from the belt substrate unwind chamber 101 (1) first enters the film-forming chamber 2102A in which an n- or p-type silicon non-monocrystalline semiconductor layer is formed on the surface of the substrate by high-frequency plasma-assisted CVD, (2) next enters the film-forming chamber 103A in which an i-type silicon non-monocrystalline semiconductor layer is formed by microwave plasma-assisted CVD, (3) subsequently enters the film-forming chamber 2104A in which an i-type, i.e. silicon non-monocrystalline semiconductor layer is formed by high-frequency plasma-assisted CVD, (4) next enters the film-forming chamber 2105A in which a p- or n- type silicon non-monocrystalline semiconductor layer is formed on the surface of the i-type layer by plasma doping, (5) next enters the film-forming chamber 2102B in which an n-or p-type silicon non-monocrystalline semiconductor layer is formed by high-frequency plasma-assisted CVD, (6) next enters the film-forming chamber 2103B in which an i-type silicon non-monocrystalline semiconductor layer is formed by microwave plasma-assisted CVD, (7) subsequently enters the film-forming chamber 2104B in which an i-type silicon non-monocrystalline semiconductor layer is formed by high-frequency plasma-assisted CVD, (8) next enters the film-forming chamber 2105B in which a p- or n-type silicon non-monocrystalline semiconductor layer is formed on the surface of the i-type layer by plasma doping, (9) next enters the film-forming chamber 2102C in which an n- or p-type silicon non-monocrystalline semiconductor layer is formed by high-frequency plasma-assisted CVD, (10) next enters the film-forming chamber 2103C in which an i-type silicon non-monocrystalline semiconductor layer is formed by microwave plasma-assisted CVD, (11) subsequently enters the film-forming chamber 2104C in which an i-type silicon non-monocrystalline semiconductor layer is formed by high-frequency plasma-assisted CVD, (12) and then enters the film-forming chamber 2105C in which a p- or n-type silicon non-monocrystalline semiconductor layer is formed on the surface of the i-type layer by plasma doping. Finally, the belt substrate with these layers is taken up in the belt substrate wind-up chamber 106.

Apparatus Example 10

Figure 22:
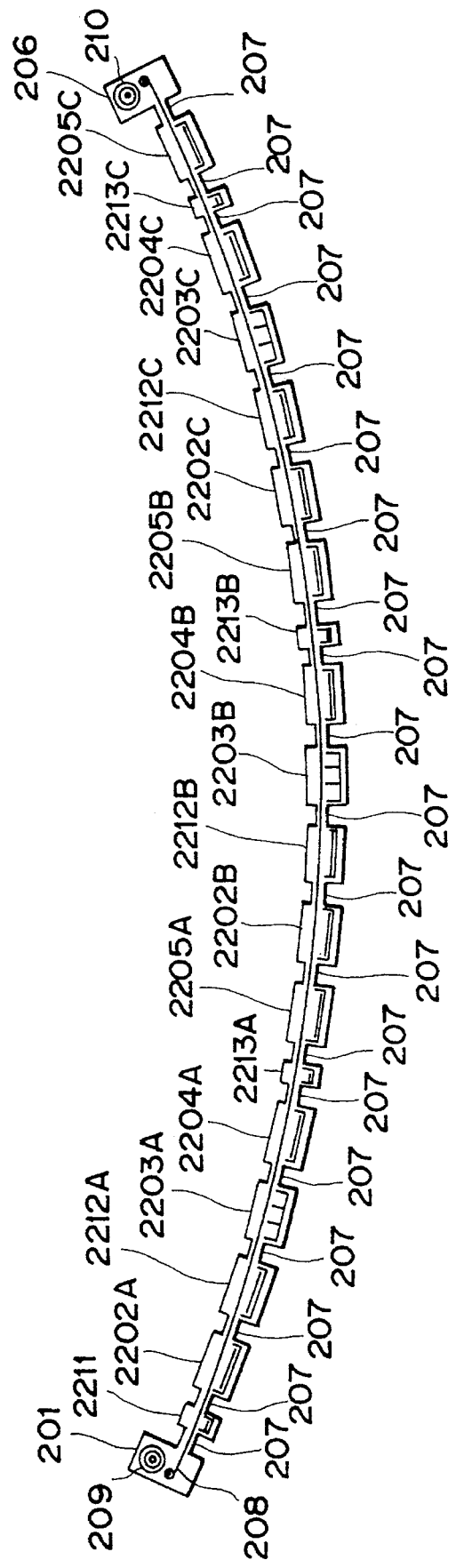
FIG. 22 is a diagrammatic cross section view of a further example of the apparatus of the present invention capable of continuously forming a semiconductor multi-layered film.

FIG. 22 is a diagrammatic illustration of another example of the apparatus of the present invention, capable of continuously forming multi-layer semiconductor films.

In FIG. 22, the apparatus of the present invention, capable of continuously forming multi-layer semiconductor films is comprised of a belt substrate unwind chamber 201, a glow discharge cleaning chamber 211, a film-forming chamber 2202A in which an n- or p-type semiconductor layer is formed by high-frequency plasma-assisted CVD, a film-forming chamber 2212A in which an i-type semiconductor layer is formed by high-frequency plasma-assisted CVD, a film-forming chamber 2203A in which an i-type semiconductor layer is formed by microwave plasma-assisted CVD, a film-forming chamber 2204A in which an i-type semiconductor layer is formed by high-frequency plasma-assisted CVD, a hydrogen plasma treating chamber 2213A, a film-forming chamber 2205A in which a p- or n-type semiconductor layer is formed by plasma doping, a film-forming chamber 2202B in which an n- or p-type semiconductor layer is formed by high-frequency plasma-assisted CVD, a film-forming chamber 2212B in which an i-type semiconductor layer is formed by high-frequency plasma-assisted CVD, a film-forming chamber 2203B in which an i-type semiconductor layer is formed by microwave plasma-assisted CVD, a film-forming chamber 2204B in which an i-type semiconductor layer is formed by high-frequency plasma-assisted CVD, a hydrogen plasma treating chamber 2213B, a film-forming chamber 2205B in which a p- or n-type semiconductor layer is formed by plasma doping, a film-forming chamber 2202C in which an n-or p-type semiconductor layer is formed by high-frequency plasma-assisted CVD, a film-forming chamber 2212C in which an i-type semiconductor layer is formed by high-frequency plasma-assisted CVD, a film-forming chamber 2203C in which an i-type semiconductor layer is formed by microwave plasma-assisted CVD, a film-forming chamber 2204C in which an i-type semiconductor layer is formed by high-frequency plasma-assisted CVD, a hydrogen plasma treating chamber 2213C, a film-forming chamber 2205C in which a p- or n-type semiconductor layer is formed by plasma doping, and a belt substrate wind-up chamber 206.

In the apparatus shown in FIG. 22, the belt substrate 208 is unwound from the bobbin 209 provided in the belt substrate unwind chamber 201, and is transported while being passed through the fifteen film-forming chambers and four treating chambers each connected through a gas gate 207, until it is wound up on the bobbin 210 provided in the belt substrate wind-up chamber 206, in the course of which multi-layer non-monocrystalline semiconductor films of a nipnipnip or pinpinpin structure are continuously formed on the surface of the substrate.

The belt substrate 208 fed from the belt substrate unwind chamber 201 (1) first enters into the glow discharge cleaning chamber 211, where its surface is cleaned by glow discharge, (2) next enters the film-forming chamber 2202A in which an n- or p-type silicon non-monocrystalline semiconductor layer is formed on the surface of the substrate by high-frequency plasma-assisted CVD, (3) next enters the film-forming chamber 2212A in which an i-type silicon non-monocrystalline semiconductor layer is formed by high-frequency plasma-assisted CVD, (4) next enters the film-forming chamber 203A in which an i-type silicon non-monocrystalline semiconductor layer is formed by microwave plasma-assisted CVD, (5) subsequently enters the film-forming chamber 2204A in which an i-type silicon non-monocrystalline semiconductor layer 1504A is formed by high frequency plasma-assisted CVD, (6) next enters the hydrogen plasma treating chamber 2213A, where the surface of the i-type layer is treated with hydrogen plasma, (7) next enters the film-forming chamber 2205A in which a p- or n-type silicon non-monocrystalline semiconductor layer is formed on the surface of the i-type layer by plasma doping, (8) next enters the film-forming chamber 2202B in which an n- or p-type silicon non-monocrystalline semiconductor layer is formed on the surface of the foregoing layer by high-frequency plasma-assisted CVD, (9) next enters the film-forming chamber 2212B in which an i-type silicon non-monocrystalline semiconductor layer is formed by high-frequency plasma-assisted CVD, (10) next enters the film-forming chamber 2203B in which an i-type silicon non-monocrystalline semiconductor layer is formed by microwave plasma-assisted CVD, (11) subsequently enters the film-forming chamber 2204B in which an i-type silicon non-monocrystalline semiconductor layer is formed by high-frequency plasma-assisted CVD, (12) next enters the hydrogen plasma treating chamber 2213B, where the surface of the i-type layer is treated with hydrogen plasma, (13) next enters the film-forming chamber 2205B in which a p- or n-type silicon non-monocrystalline semiconductor layer is formed on the surface of the i-type layer by plasma doping, (14) next enters the film-forming chamber 2202C in which an n- or p-type silicon non-monocrystalline semiconductor layer is formed on the surface of the foregoing layer by high-frequency plasma-assisted CVD, (15) next enters the film-forming chamber 2212C in which an i-type silicon non-monocrystalline semiconductor layer is formed by high-frequency plasma-assisted CVD, (16) next enters the film-forming chamber 2203C in which an i-type silicon non-monocrystalline semiconductor layer is formed by microwave plasma-assisted CVD, (17) subsequently enters the film-forming chamber 2204C in which an i-type silicon non-monocrystalline semiconductor layer is formed by high-frequency plasma-assisted CVD, (18) next enters the hydrogen plasma treating chamber 2213C, where the surface of the i-type layer is treated with hydrogen plasma, (19) and then enters the film-forming chamber 2205C in which a p- or n-type silicon non-monocrystalline semiconductor layer is formed on the surface of the i-type layer by plasma doping. Finally, the belt substrate with these layers is taken up in the belt substrate wind-up chamber 206.

Apparatus Example 11

The FIG. 22 apparatus from which the glow discharge cleaning chamber 211 and the gas gate with which it is connected have been removed can be included as a separate apparatus example of the present invention.

In this instance, the apparatus is the same as that of Apparatus Example 10 except that the belt substrate is not cleaned by glow discharge.

Apparatus Example 12

The FIG. 22 apparatus from which the film-forming chamber(s) 2212A and/or 2212B and/or 2212C in which i-type layer(s) is/are formed by high-frequency plasma-assisted CVD and the gas gates with which they are connected have been removed can be included as yet another apparatus example of the present invention.

In this instance, the apparatus is the same as that of Apparatus Example 10 except that the i-type layer is not formed on at least one n- or i-type layer by high-frequency plasma-assisted CVD.

Apparatus Example 13

The FIG. 22 apparatus from which the hydrogen plasma treating chamber(s) 2213A and/or 2213B and/or 2213C and the gas gates with which they are connected have been removed can be included as still another apparatus example of the present invention.

In this instance, the apparatus is the same as that of Apparatus Example 10 except that the surface of the i-type layer is not treated with hydrogen plasma before at least one p- or n-type layer is formed.

Apparatus Example 14

The FIG. 22 apparatus from which the glow discharge cleaning chamber 2211, the film-forming chamber(s) 2212A and/or 2212B and/or 2212C in which i-type layer(s) is/are formed by high-frequency plasma-assisted CVD and the gas gates with which they are connected have been removed can be included as another apparatus example of the present invention.

In this instance, the apparatus is the same as that of Apparatus Example 10 except that the belt substrate is not cleaned by glow discharge and the i-type layer is not formed on at least one n- or p-type layer by high-frequency plasma-assisted CVD.

Apparatus Example 15

The FIG. 22 apparatus from which the glow discharge cleaning chamber 211, the hydrogen plasma treating chamber(s) 2211, the hydrogen plasma treating chamber(s) 2213A and/or 2213B and/or 2213C and the gas gates with which they are connected have been removed can be included as yet another apparatus example of the present invention.

In this instance, the apparatus is the same as that of Apparatus Example 10 except that the belt substrate is not cleaned by glow discharge and the surface of the i-type layer is not treated with hydrogen plasma before at least one p- or n-type layer is formed.

Apparatus Example 16

The FIG. 22 apparatus from which the film-forming chamber(s) 2212A and/or 2212B and/or 2212C in which i-type layer(s) is/are formed by high-frequency plasma-assisted CVD, the hydrogen plasma treating chamber(s) 2213A and/or 2213B and/or 2213C and the gas gates with which they are connected have been removed can be included as still another apparatus example of the present invention.

In this instance the apparatus is the same as that of Apparatus Example 10 except that the i-type layer is not formed on at least one n- or p-type layer by high-frequency plasma-assisted CVD and the surface of the i-type layer is not treated with hydrogen plasma before at least one p-or n-type layer is formed.

Apparatus Example 17

FIG. 23 is diagrammatic illustration of another basic example of the apparatus of the present invention, capable of continuously forming semiconductor multi-layer deposited films. In FIG. 23, the apparatus is comprised of a belt substrate unwind chamber 101, a film-forming chamber 2302A in which an n- or p-type semiconductor layer is formed by high-frequency plasma-assisted CVD, a film-forming chamber 2303A in which an i-type semiconductor layer is formed by microwave plasma-assisted CVD, a film-forming chamber 2304A in which an i-type semiconductor layer is formed by high-frequency plasma-assisted CVD, a film-forming chamber 2305A in which a p- or n-type semiconductor layer is formed by plasma doping, a film-forming chamber 2302B in which an n- or p-type semiconductor layer is formed by high-frequency plasma-assisted CVD, a film-forming chamber 2303B in which an i-type semiconductor layer is formed by microwave plasma-assisted CVD, a film-forming chamber 2304B in which an i-type semiconductor layer is formed by high-frequency plasma-assisted CVD, a film-forming chamber 2305B in which a p-type or n-type semiconductor layer is formed by plasma doping, a film-forming chamber 2302C in which an n- or p-type semiconductor layer is formed by high-frequency plasma-assisted CVD, a film-forming chamber 2304C in which an i-type semiconductor layer is formed by high-frequency plasma-assisted CVD, a film-forming chamber 2305C in which a p- of n-type semiconductor layer is formed by plasma doping, and a belt substrate wind-up chamber 106.

Here, a series of film-forming chambers are provided in an overall convex shape in the direction of gravity, e.g., in the shape of a catenary curve or a circular arc, along the shape of the belt substrate that hangs by its own weight. The belt substrate is stretched without looseness under a slight tension so that it can be kept in a given shape in the course of film formation and at the same time any stress applied to the belt substrate and semiconductor layers formed thereon can be relaxed during transport of the belt substrate. Thus, faults in the films can be prevented from being caused by deformation or stress of the substrate.

In the apparatus shown in FIG. 23, the belt substrate 108 unwound from the bobbin 109 provided in the belt substrate unwind chamber 101, and is transported while being passed through the eleven film-forming chambers each connected with the gas gate 107, until it is wound up on the bobbin 110 provided in the belt substrate wind-up chamber 106, in the course of which multi-layer monocrystalline semiconductor films of a nipnipnip or pinpinpin structure are continuously formed on the surface of the substrate.

The belt substrate 108 fed from the belt substrate unwind chamber 101(1) first enters the film-forming chamber 2302A in which an n- or p-type silicon non-monocrystalline semiconductor layer is formed on the surface of the substrate by high-frequency plasma-assisted CVD, (2) next enters the film-forming chamber 2303A in which an i-type silicon non-monocrystalline semiconductor layer is formed by microwave plasma-assisted CVD, (3) subsequently enters the film-forming chamber 2304A in which an i-type silicon non-monocrystalline semiconductor layer is formed by high-frequency plasma-assisted CVD, (4) next enters the film-forming chamber 2305A in which a p- or n-type silicon non-monocrystalline semiconductor layer is formed on the surface of the i-type semiconductor layer by plasma doping, (5) next enters the film-forming chamber 2302B in which an n- or p-type silicon non-monocrystalline semiconductor layer is formed by high-frequency plasma-assisted CVD, (6) next enters the film-forming chamber 2303B in which an i-type silicon non-monocrystalline semiconductor layer is formed by microwave plasma-assisted CVD, (7) subsequently enters the film-forming chamber 2304B in which an i-type silicon non-monocrystalline semiconductor layer is formed by high-frequency plasma-assisted CVD, (8) next enters the film-forming chamber 2305B in which a p- or n-type silicon non-monocrystalline semiconductor layer is formed on the surface of the i-type semiconductor layer by plasma doping, (9) next enters the film-forming chamber 2302C in which an n- or p-type silicon non-monocrystalline semiconductor layer is formed by high-frequency plasma-assisted CVD, (10) subsequently enters the film-forming chamber 2304C in which an i-type silicon non-monocrystalline semiconductor layer is formed by high-frequency plasma-assisted CVD, (11) and then enters the film-forming chamber 2305 in which a p- or n-type silicon non-monocrystalline semiconductor layer is formed on the surface of the i-type semiconductor layer by plasma doping. Finally, the belt substrate with these layers formed thereon is taken up in the belt substrate wind-up chamber 106.

Apparatus Example 18

Figure 24:
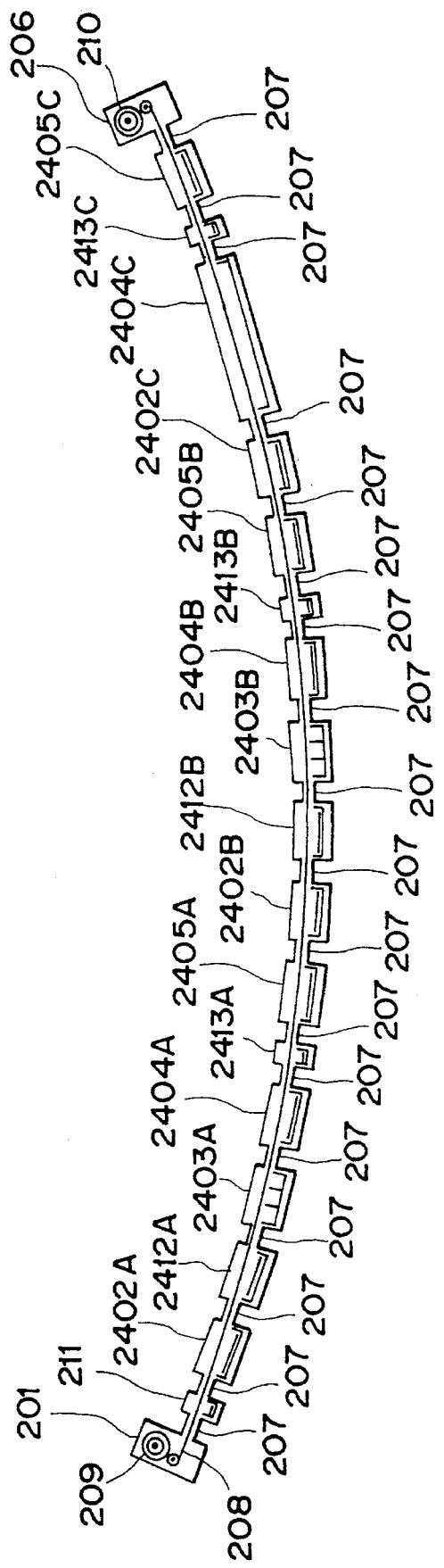
FIG. 24 is a diagrammatic cross section view of a still further example of the apparatus of the present invention capable of continuously forming a semiconductor multi-layered film.

FIG. 24 is a diagrammatic illustration of another example of the apparatus of the present invention, capable of continuously forming semiconductor multi-layer deposited films.

In FIG. 24, the apparatus is comprised of a belt substrate unwind chamber 201, a glow discharge cleaning chamber 211, a film-forming chamber 2402A in which an n- or p-type semiconductor layer is formed by high-frequency plasma-assisted CVD, a film-forming chamber 2412A in which an i-type semiconductor layer is formed by high-frequency plasma assisted CVD, a film-forming chamber 2403A in which an i-type semiconductor layer is formed by microwave plasma-assisted CVD, a film-forming chamber 2404A in which an i-type semiconductor layer is formed by high frequency plasma-assisted CVD, a hydrogen plasma treating chamber 2413A, a film-forming chamber 2405A in which a p- or n-type semiconductor layer is formed by plasma doping, a film-forming chamber 2402B in which an n- or p-type semiconductor layer is formed by high-frequency plasma-assisted CVD, a film-forming chamber 2412B in which an i-type semiconductor layer is formed by high-frequency plasma-assisted CVD, a film-forming chamber 2403B in which an i-type semiconductor layer is formed by microwave plasma-assisted CVD, a film-forming chamber 2404B in which an i-type semiconductor layer is formed by high-frequency plasma-assisted CVD, a hydrogen plasma treating chamber 2413B, a film-forming chamber 2405B in which a p- or n-type semiconductor layer is formed by plasma doping, a film-forming chamber 2402C in which an n- or p-type semiconductor layer is formed by high-frequency plasma-assisted CVD, a film-forming chamber 2404C in which an i-type semiconductor layer is formed by high-frequency plasma-assisted CVD, a hydrogen plasma treating chamber 2413C, a film-forming chamber 2405C in which a p- or n-type semiconductor layer is formed by plasma doping, and a belt substrate wind-up chamber 206.

In the apparatus shown in FIG. 24 the belt substrate 208 is unwound from the bobbin 209 provided in the belt substrate unwind chamber 201, and is transported while being passed through fifteen chambers each connected with a gas gate 207, until it is would up on the bobbin 210 provided in the belt substrate wind-up chamber 206, in the course of which non-monocrystalline semiconductor multi-layer deposited films of a nipnipnip or pinpinpin structure are continuously formed on the surface of the substrate.

The belt substrate 208 fed from the belt substrate unwind chamber 201(1) first enters the glow discharge cleaning chamber 211, where its surface is cleaned by glow discharge (2) next enters the film-forming chamber 2402A in which an n- or p-type silicon non-monocrystalline semiconductor layer is formed on the surface of the substrate by high-frequency plasma-assisted CVD, (3) next enters the film-forming chamber 2412A in which an i-type silicon non-monocrystalline semiconductor is formed by high-frequency plasma-assisted CVD, (4) next enters the film-forming chamber 2403A in which an i-type silicon non-monocrystalline semiconductor layer is formed by microwave plasma-assisted CVD, (5) subsequently enters the film-forming chamber 2404A in which an i-type silicon non-monocrystalline semiconductor layer is formed by high-frequency plasma-assisted CVD, (6) next enters the hydrogen plasma treating chamber 2413A, where the surface of the i-type layer is treated with hydrogen plasma, (7) next enters the film-forming chamber 2405A in which a p- or n-type silicon non-monocrystalline semiconductor layer is formed on the surface of the i-type semiconductor layer by plasma doping, (8) next enters the film-forming chamber 2402B in which an n- or p-type silicon non-monocrystalline semiconductor layer is formed by high-frequency plasma-assisted CVD, (9) next enters the film-forming chamber 2412B in which an i-type silicon non-monocrystalline semiconductor layer is formed by high-frequency plasma-assisted CVD, (10) next enters the film-forming chamber 2403B in which an i-type silicon non-monocrystalline semiconductor layer is formed by microwave plasma-assisted CVD, (11) subsequently enters the film-forming chamber 2404B in which an i-type silicon non-monocrystalline semiconductor layer is formed by high-frequency plasma-assisted CVD, (12) next enters the hydrogen plasma treating chamber 2413B, where the surface of the i-type semiconductor layer is treated with hydrogen plasma, (13) next enters the film-forming chamber 2405B in which a p- or n-type silicon non-monocrystalline semiconductor layer is formed on the surface of the i-type semiconductor layer by plasma doping, (14) next enters the film-forming chamber 2402C in which an n- or p-type silicon non-monocrystalline semiconductor layer is formed by high-frequency plasma-assisted CVD, (15) subsequently enters the film-forming chamber 2404C in which an i-type silicon non-monocrystalline semiconductor layer is formed by high-frequency plasma-assisted CVD, (16) next enters the hydrogen plasma treating chamber 2413C, where the surface of the i-type semiconductor layer is treated with hydrogen plasma, (17) and then enters the film-forming chamber 2405C in which a p- or n-type silicon non-monocrystalline semiconductor layer is formed on the surface of the i-type layer by plasma doping. Finally, the belt substrate with these layers is taken up in the belt substrate wind-up chamber 206.

Apparatus Example 19

The FIG. 24 apparatus from which the glow discharge cleaning chamber 211 and the gas gate with which it is connected have been removed can be included as a separate apparatus example of the present invention.

In this instance, the apparatus is the same as that of Apparatus Example 18 except that the belt substrate is not cleaned by glow discharge.

Apparatus Example 20

The FIG. 24 apparatus from which the film-forming chamber(s) 2412A and/or 2412B in which i-type semiconductor layer(s) is/are formed by high-frequency plasma-assisted CVD and the gas gates with which they are connected have been removed can be included as another apparatus example of the present invention.

In this instance, the apparatus is the same as that of Apparatus Example 18 except that the i-type semiconductor layer is not formed on at least one n- or p-type semiconductor layer by high-frequency plasma-assisted CVD.

Apparatus Example 21

The FIG. 24 apparatus from which the hydrogen plasma treating chamber(s) 2413A and/or 2413B and/or 2413C and the gas gates with which they are connected have been removed can be included as yet another apparatus example of the present invention.

In this instance, the apparatus is the same as that of Apparatus Example 18 except that the surface of the i-type semiconductor layer is not treated with hydrogen plasma before at least one p- or n-type semiconductor layer is formed.

Apparatus Example 22

The FIG. 24 apparatus from which the glow discharge cleaning chamber 211, the film-forming chamber(s) 2412A and/or 2412B in which i-type semiconductor layer(s) is/are formed by high-frequency plasma-assisted CVD and the gas gates with which they are connected have been removed can be included as still another apparatus example of the present invention.

In this instance, the apparatus is the same as that of Apparatus Example 18 except that the belt substrate is not cleaned by glow discharge and the i-type semiconductor layer is not formed on at least one n- or p-type semiconductor layer by high-frequency plasma-assisted CVD.

Apparatus Example 23

The FIG. 24 apparatus from which the glow discharge cleaning chamber 211, the hydrogen plasma treating chamber(s) 2413A and/or 2413B and/or 2413C and the gas gates with which they are connected have been removed can be included as another apparatus example of the present invention.

In this instance, the apparatus is the same as that of Apparatus Example 18 except that the belt substrate is not cleaned by glow discharge and the surface of the i-type semiconductor layer is not treated with hydrogen plasma before at least one p- or n-type semiconductor layer is formed.

Apparatus Example 24

The FIG. 24 apparatus from which the film-forming chamber(s) 2412A and/or 2412B in which i-type semiconductor layer(s) is/are formed by high-frequency plasma-assisted CVD, the hydrogen plasma treating chamber(s) 2413A and/or 2413B and/or 2413C and the gas gates with which they are connected have been removed can be included as yet another apparatus example of the present invention.

In this instance, the apparatus is the same as that of Apparatus Example 18 except that the i-type semiconductor layer is not formed on at least one n- or p-type semiconductor layer by high-frequency plasma-assisted CVD and the surface of the i-type semiconductor layer is not treated with hydrogen plasma before at least one p- or n-type semiconductor layer is formed.

An example of continuous formation of the semiconductors for photovoltaic devices by the use of the apparatus of the present invention will be described below with reference to FIGS. 1, 21, and 23.

Belt substrate setting Step

To form multi-layer semiconductor films using the apparatus of the present invention, the belt substrate is first placed in the apparatus and set at a given position.

To install the belt substrate in the apparatus of the present invention, the bobbin 109 around which the belt substrate 108 has been wound in a coil is first placed in the belt substrate unwind chamber 101. The belt substrate is unwound on its leading end, and is passed through the gas gate 107 and the film-forming chambers 102 to 105, 2102A to 2105C or 2302A to 2305C until it is stretched over an empty bobbin 110 of the belt substrate wind-up chamber 106, where it is fixed at its leading end.

On the bobbin 109 around which the belt substrate has been wound before the film formation, a protective film for preventing the surface of the belt substrate from being scratched may have been rolled up together with the belt substrate 108. In the case when such a protective film is provided, the leading end of the protective film is fixed to a protective film wind-up bobbin 111 provided in the belt substrate unwind chamber 101.

Similarly, on the bobbin 110 around which the belt substrate is wound up, a protective film for preventing the surface of the belt substrate from being scratched may be rolled up together with the belt substrate 108.

In the case when such a protective film is rolled up, the protective film is unwound from a protective film unwind bobbin 112 provided in the belt substrate wind-up chamber 106, and its leading end is fixed to the empty bobbin 110 in overlap with the belt substrate 108.

After the belt substrate and the protective film have been fixed to each bobbin, the shaft of the wind-up bobbin is kept fixed and suspended, where a torque for producing tension is applied to the unwound bobbin so that the belt substrate and the protective film are stretched without looseness.

Preheating and baking step

After the belt substrate has been installed, the belt substrate is kept stretched and stationary, and the inside of the apparatus is evacuated by means of a vacuum pump such as a rotary pump or a mechanical booster pump. At this time, the inside should be substantially uniformly evacuated by means of vacuum pumps connected to the belt substrate unwind chamber 101 and the belt substrate wind-up chamber 106 so that the film-forming chambers 102 to 105, 2102A to 2105C or 2302A to 2305C can be evacuated through the gas gates 107 and any adsorbed gases can be prevented from flowing from the belt substrate unwind chamber 101 and the belt substrate wind-up chamber 106 into the film-forming chambers 102 to 105, 2102A to 2105C, or 2302A to 2305C, and flowing from the impurity-doped layer film-forming chambers 102 to 105, or 2302A to 2305C, into the i-type semiconductor layer film-forming chamber 103 and 104, 2103A, 2104A, 2104C and 2103C, or 2303A, 2304A, and 2304C.

After each film-forming chamber has been evacuated to about 10 Pa, the insides of the film-forming chambers are further evacuated to 1 Pa or lower by means of a vacuum pump connected to each film-forming chamber.

After each film-forming chamber has reached an internal pressure of 1 Pa or less, evacuation of the film-forming chambers 102 to 105 or 2302A to 2305C is stopped, and a gas such as $H_2$, He, Ar, Ne, Kr, or Xe is fed into the film-forming chamber 103 and/or the film-forming chamber 104, or 2304A, 2303B, 2304B and 2304C, to establish a flow of gas from the film-forming chambers to the belt substrate unwind chamber 101 and belt substrate wind-up chamber 106, and the insides of the chambers 101 to 106 are made to have a pressure of about several Pa.

After the pressure in each film-forming chamber has become stable, the film-forming chambers are heated by means of a radiant heater, a substrate temperature control assembly, a film-forming temperature control assembly, and a block heater to preheat and bake the inner wall of each film-forming chamber and the belt substrate at 100° to 500° C.

Semiconductor Layer Forming Step

After the film-forming chambers have been preheated and baked, the shaft of the wind-up bobbin of the belt substrate wind-up chamber 106 is rotated to continuously transport the belt substrate 108 at a given speed from the belt substrate unwind chamber 101 to the belt substrate wind-up chamber 106 through the film-forming chambers 102, 103, 104 and 105, or 2102A, 2103A, 2104A, 2105A, 2102B, 2103B, 2104B, 2105B, 2102C, 2103C, 2104C and 2105C, or 2302A, 2303A, 2304A, 2305A, 2302B, 2303B, 2304B, 2305B, 2302C, 2304C and 2305C.

The belt substrate is preferably transported at a speed of from 1 to 100 mm/sec, and more preferably from 5 to 50 mm/sec.

While the belt substrate is transported, the temperature of the belt substrate in the film forming space in each film-forming chamber and the temperature of the wall surface of each film-forming chamber are controlled at a given temperature using a radiant heater, a substrate temperature control assembly, a film-forming temperature control assembly, and a block heater.

After the temperature of the belt substrate has become stable, gas such as $H_2$, He, Ar, Ne, Kr, or Xe is stopped from being fed into the film-forming chambers, and the film-forming chambers 102 to 105, 2102A to 2105C or 2302A to 2305C are evacuated by means of vacuum pumps connected to the respective film-forming chambers. Then, a gas such as $H_2$, He, Ar, Ne, Kr, or Xe for separating the starting material gases is fed from a gas cylinder into each gas gate 107 via a mass flow controller.

After the flow rate of gas has become stable, the evacuation of the film-forming chamber 103, or chambers 2103A to 2103C or 2303A and 2303B, carried out by means of the low-vacuum pump such as a rotary pump or a mechanical booster pump, is changed to that carried out by means of a high vacuum pump such as a turbo-molecular pump or an oil diffusion pump.

Next, starting material gases for forming semiconductor layers are fed into the film-forming chambers 102 to 105, 2102A to 2105C or 2302A to 2305C from gas cylinders via mass flow controllers.

After the staring material gas flow rate in each film-forming chamber has become stable, the evacuation rate of each film-forming chamber is controlled by means of an exhaust rate control valve provided on an exhaust tube to set the film-forming chambers to a given pressure.

As a preferable internal pressure of the chambers into which the staring material gases are fed, the microwave plasma-assisted CVD film-forming chamber 103 or chambers 2303A and 2303B may have an internal pressure of from 0.1 to 10 Pa, and the other chambers, from 10 to 1,000 Pa. In order to prevent impurity gases from being included, the internal pressure of the i-type semiconductor layer film-forming chambers 104, 2104A and 2304A to 2304C should be set a little higher than the internal pressure of the p-type semiconductor layer film-forming chambers 105, 2105A, 2105B and 2305A to 2305C, the internal pressure of the n-type semiconductor layer film-forming chambers 102, 2101A and 2302A a little higher than the internal pressure of the belt substrate unwind chamber 101; and the internal pressure of the p-type semiconductor layer film-forming chambers 105, 2105C and 2305C a little higher than the internal pressure of the belt substrate wind-up chamber 106.

After the pressure in each film-forming chamber has become stable, discharge power such as microwave power, high-frequency power, low-frequency power, or DC power is correspondingly applied to the film-forming chambers 102 to 105, 2102A to 2105C or 2302A to 2305C. Upon application of the discharge power, the starting material gases in each film-forming chamber are ionized to form plasma.

In this way, the plasma is simultaneously formed in the film-forming chambers 102 to 105, 2102A to 2105C or 2302A to 2305C while the belt substrate is transported at a given speed, so that semiconductor layers are formed in the respective film-forming chambers on the continuously moving belt substrate, and the multi-layer semiconductor deposited films of nip or pin structure or nipnipnip of pinpinpin structure are continuously formed.

In this film formation, the semiconductor layers formed in the film-forming chambers 102 to 105, 2102A to 2105C or 2302A to 2305C are formed under the conditions as shown below.

Film-forming conditions in film-forming chambers 102, 2102A–C and 2302A–C

In the film-forming chambers 102, 2102A to 2102C and 2302A to 2302C, n- or p-type silicon non-monocrystalline semiconductor layers are formed by high-frequency plasma-assisted CVD.

The starting material gases fed into these film-forming chambers contain a gasifiable compound containing at least Si atoms. Gasifiable compounds containing at least Si atoms include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$ and $Si_2D_3H_3$. For the purpose of narrowing the optical band gas, the starting material gases may also contain a gasifiable compound containing Ge atoms.

Gasifiable compounds containing Ge atoms specifically include $GeH_4$, $GeD_4$, $GeF_4$, $GeFH_3$, $GeF_2H_2$, $GeF_3H$, $GeHD_3$, $GeH_2D_2$ and $GeH_3D$. For the purpose of narrowing the optical band gaps, the starting material gas may further contain a gasifiable compound containing atoms such as C, O, and N.

Gasifiable compounds containing C atoms specifically include $CH_4$, $CH_4$, $C_nH_{2n+2}$ (n is an integer), $C_nH_{2n}$ (n is an integer), $C_2H_2$, $C_6H_6$, $CO_2$, and CO.

Gasifiable compounds containing O atoms include $O_2$, CO, $CO_2$, NO, $NO_2$, $N_2O$, $CH_3CH_2OH$, and $CH_3OH$.

Gasifiable compounds containing N atoms include $N_2$, $NH_3$, $ND_3$, NO, $NO_2$, and $N_2O$.

For valence electron control of n- or p-conductivity type of the non-monocrystalline semiconductor layers thus formed, the starting material gases may also contain a gasifiable compound containing atoms of Group V or Group III of the periodic table.

Compounds which can be effectively used as the starting material for introducing Group V atoms specifically include, as a material for introducing P atoms, phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$, and $PI_3$. Other usable materials include $AsH_3$, $AsF_3$, $AsCl_3$, $AsBr_3$, $AsF_5$, $SbF_3$, $SbF_5$, $SbCl_3$, $SbCl_5$, $BiH_3$, $BiCl_3$, $BiBr_3$. In particular, $PH_3$, $PF_3$, and $AsH_3$ are suitable.

Compounds which can be used as the starting material for introducing Group III atoms specifically include, as a material for introducing B atoms, boron hydrides such as $B_2H_6$, $B_4H_{10}$, $B_5H_9$, $B_5H_{11}$, $B_6H_{12}$, and $B_6H_{14}$, and boron halides such as $BF_3$ and $BCl_3$. Other usable materials include $AlCl_3$, $GaCl_3$, and $InCl_3$. In particular, $B_2H_6$ and $BF_3$ are suitable.

The starting material gases may also contain a diluting gas such as $H_2$, $D_2$, He, Ne, Ar, Xe, or Kr.

The discharge power applied to these film-forming chambers is for the purpose of forming a high-frequency plasma, and thus at least includes high-frequency power. The applied higher-frequency power may be appropriately determined according to the flow rate of the starting material gases fed into the film-forming chambers. It may preferably be in the range of from 0.001 to 1 $W/cm^3$ based on the volume of the plasma-forming space, and should be composed of stable continuous oscillatory waves with few variations such as ripples. The frequency of the high-frequency power is preferably in the range of from 1 MHz to 500 MHz, and industrial frequency of 13.56 MHz is suitably used. A frequency with few variations is preferable.

DC power may also be applied together with the high-frequency power. A voltage of from 10 to 200 V is preferably applied to a high-frequency discharge electrode or an electrode provided separately from the discharge electrode, with a polarity such that the electrode side is positive and in the range where no abnormal discharge such as sparks may occur.

Such high-frequency power is applied to the film-forming chambers and preferably the DC current is applied at the same time, whereby the starting material gases are ionized and decomposed in the film-forming chambers to form n- or p-type silicon non-monocrystalline semiconductor layers on the belt substrate.

The semiconductor layers formed under such film-forming conditions are formed of a silicon material including amorphous (including what is called microcrystalline) to polycrystalline, non-monocrystalline materials.

Film-forming conditions in film-forming chambers 103, 2103A–C and 2303A–B

In the film-forming chambers 103, 2103A to 2103C and 2303A and 2303B, i-type silicon non-monocrystalline semiconductor layers are formed by microwave plasma-assisted CVD.

The starting material gases fed into these film-forming chambers contain a gasifiable compound containing at least Si atoms. Gasifiable compounds containing at least Si atoms include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, and $Si_2D_3H_3$. For the purpose of narrowing the optical band gas, the starting material gases may also contain a gasifiable compound containing Ge atoms.

Gasifiable compounds containing Ge atoms specifically include $GeH_4$, $GeD_4$, $GeF_4$, $GeFH_3$, $GeF_2H_2$, $GeF_3H$, $GeHD_3$, $GeH_2D_2$, and $GeH_3D$. For the purpose of narrowing the optical band gaps, the starting material gases may further contain a gasifiable compound containing atoms such as C, O, and N.

Gasifiable compounds containing C atoms specifically include $CH_4$, $CD_4$, $C_nH_{2n+2}$ (n is an integer), $C_nH_{2n}$ (n is an integer), $C_2H_2$, $C_4H_4$, $CO_2$, and CO.

Gasifiable compounds containing O atoms include $O_2$, CO, $CO_2$, NO, $NO_2$, $N_2O$, $CH_3CH_2OH$, and $CH_3OH$.

Gasifiable compounds contain N atoms include $N_2$, $NH_3$, $ND_3$, NO, $NO_2$, and $N_2O$.

The semiconductor layers formed in these film-forming chambers may contain a small quantity of impurities for valence electron control, and the starting material gases may also contain a gasifiable compound containing atoms of Group V or Group III of the periodic table.

Compounds which can be effectively use as the starting material for introducing Group V atoms specifically include, as a material for introducing P atoms, phosphorus hydrides such $PH_3$ and $P_2H_4$ and phosphorus halides such as $PH_4I$, $PF_3$, $PF_5$, $PCl_3$, $PCl_5$, $PBr_3$, $PBr_5$, and $PI_3$. In addition, usable materials include $AsH_3$, $AsF_3$, $AsCl_3$, $AsBr_3$, $AsF_5$, $SbF_3$, $SbF_5$, $SbCl_3$, $SbCl_5$, $BiH_3$, $BiCl_3$, and $BiBr_3$. In particular, $PH_3$, $PF_3$, and $AsH_3$ are suitable.

Compounds which can be used as the starting material for introducing Group III atoms specifically include, as a material for introducing B atoms, boron hydrides such as $B_2H_6$, $B_4H_{10}$, $B_5H_9$, $B_5H_{11}$, $B_6H_{12}$, and $B_6H_{14}$, and boron halides such as $BF_3$ and $BCl_3$. In addition, usable materials also include $AlCl_3$, $GaCl_3$, and $InCl_3$. In particular, $B_2H_6$ and $BF_3$ are suitable.

The starting material gases may also contain a diluting gas such as $H_2$, $D_2$, He, Ne, Ar, Xe, or Kr.

The discharge power applied to these film-forming chambers is for the purpose of ionizing the starting material gases to form a microwave plasma, and thus at least includes microwave power. The microwave power applied may be appropriately determined according to the flow rate of the starting material gases fed into the film-forming chambers. It is preferably in the range of from 0.01 to 1 $W/cm^3$ based on the volume of plasma-forming space, and should be composed of stable continuous oscillatory waves with few variations such as ripples. The frequency of the microwave power is preferably in the range of from 500 MHz to 10 GHz, and industrial frequency of 2.45 GHz is suitably used. A frequency with few variations is preferable.

High-frequency power or DC power may also be applied together with the microwave power to the film-forming chambers 103 and 2303A and 2303B in which i-type layers are formed by microwave plasma-assisted CVD, using a bias electrode provided in the microwave plasma forming space.

When high-frequency power is applied, it may preferably be in the range of from 0.02 to 2 W/cm$^3$. The frequency is preferably in the range of from 1 MHz to 500 MHz, and industrial frequency of 13.56 MHz is suitably used. In the case when DC power is applied, a voltage of from 10 to 300 V is preferably applied with polarity such that the electrode side is positive and in the range where no abnormal discharge such as sparks may occur.

Such microwave power is applied to the film-forming chambers and preferably the high-frequency or DC current is applied at the same time, whereby the starting material gases are ionized and decomposed in the film-forming chambers to form i-type silicon non-monocrystalline semiconductor layers on the belt substrate.

The semiconductor layers formed under such film-forming conditions are formed of a silicon material including amorphous (including what is called microcrystalline) to polycrystalline, non-monocrystalline materials.

Film-forming conditions in film-forming chambers 104, 2104A–C and 2304A–C

In the film-forming chambers 104, 2104A to 2104C and 2304A to 2304C, i-type silicon non-monocrystalline semiconductor layers are formed by high-frequency plasma-assisted CVD.

The starting material gases fed into these film-forming chambers contain a gasifiable compound containing at least Si atoms. Gasifiable compounds containing at least Si atoms include $SiH_4$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, and $Si_2D_3H_3$. For the purpose of narrowing the optical band gaps, the starting material gases may also contain a gasifiable compound containing Ge atoms.

Gasifiable compounds containing Ge atoms specifically include $GeH_4$, $GeD_4$, $GeF_4$, $GeFH_3$, $GeF_2H_2$, $GeF_3H$, $GeHD_3$, $GeH_2D_2$, and $GeH_3D$. For the purpose of narrowing the optical band gaps, the starting material gases may further contain a gasifiable compound containing atoms such as C, O, and N.

Gasifiable compounds containing C atoms specifically include $CH_4$, $CD_4$, $C_nH_{2n+2}$ (n is an integer), $C_nH_{2n}$ (n is an integer), $C_2H_2$, $C_4H_4$, $CO_2$, and CO.

Gasifiable compounds containing O atoms include $O_2$, CO, $CO_2$, NO, $NO_2$, $N_2O$, $CH_3CH_2OH$, and $CH_3OH$.

Gasifiable compounds containing N atoms include $N_2$, $NH_3$, $ND_3$, NO, $NO_2$, and $N_2O$.

The semiconductor layers formed in these film-forming chambers may contain a small quantity of impurities for valence electron control, and the starting material gases may also contain a gasifiable compound containing atoms of Group V or Group III of the periodic table.

Compounds which can be effectively used as the starting material for introducing Group V atoms specifically include, as a material for introducing P atoms, phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$, and $PI_3$. In addition, usable materials also include $ASH_3$, $AsF_3$, $AsCl_3$, $AsBr_3$, $AsF_5$, $SbF_3$, $SbF_5$, $SbCl_3$, $SbCl_5$, $BiH_3$, $BiCl_3$, and $BiBr_3$. In particular, $PH_3$, $PF_3$ and $AsH_3$ are suitable.

Compounds which can be used as the starting material for introducing Group III atoms specifically include, as a material for introducing B atoms, boron hydrides such as $B_2H_6$, $B_4H_{10}$, $B_5H_9$, $B_5H_{11}$, $B_6H_{12}$, and $B_6H_{14}$, and boron halides such as $BF_3$ and $BCl_3$. In addition, usable materials also include $AlCl_3$, $GaCl_3$, and $InCl_3$. In particular, $B_2H_6$ and $BF_3$ are suitable.

The starting material gases may also contain a diluting gas such as $H_2$, $D_2$, He, Ne, Ar, Xe, or Kr.

The discharge power applied to these film-forming chambers is for the purpose of ionizing the starting material gases to form a high-frequency plasma, and thus at least includes high-frequency power. The high-frequency power applied may be appropriately determined according to the flow rate of the starting material gases fed into the film-forming chambers. It is preferably in the range of from 0.01 to 1 W/cm$^3$ based on the volume of plasma-forming space, and should be composed of stable continuous oscillatory waves with few variations such as ripples. The frequency of the high-frequency power is preferably in the range of from 1 MHz to 500 MHz, and industrial frequency of 13.56 MHz is suitably used. A frequency with few variations is preferable. DC power may also be applied together with the high-frequency power. A voltage of from 10 to 200 V may preferably be applied to a high-frequency discharge electrode or an electrode provided separately from the discharge electrode, with a polarity such that the electrode side is positive and in the range where no abnormal discharge such as sparks may occur.

Such high-frequency power is applied to the film-forming chambers and preferably the DC current is applied at the same time, whereby the starting material gases are ionized and decomposed in the film-forming chambers to form i-type silicon non-monocrystalline semiconductor layers on the belt substrate.

The semiconductor layers formed under such film-forming conditions are formed of a silicon material including amorphous (including what is called microcrystalline) to polycrystalline, non-monocrystalline materials.

Film-forming conditions in film-forming chambers 105, 2105A–C and 2305A–C

In the film-forming chambers 105, 2105A to 2105C and 2305A to 2305C, p- or n-type silicon non-monocrystalline semiconductor layers are formed by plasma doping.

The starting material gases fed into these film-forming chambers contain a gasifiable compound containing atoms of Group III or Group V of the periodic table, in order to make the i-type semiconductor layers have a p- or n-type conductivity in the vicinity of their surfaces by plasma doping.

Compounds which can be used as the starting material for introducing Group III atoms specifically include, as a material for introducing B atoms, boron hydrides such as $B_2H_6$, $B_4H_{10}$, $B_5H_9$, $B_5H_{11}$, $B_6H_{12}$, and $B_6H_{14}$, and boron halides such as $BF_3$ and $BCl_3$. In addition usable materials also include $AlCl_3$, $GaCl_3$, and $InCl_3$. In particular, $B_2H_6$ and $BF_3$ are suitable.

Compounds which can be effectively used as the starting material for introducing Group V atoms specifically include, as a material for introducing P atoms, phosphorus hydrides such as $PH_3$ and $P_2H_4$ and phosphorus halides such as $PH_4I$, $PF_3$, $PF_5$, $PCl_3$, $PCl_5$, $PBr_3$, $PBr_5$, and $PI_3$. In addition, usable materials also include $AsH_3$, $AsF_3$, $AsCl_3$, $AsBr_3$, $AsF_5$, $SbF_3$, $SbF_5$, $SbCl_3$, $SbCl_5$, $BiH_3$, $BiCl_3$, and $BiBr_3$. In particular, $PH_3$, $PF_3$, and $AsH_3$ are suitable.

The starting material gases may also contain a diluting gas such as $H_2$, $D_2$, He, Ne, Ar, Xe, or Kr.

In order to form impurity-doped layers in a desired thickness by plasma doping, the starting material gases may further contain a sufficiently small amount of a gas containing Si atoms and a gas containing atoms such as C, O, or N.

Such gases containing Si atoms include $SiH_3$, $Si_2H_6$, $SiF_4$, $SiFH_3$, $SiF_2H_2$, $SiF_3H$, $Si_3H_8$, $SiD_4$, $SiHD_3$, $SiH_2D_2$, $SiH_3D$, and $Si_2D_3H_3$. Gases containing C atoms include $CH_4$, $CD_4$, $C_nH_{2n+2}$ (n is an integer), $C_nH_{2n}$ (n is an integer), $C_2H_2$, $C_4H_4$, $CO_2$, and CO. Gases containing O atoms include $O_2$, CO, $CO_2$, NO, $NO_2$, $N_2O$, $CH_3CH_2OH$, and $CH_3OH$. Gases containing N atoms include $N_2$, $NH_3$, $ND_3$, NO, $NO_2$, and $N_2O$.

The discharge power applied to these film-forming chambers includes low-frequency power, high-frequency, and microwave power, and is for the purpose of ionizing the starting material gases to form a glow discharge plasma. It may preferably to be a low-frequency power of from 5 kHz to 500 kHz.

The power is preferably applied in the range of from 0.01 to 1 $W/cm^3$ based on the volume of plasma-forming space, and should be composed of stable continuous oscillatory waves with few variations such as ripples. DC power may also be applied together with the discharge power. A voltage of from 10 to 200 V may preferably be applied to a discharge electrode or an electrode provided separately from the discharge electrode, with a polarity such that the electrode side is positive and in the range where no abnormal discharge such as sparks may occur.

Such discharge power is applied to the film-forming chambers and preferably the DC current is applied at the same time, whereby the starting material gases are ionized and decomposed in the film-forming chambers to form p- or n-type silicon non-monocrystalline semiconductor layers on the belt substrate.

The semiconductor layers formed under such film-forming conditions are formed of a silicon material including amorphous (including what is called microcrystalline) to polycrystalline, non-monocrystalline materials.

While continuously transporting the belt substrate, the semiconductor layers are formed in the respective film-forming chambers 102 to 105, 2102A to 2105C or 2302A to 2305C for a given time in the manner as described above, to thereby product a belt substrate on the surface of which the multi-layer semiconductor multi-layer films have been formed, which is then continuously wound around the wind-up bobbin 110 provided in the wind-up chamber 106.

Belt Substrate Takeout Step

After the belt substrate on the surface of which the multi-layer semiconductor films have been formed has been produced in a given length and wound around the bobbin in the wind-up chamber, the discharge power applied to the respective film-forming chambers 102 to 105, 2102A to 2105C or 2302A to 2305C, the feeding of the starting material gases and the transfer and heating of the belt substrate are stopped, and the feeding of the gas into the respective gas gates is also stopped. All the chambers 101 to 106 are evacuated by means of the vacuum pumps respectively connected to the chambers, and the evacuation of the film-forming chamber(s) 103, 2103A to 2103C or 2303A and 2303B, carried out by means of the high-vacuum pump, is changed to that carried out by means of the low-vacuum pump. Next, the insides of the film-forming chambers 102 to 105, 2012A to 2105C or 2302A to 2305C and the starting material gas feeding systems through which the starting material gases had been fed into these chambers are thoroughly purged using an inert gas such as He or Ar.

After the purging of the film-forming chambers and the starting material gas feeding systems through which the starting material gases had been fed into these chambers has been completed, the evacuation of the chambers 101 to 106 is stopped, and the chambers 101 to 106 are filled with an inert gas such as He or Ar under a pressure a little lower than the atmospheric pressure, to cool the insides of the respective chambers and the belt substrate with the multi-layer semiconductor films formed thereon.

After the film-forming chambers and the belt substrate have been cooled nearly to room temperature, dry $N_2$, Ar, or He gas is fed into the apparatus to bring the apparatus under atmospheric pressure, the drive power and torque applied to each bobbin are removed, the belt substrate is cut off inside the wind-up chamber 106 except for its portion remaining in the belt substrate unwind chamber 101 and extending therefrom up to the wind-up chamber 106, and then the bobbin 110 around which the belt substrate with the semiconductor layers is formed is removed from the belt substrate wind-up chamber 106.

In the apparatus of the present invention, the insides of the belt substrate unwind chamber 101 and belt substrate wind-up chamber 106 are inevitably exposed to the air when the belt substrate is placed in the apparatus or removed from the apparatus. Accordingly, there is a possibility that, once the air flows into a series of film-forming chambers 102 to 105, 2102A to 2105C or 2302A to 2305C, water vapor or an impurity gas such as oxygen adsorbs on the inner walls of the film-forming chambers to affect the characteristics of the semiconductor layers. Hence, air flow-in preventing means may be provided between the belt substrate unwind chamber 101 and the film-forming chamber 102, 2102A or 2302A and between the belt substrate wind-up chamber 106 and the film-forming chamber 105, 2105C or 2305C so that the apparatus has a load lock construction. In this instance, the air flow-in preventing means may include vacuum-sealing means for keeping the insides of the film-forming chambers 102 to 105, 2102A to 2105C or 2302A to 2305C under reduced pressure, and air flow-in preventing means in which an inert gas such as He or gas such as high-impurity nitrogen having no influence on the film formation is introduced into the film-forming chambers 102 to 105, 2102A to 2105C or 2302A to 2305C to apply a pressure higher than the atmospheric pressure to thereby form a flow of clean gas to the unwind chamber 101 or wind-up chamber 106 so that the air can be prevented from flowing into the chambers.

Since, however, when the apparatus is provided with a sealed construction it is very difficult to stretch the belt substrate through the insides of the film-forming chambers 102 to 105, 2102A to 2105C or 2302A to 2305C while keeping the film-forming chambers 102 to 105, 2102A to 2105C or 2302A to 2305C in vacuum, the sealed construction should preferably be a mechanically sealed construction in which o-rings, gaskets, helicoflexes, magnetic fluids or the like are used so that the vacuum can be maintained when the belt substrate 108 is inserted and stretched through the film-forming chambers 102 to 105, 2102A to 2105C or 2302A to 2305C.

The air flow-in preventing means may also be provided in the film-forming chamber 103 or chambers 2103A to 2103C or 2303A and 2303B in which i-type semiconductor layers are formed by microwave plasma-assisted CVD. Since films are formed at a higher rate in the film-forming chamber in which i-type semiconductor layers are formed by microwave plasma-assisted CVD, semiconductor layers may adhere to its inside walls in a larger quantity than in other film-forming chambers. If the formation of semiconductor layers is continued while such layers have adhered in a large quantity, the microwave transmittance of a microwave guide window may decrease to cause a decrease in the power applied into the chamber, or film fragments separated from the inside walls may adhere to the semiconductor layers to cause defects. Hence, the inside(s) of the film-forming chamber 103 or chambers 2103A to 2103C or 2303A and 2303B must be cleaned periodically. In order to also prevent the air flowing into other film-forming chambers on that occasion to affect them, it is effective to provide the air flow-in preventing means described above, and the air flow-in preventing means should be also provided between the film-forming chamber 103 or chambers 2303A and 2303B and other film-forming chambers.

Through a series of steps as described above, the apparatus of the present invention can continuously form semiconductor multi-layer deposited films on the belt substrate.

EXAMPLES

The present invention will be described below by means of specific examples in which the apparatus for continuously forming semiconductor multi-layer deposited films is used.

Example 1

Using the apparatus for continuously forming semiconductor multi-layer deposited films of the present invention as shown in Apparatus Example 1, multi-layer silicon non-monocrystalline semiconductor films of nip structure for use in photovoltaic elements having i-type semiconductor layers formed of amorphous silicon were continuously fabricated.

First, a belt substrate having a finely irregular surface, comprised of a beltlike stainless steel sheet (12 cm wide× 200 m long×0.15 mm thick) made of SUS430BA on the surface of which an Ag layer of 500 nm thick and a transparent conductive ZnO layer of about 2 µm thick had been deposited by sputtering, was placed in the belt substrate unwind chamber 101 wound around the bobbin 109. The belt substrate was passed through the respective gas gates 107 and film-forming chambers 102 to 105 until it was stretched to the belt substrate wind-up chamber 106, and a tension was applied thereto to the extent that it was not loose.

In the belt substrate wind-up chamber 106, a bobbin 112 around which a protective film made of well dried aramid paper (trade name: NOMEX, available from Du Pont Co.: 12 cm wide×200 m long×0.05 mm thick) had been wound was installed so that the protective film was rolled up together with the belt substrate.

After the belt substrate was installed, the insides of the chambers 101 to 106 were evacuated by means of pumps (not shown) comprised of a combination of a rotary pump and a mechanical pump. Subsequently, He gas was fed, and the insides of the film-forming chambers were heated at about 350° C in an about 200 Pa atmosphere of He to perform baking.

After the baking was completed, the chambers 101 to 106 were evacuated. The chamber 101, film-forming chambers 102, 104 and 105, and chamber 106 were evacuated by means of pumps comprised of a combination of a rotary pump and a mechanical pump and the film-forming chamber 103 was evacuated by means of two oil diffusion pumps (HS-16, available from Varian Co.), $H_2$ was fed as a gate gas into the respective gas gates 107 at 500 sccm each, and the respective starting material gases were flowed into the film-forming chambers 102 to 105 at given flow rates. Then, the divergence of throttle valves provided to the chambers 101 to 106 was controlled so that the belt substrate unwind chamber 101 and wind-up chamber 106 were each set at an internal pressure of 125 Pa and the film-forming chambers 102, 103, 104, and 105 were set at internal pressures of 130 Pa, about 1 Pa, 135 Pa, and 130 Pa, respectively.

When the pressure in each chamber became stable, the wind-up bobbin in the belt substrate wind-up chamber 106 was rotated to continuously transport the belt substrate 108 at a constant speed of 100 cm/min in the direction from the film-forming chamber 102 toward the film-forming chamber 105. Temperature control systems (not shown) provided in the film-forming chambers 102 to 105 were also operated to control temperatures so that the transported belt substrate had a given temperature in the film-forming space in each film-forming chamber.

When the temperature of the belt substrate had become stable, high-frequency power of 13.56 MHz was applied to the film-forming chambers 102 and 104 through parallel flat-plate electrodes; microwave power of 2.45 GHz was applied to the three film-forming sub-chambers provide inside the film-forming chamber 103, through microwave guide windows provided in the side walls of the respective film-forming chambers; and low-frequency power of 75 kHz was applied to the film-forming chamber 105 through parallel flat-plate electrodes; all from corresponding power sources via matching boxes.

High-frequency power of 13.56 MHz was further applied through rod electrodes provided in front of the microwave guide window and in parallel to the belt substrate, from a power source (not shown) via a matching box to the three film-forming chambers provided inside the film-forming chamber 103.

Upon application of the discharge power, the starting material gases in the film-forming chambers 102 to 105 were changed into plasma, and semiconductor layers were formed on the surface of the belt substrate continuously transported through the respective film-forming chambers, so that semiconductor layers of nip structure were continuously formed on the surface of the belt substrate.

Conditions for forming the semiconductor layers in the film-forming chambers are shown in Table 1.

The belt substrate was moved for 180 minutes after the start of its transport, during which time the semiconductor layers were continuously formed for 170 minutes.

After the semiconductor layers were formed in a substrate length of about 170 m, the application of discharge power, the feeding of starting material gases, and the heating of the belt substrate and film-forming chambers were stopped, and the insides of the film-forming chambers were purged. After the belt substrate and the insides of the film-forming chambers were well cooled, the apparatus was opened to remove the belt substrate (with semiconductor layers) wound around the bobbin 110, from the belt substrate wind-up chamber 106.

The belt substrate thus removed was further continuously processed using a continuous modularized apparatus, where a 70 nm thick ITO ($In_2O_3+SnO_2$) thin film was formed as a transparent electrode over the entire surface of the multi-layer semiconductor film formed using the apparatus of the present invention, thin-line Al electrodes were formed thereon as collector electrodes at given intervals, and then the unit cells were formed into modules, e.g., in series. Thus, 35 cm×35 cm solar cell modules were continuously produced.

Figure 9:
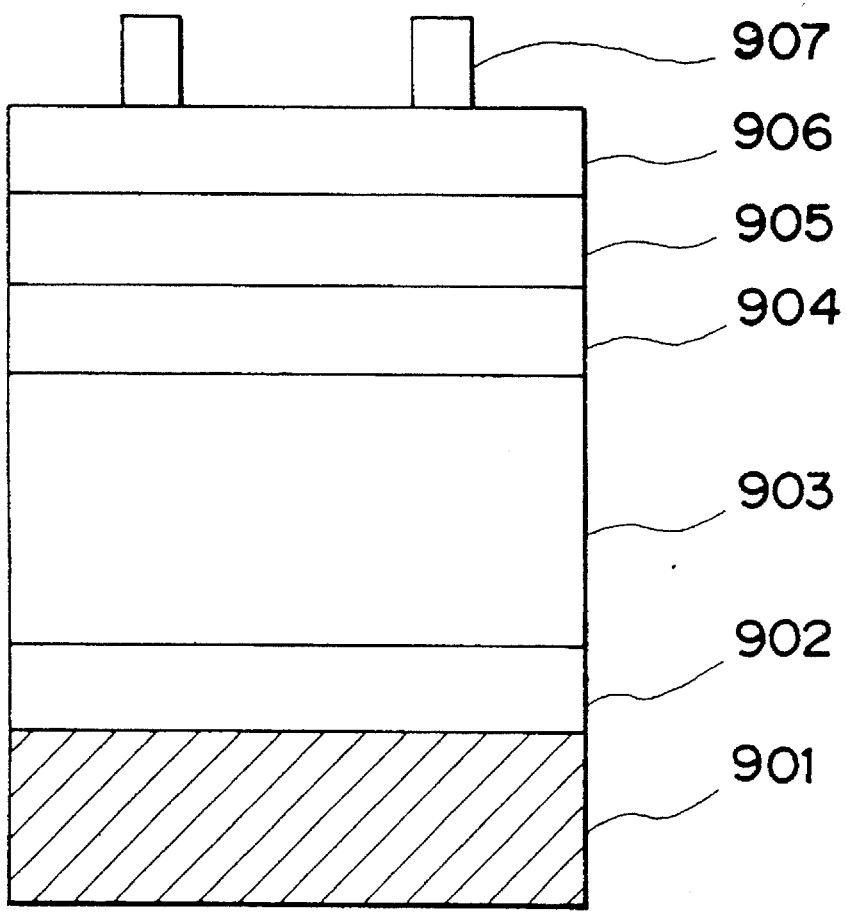
FIG. 9 is a diagrammatic cross section view of an example of the photovoltaic element of the present invention.

The layer configuration of the solar cells thus produced is diagrammatically shown in FIG. 9.

The characteristics of the solar cell modules thus produced were evaluated under exposure to artificial sunlight of AM 1.5 (100 mW/cm$^2$). As a result, they showed an average photoelectric conversion efficiency as high as 1.15 relative to an average value of 1.00 of the photoelectric conversion efficiency of solar cell modules produced using an apparatus of roll-to-roll type in which the i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such an apparatus, decreased to ±2% or less when produced in the apparatus of Example 1.

Comparative Example 1-1

Using a apparatus wherein the film-forming chamber 104 in which i-type semiconductor layers are formed by high-frequency plasma-assisted CVD was removed from the apparatus of the present invention shown in Apparatus Example 1 and the p-type semiconductor layer film-forming chamber was replaced with a high-frequency plasma-assisted CVD film-forming chamber, multi-layer silicon non-monocrystalline semiconductor films of nip structure for use in photovoltaic elements were continuously formed to produce solar cell modules in the same manner as in Example 1 except that the i-type semiconductor layers formed by high-frequency plasma-assisted CVD were not formed and the p-type semiconductor layers were formed by high-frequency plasma-assisted CVD.

Conditions for forming the semiconductor layers in the film-forming chambers are shown in Table 2.

The film-forming conditions for the p-type semiconductor layers were made different from the film-forming conditions in the n-type semiconductor layer film-forming chamber, for the purpose of forming semiconductor layers in what is called a microcrystalline state in order to improve conductivity and short-wavelength light transmittance.

Characteristics of the solar cell modules thus produced were evaluated under exposure to artificial sunlight of AM 1.5 (100 mW/cm$^2$). As a result, they showed an average photoelectric conversion efficiency of as low as 1.00 relative to an average value of 1.15 of the photoelectric conversion efficiency of the solar cell modules produced in Example 1. Non-uniformity of photoelectric conversion efficiency between modules was also as large as ±5%.

Comparative Example 1-2

Using an apparatus wherein the p-type semiconductor layer film-forming chamber of the apparatus of the present invention shown in Apparatus Example 1 was replaced with a high-frequency plasma-assisted CVD film-forming chamber, multi-layer silicon non-monocrystalline semiconductor films of nip structure for use in photovoltaic elements were continuously formed to produce solar cell modules in the same manner as in Example 1 except that the p-type semiconductor layers were formed by high-frequency plasma-assisted CVD.

Conditions for forming the semiconductor layers in the film-forming chambers are shown in Table 3.

Characteristics of the solar cell modules thus produced were evaluated under exposure to artificial sunlight of AM 1.5 (100 mW/cm$^2$). As a result, they showed an average photoelectric conversion efficiency of as low as 1.03 relative to an average value of 1.15 of the photoelectric conversion efficiency of the solar cell modules produced in Example 1. Non-uniformity of photoelectric conversion efficiency between modules was also as large as ±5%.

Example 2

Using the apparatus for continuously forming multi-layer semiconductor films of the present invention as shown in Apparatus Example 1, multi-layer silicon non-monocrystalline semiconductor films of nip structure for use in photovoltaic elements were continuously formed to produce solar cell modules in the same manner as in Example 1 except that the i-type semiconductor layers were each formed in three chambers in which the Ge-containing starting material gases were in concentrations different from one another so that the Ge content in the continuously formed i-type semiconductor layers was changed to become large-small-large in the layer thickness direction.

The length of the three i-type semiconductor layer film-forming chambers in the semiconductor layer forming region in the direction of belt substrate movement was adjusted using a barrier plate of a given length (serving also as a plasma leak guard) provided between the belt substrate surface and the plasma in each chamber.

Conditions for forming the semiconductor layers in the film-forming chambers are shown in Table 4, and the layer configuration of the produced solar cells is diagrammatically shown in FIG. 9.

Characteristics of the solar cell modules thus produced were evaluated under exposure to artificial sunlight of AM 1.5 (100 mW/cm$^2$). As a result, they showed an average photoelectric conversion efficiency as high as 1.20 relative to an average value of 1.00 of the photoelectric conversion efficiency of solar cell modules produced using an apparatus of roll-to-roll type in which the i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such an apparatus, decreased to ±2% or less in the apparatus of Example 2.

Comparative Example 2-1

Using an apparatus wherein the film-forming chamber 104 in which i-type semiconductor layers are formed by high-frequency plasma-assisted CVD was removed from the apparatus of the present invention shown in Apparatus Example 1 and the p-type semiconductor layer film-forming chamber was replaced with a high-frequency plasma-assisted CVD film-forming chamber, multi-layer silicon non-monocrystalline semiconductor films of nip structure for use in photovoltaic elements were continuously formed to produce solar cell modules in the same manner as in Example 2 except that the i-type semiconductor layers formed by high-frequency plasma-assisted CVD were not formed and the p-type semiconductor layers were formed by high-frequency plasma-assisted CVD.

Conditions for forming the semiconductor layers in the film-forming chambers are shown in Table 5.

Characteristics of the solar cell modules thus produced were evaluated under exposure to artificial sunlight of AM 1.5 (100 mW/cm$^2$). As a result, they showed an average photoelectric conversion efficiency of as low as 1.00 relative to an average value of 1.20 of the photoelectric conversion efficiency of the solar cell modules produced in Example 2. Non-uniformity of photoelectric conversion efficiency between modules was also as large as ±5%.

Comparative Example 2-2

Using an apparatus wherein the p-type semiconductor layer film-forming chamber of the apparatus for continuously forming multi-layer semiconductor films of the present invention shown in Apparatus Example 1 was replaced with a high-frequency plasma-assisted CVD film-forming chamber, multi-layer silicon non-monocrystalline semiconductor films of nip structure for use in photovoltaic elements were continuously formed to produce solar cell modules in the same manner as in Example 2 except that the p-type semiconductor layers were formed by high-frequency plasma-assisted CVD.

Conditions for forming the semiconductor layers in the film-forming chambers are shown in Table 6.

Characteristics of the solar cell modules thus produced were evaluated under exposure to artificial sunlight of AM 1.5 (100 mW/cm$^2$). As a result, they showed an average photoelectric conversion efficiency of as low as 1.05 relative to an average value of 1.20 of the photoelectric conversion efficiency of the solar cell modules produced in Example 2. Non-uniformity of the photoelectric conversion efficiency between modules was also as large as ±5%.

Example 3

Using the apparatus for continuously forming multi-layer semiconductor films of the present invention as shown in Apparatus Example 1, multi-layer silicon non-monocrystalline semiconductor films of nip structure for use in photovoltaic elements were continuously formed to produce solar cell modules in the same manner as in Example 1 except that the 75 kHz frequency of the discharge power in the film-forming chamber 105 in which p-type semiconductor layers were formed by plasma doping was changed to 400 kHz.

The layer configuration of the solar cells produced is diagrammatically shown in FIG. 9.

In FIG. 9, 901 represents the substrate; 902 is an n-type semiconductor layer formed by high-frequency plasma assisted CVD; 903 is an i-type semiconductor layer formed by microwave plasma assisted CVD; 904 is an i-type semiconductor layer formed by high frequency assisted plasma CVD; 905 is a p-type semiconductor formed by plasma doping; 906 is a transparent conductive film and 907 is a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such an apparatus, decreased to ±2% or less in the apparatus of Example 3.

Example 4

Using the apparatus for continuously forming multi-layer semiconductor films of the present invention as shown in Apparatus Example 1, multi-layer silicon non-monocrystalline semiconductor films of nip structure for use in photovoltaic elements were continuously formed to produce solar cell modules in the same manner as in Example 2 except that SiH$_4$ gas was added to the starting material gases fed in an amount of 3 sccm into the film-forming chamber 105 in which p-type semiconductor layers were formed by plasma doping, which amount was small enough for depositing about 10 nm thick semiconductor layers.

The layer configuration of the solar cells produced is diagrammatically shown in FIG. 9.

Characteristics of the solar cell modules thus produced were evaluated under exposure to artificial sunlight of AM 1.5 (100 mW/cm$^2$). As a result, they showed an average photoelectric conversion efficiency of as good as 1.18 relative to an average value of 1.00 of the photoelectric conversion efficiency of solar cell modules produced using an apparatus of roll-to-roll type in which the i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such an apparatus, decreased to 2% or less in the apparatus of Example 4.

Comparative Example 4

Multi-layer silicon monocrystalline semiconductor films of nip structure for use in photovoltaic elements were continuously formed to produce solar cell modules in the same manner as in Example 4 except that SiH$_4$ gas containing Si atoms was added to the starting material gases fed in an amount of 30 sccm into the p-type semiconductor layer film-forming chamber of the apparatus of the present invention shown in Apparatus Example 1, which amount was large enough to deposit about 10 nm thick semiconductor layers.

Characteristics of the solar cell modules thus produced were evaluated under exposure to artificial sunlight of AM 1.5 (100 mW/cm$^2$). As a result, they showed an average photoelectric conversion efficiency of as low as 0.85 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules was also as large as ±6%.

Example 5

Using the apparatus for continuously forming multi-layer semiconductor films of the present invention as shown in Apparatus Example 1, multi-layer silicon non-monocrystalline semiconductor films of pin structure for use in photovoltaic elements were continuously formed to produce solar cell modules in the same manner as in Example 2 except that the conductivity types of the semiconductor layers formed in the film-forming chambers 102 and 105 were reversed.

Figure 10:
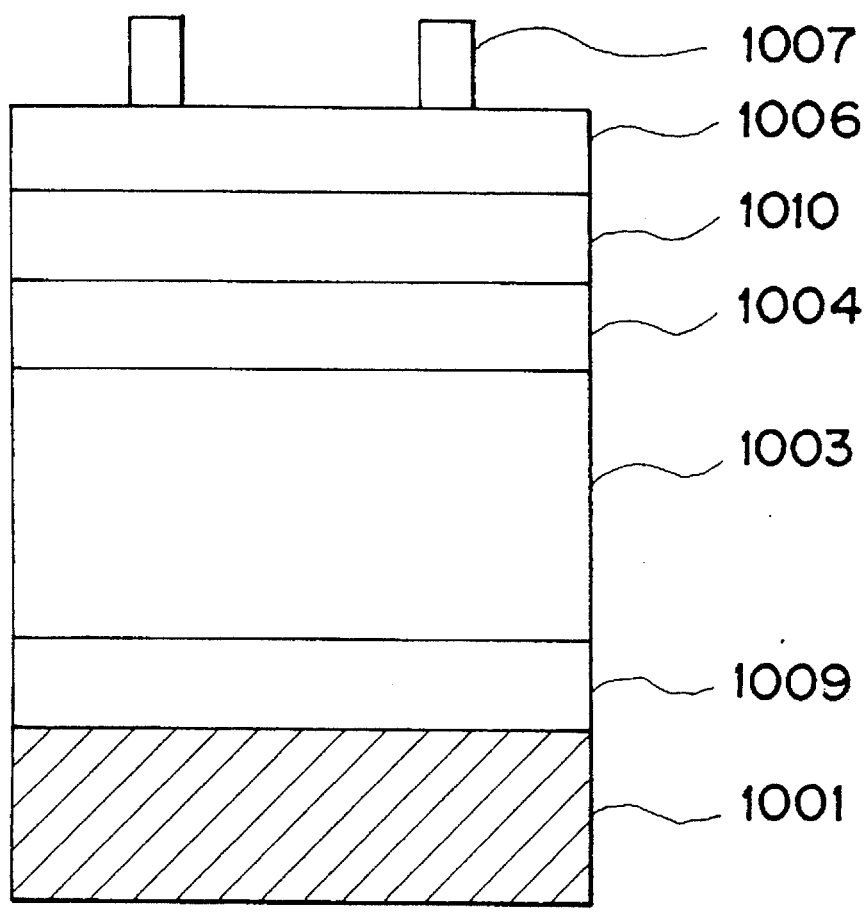
FIG. 10 is a diagrammatic cross section view of another example of the photovoltaic element of the present invention.

Conditions for forming the semiconductor layers in the film-forming chambers are shown in Table 7, and the layer configuration of the produced solar cells is diagrammatically shown in FIG. 10.

In FIG. 10, 1001 represents the substrate; 1009 represents a p-type semiconductor layer formed by high-frequency plasma assisted CVD; 1003 represents an i-type semiconductor layer formed by microwave plasma assisted CVD; 1004 represents an i-type semiconductor layer formed by high frequency plasma assisted CVD; 1010 represents an n-type semiconductor layer formed by plasma doping; 1006 is a transparent conductive film; and 1007 is a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers were formed only by microwave plasma-assisted CVD and p- and n-type semiconductor layers were formed by high-frequency plasma-assisted CVD. Non-uniformity of photoelectric conversion efficiency between modules, which was ±5% when produced using such an apparatus, decreased to ±2% or less in the apparatus of Example 5.

Example 6

Using the apparatus for continuously forming multi-layer semiconductor films of the present invention as shown in Apparatus Example 1, multi-layer silicon non-monocrystalline semiconductor films of nip structure for use in photovoltaic element were continuously formed to produce solar cell modules in the same manner as in Example 2 except that the belt substrate made of SUS430BA on which the Ag layer and ZnO layer were formed by sputtering was replaced with a belt substrate made of SUS430BA whose surface had been thoroughly cleaned and degreased.

The layer configuration of the solar cells produced is diagrammatically shown in FIG. 9.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which SUS430BA is used as the belt substrate, i-type semiconductor layers were formed only by microwave plasma-assisted CVD, and n- and p-type semiconductor layers were formed by high-frequency plasma-assisted CVD. Non-uniformity of photoelectric conversion efficiency between modules, which was ±5% when produced using such an apparatus, decreased to ±2% or less in the apparatus of Example 6.

Example 7

Using the apparatus for continuously forming semiconductor multi-layer deposited films of the present invention as shown in Apparatus Example 2, multi-layer silicon non-monocrystalline semiconductor films of nip structure for use in photovoltaic elements were continuously formed to produce solar cell modules in substantially the same manner as in Example 1 except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the p-type semiconductor layers were formed.

The glow discharge cleaning was carried out using Ar high-frequency plasma, and the hydrogen plasma treatment was carried out using high-frequency plasma.

Figure 11:
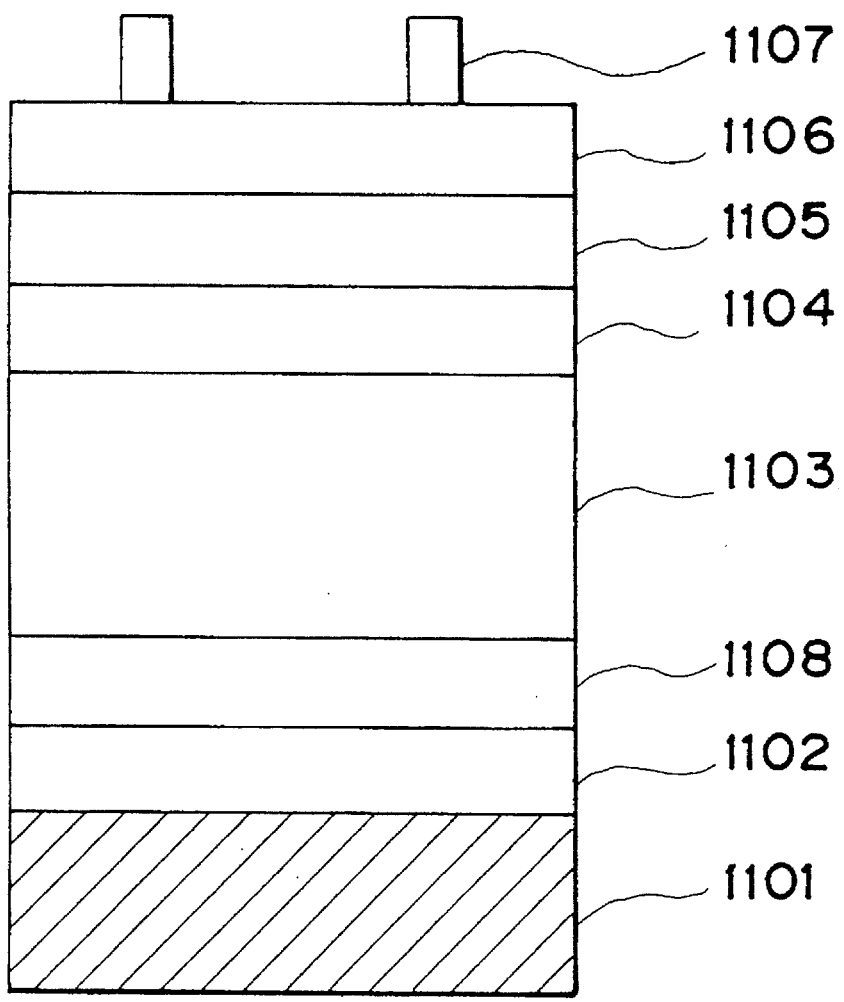
FIG. 11 is a diagrammatic cross section view of still another example of the photovoltaic element of the present invention.

Conditions for forming the semiconductor layers in film-forming chambers and conditions for surface treatment are shown in Table 8, and the layer configuration of the solar cells thus produced is diagrammatically shown in FIG. 11.

In FIG. 11, 1101 represents the substrate; 1102 represents an n-type semiconductor layer formed by high-frequency plasma-assisted CVD; 1108 represents an i-type semiconductor layer formed by high frequency plasma assisted CVD; 1103 represents an i-type semiconductor layer formed by microwave plasma assisted CVD; 1104 represents an i-type semiconductor layer formed by high frequency plasma assisted CVD; 1105 represents a p-type semiconductor layer formed by plasma doping; 1106 represents a transparent conductive film; and 1107 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.17 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such an apparatus, decreased to ±1.5% or less in the apparatus of Example 7.

Example 8

Using the apparatus for continuously forming multi-layer semiconductor films of the present invention as shown in Apparatus Example 2, multi-layer silicon non-monocrystalline semiconductor films of nip structure for use in photovoltaic elements, having i-type semiconductor layers formed of amorphous SiGe were continuously formed to produce solar cell modules in substantially the same manner as in Example 2 except that the surface of the belt substrate was cleaned by glow discharge, the i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the p-type semiconductor layers were formed.

The glow discharge cleaning was carried out using He high-frequency plasma, and the hydrogen plasma treatment was carried out using low-frequency plasma.

Conditions for forming the semiconductor layers in film-forming chambers and conditions for surface treatment are shown in Table 9, and the layer configuration of the solar cells produced is diagrammatically shown in FIG. 11.

Characteristics of the solar cell modules thus produced were evaluated under exposure to artificial sunlight of AM 1.5 (100 mW/cm$^2$). As a result, they showed an average photoelectric conversion efficiency of as good as 1.22 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such an apparatus, decreased to ±1.5% or less in the apparatus of Example 8.

Example 9

Using the apparatus for continuously forming multi-layer semiconductor films of the present invention as shown in Apparatus Example 2, multi-layer silicon non-monocrystalline semiconductor films of pin structure for use in photovoltaic elements, having i-type semiconductor layers formed of amorphous SiGe, were continuously formed to produce solar cell modules in substantially the same manner as in Example 5 except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the n-type semiconductor layers were formed.

The glow discharge cleaning was carried out using He high-frequency plasma, and the hydrogen plasma treatment was carried out using low-frequency plasma.

Figure 12:
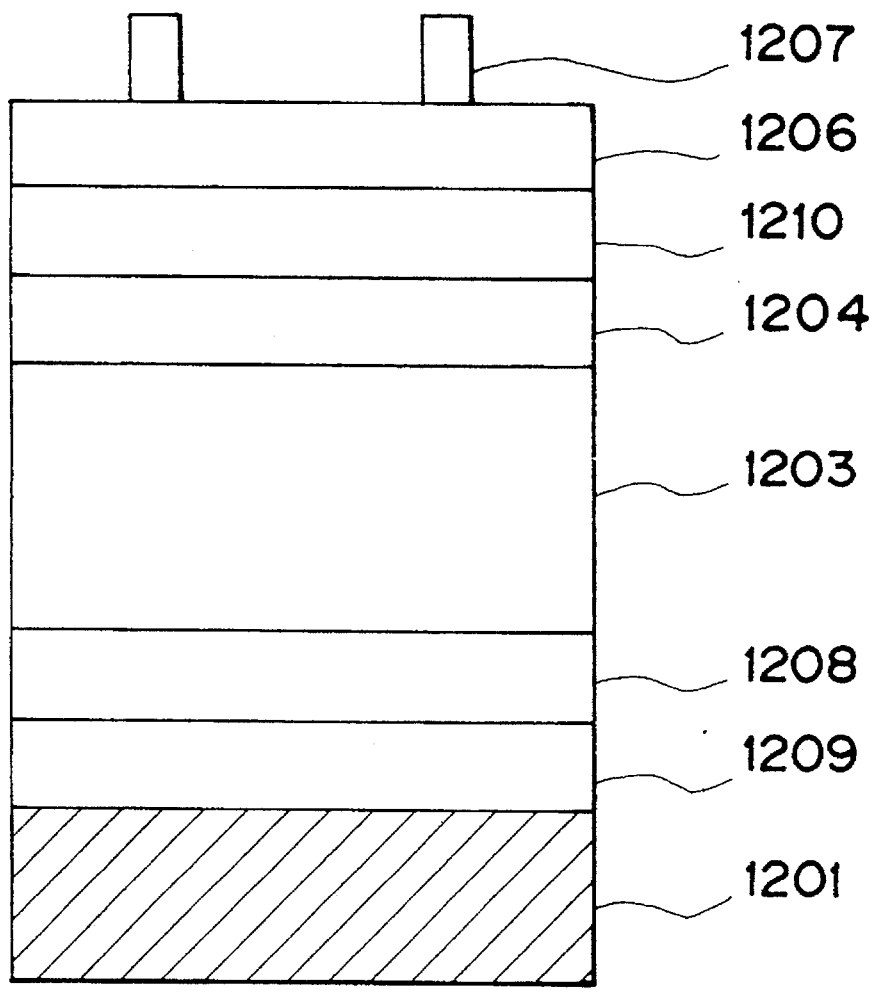
FIG. 12 is a diagrammatic cross section view of a further example of the photovoltaic element of the present invention.

Conditions for forming the semiconductor layers in the film-forming chambers and conditions for surface treatment are shown in Table 10, and the layer configuration of the solar cells thus produced is diagrammatically shown in FIG. 12.

In FIG. 12, 1201 represents the substrate; 1209 represents a p-type semiconductor layer formed by high-frequency plasma assisted CVD; 1208 represents an i-type semiconductor layer formed by high frequency plasma assisted CVD; 1203 represents an i-type semiconductor layer formed by microwave plasma-assisted CVD; 1204 represents an i-type semiconductor layer formed by high-frequency plasma-assisted CVD; 1210 represents an n-type semiconductor layer formed by plasma doping; 1206 represents a transparent conductive film and 1207 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.22 relative to an average value of 1.00 of the photoelectric conversion efficiency of solar cell modules produced using an apparatus of roll-to-roll type in which i-type semiconductor layers were formed only by microwave plasma-assisted CVD and p- and n-type semiconductor layers were formed by high-frequency plasma-assisted CVD. Non-uniformity of photoelectric conversion efficiency between modules, which was ±5% when produced using such an apparatus, decreased to ±1.5% or less in the apparatus of Example 9.

Example 10

Using the apparatus for continuously forming multi-layer semiconductor films of the present invention as shown in Apparatus Example 2, multi-layer silicon non-monocrystalline semiconductor films of nip structure for use in photovoltaic elements, having i-type semiconductor layers formed of amorphous SiGe, were continuously formed to produce solar cell modules in substantially the same manner as in Example 8 except that the i-type semiconductor layers were doped with a very small quantity of boron.

Conditions for forming the semiconductor layers in the film-forming chambers and conditions for surface treatment are shown in Table 11, and the layer configuration of the solar cells produced is diagrammatically shown in FIG. 11.

Characteristics of the solar cell modules thus produced were evaluated under exposure to artificial sunlight of AM 1.5 (100 mW/cm$^2$). As a result, they showed an average photoelectric conversion efficiency of as good as 1.23 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such an apparatus, decreased to ±1.5% or less in the apparatus of Example 10.

Example 11

Using the apparatus for continuously forming semiconductor multi-layer deposited films of the present invention as shown in Apparatus Example 2, multi-layer silicon non-monocrystalline semiconductor films of nip structure for use in photovoltaic elements, having i-type semiconductor layers formed of amorphous SiGe, were continuously formed to produce 35 cm×35 cm solar cell modules in substantially the same manner as in Example 8 except that a broad belt substrate of 36 cm wide was used.

In the apparatus used in the example, the belt substrate was three times wider than that used in Examples 1 to 10. The three film-forming chambers inside the microwave plasma-assisted CVD film-forming chamber 203 were each provided with opposed microwave applying means on both sides of the belt substrate, and microwave power was fed into them through a total of six microwave applying means. The electric fields of the opposed microwave feeding means were vertical to each other.

Conditions for forming the semiconductor layers in the film-forming chambers and conditions for surface treatment are shown in Table 12, and the layer configuration of the solar cells thus produced is diagrammatically shown in FIG. 11.

Characteristics of the solar cell modules thus produced were evaluated under exposure to artificial sunlight of AM 1.5 (100 mW/cm$^2$). As a result, they showed an average photoelectric conversion efficiency of as good as 1.23 relative to an average value 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between module, which was ±6% when produced using such an apparatus, decreased to ±2.0% or less in the apparatus of Example 11, thereby demonstrating that multi-layer semiconductor films for photovoltaic elements having a high quality over a large area were formed in a good uniformity.

Example 12

Using the apparatus for continuously forming multi-layer semiconductor films of the present invention as shown in Apparatus Example 9, three photovoltaic elements of nip structure having i-type semiconductor layers respectively formed of amorphous SiGe, amorphous SiGe, and amorphous Si were successively deposited on a belt substrate to thereby continuously form multi-layer silicon non-monocrystalline semiconductor films of nipnipnip structure.

In the film-forming chambers 2103A and 2103B, the i-type semiconductor layers were each formed through three chambers in which the germanium-containing starting material gas was in concentrations different from one another so that the germanium content in the i-type semiconductor layers continuously formed in the film-forming chambers 2103A and 2103B was changed to become large-small-large in the layer thickness direction.

First, a belt substrate having a finely irregular surface, comprised of a beltlike stainless steel sheet (12 cm wide×200 m long×0.15 mm thick) made of SUS430BA on the surface of which an Ag layer 500 nm thick and a transparent conductive ZnO layer about 2 nm thick had been successively formed by sputtering, was placed in the belt substrate unwind chamber 101 wound around the bobbin 109. The belt substrate was passed through the respective gas gates 107 and film-forming chambers 2102A to 2105C until it was stretched to the belt substrate wind-up chamber 106, and tension was applied thereto to the extent that it was not loose.

In the belt substrate wind-up chamber 106, a bobbin around which a protective film made of well dried aramid film (trade name: NOMEX, available from Du Pont Co.: 12 cm wide×200 m long×0.5 mm thick) had been wound was installed so that the protective film was rolled up together with the belt substrate.

After the belt substrate was installed, the insides the chambers 101 to 106 were evacuated by means of vacuum pumps (not shown) comprised of a combination of a rotary pump and a mechanical pump. After evacuating them, He gas was fed, and the insides of the film-forming chambers were heated at about 350° C. in an about 200 Pa atmosphere of He to carry out baking.

After the baking was completed, the chambers 101 to 106 were again evacuated. After evacuating the chamber 101, film-forming chambers 2102A, 2104A, 2105A, 2102B, 2104B, 2105B, 2102C, 2104C, 2105C and chamber 106 by means of vacuum pumps comprised of a combination of a rotary pump and a mechanical pump, connected to the respective chambers, and the film-forming chambers 2103A, 2103B and 2103C by means of two oil diffusion pumps (HS-16, available from Varian Co.) connected to the respective chambers, $H_2$ was fed as a gate gas into the respective gas gates 107 at 500 sccm each, and the respective starting material gases were fed into the film-forming chambers 2102A to 2105C at given flow rates. Then, the divergence of throttle valves provided to the chambers 101 to 106 was controlled so that the belt substrate unwind chamber 101 and wind-up chamber 106 were each set at an internal pressure of 125 Pa. The film-forming chambers 2102A, 2103A, 2104A, 2105A, 2102B, 2103B, 2104B, 2105B, 2102C, 2103C, 2104C and 2105C were set at internal pressures of 130 Pa, about 1 Pa, 135 Pa, 130 Pa, 130 Pa, about 1 Pa, 135 Pa, 130 Pa, 130 Pa, 1 Pa, 135 Pa and 130 Pa, respectively.

When the pressure in each chamber became stable, the wind-up bobbin 110 in the belt substrate wind-up chamber 106 was rotated to continuously transport the belt 108 at a constant speed of 100 cm/min in the direction from the film-forming chamber 2102A toward the film-forming chamber 2105C. Temperature control systems (not shown) provided in the film-forming chambers 2102A to 2105C were also operated to control temperatures so that the transported belt substrate had a given temperature in the film-forming space in each film-forming chamber.

When the temperature of the belt substrate became stable, high-frequency power of 13.56 MHz applied into the film-forming chambers 2102A, 2104A, 2102B, 2104B, 2102C and 2104C through parallel flat-plate electrodes; microwave power of 2.45 GHz was fed into the film-forming chambers 2103A, 2103B and 2103C through microwave guide windows provided in the side walls of the respective film-forming chambers; and low-frequency power of 75 kHz was fed into the film-forming chambers 2105A and 2105B through parallel flat-plate electrodes; all from corresponding power sources via matching boxes.

High-frequency power of 13.56 MHz was further applied into the film-forming chambers provided inside the film-forming chambers 2103A, 2103B and 2103C through rod bias electrodes provided in front of the microwave guide windows and in parallel to the belt substrate, from power sources (not shown) via matching boxes.

Three film-forming chambers were provided in the film-forming chambers 2103A and 2103B to form an i-type semiconductor layer. In the film-forming chamber 2103C, one film-forming chamber was used to form an i-type semiconductor layer. The lengths of the film-forming chambers 2103A, 2103B, and 2103C in the semiconductor layer forming regions in the direction of belt substrate movement were each about 20 cm. These lengths were adjusted using barrier plates with given lengths (serving also as plasma leak guards) provided between the belt substrate surface and the plasma.

Upon application of the discharge power, the starting material gases in the film-forming chambers 2102A to 2105C were changed into plasma, and semiconductor layers formed on the surface of the belt substrate continuously transported through the respective film-forming chambers, so that semiconductor layers of nipnipnip structure were continuously formed on the surface of the belt substrate.

Conditions for forming the semiconductor layers in the film-forming chambers 2102A to 2105A in which a first photovoltaic element is fabricated are shown in Table 13, conditions for forming the semiconductor layers in the film-forming chambers 2102B to 2105B in which a second photovoltaic element is fabricated as shown in Table 14, and conditions for forming the semiconductor layers in the film-forming chambers 2102C to 2105C in which a third photovoltaic element is fabricated are shown in Table 15.

The belt substrate was moved for 180 minutes after the start of its transport, in the course of which the semiconductor layers were continuously formed for 170 minutes.

After the semiconductor layers were formed for about 170 m, the application of discharge power, the feeding of starting material gases and the heating of the belt substrate and film-forming chambers were stopped, and the insides of the film-forming chambers were purged. After the belt substrate and the insides of the film-forming chambers were well cooled, the apparatus was opened to take out the belt substrate (with semiconductor layers) wound around the bobbin 110, from the belt substrate wind-up chamber 106 to the outside of the apparatus.

The belt substrate thus taken out was further continuously processed using a continuous modularized apparatus, where a 70 nm thick ITO ($In_2O_3+SnO_2$) thin film was formed as a transparent electrode over the entire surface of the multi-layer semiconductor films formed using the apparatus of the present invention, and thin-line Ag electrodes were formed thereon as collector electrodes at given intervals and then the unit cells were formed into modules, e.g., in series. Thus, 35 cm×35 cm solar cell modules comprised of triple-layer tandem solar cells in which photovoltaic elements with different band gaps superposingly formed were continuously produced.

Figure 13:
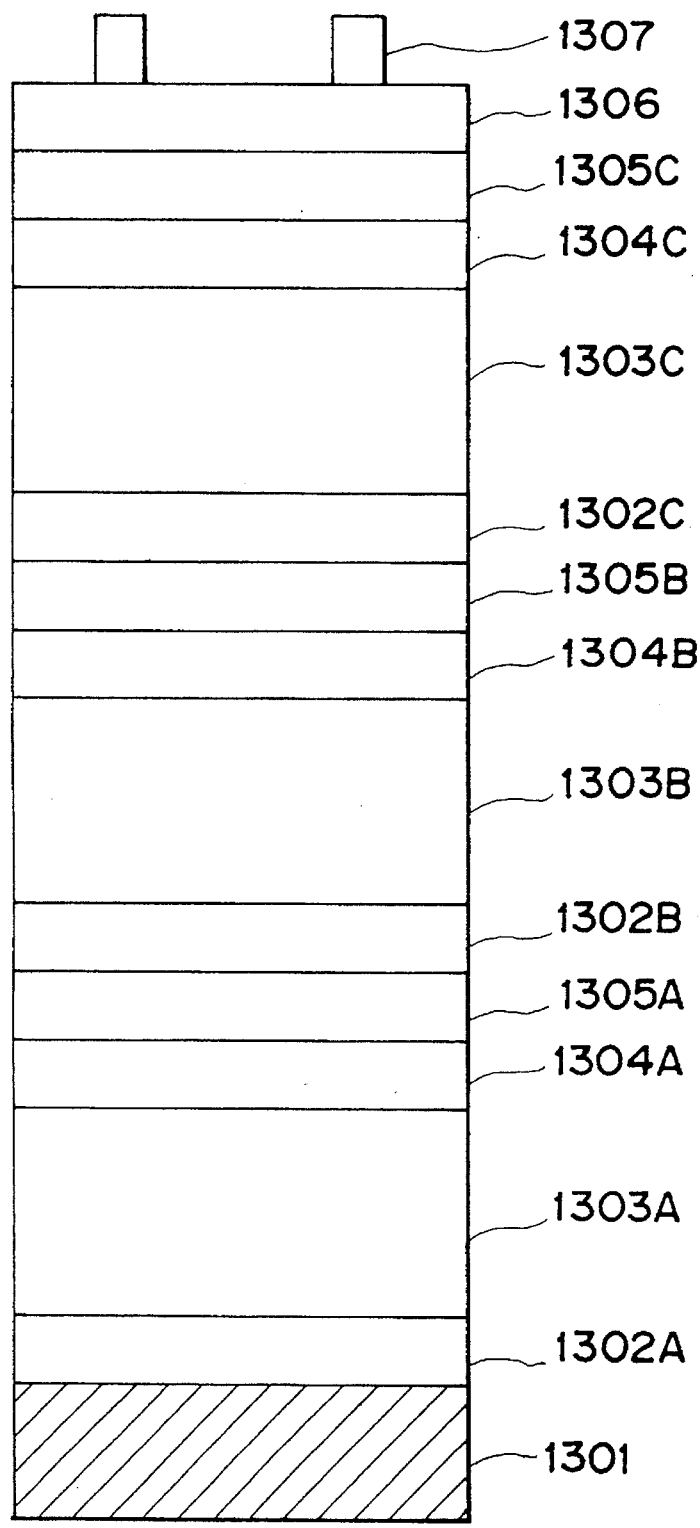
FIG. 13 is a diagrammatic cross section view of a triple photovoltaic element according to the present invention.

The layer configuration of the solar cells thus produced is diagrammatically shown in FIG. 13.

In FIG. 13, 1301 represents the substrate; 1302A, B and C represent an n-type semiconductor layer formed by high-frequency plasma-assisted CVD; 1303A, B and C represent an i-type semiconductor layer formed by microwave plasma assisted CVD; 1304A, B and C represent an i-type semiconductor layer by high frequency plasma assisted CVD;

1305A, B and C represent a p-type semiconductor layer formed by plasma doping; 1306 represents a transparent conductive film; and 1307 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such a conventional apparatus, decreased to ±2% or less.

Comparative Example 12-1

Using an apparatus with a conventionally known construction wherein the film-forming chambers 2104A, 2104B, and 2104C in which i-type semiconductor layers are formed by high-frequency plasma-assisted CVD were removed from the apparatus of the present invention shown in Apparatus Example 9 and the p-type semiconductor layer film-forming chambers 2105A, 2105B, and 2105C were replaced with high-frequency plasma-assisted CVD film-forming chambers, multi-layer silicon non-monocrystalline semiconductor films of nipnipnip structure for use in photovoltaic elements were continuously formed to produce solar cell modules in the same manner as in Example 12 except that the i-type semiconductor layers formed by high-frequency plasma-assisted CVD were not formed and the p-type semiconductor layers were formed by high-frequency plasma-assisted CVD.

Conditions for forming the semiconductor layers in the film-forming chambers 2102A to 2105A in which a first photovoltaic element is fabricated are shown in Table 16, conditions for forming the semiconductor layers in the film-forming chambers 2102B to 2105B in which a second photovoltaic element is fabricated are shown in Table 17, and conditions for forming the semiconductor layers in the film-forming chambers 2102C to 2105C in which a third photovoltaic element is fabricated are shown in Table 18.

Characteristics of the solar cell modules thus produced were evaluated under exposure to artificial sunlight of AM 1.5 (100 mW/cm$^2$). As a result, they showed an average photoelectric conversion efficiency of as low as 1.00 relative to an average value of 1.20 of the photoelectric conversion efficiency of the solar cell modules produced in Example 12. Non-uniformity of photoelectric conversion efficiency between modules was also as large as ±5%.

Comparative Example 12-2

Using an apparatus wherein the p-type semiconductor layer film-forming chambers 2105A and 2105B of the apparatus of the present invention shown in Apparatus Example 9 were replaced with high-frequency plasma-assisted CVD film-forming chambers, multi-layer silicon non-monocrystalline semiconductor films of nipnipnip structure were continuously formed to produce solar cell modules in the same manner as in Example 12 except that the p-type semiconductor layers were formed by high-frequency plasma-assisted CVD.

Conditions for forming the semiconductor layers in the film-forming chambers 2102A to 2105A in which a first photovoltaic element is fabricated are shown in Table 19, conditions for forming the semiconductor layers in the film-forming chambers 2102B to 2105B in which a second photovoltaic element is fabricated are shown in Table 20, and conditions for forming the semiconductor layers in the film-forming chambers 2102C to 2105C in which a third photovoltaic element is fabricated are shown in Table 21.

Characteristics of the solar cell modules thus produced were evaluated under exposure to artificial sunlight of AM 1.5 (100 mW/cm$^2$). As a result, they show an average photoelectric conversion efficiency of as low as 1.05 relative to an average value of 1.20 of the photoelectric conversion efficiency of the solar cell modules produced in Example 12. Non-uniformity of photoelectric conversion efficiency between modules was also as large as ±5%.

Example 13

Using the apparatus for continuously forming multi-layer semiconductor films of the present invention as shown in Apparatus Example 9, three photovoltaic elements of nip structure having i-type semiconductor layers respectively formed of amorphous SiGe, amorphous Si, and amorphous Si were successively formed on the substrate to thereby continuously form multi-layer silicon non-monocrystalline semiconductor films of nipnipnip structure, in the same manner as in Example 12 except that the i-type semiconductor layers formed in the film-forming chamber 2103B were replaced with films formed of amorphous silicon. Then the unit cells thus obtained were formed into modules. Thus, 35 cm×35 cm solar cell modules comprised of triple-layer tandem solar cells were continuously produced.

Conditions for forming the semiconductor layers in the film-forming chambers 2102A to 2105A in which a first photovoltaic element was fabricated and conditions for forming the semiconductor layers in the film-forming chambers 2102C to 2105C in which a third photovoltaic element was fabricated were the same as those in Example 12 as shown in Tables 13 and 15, respectively. Only the conditions for forming the semiconductor layers in the film-forming chambers 2102B to 2105B in which a second photovoltaic element was fabricated were changed as shown in Table 22.

The layer configuration of the solar cells thus produced is diagrammatically shown in FIG. 13.

Characteristics of the solar cell modules thus produced were evaluated under exposure to artificial sunlight of AM 1.5 (100 mW/cm$^2$). As a result, they showed an average photoelectric conversion efficiency of as good as 1.15 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such a conventional apparatus, decreased to ±2% or less.

Comparative Example 13-1

Using an apparatus with a conventionally known construction wherein the film-forming chambers 2104A, 2104B, and 2104C in which i-type semiconductor layers are formed by high-frequency plasma-assisted CVD were removed from the apparatus of the present invention shown in Apparatus Example 9 and the p-type semiconductor layer film-forming chambers 2105A, 2105B, and 2105C were replaced with high-frequency plasma-assisted CVD film-forming chambers, multi-layer silicon non-monocrystalline semiconductor films of nipnipnip structure for use in photovoltaic elements were continuously formed to produce solar cell modules in the same manner as in Example 13 except that the i-type semiconductor layers formed by high-frequency plasma-assisted CVD were not formed and the p-type semiconductor layers were formed by high-frequency plasma-assisted CVD.

Conditions for forming the semiconductor layers in the film-forming chambers 2102A to 2105A in which a first photovoltaic element was fabricated and conditions for forming the semiconductor layers in the film-forming chambers 2102C to 2105C in which a third photovoltaic element was fabricated were the same as those in Comparative Example 12-1 as shown in Tables 16 and 18, respectively. Only the conditions for forming the semiconductor layers in the film-forming chambers 2102B to 2105B in which a second photovoltaic element was fabricated were changed as shown in Table 23.

Characteristics of the solar cell modules thus produced were evaluated under exposure to artificial sunlight of AM 1.5 (100 mW/cm$^2$). As a result, they showed an average photoelectric conversion efficiency of as low as 1.00 relative to an average value of 1.15 of the photoelectric conversion efficiency of the solar cell modules produced in Example 13. Non-uniformity of photoelectric conversion efficiency between modules was also as large as ±5%.

Comparative Example 13-2

Using an apparatus wherein the p-type semiconductor layer film-forming chambers 2105A, 2105B, and 2105C of the apparatus for continuously forming semiconductor multi-layer deposited films of the present invention shown in Apparatus Example 12 were replaced with high-frequency plasma-assisted CVD film-forming chambers, multi-layer silicon non-monocrystalline semiconductor films of nipnipnip structure were continuously formed to produce solar cell modules in the same manner as in Example 13 except that the p-type semiconductor layers were formed by high-frequency plasma-assisted CVD.

Conditions for forming the semiconductor layers in the film-forming chambers 2102A to 2105A in which a first photovoltaic element was fabricated and conditions for forming the semiconductor layers in the film-forming chambers 2102C to 2105C in which a third photovoltaic element was fabricated were the same as those in Comparative Example 12-2 as shown in Tables 19 and 21, respectively. Only the conditions for forming the semiconductor layers in the film-forming chambers 2102B to 2105B in which a second photovoltaic element was fabricated were changed as shown in Table 24.

Characteristics of the solar cell modules thus produced were evaluated under exposure to artificial sunlight of AM 1.5 (100 mW/cm$^2$). As a result, they showed an average photoelectric conversion efficiency of as low as 1.03 relative to an average value of 1.15 of the photoelectric conversion efficiency of the solar cell modules produced in Example 13. Non-uniformity of photoelectric conversion efficiency between modules was also as large as ±5%.

Example 14

Using the apparatus for continuously forming semiconductor multi-layer deposited films of the present invention as shown in Apparatus Example 9, three photovoltaic elements of nip structure having i-type semiconductor layers respectively formed of amorphous SiGe, amorphous SiGe, and amorphous SiC were successively formed on the substrate to thereby continuously form multi-layer silicon non-monocrystalline semiconductor films of nipnipnip structure, in the same manner as in Example 12 except that the i-type semiconductor layers formed in the film-forming chamber 2103C were replaced with layers formed of amorphous SiC and were each formed in two film-forming chambers. Then the unit cells obtained were formed into modules. Thus, 35 cm×35 cm solar cell modules comprised of triple-layer tandem solar cells were continuously produced.

Conditions for forming the semiconductor layers in the film-forming chambers 2102A to 2105A in which a first photovoltaic element was fabricated and conditions for forming the semiconductor layers in the film-forming chambers 2102B to 2105B in which a second photovoltaic element was fabricated were the same as those in Example 12 as shown in Tables 13 and 14, respectively. Only the conditions for forming the semiconductor layers in the film-forming chambers 2102C to 2105C in which a third photovoltaic element was fabricated were changed as shown in Table 25.

The layer configuration of the solar cells thus produced is diagrammatically shown in FIG. 13.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 15

Using the apparatus for continuously forming semiconductor multi-layer deposited films of the present invention as shown in Apparatus Example 9, three photovoltaic elements of nip structure having i-type semiconductor layers respectively formed of amorphous SiGe, amorphous Si, and amorphous SiC were successively formed on the substrate to thereby continuously form silicon non-monocrystalline semiconductor multi-layer deposited films of nipnipnip structure, in the same manner as in Example 13 except that the i-type semiconductor layers formed in the film-forming chamber 2103C were replaced with layers formed of amorphous SiC and were each formed in two film-forming chambers. Then the unit cells thus obtained were formed into modules. Thus, 35 cm×35 cm solar cell modules comprised of triple-layer tandem solar cells were continuously produced.

Conditions for forming the semiconductor layers in the film-forming chambers 2102A to 2105A in which a first photovoltaic element was fabricated and conditions for forming the semiconductor layers in the film-forming chambers 2102B to 2105B in which a second photovoltaic element was fabricated were the same as those in Example 13 as shown in Tables 13 and 22, respectively. Only the conditions for forming the semiconductor layers in the film-forming chambers 2102C to 2105C in which a third photovoltaic element was fabricated were changed as shown in Table 25.

The layer configuration of the solar cells thus produced is diagrammatically shown in FIG. 13.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average of 1.00 of the photoelectric conversion efficiency of solar cell modules produced using an apparatus of roll-to-roll type in which i-type semiconductor layers were formed only by microwave plasma-assisted CVD an n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 16

Using the apparatus for continuously forming semiconductor multi-layer deposited films of the present invention as shown in Apparatus Example 9, multi-layer silicon non-monocrystalline semiconductor films of nipnipnip structure were continuously formed in the same manner as in Example 12 except that the 75 kHz frequency of the discharge power in the film-forming chambers 2105A, 2105B, and 2105C in which p-type semiconductor layers were formed by plasma doping was changed to 400 kHz. Then the unit cells thus obtained were formed into modules. Thus, 35 cm×35 cm solar cell modules comprised of triple-layer tandem solar cells in which photovoltaic elements with different band gaps were formed were continuously produced.

The layer configuration of the solar cells thus produced is diagrammatically shown in FIG. 13.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 17

Using the apparatus for continuously forming semiconductor multi-layer deposited films of the present invention as shown in Apparatus Example 9, multi-layer silicon non-monocrystalline semiconductor films of nipnipnip structure were continuously formed in the same manner as in Example 12 except that SiH$_4$ gas was added to the starting material gases fed in an amount of 3 sccm into the film-forming chambers 2105A, 2105B, and 2105C in which p-type semiconductor layers were formed by plasma doping, which was small enough for forming about 10 nm thick semiconductor layers by deposition. Then the unit cells thus obtained were formed into modules. Thus, 35 cm×35 cm solar cell modules comprised of triple-layer tandem solar cells in which photovoltaic elements with different band gaps were formed were continuously produced.

The layer configuration of the solar cells thus produced is diagrammatically shown in FIG. 13.

Characteristics of the solar cell modules thus produced wee evaluated under exposure to artificial sunlight of AM 1.5 (100 mW/cm$^2$). As a result, they showed an average photoelectric conversion efficiency of as good as 1.18 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Comparative Example 17

Multi-layer silicon non-monocrystalline semiconductor films of nipnipnip structure were continuously formed to produce solar cell modules in the same manner as in Example 17 except that SiH$_4$ gas was added to the starting material gas fed in an amount of 30 sccm into the p-type semiconductor layer film-forming chambers of the apparatus of the present invention shown in Apparatus Example 9, which was large enough to form about 10 nm thick semiconductor layers by deposition.

Characteristics of the solar cell modules thus produced were evaluated under exposure to artificial sunlight of AM 1.5 (100 mW/cm$^2$). As a result, they showed an average photoelectric conversion efficiency of as low as 0.85 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules was also as large as ±6%.

Example 18

Using the apparatus for continuously forming multi-layer semiconductor films of the present invention as shown in Apparatus Example 9, multi-layer silicon non-monocrystalline semiconductor films of nipnipnip structure were continuously formed in the same manner as in Example 12 except that the conductivity types of the semiconductor layers were reversed so that the p-type semiconductor layers were formed in film-forming chambers 2102A, 2102B, and 2102C and n-type semiconductor layers were formed in film-forming chambers 2105A, 2105B, and 2105C. Then the unit cells thus obtained were formed into modules. Thus, 35 cm×35 cm solar cell modules comprised of triple-layer tandem solar cells in which photovoltaic elements with different band gaps were formed were continuously produced.

Conditions for forming the semiconductor layers in the film-forming chambers 2102A to 2105A in which a first photovoltaic element is fabricated are shown in Table 26, conditions for forming the semiconductor layers in the film-forming chambers 2102B to 2105B in which a second photovoltaic element is fabricated are shown in Table 27, and conditions for forming the semiconductor layers in the film-forming chambers 2102C to 2105C in which a third photovoltaic element is fabricated are shown in Table 28.

Figure 14:
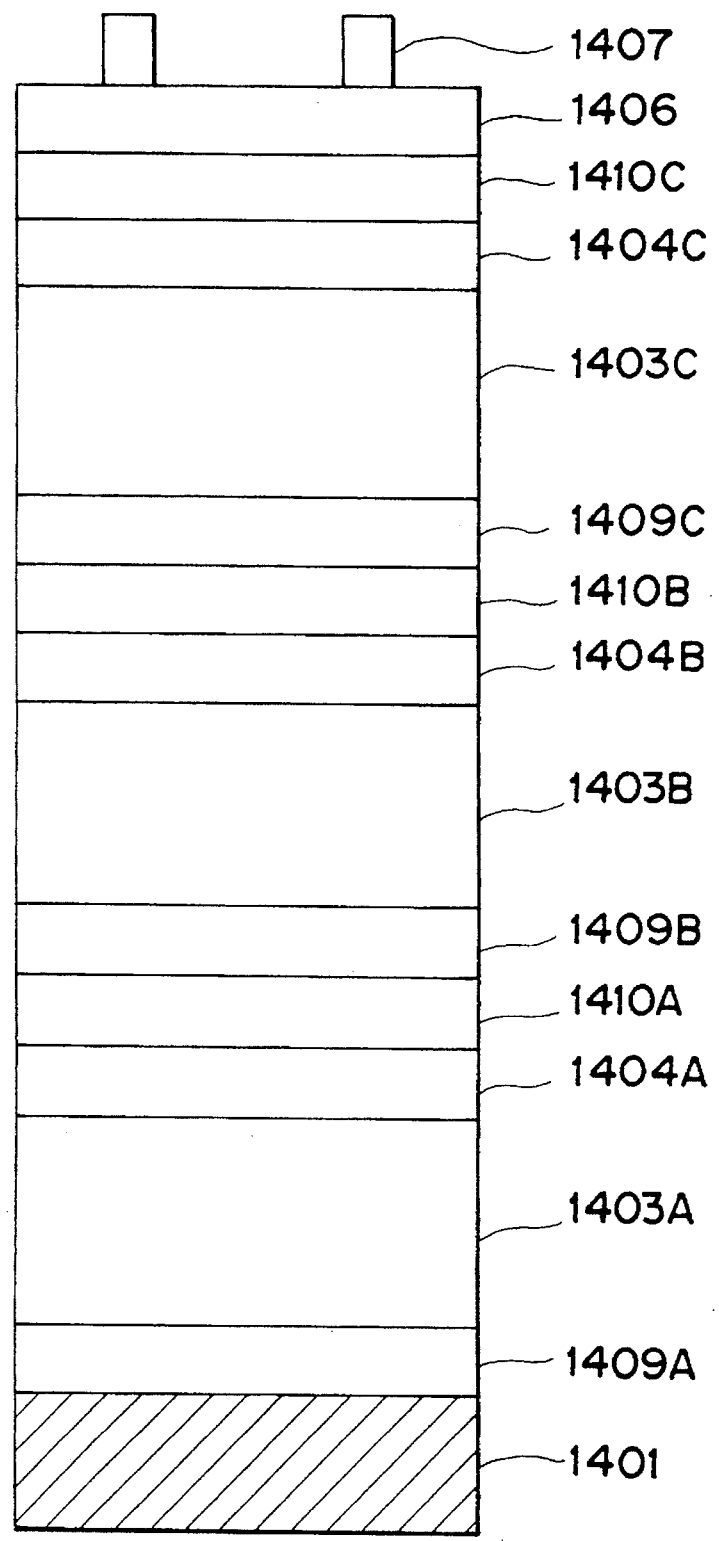
FIG. 14 is a diagrammatic cross section view of another triple photovoltaic element according to the present invention.

The layer configuration of the solar cells thus produced is diagrammatically shown in FIG. 14.

In FIG. 14, 1401 represents the substrate; 1409 A, B and C represent a p-type semiconductor layer formed by high-frequency plasma assisted CVD; 1403A, B and C represent an i-type semiconductor layer formed by microwave plasma assisted CVD; 1404 A, B and C represent an i-type semiconductor layer formed by high-frequency plasma assisted CVD; 1410 A, B and C represent an n-type semiconductor layer formed by plasma doping; 1406 represents a transparent conductive film; and 1407 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers were formed only by microwave plasma-assisted CVD and p- and n-type semiconductor layers were formed by high-frequency plasma-assisted CVD. Non-uniformity of photoelectric conversion efficiency between modules, which was ±5% when produced using such a comparative apparatus, decreased to ±2% or less.

Example 19

Using the apparatus for continuously forming semiconductor multi-layer deposited films of the present invention as shown in Apparatus Example 9, multi-layer silicon non-monocrystalline semiconductor films of nipnipnip structure were continuously formed in the same manner as in Example 12 except that the belt substrate made of SUS430BA on which the Ag layer and ZnO layer were formed by sputtering was replaced with a belt substrate made of SUS430BA whose surface had been thoroughly cleaned and decreased. Then the unit cells thus obtained were formed into modules. Thus, 35 cm×35 cm solar cell modules comprised of triple-layer tandem solar cells in which photovoltaic elements with different band gaps were formed were continuously produced.

The layer configuration of the solar cells thus produced is diagrammatically shown in FIG. 13.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which SUS430BA is used as the belt substrate, i-type semiconductor layers were formed only by microwave plasma-assisted CVD, and n- and p-type semiconductor layers were formed by high-frequency plasma-assisted CVD. Non-uniformity of photoelectric conversion efficiency between modules, which was ±5% when produced using such an apparatus, decreased to ±2% or less.

Example 20

Using the apparatus for continuously forming multi-layer semiconductor films of the present invention as shown in Apparatus Example 10, three photovoltaic elements of nip structure having i-type semiconductor layers respectively formed of amorphous SiGe, amorphous SiGe, and amorphous Si were successively formed on the substrate to thereby continuously form silicon non-monocrystalline semiconductor multi-layer deposited films of nipnipnip structure, in substantially the same manner as in Example 12 except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the p-type semiconductor layers were formed. Then the unit cells thus obtained were formed into modules. Thus, 35 cm×35 cm solar cell modules comprised of triple-layer tandem solar cells in which photovoltaic elements with different band gaps were formed were continuously produced.

The glow discharge cleaning was carried out using He high-frequency plasma, and the hydrogen plasma treatment was carried out using high-frequency plasma.

Conditions for forming the semiconductor layers in the film-forming chambers 2211 to 2205A in which a first photovoltaic element is fabricated are shown in Table 29, conditions for forming the semiconductor layers in the film-forming chambers 2202B to 2205B in which a second photovoltaic element is fabricated are shown in Table 30, and conditions for forming the semiconductor layers in the film-forming chambers 2202C to 2205C in which a third photovoltaic element is fabricated are shown in Table 31.

Figure 15:
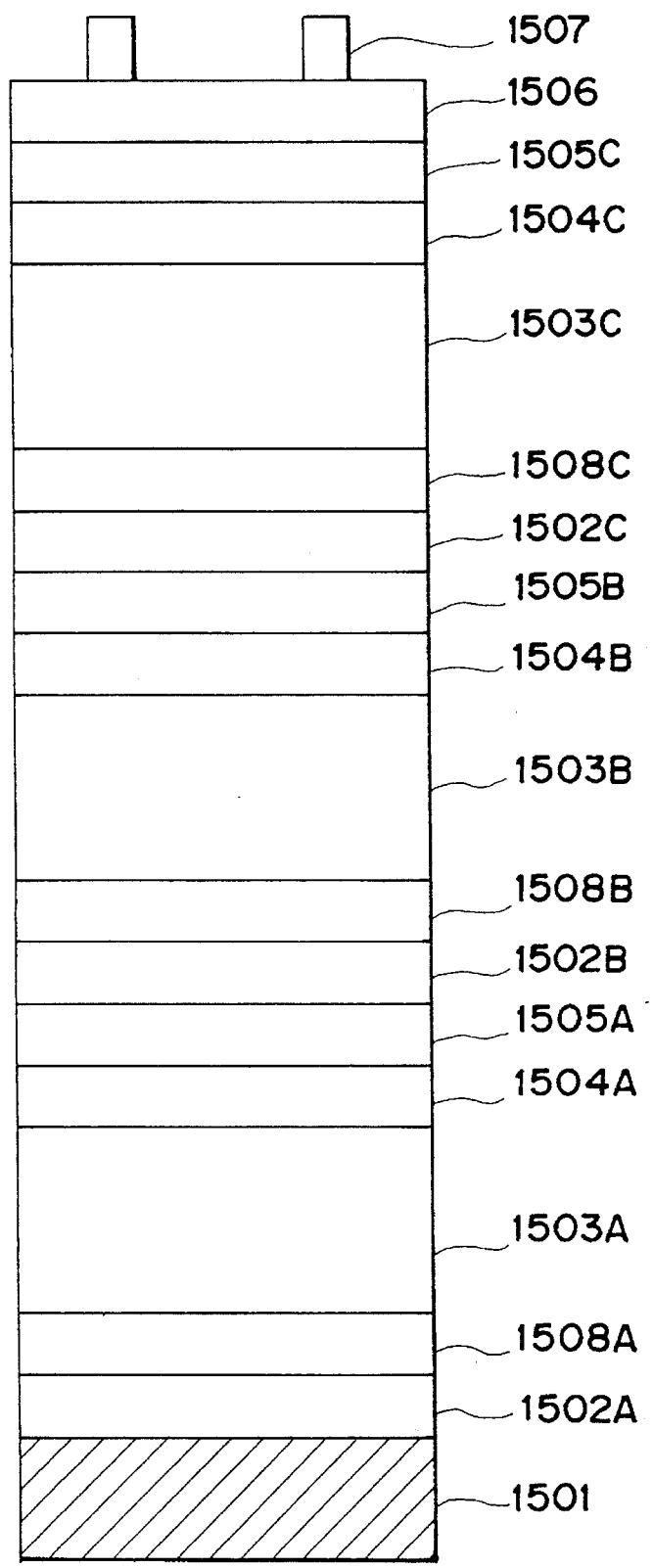
FIG. 15 is a diagrammatic cross section view of still another triple photovoltaic element according to the present invention.

The layer configuration of the solar cells thus produced is diagrammatically shown in FIG. 15.

In FIG. 15, 1501 represents the substrate; 1502A, B and C represent an n-type semiconductor layer formed by high-frequency plasma-assisted CVD; 1508A, B and C represent an i-type semiconductor layer formed by high-frequency plasma assisted CVD; 1503A, B and C represent an i-type semiconductor layer formed by microwave plasma assisted CVD; 1504A, B and C represent an i-type semiconductor layer formed by high-frequency plasma assisted CVD; 1505A, B and C represent a p-type semiconductor layer formed by plasma doping; 1506 represents a transparent conductive film; and 1507 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.22 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±1.5% or less.

Example 21

Using the apparatus for continuously forming multi-layer semiconductor films of the present invention as shown in Apparatus Example 10, three photovoltaic elements of nip structure having i-type semiconductor layers respectively formed of amorphous SiGe, amorphous Si, and amorphous SiC were successively formed on the substrate to thereby continuously form multi-layer silicon non-monocrystalline semiconductor films of nipnipnip structure, in substantially the same manner as in Example 15 except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the p-type semiconductor layers were formed. Then the unit cells thus obtained were formed into modules. Thus, 35 cm×35 cm solar cell modules comprised of triple-layer tandem solar cells in which photovoltaic elements with different band gaps were formed were continuously produced.

The glow discharge cleaning was carried out using He high-frequency plasma, and the hydrogen plasma treatment was carried out using high-frequency plasma.

Conditions for forming the semiconductor layers in the film-forming chambers 2211 to 2205A in which a first photovoltaic element is fabricated are shown in Table 29, conditions for forming the semiconductor layers in the film-forming chambers 2202B to 2205B in which a second photovoltaic element is fabricated are shown in Table 32, and conditions for forming chambers 2202C to 2205C in which a third photovoltaic element is fabricated are shown in Table 33.

The layer configuration of the solar cells thus produced is diagrammatically shown in FIG. 15.

Characteristics of the solar cell modules thus produced were evaluated under exposure to artificial sunlight of AM 1.5 (100 mW/cm$^2$). As a result, they showed an average photoelectric conversion efficiency of as good as 1.22 relative to an average value of 1.00 of the photoelectric conversion efficiency of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to +1.5% or less.

Example 22

Using the apparatus for continuously forming semiconductor multi-layer deposited films of the present invention as shown in Apparatus Example 10, multi-layer silicon non-monocrystalline semiconductor films of nipnipnip structure were continuously formed in substantially the same manner as in Example 18 except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the n-type semiconductor layers were formed. Then the unit cells thus obtained were formed into modules. Thus, solar cell modules comprised of triple-layer tandem solar cells in which photovoltaic elements with different band gaps were formed were continuously produced.

The glow discharge cleaning was carried out using He high-frequency plasma, and the hydrogen plasma treatment was carried out using high-frequency plasma.

Conditions for forming the semiconductor layers in the film-forming chambers 2211 to 2205A in which a first photovoltaic element is fabricated are shown in Table 34, conditions for forming the semiconductor layers in the film-forming chambers 2202B to 2205B in which a second photovoltaic element is fabricated are shown in Table 35, and conditions for forming the semiconductor layers in the film-forming chambers 2202C to 2205C in which a third photovoltaic element is fabricated are shown in Table 36.

Figure 16:
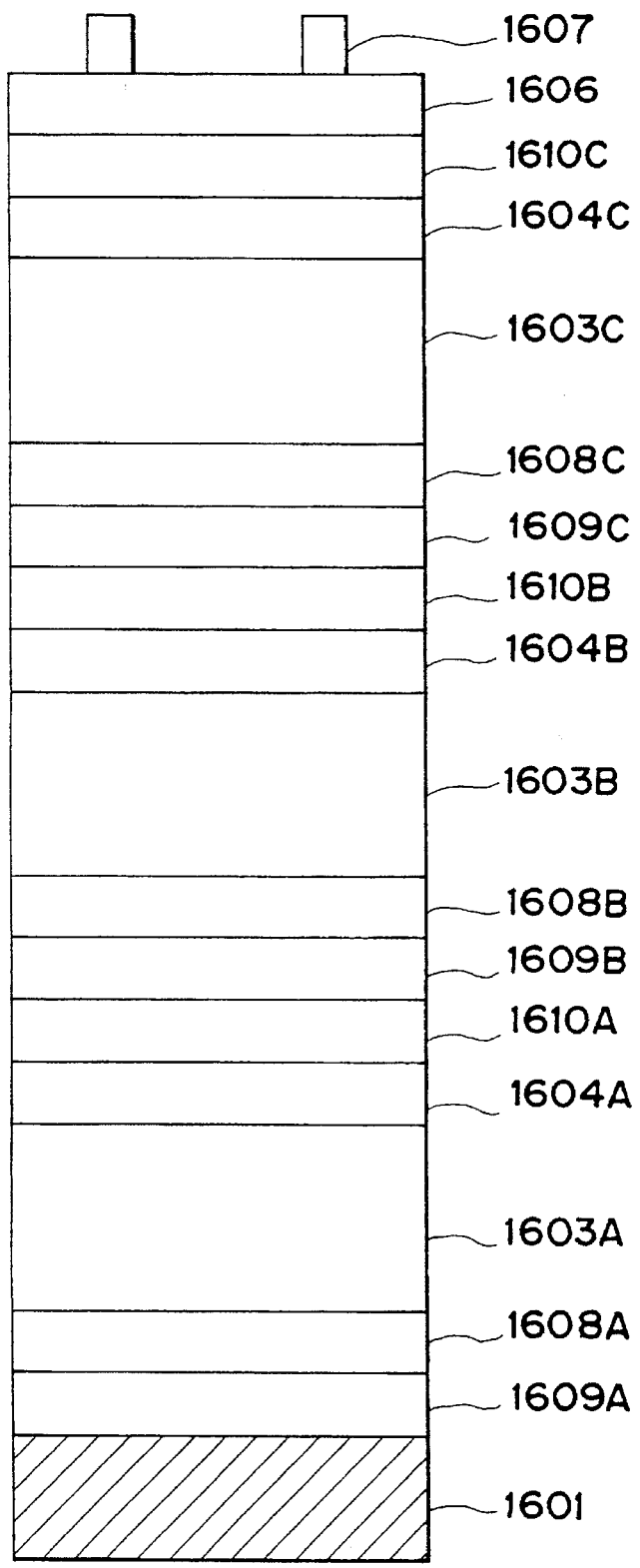
FIG. 16 is a diagrammatic cross section view of a further triple photovoltaic element according to the present invention.

The layer configuration of the solar cells thus produced is diagrammatically shown in FIG. 16.

If FIG. 16, 1601 represents the substrate; 1609A, B and C represent a p-type semiconductor layer formed by high-frequency plasma assisted CVD; 1608A, B and C represent an i-type semiconductor layer formed by high-frequency plasma assisted CVD; 1603A, B and C represent an i-type semiconductor layer formed by microwave plasma assisted CVD; 1604A, B and C represent an i-type semiconductor layer formed by high-frequency plasma assisted CVD; 1610A, B and C represent an n-type semiconductor layer formed by plasma doping; 1606 represents a transparent conductive film; and 1607 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.22 relative to an average value of 1.00 of the photoelectric conversion efficiency of solar cell modules produced using an apparatus of roll-to-roll type in which i-type semiconductor layers were formed only by microwave plasma-assisted CVD and p- and n-type semiconductor layers were formed by high-frequency plasma-assisted CVD. Non-uniformity of photoelectric conversion efficiency between modules, which was ±5% when produced using such a comparative apparatus, decreased to ±1.5% or less.

Example 23

Using the apparatus for continuously forming multi-layer semiconductor films of the present invention as shown in Apparatus Example 10, multi-layer silicon non-monocrystalline semiconductor films of nipnipnip structure were continuously formed in substantially the same manner as in Example 20 except that a broad belt substrate of 36 cm width was used. Then the unit cells thus obtained were formed into modules. Thus, 35 cm×35 cm solar cell modules comprised of triple-layer tandem solar cells in which solar cells with different band gaps were formed were continuously produced.

In the apparatus used in the present preparation example, the width of the belt substrate was three times that use in the apparatus used in Examples 12 to 22. The film-forming chambers, three chambers, three chambers and one chamber, provided inside the microwave plasma-assisted CVD film-forming chambers 2203A, 2203B and 2203C, respectively, were each provided therein with opposed microwave applying means on both sides of the belt substrate, and microwave power was applied into them through a total of six microwave applying means in the film-forming chamber 2203A, a total four microwave applying means in the film-forming chamber 2203B and a total of two microwave applying means in the film-forming chamber 2203C.

The electric fields of the opposed microwave applying means were vertical to each other.

Conditions for forming the semiconductor layers in the film-forming chambers 2211 to 2205A in which a first photovoltaic element is fabricated are shown in Table 37, conditions for forming the semiconductor layers in the film-forming chambers 2202B to 2205B in which a second photovoltaic element is fabricated are shown in Table 38, and conditions for forming the semiconductor layers in the film-forming chambers 2202C to 2205C in which a third photovoltaic element is fabricated are shown in Table 39.

The layer configuration of the solar cells thus produced is diagrammatically shown in FIG. 15.

Characteristics of the solar cell modules thus produced were evaluated under exposure to artificial sunlight of AM 1.5 (100 mW/cm$^2$). As a result, they showed an average photoelectric conversion efficiency of as good as 1.23 relative to the average value of 1.00 of the photoelectric conversion elements of solar cell modules produced using an apparatus of roll-to-roll type in which i-type semiconductor layers were formed only by microwave plasma-assisted CVD and n- and p-type semiconductor layers were formed by high-frequency plasma-assisted CVD. Non-uniformity of photoelectric conversion efficiency between modules, which was ±6% when produced using such a comparative apparatus, decreased to ±2.0% or less, demonstrating that multi-layer semiconductor films for photovoltaic elements having a high quality over a large area were formed in a good uniformity.

Example 24

Using the apparatus for continuously forming multi-layer semiconductor films of the present invention as shown in Apparatus Example 17, three photovoltaic elements of nip structure having i-type semiconductor layers respectively formed of amorphous SiGe, amorphous SiGe, and amorphous Si were successively formed on a belt substrate to thereby continuously form multi-layer silicon non-monocrystalline semiconductor films of nipnipnip structure.

The film-forming chambers 2303A and 2303B, in which the i-type semiconductor layers were formed were each so designed as to have three chambers in which the germanium-containing gas in the starting material gases was in concentrations different from one another so that the germanium content in the i-type semiconductor layers continuously formed in the film-forming chambers 2303A and 2303B was changed to become large-small-large in the layer thickness direction.

First, a belt substrate having a finely irregular surface, comprised of a belt-like stainless steel sheet (12 cm wide× 200 m long×0.15 mm thick) made of SUS430BA on the surface of which an Ag layer 500 nm thick and a transparent conductive ZnO layer about 2 μm thick had been formed by sputtering, was placed in the belt substrate unwind chamber 101 wound around the bobbin 109. The belt substrate was passed through the respective gas gates 107 and film-forming chambers 2302A to 2305C until it stretched to the belt substrate wind-up chamber 106, and a tension was applied thereto the extent that it was not loose. In the belt substrate wind-up chamber 106, a bobbin 112 around which a protective film made of well dried aramid film (trade name: NOMEX, available from Du Pont Co.: 12 cm wide×200 m long×0.05 mm thick) had been wound was installed so that the protective film was rolled up together with the belt substrate.

After the belt substrate was installed, the insides of the chambers 101 to 106 were evacuated by means of vacuum pumps (not shown) comprised of a combination of a rotary pump and a mechanical pump. After evacuating them, He gas was fed, and the insides of the film-forming chambers were heated at about 350° C. in an about 200 Pa atmosphere of He to carry out baking.

After the baking was completed, the chambers 101 to 106 were evacuated. After evacuating the chamber 101, film-forming chambers 2302A, 2304A, 2305A, 2302B, 2304B, 2305B, 2302C, 2304C, 2305C, and chamber 106 by means of vacuum pumps comprised of a combination of a rotary pump and a mechanical pump, connected to the respective chambers, and the film-forming chambers 303A and 2303B by means of two oil diffusion pumps (HS-16, available from Varian Co.) connected to the respective chambers, H$_2$ was fed as a gate gas into the respective gas gates 107 at 500 sccm each, and the respective starting material gases were fed into the film-forming chambers 2302A to 2305C at given flow rates. Then, the divergence of throttle valves provided to the chambers 101 to 106 was controlled so that the belt substrate unwind chamber 101 and wind-up chamber 106 were each set at an internal pressure of 125 PA and the film-forming chambers 2302A, 2303A, 2304A, 2305A, 2302B, 2303B, 2304B, 2305B, 2302C, 2304C and 2305C at internal pressures of 130 Pa, about 1 Pa, 135 Pa, 130 Pa, 130 Pa, about 1 Pa, 135 Pa, 130 Pa, 130 Pa, 135 Pa, and 130 Pa, respectively.

When the pressure in each chamber became stable, the wind-up bobbin in the belt substrate wind-up chamber 106 was rotated to continuously transport the belt substrate 108 at a constant speed of 100 cm/min in the direction from the film-forming chamber 2302A toward the film-forming chamber 2305C. Temperature control systems (not shown) provided in the film-forming chambers 2302A to 2305C were also operated to control temperatures so that the moving belt substrate had a given temperature in the film-forming space in each film-forming chamber.

When the temperature of the belt substrate became stable, high-frequency power of 13.56 MHz was applied into the film-forming chambers 2302A, 2304A, 2302B, 2304B, 2302C and 2304C through parallel flat-plate electrodes; microwave power of 2.45 GHz was fed into the film-forming chambers provided inside the film-forming chambers 2303A and 2303B through microwave guide windows provided in the side walls of the respective film-forming chambers; and low-frequency power of 75 kHz was fed into the film-forming chambers 2305A and 2305B through parallel flat-plate electrodes; all from corresponding power sources via matching boxes. High-frequency power of 13.56 MHz was further applied into the film-forming chambers provided inside the film-forming chambers 2303A and 2303B through rod bias electrodes provided in front of the microwave guide windows and in parallel to the belt substrate, from power sources (not shown) via matching boxes. The lengths of the film-forming chambers 2303A and 2303B in their semiconductor layer forming regions in the direction of the belt substrate movement were each about 20 cm. The lengths of these film-forming chambers in their semiconductor layer forming regions in the direction of belt substrate movement were so adjusted using barrier plates with given lengths (serving also as plasma leak guards) provided between the belt substrate surface and the plasma. Upon application of the discharge power, the starting material gases in the film-forming chambers 2302A to 2305C where changed into plasma, and semiconductor layers were formed on the surface of the belt substrate continuously transported through the respective film-forming chambers, so that semiconductor layers of nipnipnip structure were continuously formed on the surface of the belt substrate.

Conditions for forming the semiconductor layers in the film-forming chambers 2302A to 2305A in which a first photovoltaic element is fabricated are shown in Table 40, conditions for forming the semiconductor layers in the film-forming chambers 2102B to 2105B in which a second photovoltaic element is fabricated are shown in Table 41, and conditions for forming the semiconductor layers in the film-forming chambers 2302C to 2305C in which a third photovoltaic element is fabricated are shown in Table 42.

The belt substrate was moved for 180 minutes after the start of its transport, during which time the semiconductor layers were continuously formed for 170 minutes.

After the semiconductor layers were formed in a substrate length of about 170 m, the application of discharge power, the feeding of starting material gases and the heating of the belt substrate and film forming chambers were stopped, and the insides of the film-forming chambers were purged. After the belt substrate and the insides of the film-forming chambers were well cooled, the apparatus was opened to take out the belt substrate (with semiconductor layers) wound around the bobbin 110, from the belt substrate wind-up chamber 106 to the outside of the apparatus.

The belt substrate thus removed was further continuously processed using a continuous modularized apparatus, where a 70 nm thick ITO ($In_2O_3+SnO_2$) thin film was formed as a transparent electrode over the entire surface of the multi-layer semiconductor films formed using the apparatus of the present invention, and thin-line Ag electrodes were formed thereon as collector electrodes at given intervals and then the unit cells were formed into modules, e.g., in series. Thus, 35 cm×35 cm solar cell modules comprised of triple-layer tandem solar cells in which photovoltaic elements with different band gaps were formed were continuously produced.

Figure 17:
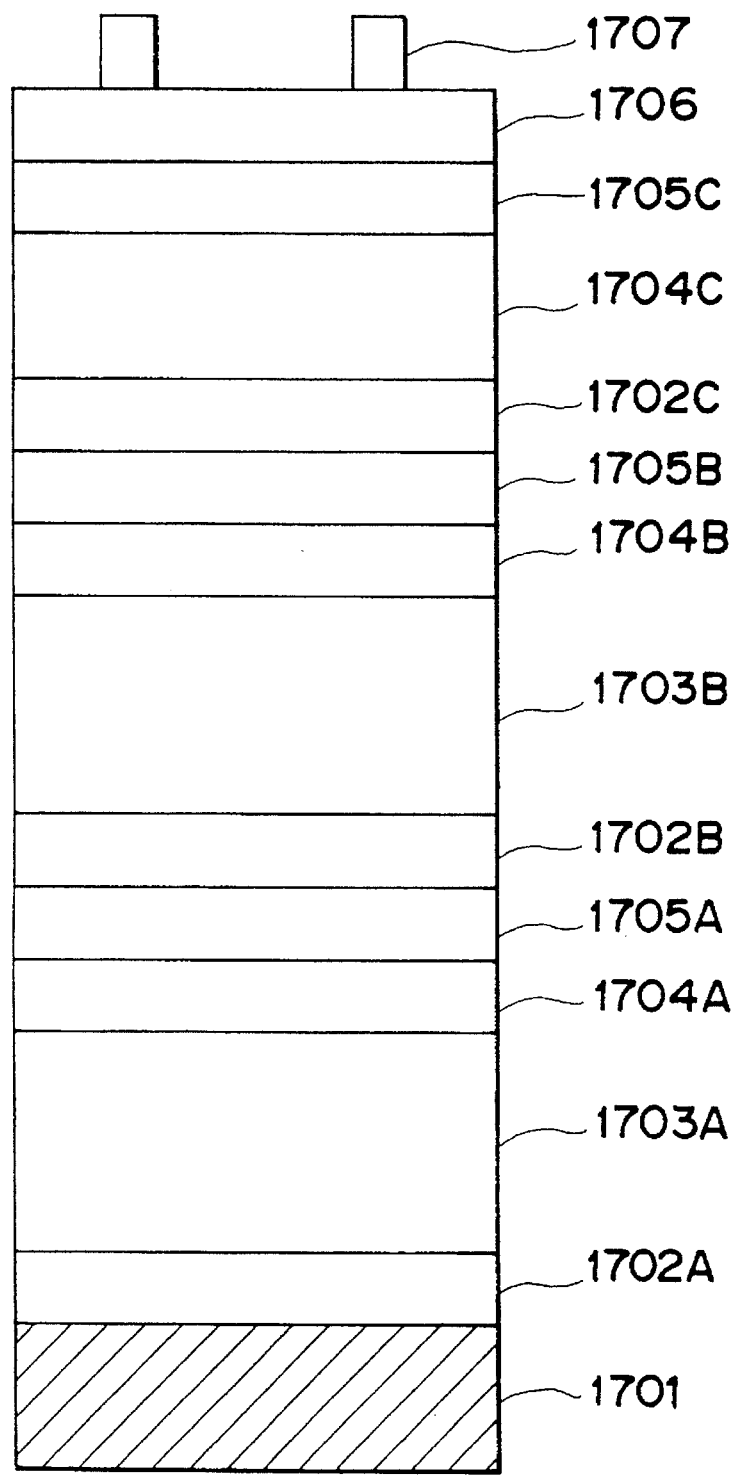
FIG. 17 is a diagrammatic cross section view of still further triple photovoltaic element according to the present invention.

The layer configuration of the solar cells thus produced is diagrammatically shown in FIG. 17.

In FIG. 17, 1701 represents the substrate; 1702A, B and C represent an n-type semiconductor layer formed by high-frequency plasma-assisted CVD; 1703A and B represent an i-type semiconductor layer formed by microwave plasma-assisted CVD; 1704A, B and C represent an i-type semiconductor layer formed by high-frequency plasma-assisted CVD; 1705A, B and C represent a p-type semiconductor layer formed by plasma doping; 1706 represents a transparent conductive film; and 1707 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.18 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a conventional apparatus, decreased to ±2% or less.

Comparative Example 24-1

Using an apparatus with a conventionally known construction where the film-forming chambers 2304A and 2304B in which i-type semiconductor layers were formed by high-frequency plasma-assisted CVD were removed from the apparatus of the present invention shown in Apparatus Example 17 and the p-type semiconductor layer film-forming chambers 2305A, 2305B, and 2305C were replaced with high-frequency plasma-assisted CVD film-forming chambers, multi-layer silicon non-monocrystalline semiconductor films of nipnipnip structure for use in photovoltaic elements were continuously formed to produce solar cell modules in the same manner as in Example 24 except that the i-type semiconductor layers formed by microwave plasma-assisted CVD on the i-type semiconductor layer formed by microwave plasma-assisted CVD were not formed and the p-type semiconductor layers were formed by high frequency plasma-assisted CVD.

Conditions for forming the semiconductor layers in the film-forming chambers 2302A to 2305A in which a first photovoltaic element is fabricated are shown in Table 43, conditions for forming the semiconductor layers in the film-forming chambers 2302B to 2305B in which a second photovoltaic element is fabricated are shown in Table 44, and conditions for forming the semiconductor layers in the film-forming chambers 2302C to 2305C in which a third photovoltaic element is fabricated are shown in Table 45.

Characteristics of the solar cell modules thus produced were evaluated under exposure to artificial sunlight of AM 1.5 (100 mW/cm$^2$). As a result, they showed an average photoelectric conversion efficiency of as low as 1.00 relative to an average value of 1.18 of the photoelectric conversion efficiency of the solar cell modules produced in Example 24. Non-uniformity of photoelectric conversion efficiency between modules was also as large as ±5%.

Comparative Example 24-2

Using an apparatus wherein the p-type semiconductor layer film-forming chambers 2305A and 2305B of the apparatus of the present invention shown in Apparatus Example 17 were replaced with high-frequency plasma-assisted CVD film-forming chambers, multi-layer silicon non-monocrystalline semiconductor films of nipnipnip structure were continuously formed to produce solar cell modules in the same manner as in Example 24 except that the p-type semiconductor layers were formed by high-frequency plasma-assisted CVD.

Conditions for forming the semiconductor layers in the film-forming chambers 2302A to 2305A in which a first photovoltaic element is fabricated are shown in Table 46, conditions for forming the semiconductor layers in the film-forming chambers 2302B to 2305B in which a second photovoltaic element is fabricated are shown in Table 47, and conditions for forming the semiconductor layers in the film-forming chambers 2302C to 2305C in which a third photovoltaic element is fabricated are shown in Table 49.

Characteristics of the solar cell modules thus produced were evaluated under exposure to artificial sunlight of AM 1.5 (100 mW/cm$^2$). As a result, they showed an average photoelectric conversion efficiency of as low as 1.03 relative to an average value of 1.18 of the photoelectric conversion efficiency of the solar cell modules produced in Example 24. Non-uniformity of photoelectric conversion efficiency between modules was also as large as ±5%.

Example 25

Using the apparatus for continuously forming multi-layer semiconductor films of the present invention as shown in Apparatus Example 17, three photovoltaic elements of nip structure having i-type semiconductor layers respectively formed of amorphous SiGe, amorphous Si, and amorphous Si were successively formed on the substrate to thereby continuously form multi-layer silicon non-monocrystalline films of nipnipnip structure, in the same manner as in Example 24 except that the i-type semiconductor layers formed in the film-forming chamber 2303B were replaced with films formed of amorphous silicon. Then the unit cells obtained were formed into modules. Thus, 35 cm×35 cm solar cell modules comprised of triple-layer tandem solar cells were continuously produced. Conditions for forming the semiconductor layers in the film-forming chambers 2302A to 2305A in which a first photovoltaic element was fabricated and conditions for forming the semiconductor layers in the film-forming chambers 2302A to 2305C in which a first photovoltaic element was fabricated were the same as those in Example 24 as shown in Tables 40 and 42, respectively. Only the conditions for forming the semiconductor layers in the film-forming chambers 2302B to 2305B in which a second photovoltaic element was fabricated were changed as shown in Table 48.

The layer configuration of the solar cells thus produced is diagrammatically shown in FIG. 17.

Characteristics of the solar cell modules thus produced were evaluated under exposure to artificial sunlight of AM 1.5 (100 mW/cm$^2$). As a result, they showed an average photoelectric conversion efficiency of as good as 1.13 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Comparative Example 25-1

Using the apparatus with a conventionally known construction wherein the film-forming chambers 2304A and 2304B in which i-type semiconductor layers were formed by high-frequency plasma-assisted CVD were removed from the apparatus of the present invention shown in Apparatus Example 17 and the p-type semiconductor layer film-forming chambers 2305A, 2305B, and 2305C were replaced with high-frequency plasma-assisted CVD film-forming chambers, multi-layer silicon non-monocrystalline semiconductor films of nipnipnip structure for use in photovoltaic elements were continuously formed to produce solar cell modules in the same manner as in Example 25 except that the i-type semiconductor layers formed by high-frequency plasma-assisted CVD were not formed and the p-type semiconductor layers were formed by high-frequency plasma-assisted CVD. Conditions for forming the semiconductor layers in the film-forming chambers 2302A to 2305A in which a first photovoltaic element was fabricated and conditions for forming the semiconductor layers in the film-forming chambers 2302C to 2305C in which a third photovoltaic element was fabricated were the same as those in Comparative Example 24-1 as shown in Tables 43 and 45, respectively. Only the conditions for forming the semiconductor layers in the film-forming chambers 2302B to 2305B in which a third photovoltaic element was fabricated were changed as shown in Table 49.

Characteristics of the solar cell modules thus produced were evaluated under exposure to artificial sunlight of AM 1.5 (100 mW/cm$^2$). As a result, they showed an average photoelectric conversion efficiency of as low as 1.00 relative to an average value of 1.13 of the photoelectric conversion efficiency of solar cell modules produced in Example 25. Non-uniformity of photoelectric conversion efficiency between modules was also as large as ±5%.

Comparative Example 25-2

Using an apparatus wherein the p-type semiconductor layer film-forming chambers 2305A, 2305B, and 2305C of the apparatus for continuously forming semiconductor multi-layer deposited films of the present invention shown in Apparatus Example 17 was replaced with high-frequency plasma-assisted CVD film-forming chambers, multi-layer silicon non-monocrystalline semiconductor films of nipnipnip structure were continuously formed to produce solar cell modules in the same manner as in Example 25, except that the p-type semiconductor layers were formed by high-frequency plasma-assisted CVD. Conditions for forming the semiconductor layers in the film-forming chambers 2302A to 2305A in which a first photovoltaic element was fabricated and conditions for forming the semiconductor layers in the film-forming chambers 2302C to 2305C in which a third photovoltaic element was fabricated were the same as those in Comparative Example 24-2 as shown in Tables 46 and 45, respectively. Only the conditions for forming the semiconductor layers in the film-forming chambers 2302B to 2305B in which a third photovoltaic element was fabricated were changed as shown in Table 50.

Characteristics of the solar cell modules thus produced were evaluated under exposure to artificial sunlight of AM 1.5 (100 mW/cm$^2$). As a result, they showed an average photoelectric conversion efficiency of as low as 1.03 relative to an average value of 1.13 of the photoelectric conversion efficiency of the solar cell modules produced in Example 25. Non-uniformity of photoelectric conversion efficiency between modules was also as large as ±5%.

Example 26

Using the apparatus for continuously forming semiconductor multi-layer deposited films of the present invention as shown in Apparatus Example 17, three photovoltaic elements of nip structure having i-type semiconductor layers respectively formed of amorphous SiGe, amorphous SiGe, and amorphous SiC were successively formed on the substrate to thereby continuously form multi-layer silicon non-monocrystalline semiconductor films of nipnipnip structure, in the same manner as in Example 24 except that the i-type semiconductor layers formed in the film-forming chamber 2304C was replaced with those formed of amorphous SiC. Then the unit cells thus obtained were formed into modules. Thus, 35 cm×35 cm solar cell modules comprised of triple-layer tandem solar cells were continuously produced. Conditions for forming the semiconductor layers in the film-forming chambers 2302A to 2305A in which a first photovoltaic element was fabricated and conditions for forming the semiconductor layers in the film-forming chambers 2302B to 2305B in which a second photovoltaic element was fabricated were the same as those in Example 24 as shown in Tables 40 and 41, respectively. Only the conditions for forming the semiconductor layers in the film-forming chambers 2302C to 2305C in which a third photovoltaic element was fabricated were changed as shown in Table 51.

The layer configuration of the solar cells thus produced is diagrammatically shown in FIG. 17.

Characteristics of the solar cell modules thus produced were evaluated under exposure to artificial sunlight of AM 1.5 (100 mW/cm$^2$). As a result, they showed an average photoelectric conversion efficiency of as good as 1.18 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 27

Using the apparatus for continuously forming semiconductor multi-layer deposited films of the present invention as shown in Apparatus Example 17, three photovoltaic elements of nip structure having i-type semiconductor layers respectively formed of amorphous SiGe, amorphous Si, and amorphous SiC were successively formed on the substrate to thereby continuously form multi-layer silicon non-monocrystalline semiconductor films of nipnipnip structure, in the same manner as in Example 25 except that the i-type semiconductor layers formed in the film-forming chamber 2304C was replaced with those formed of amorphous SiC. Then the unit cells thereby obtained were formed into modules. Thus, 35 cm×35 cm solar cell modules comprised of triple-layer tandem solar cells were continuously produced. Conditions for forming the semiconductor layers in the film-forming chambers 2302A to 2305A in which a first photovoltaic element was fabricated and conditions for forming the semiconductor layers in the film-forming chambers 2302B to 2305B in which a second photovoltaic element was fabricated were the same as those in Example 25 as shown in Tables 40 and 48, respectively. Only the conditions for forming the semiconductor layers in the film-forming chambers 2302C to 2305C in which a third photovoltaic element was fabricated were changed as shown in Table 52.

The layer configuration of the solar cells produced is diagrammatically shown in FIG. 17.

Characteristics of the solar cell modules thus produced were evaluated under exposure to artificial sunlight of AM 1.5 (100 mW/cm$^2$). As a result, they showed an average photoelectric conversion efficiency of as good as 1.18 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 28

Using the apparatus for continuously forming multi-layer semiconductor films of the present invention as shown in Apparatus Example 17, multi-layer silicon non-monocrystalline semiconductor films of nipnipnip structure were continuously formed in the same manner as in Example 24 except that the 75 kHz frequency of the discharge power in the film-forming chambers 2305A, 2305B, and 2305C in which p-type semiconductor layers were formed by plasma doping was changed to 400 kHz. Then the unit cells thus obtained were formed into modules. Thus, 35 cm×35 cm solar cell modules comprised of triple-layer tandem solar cells in which photovoltaic elements with different band gaps were formed were continuously produced.

The layer configuration of the solar cells thus produced is diagrammatically shown in FIG. 17.

Characteristics of the solar cell modules thus produced were evaluated under exposure to artificial sunlight of AM 1.5 (100 mW/cm$^2$). As a result, i they showed an average photoelectric conversion efficiency of as good as 1.18 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 29

Using the apparatus for continuously forming multi-layer semiconductor films of the present invention as shown in Apparatus Example 17, multi-layer silicon non-monocrystalline semiconductor films of nipnipnip structure were continuously formed in the same manner as in Example 24 except that SiH$_4$ gas was added in an amount of 3 sccm to the starting material gases fed into the film-forming chambers 2305A, 2305B, and 2305C in which p-type semiconductor layers were formed by plasma doping, which was small enough for forming about 10 nm thick semiconductor layers by deposition. Then the unit cells thus obtained were formed into modules. Thus, 35 cm×35 cm solar cell modules comprised of triple-layer tandem solar cells in which photovoltaic elements with different band gaps were formed were continuously produced.

The layer configuration of the solar cells thus produced is diagrammatically shown in FIG. 17.

Characteristics of the solar cell modules thus produced were evaluated under exposure to artificial sunlight of AM 1.5 (100 mW/cm$^2$). As a result, they showed an average photoelectric conversion efficiency of as good as 1.16 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Comparative Example 29

Multi-layer silicon non-monocrystalline semiconductor films of nipnipnip structure were continuously formed to produce solar cell modules in the same manner as in Example 29 except that SiH$_4$ gas was added in an amount of 30 sccm to the starting material gases fed into the p-type semiconductor layer film-forming chambers of the apparatus of the present invention shown in Apparatus Example 17, which was large enough to form about 10 nm thick semiconductor layers by deposition.

Characteristics of the solar cell modules thus produced were evaluated under exposure to artificial sunlight of AM 1.5 (100 mW/cm$^2$). As a result, they showed an average photoelectric conversion efficiency of as low as 0.85 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules was also as large as ±6%.

Example 30

Using the apparatus for continuously forming multi-layer semiconductor films of the present invention as shown in Apparatus Example 17, multi-layer silicon non-monocrystalline semiconductor films of pinpinpin structure were continuously formed in the same manner as in Example 24, except that the conductivity types of the semiconductor layers were reversed so that the p-type semiconductor layers were formed in film-forming chambers 2302A, 2302B, and 2302C and n-type semiconductor layers in film-forming chambers 2305A, 2305B, and 2305C. Then the unit cells thus obtained were formed into modules. Thus 35 cm×35 cm solar cell modules comprised of triple-layer tandem solar cells in which photovoltaic elements with different band gaps were formed were continuously produced.

Conditions for forming the semiconductor layers in the film-forming chambers 2302A to 2305A in which a first photovoltaic element is fabricated are shown in Table 52, conditions for forming the semiconductor layers in the film-forming chambers 2302B to 2305B in which a second photovoltaic element is fabricated are shown in Table 53, and conditions for forming the semiconductor layers in the film-forming chambers 2302C to 2305C in which a third photovoltaic element is fabricated are shown in Table 54. The layer configuration of the solar cells thereby produced is diagrammatically shown in FIG. 18.

Figure 18:
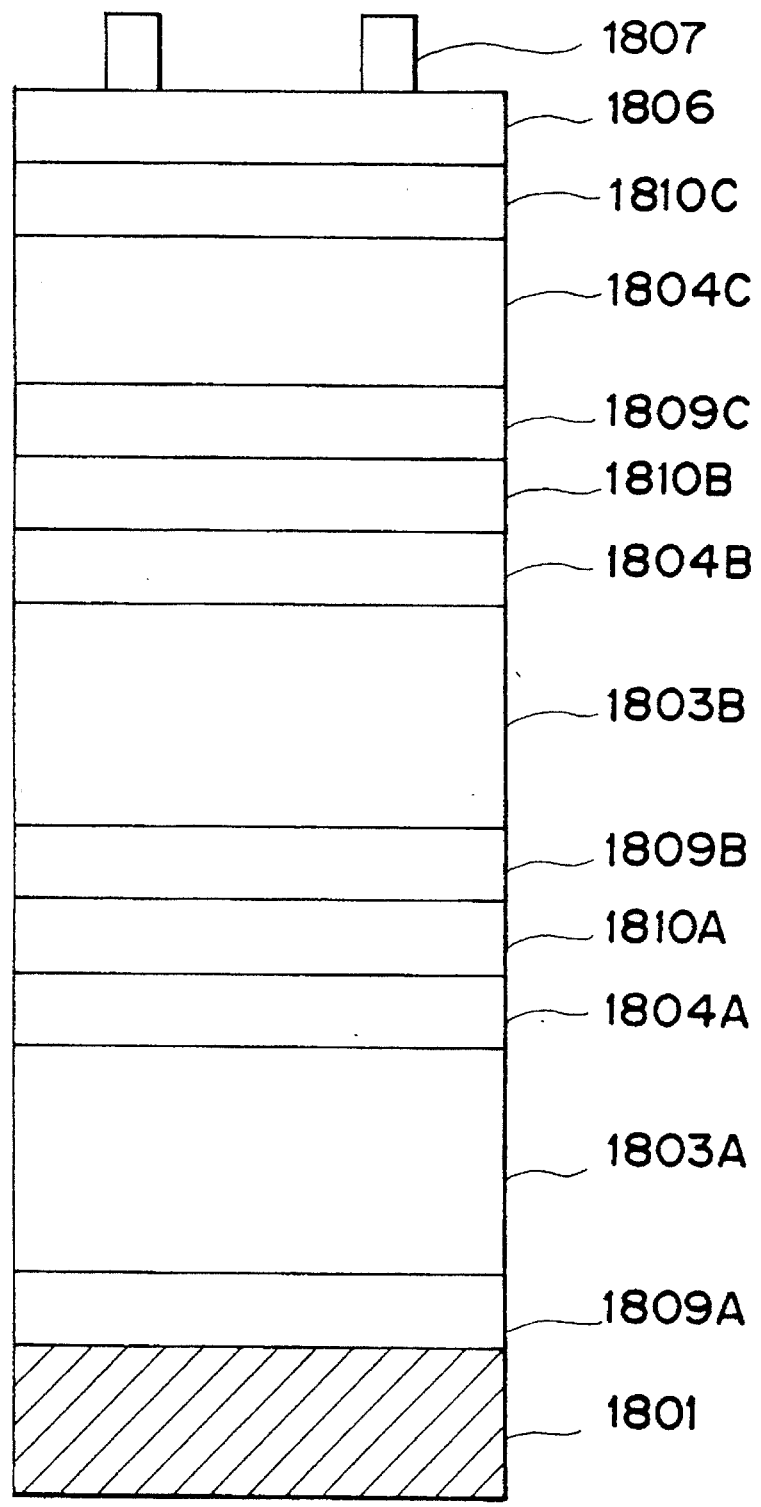
FIG. 18 is a diagrammatic cross section view of a still further triple photovoltaic element according to the present invention.

In FIG. 18, 1801 represents the substrate; 1809A, B and C represent a p-type semiconductor layer formed by high-frequency plasma assisted CVD; 1803A and B represent an i-type semiconductor layer formed by microwave plasma assisted CVD; 1804A, B and C represent an i-type semiconductor layer formed by high-frequency plasma assisted CVD; 1810A, B and C represent an n-type semiconductor layer formed by plasma doping; 1806 represents a transparent conductive film; and 1807 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.18 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 31

Using the apparatus for continuously forming multi-layer semiconductor films of the present invention as shown in Apparatus Example 17, multi-layer silicon non-monocrystalline semiconductor films of nipnipnip structure were continuously formed in the same manner as in Example 24, except that the belt substrate made of SUS430BA on which the Ag layer and ZnO layer formed by sputtering was replaced with a belt substrate made of SUS430BA whose surface has been thoroughly cleaned and degreased. Then the unit cells thus obtained were formed into modules. Thus, 35 cm×35 cm solar cell modules comprised of triple-layer tandem solar cells in which photovoltaic elements with different band gaps were formed were continuously produced.

The layer configuration of the solar cells thus produced is diagrammatically shown in FIG. 17.

Characteristics of the solar cell modules thus produced were evaluated under exposure to artificial sunlight of AM 1.5 (100 mW/cm$^2$). As a result, they showed an average photoelectric conversion efficiency of as good as 1.18 relative to an average value of 1.00 of the photoelectric conversion efficiency of solar cell modules produced using an apparatus of roll-to-roll type in which SUS430BA is used as the belt substrate, i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±2% or less.

Example 32

Using the apparatus for continuously forming multi-layer semiconductor films of the present invention as shown in Apparatus Example 18, three photovoltaic elements of nip structure having i-type semiconductor layers respectively formed of amorphous SiGe, amorphous SiGe, and amorphous Si were successively formed on the substrate to thereby continuously form multi-layer silicon non-monocrystalline semiconductor films of nipnipnip structure, in substantially the same manner as in Example 24 except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the p-type semiconductor layers were formed. Then the unit cells thus obtained were formed into modules. Thus 35 cm×35 cm solar cell modules comprised of triple-layer tandem solar cells in which photovoltaic elements with different band gaps were formed were continuously produced. The glow discharge cleaning was carried out using He high-frequency plasma, and the hydrogen plasma treatment was carried out using high-frequency plasma.

Conditions for forming the semiconductor layers in the film-forming chambers 2411 to 2405A in which a first photovoltaic element is fabricated are shown in Table 55, conditions for forming the semiconductor layers in the film-forming chambers 2402B to 2405B in which a second photovoltaic element is fabricated are shown in Table 56, and conditions for forming the semiconductor layers in the film-forming chambers 2402C to 2405C in which a third photovoltaic element is fabricated are shown in Table 57. The layer configuration of the solar cells thereby produced is diagrammatically shown in FIG. 19.

Figure 19:
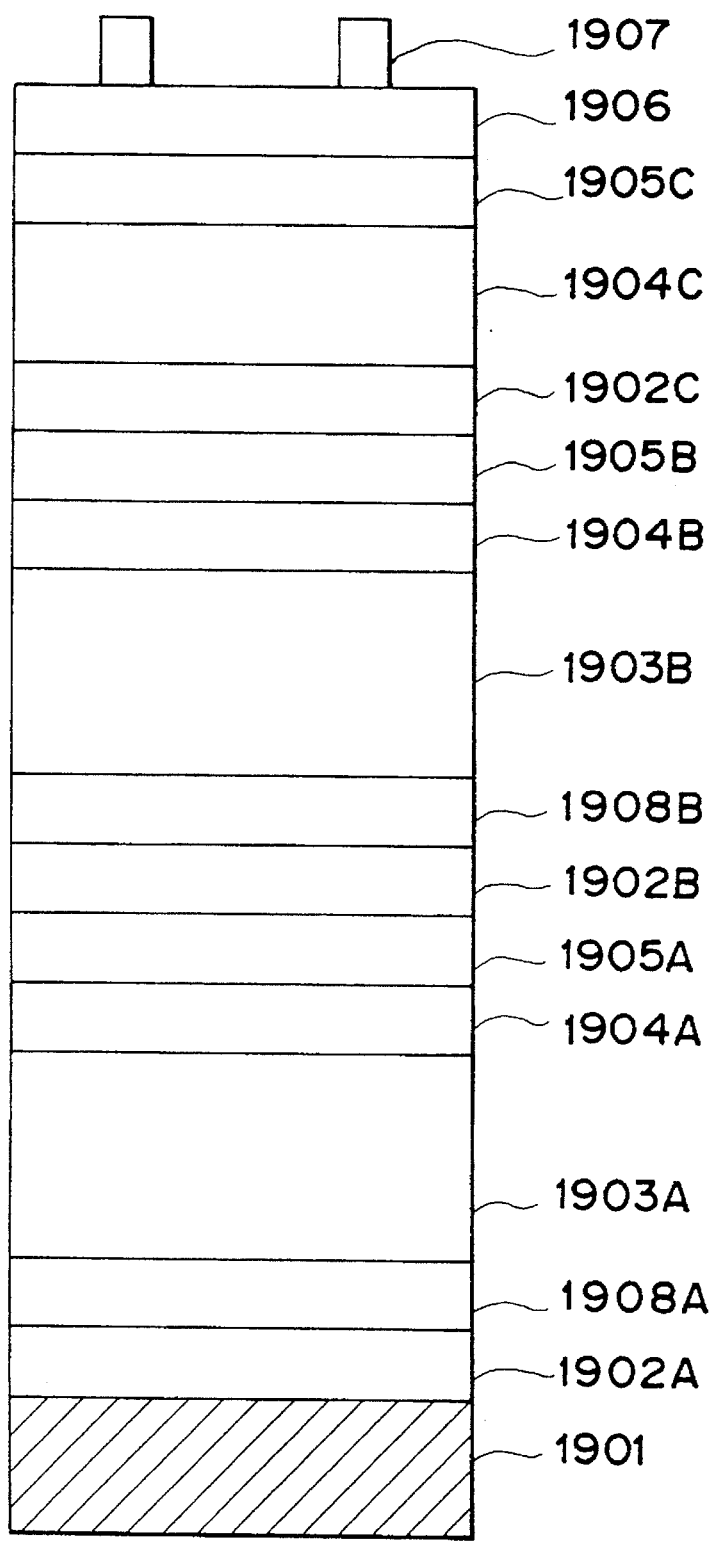
FIG. 19 is a diagrammatic cross section view of a still further triple photovoltaic element according to the present invention.

In FIG. 19, 1901 represents the substrate; 1902A, B and C represent an n-type semiconductor layer formed by high-frequency plasma-assisted CVD; 1908A and B represent an i-type semiconductor layer formed by high frequency plasma assisted CVD; 1903A and B represent an i-type semiconductor layer formed by microwave plasma assisted CVD; 1904A, B and C represent an i-type semiconductor layer formed by high frequency plasma assisted CVD; 1905A, B and C represent a p-type semiconductor layer formed by plasma doping; 1906 represents a transparent conductive film; and 1907 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±5% when produced using such a comparative apparatus, decreased to ±1.5% or less.

Example 33

Using the apparatus for continuously forming multi-layer semiconductor films of the present invention as shown in Apparatus Example 18, three photovoltaic elements of nip structure having i-type semiconductor layers respectively formed of amorphous SiGe, amorphous Si, and amorphous SiC were successively formed on the substrate to thereby continuously form multi-layer silicon non-monocrystalline semiconductor films of nipnipnip structure, in substantially the same manner as in Example 27, except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the p-type semiconductor layers were formed. Then the unit cells thus obtained were formed into modules. Thus, 35 cm×35 cm solar cell modules comprised of triple-layer tandem solar cells in which photovoltaic elements with different band gaps were formed were continuously produced. The glow discharge cleaning was carried out using He high-frequency plasma, and the hydrogen plasma treatment was carried out using high-frequency plasma.

Conditions for forming the semiconductor layers in the film-forming chambers 2411 to 2405A in which a first photovoltaic element is fabricated are shown in Table 55, conditions for forming the semiconductor layers in the film-forming the semiconductor layers in the film-forming chambers 2402B to 2405B in which a second photovoltaic element is fabricated are shown in Table 58, and conditions for forming the semiconductor layers in the film-forming chambers 2402C to 2405C in which a third photovoltaic element is fabricated are shown in Table 59. The layer configuration of the solar cells thereby produced is diagrammatically shown in FIG. 19.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD.

Non-uniformity of photoelectric conversion efficiency between modules, which was ±5% when produced using such a comparative apparatus, decreased to ±1.5% or less.

Example 34

Using the apparatus for continuously forming multi-layer semiconductor films of the present invention as shown in Apparatus Example 18, multi-layer silicon non-monocrystalline semiconductor films of pinpinpin structure were continuously formed in substantially the same manner as in Example 30, except that the surface of the belt substrate was cleaned by glow discharge, i-type semiconductor layers were formed by high-frequency plasma-assisted CVD before the i-type semiconductor layers were formed by microwave plasma-assisted CVD, and the surfaces of the i-type semiconductor layers were treated with hydrogen plasma before the n-type semiconductor layers were formed. Then the unit cells thus obtained were formed into modules. Thus, solar cell modules comprised of triple-layer tandem solar cells in which photovoltaic elements with different band gaps were formed were continuously produced. The glow discharge cleaning was carried out using He high-frequency plasma, and the hydrogen plasma treatment was carried out using high-frequency plasma.

Conditions for forming the semiconductor layers in the film-forming chambers 2411 to 2405A in which a first photovoltaic element is fabricated are shown in Table 60, conditions for forming the semiconductor layers in the film-forming chambers 2402B to 2405B in which a second photovoltaic element is fabricated are shown in Table 61, and conditions for forming the semiconductor layers in the film-forming chambers 2402C to 2405C in which a third photovoltaic element is fabricated are shown in Table 62. The layer configuration of the solar cells produced is diagrammatically shown in FIG. 20.

Figure 20:
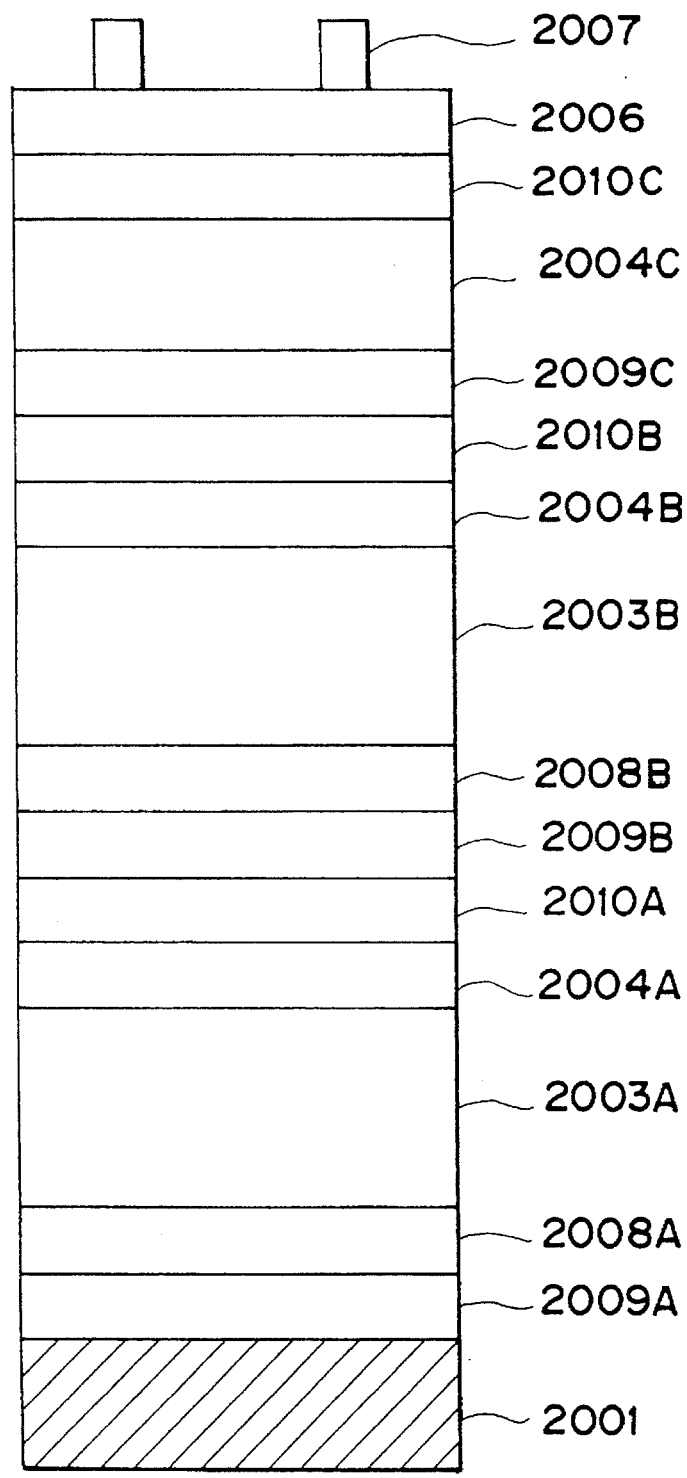
FIG. 20 is a diagrammatic cross section view of a still further triple photovoltaic element according to the present invention.

In FIG. 20, 2001 represents the substrate; 2009A, B and C represent a p-type semiconductor layer formed by high-frequency plasma assisted CVD; 2008A and B represent an i-type semiconductor layer formed by high frequency plasma assisted CVD; 2003A and B represent an i-type semiconductor layer formed by microwave plasma assisted CVD; 2004A, B and C represent an i-type semiconductor layer formed by high frequency plasma assisted CVD; 2010A, B and C represent an n-type semiconductor layer formed by plasma doping; 2006 represents a transparent conductive film; and 2007 represents a current collecting electrode.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and p- and n-type semiconductor layers were formed by high-frequency plasma-assisted CVD. Non-uniformity of photoelectric conversion efficiency between modules, which was ±5% when produced using such a comparative apparatus, decreased to ±1.5% or less.

Example 35

Using the apparatus for continuously forming multi-layer semiconductor films of the present invention as shown in Apparatus Example 18, multi-layer silicon non-monocrystalline semiconductor films of nipnipnip structure were continuously formed in substantially the same manner as in Example 32 except that a broad belt substrate of 36 cm width was used. Then the unit cells thus obtained were formed into modules. Thus, 35 cm×35 cm solar cell modules comprised of triple-layer tandem solar cells in which solar cells with different band gaps were formed were continuously produced.

In the apparatus used in the present preparation example, the belt substrate was three times as wide as that in the apparatus used in Examples 24 to 34. The film-forming chambers, three chambers provided inside the microwave plasma-assisted CVD film-forming chambers 2403A and 2403B each, were each provided therein with opposed microwave applying means on both sides of the belt substrate, and microwave power was applied into them through a total of six microwave applying means in the film-forming chamber 2403A and film-forming chamber 2403B. The electric fields of the microwave applying means opposingly provided were vertical to each other.

Conditions for forming the semiconductor layers in the film-forming chambers 2411 to 2405A in which a first photovoltaic element is fabricated are shown in Table 63, conditions for forming the semiconductor layers in the film-forming the semiconductor layers in the film-forming chambers 2402B to 2405B in which a second photovoltaic element is fabricated are shown in Table 64, and conditions for forming the semiconductor layers in the film-forming chambers 2402C to 2405C in which a third photovoltaic element is fabricated are shown in Table 65. The layer configuration of the solar cells thus produced is diagrammatically shown in FIG. 19.

Characteristics of the solar cell modules thus produced were evaluated under exposure to artificial sunlight of AM 1.5 (100 mW/cm$^2$). As a result, they showed an average photoelectric conversion efficiency of as good as 1.20 relative to an average value of 1.00 of the photoelectric conversion efficiency of solar cell modules produced using an apparatus of roll-to-roll type in which i-type semiconductor layers of photovoltaic elements firstly and secondly formed on the substrate were formed only by microwave plasma-assisted CVD and n- and p-type semiconductor layers were formed by high-frequency plasma-assisted CVD. Non-uniformity of photoelectric conversion efficiency between modules, which was ±6% when produced using such a comparative apparatus, decreased to ±2.0% or less, demonstrating that semiconductor multi-layer deposited films for photovoltaic elements having a high quality over a large area were formed in a good uniformity.

In the following tables, "HF" stands for high-frequency; "μW" for microwave; "plasma CVD" for plasma-assisted CVD (chemical vapor deposition); "a-Si" for amorphous silicon; "LF" for low-frequency; and "a-SiGe" for amorphous silicon germanium.

According to the present invention, it is possible by the roll-to-roll system to form a multi-layered semiconductor film for a photovoltaic element of high quality in a large area without nonuniformity and unevenness in characteristics, at a high formation rate and in a continuous manner.

According to the present invention, it is further possible to form a multi-layered semiconductor film for a photovoltaic element of a multi-layer type which is reduced in photo-deterioration and can provide high photoelectric conversion efficiency and output voltage, in a large area at a high formation rate in a continuous manner.

TABLE 1

| Film-forming conditions | Film-forming chambers | | | | | |
|---|---|---|---|---|---|---|
| | 102 | 103(1) | 103(2) | 103(3) | 104 | 105 |
| Semiconductor layer, formed by: | HF plasma CVD | μW plasma CVD | μW plasma CVD | μW plasma CVD | HF plasma CVD | Plasma doping |
| Semiconductor layer, formed of: (nm) | n-Type a-Si 30 | i-Type a-Si 100 | i-Type a-Si 100 | i-Type a-Si 100 | i-Type a-Si 20 | p-Type a-Si about 10 |
| Region length*: (cm) | 100 | 20 | 20 | 20 | 60 | 100 |
| Material gases: (sccm) | SiH$_4$ 200 PH$_3$ 5 H$_2$ 2,000 | SiH$_4$ 150 H$_2$ 200 | SiH$_4$ 150 H$_2$ 200 | SiH$_4$ 150 H$_2$ 200 | SiH$_4$ 150 H$_2$ 1,500 | BF$_3$ 1 H$_2$ 500 |
| Chamber internal pressure: (Pa) | 130 | 0.9 | 1 | 0.9 | 135 | 130 |
| Belt substrate temp.: (°C.) | 350 | 350 | 350 | 350 | 300 | 150 |
| Discharge power: (W) | HF 13.56 MHz 200 | μW 2.45 GHz 300 | μW 2.45 GHz 300 | μW 2.45 GHz 300 | HF 13.56 MHz 150 | LF75kHz 1,000 |
| Bias power: (W) | — | HF 13.56 MHz 600 | HF 13.56 MHz 600 | HF 13.56 MHz 600 | — | — |

*Semiconductor layer forming region length in the direction of belt subtrate transport

TABLE 2

| Film-forming conditions | Film-forming chambers | | | | |
|---|---|---|---|---|---|
| | 102 | 103(1) | 103(2) | 103(3) | 105 |
| Semiconductor layer formed by: | HF plasma CVD | μW plasma CVD | μW plasma CVD | μW plasma CVD | HF plasma CVD |
| Semiconductor layer, formed of: (nm) | n-Type a-Si 30 | i-Type a-Si 100 | i-Type a-Si 100 | i-Type a-Si 100 | i-Type a-Si about 10 |
| Region length*: (cm) | 100 | 20 | 20 | 20 | 100 |
| Material gases: (sccm) | $SiH_4$ 200 $PH_3$ 5 $H_2$ 2,000 | $SiH_4$ 150 $H_2$ 200 | $SiH_4$ 150 $H_2$ 200 | $SiH_4$ 150 $H_2$ 200 | $SiH_4$ 30 $BF_3$ 1 $H_2$ 500 |
| Chamber internal pressure: (Pa) | 130 | 0.9 | 1 | 0.9 | 130 |
| Belt substrate temp.: (°C.) | 350 | 350 | 350 | 350 | 150 |
| Discharge power: (W) | HF 13.56 MHz 200 | μW 2.45 GHz 300 | μW 2.45 GHz 300 | μW 2.45 GHz 300 | HF 13.56 MHz$_2$ 1,000 |
| Bias power: (W) | — | HF 13.56 MHz 600 | HF 13.56 MHz 600 | HF 13.56 MHz 600 | — |

*Semiconductor layer forming region length in the direction of belt subtrate transport

TABLE 3

| Film-forming conditions | Film-forming chambers | | | | | |
|---|---|---|---|---|---|---|
| | 102 | 103(1) | 103(2) | 103(3) | 104 | 105 |
| Semiconductor layer, formed by: | HF plasma CVD | μW plasma CVD | μW plasma CVD | μW plasma CVD | HF plasma CVD | HF plasma CVD |
| Semiconductor layer, formed of: (nm) | n-Type a-Si 30 | i-Type a-Si 100 | i-Type a-Si 100 | i-Type a-Si 100 | i-Type a-Si 20 | p-Type a-Si about 10 |
| Region length*: (cm) | 100 | 20 | 20 | 20 | 60 | 100 |
| Material gases: (sccm) | $SiH_4$ 200 $PH_3$ 5 $H_2$ 2,000 | $SiH_4$ 150 $H_2$ 200 | $SiH_4$ 150 $H_2$ 200 | $SiH_4$ 150 $H_2$ 200 | $SiH_4$ 150 $H_2$ 1,500 | $SiH_4$ 30 $BF_3$ 1 $H_2$ 500 |
| Chamber internal pressure: (Pa) | 130 | 0.9 | 1 | 0.9 | 135 | 130 |
| Belt substrate temp.: (°C.) | 350 | 350 | 350 | 350 | 300 | 150 |
| Discharge power: (W) | HF 13.56 MHz 200 | μW 2.45 GHz 300 | μW 2.45 GHz 300 | μW 2.45 GHz 300 | HF 13.56 MHz 150 | HF 13.56 MHz 1,000 |
| Bias power: (W) | — | HF 13.56 MHz 600 | HF 13.56 MHz 600 | HF 13.56 MHz 600 | — | — |

*Semiconductor layer forming region length in the direction of belt subtrate transport

TABLE 4

| Film-forming conditions | Film-forming chambers | | | | | |
|---|---|---|---|---|---|---|
| | 102 | 103(1) | 103(2) | 103(3) | 104 | 105 |
| Semiconductor layer, formed by: | HF plasma CVD | μW plasma CVD | μW plasma CVD | μW plasma CVD | HF plasma CVD | Plasma doping |
| Semiconductor layer, formed of: (nm) | n-Type a-Si 30 | i-Type a-SiGe 50 | i-Type a-SiGe 100 | i-Type a-SiGe 25 | i-Type a-Si 20 | p-Type a-Si about 10 |
| Region length*: (cm) | 100 | 10 | 20 | 5 | 60 | 100 |
| Material gases: (sccm) | $SiH_4$ 200 $PH_3$ 5 $H_2$ 2,000 | $SiH_4$ 125 $GeH_2$ 25 $H_2$ 200 | $SiH_4$ 100 $GeH_2$ 50 $H_2$ 200 | $SiH_4$ 125 $GeH_2$ 25 $H_2$ 200 | $SiH_4$ 150 $H_2$ 1,500 | $BF_3$ 1 $H_2$ 500 |

TABLE 4-continued

| Film-forming conditions | Film-forming chambers | | | | | |
|---|---|---|---|---|---|---|
| | 102 | 103(1) | 103(2) | 103(3) | 104 | 105 |
| Chamber internal pressure: (Pa) | 130 | 0.9 | 1 | 0.9 | 135 | 130 |
| Belt substrate temp.: (°C.) | 350 | 350 | 350 | 350 | 300 | 150 |
| Discharge power: (W) | HF 13.56 MHz 200 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt subtrate transport

TABLE 5

| Film-forming conditions | Film-forming chambers | | | | |
|---|---|---|---|---|---|
| | 102 | 103(1) | 103(2) | 103(3) | 105 |
| Semiconductor layer, formed by: | HF plasma CVD | μW plasma CVD | μW plasma CVD | μW plasma CVD | HF plasma CVD |
| Semiconductor layer, formed of: (nm) | n-Type a-Si 30 | i-Type a-SiGe 50 | i-Type a-SiGe 100 | i-Type a-SiGe 25 | p-Type a-Si about 10 |
| Region length*: (cm) | 100 | 10 | 20 | 5 | 100 |
| Material gases: (sccm) | SiH$_4$ 200 PH$_3$ 5 H$_2$ 2,000 | SiH$_4$ 125 GeH$_2$ 25 H$_2$ 200 | SiH$_4$ 100 GeH$_2$ 50 H$_2$ 200 | SiH$_4$ 125 GeH$_2$ 25 H$_2$ 200 | SiH$_4$ 30 BF$_3$ 1 H$_2$ 500 |
| Chamber internal pressure: (Pa) | 130 | 0.9 | 1 | 0.9 | 130 |
| Belt substrate temp.: (°C.) | 350 | 350 | 350 | 350 | 150 |
| Discharge power: (W) | HF 13.56 MHz 200 | μW 2.45 GHz 300 | μW 2.45 GHz 300 | μW 2.45 GHz 300 | HF 13.56 MHz 1,000 |
| Bias power: (W) | — | HF 13.56 MHz 600 | HF 13.56 MHz 600 | HF 13.56 MHz 600 | — |

*Semiconductor layer forming region length in the direction of belt substrate transport

TABLE 6

| Film-forming conditions | Film-forming chambers | | | | | |
|---|---|---|---|---|---|---|
| | 102 | 103(1) | 103(2) | 103(3) | 104 | 105 |
| Semiconductor layer, formed by: | HF plasma CVD | μW plasma CVD | μW plasma CVD | μW plasma CVD | HF plasma CVD | HF plasma CVD |
| Semiconductor layer, formed of: (nm) | n-Type a-Si 30 | i-Type a-SiGe 50 | i-Type a-SiGe 100 | i-Type a-SiGe 25 | i-Type a-Si 20 | p-Type a-Si about 10 |
| Region length*: (cm) | 100 | 10 | 20 | 5 | 60 | 100 |
| Material gases: (sccm) | SiH$_4$ 200 PH$_3$ 5 H$_2$ 2,000 | SiH$_4$ 125 GeH$_4$ 25 H$_2$ 200 | SiH$_4$ 100 GeH$_4$ 50 H$_2$ 200 | SiH$_4$ 125 GeH$_4$ 25 H$_2$ 200 | SiH$_4$ 150 H$_2$ 1,500 | SiH$_4$ 30 BF$_3$ 1 H$_2$ 500 |
| Chamber internal pressure: (Pa) | 130 | 0.9 | 1 | 0.9 | 135 | 130 |
| Belt substrate temp.: (°C.) | 350 | 350 | 350 | 350 | 300 | 150 |
| Discharge power: (W) | HF 13.56 MHz 200 | μW 2.45 GHz 300 | μW 2.45 GHz 300 | μW 2.45 GHz 300 | HF 13.56 MHz 150 | HF 13.56 MHz 1,000 |
| Bias power: (W) | — | HF 13.56 MHz 600 | HF 13.56 MHz 600 | HF 13.56 MHz 600 | — | — |

*Semiconductor layer forming region length in the direction of belt subtrate transport

TABLE 7

| Film-forming conditions | Film-forming chambers | | | | | |
|---|---|---|---|---|---|---|
| | 102 | 103(1) | 103(2) | 103(3) | 104 | 105 |
| Semiconductor layer, formed by: | HF plasma CVD | μW plasma CVD | μW plasma CVD | μW plasma CVD | HF plasma CVD | Plasma doping |
| Semiconductor layer, formed of: (nm) | p-Type a-Si 30 | i-Type a-SiGe 50 | i-Type a-SiGe 100 | i-Type a-SiGe 25 | i-Type a-Si 20 | n-Type a-Si about 10 |
| Region length*: (cm) | 100 | 10 | 20 | 5 | 60 | 100 |
| Material gases: (sccm) | $SiH_4$ 200 $B_2H_6$ 5 $H_2$ 2,000 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 | $SiH_4$ 150 $H_2$ 1,500 | $PH_3$ 1 $H_2$ 500 |
| Chamber internal pressure: (Pa) | 130 | 0.9 | 1 | 0.9 | 135 | 130 |
| Belt substrate temp.: (°C.) | 350 | 350 | 350 | 350 | 300 | 150 |
| Discharge power: (W) | HF 13.56 MHz 200 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 8

| Film-forming conditions | Film-forming chambers | | | | | |
|---|---|---|---|---|---|---|
| | 211 | 202 | 212 | 203(1) | 203(2) | 203(3) |
| Semiconductor layer, formed by (or surface-treated by): | Glow-discharge cleaning | HF plasma CVD | HF plasma CVD | μW plasma CVD | μW plasma CVD | μW Plasma CVD |
| Semiconductor layer, formed of: (nm) | — | n-Type a-Si 30 | i-Type a-Si 10 | i-Type a-Si 100 | i-Type a-Si 100 | i-Type a-Si 100 |
| Region length*: (cm) | 20 | 100 | 60 | 20 | 20 | 20 |
| Material gases: (sccm) | Ar 500 | $SiH_4$ 200 $PH_3$ 5 $H_2$ 2,000 | $SiH_4$ 75 $H_2$ 750 | $SiH_4$ 150 $H_2$ 200 | $SiH_4$ 150 $H_2$ 200 | $SiH_4$ 150 $H_2$ 200 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 200 | HF 13.56 MHz 200 | HF 13.56 MHz 75 | μW 2.45 GHz 300 | μW 2.45 GHz 300 | μW 2.45 GHz 300 |
| Bias power: (W) | — | — | — | HF 13.56 MHz 600 | HF 13.56 MHz 600 | HF 13.56 MHz 600 |

| Film-forming conditions | Film-forming chambers | | |
|---|---|---|---|
| | 204 | 213 | 205 |
| Semiconductor layer, formed by (or surface-treated by): | HF plasma CVD | $H_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | $SiH_4$ 150 $H_2$ 1,500 | $H_2$ 500 | $BF_3$ 1 $H_2$ 500 |
| Chamber internal pressure: (Pa) | 135 | 130 | 130 |
| Belt substrate temp.: (°C.) | 350 | 150 | 150 |
| Discharge power: (W) | HF 13.56 MHz 150 | HF 13.56 MHz 200 | LF 75 kHz 1,000 |
| Bias power: (W) | — | — | — |

*Length of region in which belt substrate is exposed to plasma

TABLE 9

| Film-forming conditions | Film-forming chambers | | | | | |
|---|---|---|---|---|---|---|
| | 211 | 202 | 212 | 203(1) | 203(2) | 203(3) |
| Semiconductor layer, formed by (or surface-treated by): | Glow-discharge cleaning | HF plasma CVD | HF plasma CVD | µW plasma CVD | µW plasma CVD | µW Plasma CVD |
| Semiconductor layer, formed of: (nm) | — | n-Type a-Si 30 | i-Type a-Si 10 | i-Type a-SiGe 50 | i-Type a-SiGe 100 | i-Type a-SiGe 25 |
| Region length*: (cm) | 20 | 100 | 60 | 10 | 20 | 5 |
| Material gases: (sccm) | He 500 | $SiH_4$ 200 $B_2H_6$ 5 $H_2$ 2,000 | $SiH_4$ 75 $H_2$ 750 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 |
| Chamber internal pressure: (Pa) | 125 | 130 | 135 | 0.9 | 1 | 0.9 |
| Belt substrate temp: (°C.) | 350 | 350 | 350 | 350 | 350 | 350 |
| Discharge power: (W) | HF 13.56 MHz 200 | HF 13.56 MHz 200 | HF 13.56 MHz 75 | µW 2.45 GHz 300 | µW 2.45 GHz 300 | µW 2.45 GHz 300 |
| Bias power: (W) | — | — | — | HF 13.56 MHz 600 | HF 13.56 MHz 600 | HF 13.56 MHz 600 |

| Film-forming conditions | Film-forming chambers | | |
|---|---|---|---|
| | 204 | 213 | 205 |
| Semiconductor layer, formed by (or surface-treated by): | HF plasma CVD | $H_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | $SiH_4$ 150 $H_2$ 1,500 | $H_2$ 500 | $PH_3$ 1 $H_2$ 500 |
| Chamber internal pressure: (Pa) | 135 | 130 | 130 |
| Belt substrate temp.: (°C.) | 300 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 10

| Film-forming conditions | Film-forming chambers | | | | | |
|---|---|---|---|---|---|---|
| | 211 | 202 | 212 | 203(1) | 203(2) | 203(3) |
| Semiconductor layer, formed by (or surface-treated by): | Glow-discharge cleaning | HF plasma CVD | HF plasma CVD | µW plasma CVD | µW plasma CVD | µW Plasma CVD |
| Semiconductor layer, formed of: (nm) | — | p-Type a-Si 30 | i-Type a-Si 10 | i-Type a-SiGe 50 | i-Type a-SiGe 100 | i-Type a-SiGe 25 |
| Region length*: (cm) | 20 | 100 | 60 | 10 | 20 | 5 |
| Material gases: (sccm) | He 500 | $SiH_4$ 200 $B_2H_6$ 5 $H_2$ 2,000 | $SiH_4$ 75 $H_2$ 750 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 200 | HF 13.56 MHz 200 | HF 13.56 MHz 75 | µW 2.45 GHz 300 | µW 2.45 GHz 300 | µW 2.45 GHz 300 |
| Bias power: (W) | — | — | — | HF 13.56 MHz 600 | HF 13.56 MHz 600 | HF 13.56 MHz 600 |

TABLE 10-continued

| Film-forming | | Film-forming chambers | | |
|---|---|---|---|---|
| | Film-forming conditions | 204 | 213 | 205 |
| | Semiconductor layer, formed by (or surface-treated by): | HF plasma CVD | $H_2$ plasma treatment | Plasma doping |
| | Semiconductor layer, formed of: (nm) | i-Type a-Si 20 | — | n-Type a-Si about 10 |
| | Region length*: (cm) | 60 | 20 | 100 |
| | Material gases: (sccm) | $SiH_4$ 150 $H_2$ 1,500 | $H_2$ 500 | $PH_3$ 1 $H_2$ 500 |
| | Chamber internal pressure: (Pa) | 135 | 130 | 130 |
| | Belt substrate temp.: (°C.) | 300 | 150 | 150 |
| | Discharge power: (W) | HF 13.56 MHz 150 | LF 75 kHz 200 | LF 75 kHz 1,000 |
| | Bias power: (W) | — | — | — |

*Length of region in which belt substrate is exposed to plasma

TABLE 11

| Film-forming conditions | Film-forming chambers | | | | | |
|---|---|---|---|---|---|---|
| | 211 | 202 | 212 | 203(1) | 203(2) | 203(3) |
| Semiconductor layer, formed by (or surface-treated by): | Glow-discharge cleaning | HF plasma CVD | HF plasma CVD | µW plasma CVD | µW plasma CVD | µW Plasma CVD |
| Semiconductor layer, formed of: (nm) | — | n-Type a-Si 30 | i-Type a-Si 10 | i-Type a-SiGe 50 | i-Type a-SiGe 100 | i-Type a-SiGe 25 |
| Region length*: (cm) | 20 | 100 | 60 | 10 | 20 | 5 |
| Material gases: (sccm) | He 500 | $SiH_4$ 200 $PH_3$ 5 $H_2$ 2,000 | $SiH_4$ 75 $H_2$ 750 | $SiH_4$ 125 $GeH_4$ 25 $B_2H_6/H_2$ 5 (10 ppm) $H_2$ 200 | $SiH_4$ 100 $GeH_4$ 50 $B_2H_6/H_2$ 5 (10 ppm) $H_2$ 200 | $SiH_4$ 125 $GeH_4$ 25 $B_2H_6/H_2$ 5 (10 ppm) $H_2$ 200 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 200 | HF 13.56 MHz 200 | HF 13.56 MHz 75 | µW 2.45 GHz 300 | µW 2.45 GHz 300 | µW 2.45 GHz 300 |
| Bias power: (W) | — | — | — | HF 13.56 MHz 600 | HF 13.56 MHz 600 | HF 13.56 MHz 600 |

| | Film-forming conditions | Film-forming chambers | | |
|---|---|---|---|---|
| | | 204 | 213 | 205 |
| | Semiconductor layer, formed by (or surface-treated by): | HF plasma CVD | $H_2$ plasma treatment | Plasma doping |
| | Semiconductor layer, formed of: (nm) | i-Type a-Si 20 | — | p-Type a-Si about 10 |
| | Region length*: (cm) | 60 | 20 | 100 |
| | Material gases: (sccm) | $SiH_4$ 150 $H_2$ 1,500 | $H_2$ 500 | $BF_3$ 1 $H_2$ 500 |
| | Chamber internal pressure: (Pa) | 135 | 130 | 130 |
| | Belt substrate temp.: (°C.) | 300 | 150 | 150 |
| | Discharge power: (W) | HF 13.56 MHz 150 | LF 75 kHz 200 | LF 75 kHz 1,000 |
| | Bias power: (W) | — | — | — |

*Length of region in which belt substrate is exposed to plasma

TABLE 12

| Film-forming conditions | Film-forming chambers | | | | | |
|---|---|---|---|---|---|---|
| | 211 | 202 | 212 | 203(1) | 203(2) | 203(3) |
| Semiconductor layer, formed by (or surface-treated by): | Glow-discharge cleaning | HF plasma CVD | HF plasma CVD | µW plasma CVD | µW plasma CVD | µW Plasma CVD |
| Semiconductor layer, formed of: (nm) | — | p-Type a-Si 30 | i-Type a-Si 10 | i-Type a-SiGe 50 | i-Type a-SiGe 100 | i-Type a-SiGe 25 |
| Region length*: (cm) | 20 | 100 | 60 | 10 | 20 | 5 |
| Material gases: (sccm) | He 1,500 | $SiH_4$ 600 $PH_3$ 15 $H_2$ 6,000 | $SiH_4$ 450 $H_2$ 4,500 | $SiH_4$ 375 $GeH_4$ 75 $H_2$ 600 | $SiH_4$ 300 $GeH_4$ 150 $H_2$ 600 | $SiH_4$ 375 $GeH_4$ 75 $H_2$ 600 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 600 | HF 13.56 MHz 600 | HF 13.56 MHz 450 | µW 2.45 GHz 450 × 2 | µW 2.45 GHz 450 × 2 | µW 2.45 GHz 450 × 2 |
| Bias power: (W) | — | — | — | HF 13.56 MHz 1,800 | HF 13.56 MHz 1,800 | HF 13.56 MHz 1,800 |

| Film-forming conditions | Film-forming chambers | | |
|---|---|---|---|
| | 204 | 213 | 205 |
| Semiconductor layer, formed by (or surface-treated by): | HF plasma CVD | $H_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | $SiH_4$ 450 $H_2$ 4,500 | $H_2$ 1,500 | $BF_3$ 3 $H_2$ 1,500 |
| Chamber internal pressure: (Pa) | 135 | 130 | 130 |
| Belt substrate temp.: (°C.) | 300 | 150 | 150 |
| Discharge power: (W) | HF 13.56 MHz 450 | LF 75 kHz 600 | LF 75 kHz 3,000 |
| Bias power: (W) | — | — | — |

*Length of region in which belt substrate is exposed to plasma

TABLE 13

| Film-forming conditions | Film-forming chambers | | | | | |
|---|---|---|---|---|---|---|
| | 2102A | 2103A(1) | 2103A(2) | 2103A(3) | 2104A | 2105A |
| Semiconductor layer, formed by: | HF plasma CVD | µW plasma CVD | µW plasma CVD | µW plasma CVD | HF plasma CVD | Plasma doping |
| Semiconductor layer, formed of: (nm) | n-Type a-Si 20 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | $SiH_4$ 150 $PH_3$ 3 $H_2$ 1,500 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 | $SiH_4$ 150 $H_2$ 1,500 | $BF_3$ 1 $H_2$ 500 |
| Chamber internal pressure: (Pa) | 130 | 0.9 | 1 | 0.9 | 135 | 130 |
| Belt substrate temp.: (°C.) | 350 | 350 | 350 | 350 | 350 | 150 |
| Discharge power: (W) | HF 13.56 MHz 150 | µW 2.45 GHz 300 | µW 2.45 GHz 300 | µW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 14

| Film-forming condition | Film-forming chambers | | | | | |
|---|---|---|---|---|---|---|
| | 2102B | 2103B(1) | 2103B(2) | 2103B(3) | 2104B | 2105B |
| Semiconductor layer, formed by: | HF plasma CVD | μW plasma CVD | μW plasma CVD | μW plasma CVD | HF plasma CVD | Plasma doping |
| Semiconductor layer, formed of: (nm) | n-Type a-Si 20 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | $SiH_4$ 150 $PH_3$ 3 $H_2$ 1,500 | $SiH_4$ 140 $GeH_4$ 10 $H_2$ 200 | $SiH_4$ 120 $GeH_4$ 30 $H_2$ 200 | $SiH_4$ 140 $GeH_4$ 10 $H_2$ 200 | $SiH_4$ 150 $H_2$ 1,500 | $BF_3$ 1 $H_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 15

| Film-forming conditions | Film-forming chambers | | | |
|---|---|---|---|---|
| | 2102C | 2103C | 2104C | 2105C |
| Semiconductor layer, formed by: | HF plasma CVD | μW plasma CVD | HF plasma CVD | Plasma doping |
| Semiconductor layer, formed of: (nm) | n-Type a-Si 20 | i-Type a-Si 100 | i-Type a-Si 20 | p-Type a-Si about 10 |
| Region length*: (cm) | 60 | 20 | 60 | 100 |
| Material gases: (sccm) | $SiH_4$ 150 $PH_3$ 3 $H_2$ 1,500 | $SiH_4$ 150 $H_2$ 200 | $SiH_4$ 150 $H_2$ 1,500 | $BF_3$ 1 $H_2$ 500 |
| Chamber internal pressure: (Pa) | 130 | 1 | 135 | 130 |
| Belt substrate temp.: (°C.) | 250 | 250 | 250 | 150 |
| Discharge power: (W) | HF 13.56 MHz 150 | μW 2.45 GHz 300 | HF 13.56 MHz 150 | LF 75 kHz 1,000 |
| Bias power: (W) | — | HF 13.56 MHz 600 | — | — |

*Semiconductor layer forming region length in the direction of belt substrate transport

TABLE 16

| Film-forming conditions | Film-forming chambers | | | | |
|---|---|---|---|---|---|
| | 2102A | 2103A(1) | 2103A(2) | 2103A(3) | 2105A |
| Semiconductor layer, formed by: | HF plasma CVD | μW plasma CVD | μW plasma CVD | μW plasma CVD | HF plasma CVD |
| Semiconductor layer, formed of: (nm) | n-Type a-Si 20 | i-Type a-SiGe 50 | i-Type a-SiGe 100 | i-Type a-SiGe 25 | p-Type a-Si about 10 |
| Region length*: (cm) | 60 | 10 | 20 | 5 | 100 |
| Material gases: (sccm) | $SiH_4$ 150 $PH_3$ 3 $H_2$ 1,500 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 | $SiH_4$ 30 $BF_3$ 1 $H_2$ 500 |

TABLE 16-continued

| Film-forming conditions | Film-forming chambers | | | | |
|---|---|---|---|---|---|
| | 2102A | 2103A(1) | 2103A(2) | 2103A(3) | 2105A |
| Chamber internal pressure: (Pa) | 130 | 0.9 | 1 | 0.9 | 130 |
| Belt substrate temp.: (°C.) | 350 | 350 | 350 | 350 | 150 |
| Discharge power: (W) | HF 13.56 MHz 150 | μW 2.45 GHz 300 | μW 2.45 GHz 300 | μW 2.45 GHz 300 | HF 13.56 MHz 1,000 |
| Bias power: (W) | — | HF 13.56 MHz 600 | HF 13.56 MHz 600 | HF 13.56 MHz 600 | — |

*Semiconductor layer forming region length in the direction of belt substrate transport

TABLE 17

| Film-forming conditions | Film-forming chambers | | | | |
|---|---|---|---|---|---|
| | 2102B | 2103B(1) | 2103B(2) | 2103B(3) | 2105B |
| Semiconductor layer, formed by: | HF plasma CVD | μW plasma CVD | μW plasma CVD | μW plasma CVD | HF plasma CVD |
| Semiconductor layer, formed of: (nm) | n-Type a-Si 20 | i-Type a-SiGe 50 | i-Type a-SiGe 100 | i-Type a-SiGe 25 | p-Type a-Si about 10 |
| Region length*: (cm) | 60 | 10 | 20 | 5 | 100 |
| Material gases: (sccm) | $SiH_4$ 150 $PH_3$ 3 $H_2$ 1,500 | $SiH_4$ 140 $GeH_4$ 10 $H_2$ 200 | $SiH_4$ 120 $GeH_4$ 30 $H_2$ 200 | $SiH_4$ 140 $GeH_4$ 10 $H_2$ 200 | $SiH_4$ 30 $BF_3$ 1 $H_2$ 500 |
| Chamber internal pressure: (Pa) | 130 | 0.9 | 1 | 0.9 | 130 |
| Belt substrate temp.: (°C.) | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 1,000 |
| Bias power: (W) | — | HF 13.56 MHz 600 | HF 13.56 MHz 600 | HF 13.56 MHz 600 | — |

*Semiconductor layer forming region length in the direction of belt substrate transport

TABLE 18

| Film-forming conditions | Film-forming chambers | | |
|---|---|---|---|
| | 2102C | 2103C | 2105C |
| Semiconductor layer, formed by: | HF Plasma CVD | μW plasma CVD | HF plasma CVD |
| Semiconductor layer, formed of: (nm) | n-Type a-Si 20 | i-Type a-Si 100 | p-Type a-Si about 10 |
| Region length*: (cm) | 60 | 20 | 100 |
| Material gases: (sccm) | $SiH_4$ 150 $PH_3$ 3 $H_2$ 1,500 | $SiH_4$ 150 $H_2$ 200 | $SiH_4$ 30 $BF_3$ 1 $H_2$ 500 |
| Chamber internal pressure: (Pa) | 130 | 1 | 130 |
| Belt substrate temp.: (°C.) | 250 | 250 | 150 |
| Discharge power: (W) | HF 13.56 MHz 150 | μW 2.45 GHz 300 | HF 13.56 MHz 1,000 |
| Bias power: (W) | — | HF 13.56 MHz 600 | — |

*Semiconductor layer forming region length in the direction of belt substrate transport

TABLE 19

| Film-forming conditions | Film-forming chambers | | | | | |
|---|---|---|---|---|---|---|
| | 2102A | 2103A(1) | 2103A(2) | 2103A(3) | 2104A | 2105A |
| Semiconductor layer, formed by: | HF plasma CVD | μW plasma CVD | μW plasma CVD | μW plasma CVD | HF plasma CVD | HF plasma CVD |
| Semiconductor layer, formed of: (nm) | n-Type a-Si 30 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | $SiH_4$ 150 $PH_3$ 3 $H_2$ 1,500 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 | $SiH_4$ 150 $H_2$ 1,500 | $SiH_4$ 30 $BF_3$ 1 $H_2$ 500 |
| Chamber internal pressure: (Pa) | 130 | 0.9 | 1 | 0.9 | 135 | 130 |
| Belt substrate temp.: (°C.) | 350 | 350 | 350 | 350 | 350 | 150 |
| Discharge power: (W) | HF 13.56 MHz 150 | μW 2.45 GHz 300 | μW 2.45 GHz 300 | μW 2.45 GHz 300 | HF 13.56 MHz 150 | HF 13.56 MHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 20

| Film-forming conditions | Film-forming chambers | | | | | |
|---|---|---|---|---|---|---|
| | 2102B | 2103B(1) | 2103B(2) | 2103B(3) | 2104B | 2105B |
| Semiconductor layer, formed by: | HF plasma CVD | μW plasma CVD | μW plasma CVD | μW plasma CVD | HF plasma CVD | HF plasma CVD |
| Semiconductor layer, formed of: (nm) | n-Type a-Si 20 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | $SiH_4$ 150 $PH_3$ 3 $H_2$ 1,500 | $SiH_4$ 140 $GeH_4$ 10 $H_2$ 200 | $SiH_4$ 120 $GeH_4$ 30 $H_2$ 200 | $SiH_4$ 140 $GeH_4$ 10 $H_2$ 200 | $SiH_4$ 150 $H_2$ 1,500 | $SiH_4$ 30 $BF_3$ 1 $H_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 150 | HF 13.56 MHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 21

| Film-forming conditions | Film-forming chambers | | | |
|---|---|---|---|---|
| | 2102C | 2103C | 2104C | 2105C |
| Semiconductor layer, formed by: | HF plasma CVD | μW plasma CVD | HF plasma CVD | HF plasma CVD |
| Semiconductor layer, formed of: (nm) | n-Type a-Si 20 | i-Type a-Si 100 | i-Type a-Si 20 | p-Type a-Si about 10 |
| Region length*: (cm) | 60 | 20 | 60 | 100 |
| Material gases: (sccm) | $SiH_4$ 150 $PH_3$ 3 $H_2$ 1,500 | $SiH_4$ 150 $H_2$ 200 | $SiH_4$ 150 $H_2$ 1,500 | $SiH_4$ 30 $BF_3$ 1 $H_2$ 500 |

TABLE 21-continued

| Film-forming conditions | Film-forming chambers | | | |
|---|---|---|---|---|
| | 2102C | 2103C | 2104C | 2105C |
| Chamber internal pressure: (Pa) | 130 | 1 | 135 | 130 |
| Belt substrate temp.: (°C.) | 250 | 250 | 250 | 150 |
| Discharge power: (W) | HF 13.56 MHz 150 | µW 2.45 GHz 300 | HF 13.56 MHz 150 | HF 13.56 MHz 1,000 |
| Bias power: (W) | — | HF 13.56 MHz 600 | — | — |

*Semiconductor layer forming region length in the direction of belt substrate transport

TABLE 22

| Film-forming conditions | Film-forming chambers | | | | | |
|---|---|---|---|---|---|---|
| | 2102B | 2103B(1) | 2103B(2) | 2103B(3) | 2104B | 2105B |
| Semiconductor layer, formed by: | HF plasma CVD | µW plasma CVD | µW plasma CVD | µW plasma CVD | HF plasma CVD | Plasma doping |
| Semiconductor layer, formed of: (nm) | n-Type a-Si 20 | i-Type a-Si 100 | i-Type a-Si 100 | i-Type a-Si 100 | i-Type a-Si 20 | p-Type a-Si about 10 |
| Region length*: (cm) | 60 | 20 | 20 | 20 | 60 | 100 |
| Material gases: (sccm) | SiH$_4$ 150 PH$_3$ 3 H$_2$ 1,500 | SiH$_4$ 150 H$_2$ 200 | SiH$_4$ 150 H$_2$ 200 | SiH$_4$ 150 H$_2$ 200 | SiH$_4$ 150 H$_2$ 1,500 | BF$_3$ 1 H$_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 200 | µW 2.45 GHz 300 | µW 2.45 GHz 300 | µW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 23

| Film-forming conditions | Film-forming chambers | | | | |
|---|---|---|---|---|---|
| | 2102B | 2103B(1) | 2103B(2) | 2103B(3) | 2105B |
| Semiconductor layer, formed by: | HF plasma CVD | µW plasma CVD | µW plasma CVD | µW plasma CVD | HF plasma CVD |
| Semiconductor layer, formed of: (nm) | n-Type a-Si 20 | i-Type a-Si 100 | i-Type a-Si 100 | i-Type a-Si 100 | p-Type a-Si about 10 |
| Region length*: (cm) | 60 | 20 | 20 | 20 | 100 |
| Material gases: (sccm) | SiH$_4$ 150 PH$_3$ 3 H$_2$ 1,500 | SiH$_4$ 150 H$_2$ 200 | SiH$_4$ 150 H$_2$ 200 | SiH$_4$ 150 H$_2$ 200 | SiH$_4$ 30 BF$_3$ 1 H$_2$ 500 |
| Chamber internal pressure: (Pa) | 130 | 0.9 | 1 | 0.9 | 130 |
| Belt substrate temp.: (°C.) | 300 | 300 | 300 | 300 | 150 |
| Discharge power: (W) | HF 13.56 MHz 150 | µW 2.45 GHz 300 | µW 2.45 GHz 300 | µW 2.45 GHz 300 | HF 13.56 MHz 1,000 |
| Bias power: (W) | — | HF 13.56 MHz 600 | HF 13.56 MHz 600 | HF 13.56 MHz 600 | — |

*Semiconductor layer forming region length in the direction of belt substrate transport

TABLE 24

| Film-forming conditions | Film-forming chambers | | | | | |
|---|---|---|---|---|---|---|
| | 2102B | 2103B(1) | 2103B(2) | 2103B(3) | 2104B | 2105B |
| Semiconductor layer, formed by: | HF plasma CVD | μW plasma CVD | μW plasma CVD | μW plasma CVD | HF Plasma CVD | HF Plasma CVD |
| Semiconductor layer, formed of: (nm) | n-Type a-Si 20 | i-Type a-Si 100 | i-Type a-Si 100 | i-Type a-Si 100 | i-Type a-Si 20 | p-Type a-Si about 10 |
| Region length*: (cm) | 60 | 20 | 20 | 20 | 60 | 100 |
| Material gases: (sccm) | $SiH_4$ 150 $PH_3$ 3 $H_2$ 1,500 | $SiH_4$ 150 $H_2$ 200 | $SiH_4$ 150 $H_2$ 200 | $SiH_4$ 150 $H_2$ 200 | $SiH_4$ 150 $H_2$ 1,500 | $SiH_4$ 30 $BF_3$ 1 $H_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 25

| Film-forming conditions | Film-forming chambers | | | | |
|---|---|---|---|---|---|
| | 2102C | 2103C(1) | 2203C(2) | 2104C | 2105C |
| Semiconductor layer, formed by: | HF plasma CVD | μW plasma CVD | μW plasma CVD | HF plasma CVD | Plasma doping |
| Semiconductor layer, formed of: (nm) | n-Type a-Si 20 | i-Type a-SiC 100 | i-Type a-SiC 50 | i-Type a-Si 20 | p-Type a-Si about 10 |
| Region length*: (cm) | 60 | 20 | 10 | 60 | 100 |
| Material gases: (sccm) | $SiH_4$ 150 $PH_3$ 3 $H_2$ 1,500 | $SiH_4$ 100 $CH_4$ 50 $H_2$ 200 | $SiH_4$ 100 $CH_4$ 50 $H_2$ 200 | $SiH_4$ 150 $H_2$ 1,500 | $BF_3$ 1 $H_2$ 500 |
| Chamber internal pressure: (Pa) | 130 | 1 | 1 | 135 | 130 |
| Belt substrate temp.: (°C.) | 250 | 250 | 250 | 250 | 150 |
| Discharge power: (W) | HF 13.56 MHz 150 | μW 2.45 GHz 300 | μW 2.45 GHz 300 | HF 13.56 MHz 150 | LF 756 kHz 1,000 |
| Bias power: (W) | — | HF 13.56 MHz 600 | HF 13.56 MHz 600 | — | — |

*Semiconductor layer forming region length in the direction of belt substrate transport

TABLE 26

| Film-forming conditions | Film-forming chambers | | | | | |
|---|---|---|---|---|---|---|
| | 2102A | 2103A(1) | 2103A(2) | 2103A(3) | 2104A | 2105A |
| Semiconductor layer, formed by: | HF plasma CVD | μW plasma CVD | μW plasma CVD | μW plasma CVD | HF plasma CVD | Plasma doping |
| Semiconductor layer, formed of: (nm) | p-Type a-Si 20 | i-Type a-SiGe 50 | i-Type a-SiGe 100 | i-Type a-SiGe 25 | i-Type a-Si 20 | n-Type a-Si about 10 |
| Region length*: (cm) | 60 | 10 | 20 | 5 | 60 | 100 |
| Material gases: (sccm) | $SiH_4$ 150 $B_2H_6$ 3 $H_2$ 1,500 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 | $SiH_4$ 150 $H_2$ 1,500 | $PH_3$ 1 $H_2$ 500 |

TABLE 26-continued

| Film-forming conditions | Film-forming chambers | | | | | |
|---|---|---|---|---|---|---|
| | 2102A | 2103A(1) | 2103A(2) | 2103A(3) | 2104A | 2105A |
| Chamber internal pressure: (Pa) | 130 | 0.9 | 1 | 0.9 | 135 | 130 |
| Belt substrate temp.: (°C.) | 350 | 350 | 350 | 350 | 350 | 150 |
| Discharge power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 27

| Film-forming conditions | Film-forming chambers | | | | | |
|---|---|---|---|---|---|---|
| | 2102B | 2103B(1) | 2103B(2) | 2103B(3) | 2104B | 2105B |
| Semiconductor layer, formed by: | HF Plasma CVD | μW plasma CVD | μW plasma CVD | μW plasma CVD | HF plasma CVD | Plasma doping |
| Semiconductor layer, formed of: (nm) | p-Type a-Si 20 | i-Type a-SiGe 50 | i-Type a-SiGe 100 | i-Type a-SiGe 25 | i-Type a-Si 20 | n-Type a-Si about 10 |
| Region length*: (cm) | 60 | 10 | 20 | 5 | 60 | 100 |
| Material gases: (sccm) | $SiH_4$ 150  $B_2H_6$ 3  $H_2$ 1,500 | $SiH_4$ 140  $GeH_4$ 10  $H_2$ 200 | $SiH_4$ 120  $GeH_4$ 30  $H_2$ 200 | $SiH_4$ 140  $GeH_4$ 10  $H_2$ 200 | $SiH_4$ 150  $H_2$ 1,500 | $PH_3$ 1  $H_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge Power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 28

| Film-forming conditions | Film-forming chambers | | | |
|---|---|---|---|---|
| | 102C | 103C | 104C | 105C |
| Semiconductor layer, formed by: | HF Plasma CVD | μW plasma CVD | HF plasma CVD | Plasma doping |
| Semiconductor layer, formed of: (nm) | p-Type a-Si 20 | i-Type a-Si 100 | i-Type a-Si 20 | n-Type a-Si about 10 |
| Region length*: (cm) | 60 | 20 | 60 | 100 |
| Material gases: (sccm) | $SiH_4$ 150  $B_2H_6$ 3  $H_2$ 1,500 | $SiH_4$ 150  $H_2$ 200 | $SiH_4$ 150  $H_2$ 1,500 | $PH_3$ 1  $H_2$ 500 |
| Chamber internal pressure: (Pa) | 130 | 1 | 135 | 130 |
| Belt substrate temp.: (°C.) | 250 | 250 | 250 | 150 |
| Discharge power: (W) | HF 13.56 MHz 150 | μW 2.45 GHz 300 | HF 13.56 MHz 150 | LF 75 kHz 1,000 |
| Bias Power: (W) | — | HF 13.56 MHz 600 | — | — |

*Semiconductor layer forming region length in the direction of belt substrate transport

TABLE 29

| Film-forming condition | Film-forming chambers | | | | | |
|---|---|---|---|---|---|---|
| | 2211 | 2202A | 2212A | 2203A(1) | 2203A(2) | 2203A(3) |
| Semiconductor layer, formed by (or surface-treated by): | Glow-discharge cleaning | HF plasma CVD | HF plasma CVD | μW plasma CVD | μW plasma CVD | μW Plasma CVD |
| Semiconductor layer, formed of: (nm) | — | n-Type a-Si 20 | i-Type a-Si 10 | i-Type a-SiGe 50 | i-Type a-SiGe 100 | i-Type a-SiGe 25 |
| Region length*: (cm) | 20 | 60 | 60 | 10 | 20 | 5 |
| Material gases: (sccm) | He 500 | SiH₄ 150 PH₃ 3 H₂ 1,500 | SiH₄ 75 H₂ 750 | SiH₄ 125 GeH₄ 25 H₂ 200 | SiH₄ 100 GeH₄ 50 H₂ 200 | SiH₄ 125 GeH₄ 25 H₂ 200 |
| Chamber Internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 200 | HF 13.56 MHz 150 | HF 13.56 MHz 75 | μW 2.45 GHz 300 | μW 2.45 GHz 300 | μW 2.45 GHz 300 |
| Bias power: (W) | — | — | — | HF 13.56 MHz 600 | HF 13.56 MHz 600 | HF 13.56 MHz 600 |

| Film-forming conditions | Film-forming chambers | | |
|---|---|---|---|
| | 2204A | 2213A | 2205A |
| Semiconductor layer, formed by (or surface-treated by): | HF plasma CVD | H₂ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | SiH₄ 150 H₂ 1,500 | H₂ 500 | BF₃ 1 H₂ 500 |
| Chamber internal pressure: (Pa) | 135 | 130 | 130 |
| Belt substrate temp.: (°C.) | 350 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 30

| Film-forming conditions | Film-forming chambers | | | | | |
|---|---|---|---|---|---|---|
| | 2202B | 2212B | 2203B(1) | 2203B(2) | 2203B(3) | 2204B |
| Semiconductor layer, formed by (or surface-treated by): | HF plasma CVD | HF plasma CVD | μW plasma CVD | μW plasma CVD | μW Plasma CVD | HF plasma CVD |
| Semiconductor layer, formed of: (nm) | n-Type a-Si 20 | i-Type a-Si 10 | i-Type a-SiGe 50 | i-Type a-SiGe 100 | i-Type a-SiGe 25 | i-Type a-Si 20 |
| Region length*: (cm) | 60 | 60 | 10 | 20 | 5 | 60 |
| Material gases: (sccm) | SiH₄ 150 PH₃ 3 H₂ 1,500 | SiH₄ 75 H₂ 750 | SiH₄ 140 GeH₄ 10 H₂ 200 | SiH₄ 120 GeH₄ 30 H₂ 200 | SiH₄ 140 GeH₄ 10 H₂ 200 | SiH₄ 150 H₂ 1,500 |
| Chamber internal pressure: (Pa) | 130 | 135 | 0.9 | 1 | 0.9 | 135 |
| Belt substrate temp.: (°C.) | 300 | 300 | 300 | 300 | 300 | 300 |
| Discharge power: (W) | HF 13.56 MHz 150 | HF 13.56 MHz 75 | μW 2.45 GHz 300 | μW 2.45 GHz 300 | μW 2.45 GHz 300 | HF 13.56 MHz 150 |
| Bias power: (W) | — | — | HF 13.56 MHz 600 | HF 13.56 MHz 600 | HF 13.56 MHz 600 | — |

TABLE 30-continued

| Film-forming conditions | Film-forming chambers | |
|---|---|---|
| | 2213B | 2205B |
| Semiconductor layer, formed by (or surface-treated by): | H$_2$ plasma treatment | Plasma doping |
| Semiconductor layer, formed of: (nm) | — | p-Type a-Si about 10 |
| Region length*: (cm) | 20 | 100 |
| Material gases: (sccm) | H$_2$    500 | BF$_3$    1<br>H$_2$    500 |
| Chamber internal pressure: (Pa) | 130 | 130 |
| Belt substrate temp.: (°C.) | 150 | 150 |
| Discharge power: (W) | LF 75 kHz<br>200 | LF 75 kHz<br>1,000 |
| Bias power: (W) | — | — |

*Length of region in which belt substrate is exposed to plasma

TABLE 31

| Film-forming conditions | Film-forming chambers | | | | | |
|---|---|---|---|---|---|---|
| | 2202C | 2212C | 2203C | 2204C | 2213C | 2205C |
| Semiconductor layer, formed by: | HF plasma CVD | HF plasma CVD | μW plasma CVD | HF plasma CVD | H$_2$ plasma treatment | Plasma doping |
| Semiconductor layer, formed of: (nm) | n-Type a-Si 20 | i-Type a-Si 10 | i-Type a-Si 100 | i-Type a-Si 20 | — | p-Type a-Si about 10 |
| Region length*: (cm) | 60 | 60 | 20 | 60 | 20 | 100 |
| Material gases: (sccm) | SiH$_4$   150<br>PH$_3$   3<br>H$_2$   1,500 | SiH$_4$   75<br>H$_2$   750 | SiH$_4$   150<br>H$_2$   200 | SiH$_4$   150<br>H$_2$   1,500 | H$_2$   500 | BF$_3$   1<br>H$_2$   500 |
| Chamber internal pressure: (Pa) | 130 | 135 | 1 | 135 | 130 | 130 |
| Belt substrate temp.: (°C.) | 250 | 250 | 250 | 250 | 150 | 150 |
| Discharge power: (W) | HF 13.56 MHz<br>150 | HF 13.56 MHz<br>75 | μW 2.45 GHz<br>300 | HF 13.56 MHz<br>150 | LF 75 kHz<br>200 | LF 75 kHz<br>1,000 |
| Bias power: (W) | — | — | HF 13.56 MHz<br>600 | — | — | — |

*Semiconductor layer forming region length in the direction of belt substrate transport

TABLE 32

| Film-forming conditions | Film-forming chambers | | | | | |
|---|---|---|---|---|---|---|
| | 2202B | 2212B | 2203B(1) | 2203B(2) | 2203B(3) | 2204B |
| Semiconductor layer, formed by (or surface-treated by): | HF plasma CVD | HF plasma CVD | μW plasma CVD | μW plasma CVD | μW Plasma CVD | HF plasma CVD |
| Semiconductor layer, formed of: (nm) | n-Type a-Si 20 | i-Type a-Si 10 | i-Type a-Si 100 | i-Type a-Si 100 | i-Type a-Si 100 | i-Type a-Si 20 |
| Region length*: (cm) | 60 | 60 | 20 | 20 | 20 | 60 |
| Material gases: (sccm) | SiH$_4$   150<br>PH$_3$   3<br>H$_2$   1,500 | SiH$_4$   75<br>H$_2$   750 | SiH$_4$   150<br>H$_2$   200 | SiH$_4$   150<br>H$_2$   200 | SiH$_4$   150<br>H$_2$   200 | SiH$_4$   150<br>H$_2$   1,500 |
| Chamber internal pressure: (Pa) | 130 | 135 | 0.9 | 1 | 0.9 | 135 |
| Belt substrate temp.: (°C.) | 300 | 300 | 300 | 300 | 300 | 300 |
| Discharge power: (W) | HF 13.56 MHz<br>150 | HF 13.56 MHz<br>75 | μW 2.45 GHz<br>300 | μW 2.45 GHz<br>300 | μW 2.45 GHz<br>300 | HF 13.56 MHz<br>150 |

TABLE 32-continued

| | | | HF 13.56 MHz | HF 13.56 MHz | HF 13.56 MHz | |
|---|---|---|---|---|---|---|
| Bias power: (W) | — | — | 600 | 600 | 600 | — |

| | Film-forming conditions | Film-forming chambers | |
|---|---|---|---|
| | | 2213B | 2205B |
| | Semiconductor layer, formed by (or surface-treated by): | $H_2$ plasma treatment | Plasma doping |
| | Semiconductor layer, formed of: (nm) | — | p-Type a-Si about 10 |
| | Region length*: (cm) | 20 | 100 |
| | Material gases: (sccm) | $H_2$ 500 | $BF_3$ 1  $H_2$ 500 |
| | Chamber internal pressure: (Pa) | 130 | 130 |
| | Belt substrate temp.: (°C.) | 150 | 150 |
| | Discharge power: (W) | LF 75 kHz 200 | LF 75 kHz 1,000 |
| | Bias power: (W) | — | — |

*Length of region in which belt substrate is exposed to plasma

TABLE 33

| Film-forming conditions | Film-forming chambers | | | |
|---|---|---|---|---|
| | 2202C | 2212C | 2203C(1) | 2203C(2) |
| Semiconductor layer, formed by (or surface-treated by): | HF plasma CVD | HF plasma CVD | μW plasma CVD | μW Plasma CVD |
| Semiconductor layer, formed of: (nm) | n-Type a-Si 20 | i-Type a-Si 10 | i-Type a-SiC 100 | i-Type a-Sic 50 |
| Region length*: (cm) | 60 | 30 | 20 | 10 |
| Material gases: (sccm) | $SiH_4$ 150  $PH_3$ 3  $H_2$ 1,500 | $SiH_4$ 75  $H_2$ 750 | $SiH_4$ 100  $CH_4$ 50  $H_2$ 200 | $SiH_4$ 100  $CH_4$ 50  $H_2$ 200 |
| Chamber internal pressure: (Pa) | 130 | 135 | 1 | 1 |
| Belt substrate temp.: (°C.) | 250 | 250 | 250 | 250 |
| Discharge power: (W) | HF 13.56 MHz 150 | HF 13.56 MHz 75 | μW 2.45 GHz 300 | μW 2.45 GHz 300 |
| Bias power: (W) | — | — | HF 13.56 MHz 600 | HF 13.56 MHz 600 |

| | Film-forming conditions | Film-forming chambers | | |
|---|---|---|---|---|
| | | 2204C | 2213C | 2205C |
| | Semiconductor layer, formed by (or surface-treated by): | HF plasma CVD | $H_2$ plasma treatment | Plasma doping |
| | Semiconductor layer, formed of: (nm) | i-Type a-Si 20 | — | p-Type a-Si about 10 |
| | Region length*: (cm) | 60 | 20 | 100 |
| | Material gases: (sccm) | $SiH_4$ 150  $H_2$ 1,500 | $H_2$ 500 | $BF_3$ 1  $H_2$ 500 |
| | Chamber internal pressure: (Pa) | 135 | 130 | 130 |
| | Belt substrate temp.: (°C.) | 250 | 150 | 150 |

TABLE 33-continued

| | | | |
|---|---|---|---|
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 34

| Film-forming conditions | Film-forming chambers | | | | | |
|---|---|---|---|---|---|---|
| | 2211 | 2202A | 2212A | 2203A(1) | 2203A(2) | 2204A(3) |
| Semiconductor layer, formed by (or surface-treated by): | Glow-discharge cleaning | HF plasma CVD | HF plasma CVD | μW plasma CVD | μW plasma CVD | μW Plasma CVD |
| Semiconductor layer, formed of: (nm) | — | p-Type a-Si 20 | i-Type a-Si 10 | i-Type a-SiGe 50 | i-Type a-SiGe 100 | i-Type a-SiGe 25 |
| Region length*: (cm) | 20 | 60 | 60 | 10 | 20 | 5 |
| Material gases: (sccm) | He 500 | $SiH_4$ 150 $B_2H_6$ 3 $H_2$ 1,500 | $SiH_4$ 150 $H_2$ 1,500 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 200 | HF 13.56 MHz 150 | HF 13.56 MHz 150 | μW 2.45 GHz 300 | μW 2.45 GHz 300 | μW 2.45 GHz 300 |
| Bias power: (W) | — | — | — | HF 13.56 MHz 600 | HF 13.56 MHz 600 | HF 13.56 MHz 600 |

| Film-forming conditions | Film-forming chambers | | |
|---|---|---|---|
| | 2204A | 2213A | 2205A |
| Semiconductor layer, formed by (or surface-treated by): | HF plasma CVD | $H_2$ plasma treatment | Plasma doping |
| Semiconductor layer, formed of: (nm) | i-Type a-Si 20 | — | n-Type a-Si about 10 |
| Region length*: (cm) | 60 | 20 | 100 |
| Material gases: (sccm) | $SiH_4$ 150 $H_2$ 1,500 | $H_2$ 500 | $PH_3$ 1 $H_2$ 500 |
| Chamber internal pressure: (Pa) | 135 | 130 | 130 |
| Belt substrate temp.: (°C.) | 350 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 35

| Film-forming conditions | Film-forming chambers | | | | |
|---|---|---|---|---|---|
| | 2202B | 2212B | 2203B(1) | 2203B(2) | 2203B(3) |
| Semiconductor layer, formed by (or surface-treated by): | HF plasma CVD | HF plasma CVD | μW plasma CVD | μW plasma CVD | μW Plasma CVD |
| Semiconductor layer, formed of: (nm) | p-Type a-Si 20 | i-Type a-Si 10 | i-Type a-SiGe 50 | i-Type a-SiGe 100 | i-Type a-SiGe 25 |
| Region length*: (cm) | 60 | 60 | 10 | 20 | 5 |
| Material gases: (sccm) | $SiH_4$ 150 $B_2H_6$ 3 $H_2$ 1,500 | $SiH_4$ 150 $H_2$ 1,500 | $SiH_4$ 140 $GeH_4$ 10 $H_2$ 200 | $SiH_4$ 120 $GeH_4$ 30 $H_2$ 200 | $SiH_4$ 140 $GeH_4$ 10 $H_2$ 200 |

TABLE 35-continued

| | | | | | |
|---|---|---|---|---|---|
| Chamber internal pressure: (Pa) | 130 | 135 | 0.9 | 1 | 0.9 |
| Belt substrate temp.: (°C.) | 300 | 300 | 300 | 300 | 300 |
| Discharge power: (W) | HF 13.56 MHz 150 | HF 13.56 MHz 150 | μW 2.45 GHz 300 | μW 2.45 GHz 300 | μW 2.45 GHz 300 |
| Bias power: (W) | — | — | HF 13.56 MHz 600 | HF 13.56 MHz 600 | HF 13.56 MHz 600 |

| Film-forming conditions | Film forming chambers | | |
|---|---|---|---|
| | 2204B | 2213B | 2205B |
| Semiconductor layer, formed by (or surface-treated by): | HF plasma CVD | $H_2$ plasma treatment | Plasma doping |
| Semiconductor layer, formed of: (nm) | i-Type a-Si 20 | — | n-Type a-Si about 10 |
| Region length*: (cm) | 60 | 20 | 100 |
| Material gases: (sccm) | $SiH_4$ 150 $H_2$ 1,500 | $H_2$ 500 | $PH_3$ 1 $H_2$ 500 |
| Chamber internal pressure: (Pa) | 135 | 130 | 130 |
| Belt substrate temp.: (°C.) | 300 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 36

| Film-forming conditions | Film-forming chambers | | | | | |
|---|---|---|---|---|---|---|
| | 2202C | 2212C | 2203C | 2204C | 2213C | 2205C |
| Semiconductor layer, formed by (or surface-treated by): | HF plasma CVD | HF plasma CVD | μW plasma CVD | HF plama CVD | $H_2$ plasma treatment | Plasma doping |
| Semiconductor layer, formed of: (nm) | p-Type a-Si 20 | i-Type a-Si 10 | i-Type a-Si 100 | i-Type a-Si 20 | — | n-Type a-Si about 10 |
| Region length*: (cm) | 60 | 60 | 20 | 60 | 20 | 100 |
| Material gases: (sccm) | $SiH_4$ 150 $B_2H_6$ 3 $H_2$ 1,500 | $SiH_4$ 75 $H_2$ 750 | $SiH_4$ 150 $H_2$ 200 | $SiH_4$ 150 $H_2$ 1,500 | $H_2$ 500 | $PH_3$ 1 $H_2$ 500 |
| Chamber internal pressure: (Pa) | 130 | 135 | 1 | 135 | 130 | 130 |
| Belt substrate temp.: (°C.) | 250 | 250 | 250 | 250 | 150 | 150 |
| Discharge power: (W) | HF 13.56 MHz 150 | HF 13.56 MHz 75 | μW 2.45 GHz 300 | HF 13.56 MHz 150 | LF 75 kHz 200 | LF 75 kHz 1,000 |
| Bias power: (W) | — | — | HF 13.56 MHz 600 | — | — | — |

*Length of region in which belt substrate is exposed to plasma

TABLE 37

| Film-forming conditions | Film-forming chambers | | | | | |
|---|---|---|---|---|---|---|
| | 2211 | 2202A | 2212A | 2203A(1) | 2203A(2) | 2203A(3) |
| Semiconductor layer, formed by (surface-treated by): | Glow discharge cleaning | HF plasma CVD | HF plasma CVD | μW plasma CVD | μW plasma CVD | μW Plasma CVD |
| Semiconductor layer, formed of: (nm) | — | n-Type a-Si 20 | i-Type a-Si 10 | i-Type a-SiGe 50 | i-Type a-SiGe 100 | i-Type a-SiGe 25 |

TABLE 37-continued

| Region length*: (cm) | | 20 | | 60 | | 60 | | 10 | | 20 | | 5 |
|---|---|---|---|---|---|---|---|---|---|---|---|---|
| Material gases: (sccm) | He | 1,500 | SiH$_4$ PH$_3$ H$_2$ | 450 9 4,500 | SiH$_4$ H$_2$ | 225 2,250 | SiH$_4$ GeH$_4$ H$_2$ | 375 75 600 | SiH$_4$ GeH$_4$ H$_2$ | 300 150 600 | SiH$_4$ GeH$_4$ H$_2$ | 375 75 600 |
| Chamber internal pressure: (Pa) | | 125 | | 130 | | 135 | | 0.9 | | 1 | | 0.9 |
| Belt substrate temp.: (°C.) | | 350 | | 350 | | 350 | | 350 | | 350 | | 350 |
| Discharge power: (W) | | HF 13.56 MHz 600 | | HF 13.56 MHz 450 | | HF 13.56 MHz 225 | | μW 2.45 GHz 450 × 2 | | μW 2.45 GHz 450 × 2 | | μW 2.45 GHz 450 × 2 |
| Bias power: (W) | | — | | — | | — | | HF 13.56 MHz 1,800 | | HF 13.56 MHz 1,800 | | HF 13.56 MHz 1,800 |

| Film-forming conditions | Film-forming chambers | | |
|---|---|---|---|
| | 2204A | 2213A | 2205A |
| Semiconductor layer, formed by (or surface-treated by): | HF plasma CVD | H$_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | SiH$_4$ 450 H$_2$ 4,500 | H$_2$ 1,500 | BF$_3$ 3 H$_2$ 1,500 |
| Chamber internal pressure: (Pa) | 135 | 130 | 130 |
| Belt substrate temp.: (°C.) | 350 | 150 | 150 |
| Discharge power: (W) | HF 13.56 MHz 450 | LF 75 kHz 600 | LF 75 kHz 3,000 |
| Bias power: (W) | — | — | — |

*Length of region in which belt substrate is exposed to plasma

TABLE 38

| Film-forming conditions | Film-forming chambers | | | | |
|---|---|---|---|---|---|
| | 2202B | 2212B | 2203B(1) | 2203B(2) | 2203B(3) |
| Semiconductor layer, formed by (or surface-treated by): | HF plasma CVD | HF plasma CVD | μW plasma CVD | μW plasma CVD | μW Plasma CVD |
| Semiconductor layer, formed of: (nm) | n-Type a-Si 20 | i-Type a-Si 10 | i-Type a-SiGe 50 | i-Type a-SiGe 100 | i-Type a-SiGe 25 |
| Region length*: (cm) | 60 | 60 | 10 | 20 | 5 |
| Material gases: (sccm) | SiH$_4$ 450 PH$_3$ 9 H$_2$ 4,500 | SiH$_4$ 225 H$_2$ 2,250 | SiH$_4$ 420 GeH$_4$ 30 H$_2$ 600 | SiH$_4$ 360 GeH$_4$ 90 H$_2$ 600 | SiH$_4$ 420 GeH$_4$ 30 H$_2$ 600 |
| Chamber internal pressure: (Pa) | 130 | 135 | 0.9 | 1 | 0.9 |
| Belt substrate temp.: (°C.) | 300 | 300 | 300 | 300 | 300 |
| Discharge power: (W) | HF 13.56 MHz 450 | HF 13.56 MHz 225 | μW 2.45 GHz 450 × 2 | μW 2.45 GHz 450 × 2 | μW 2.45 GHz 450 × 2 |
| Bias power: (W) | — | — | HF 13.56 MHz 1,800 | HF 13.56 MHz 1,800 | HF 13.56 MHz 1,800 |

| Film-forming conditions | Film-forming chambers | | |
|---|---|---|---|
| | 2204B | 2213B | 2205B |
| Semiconductor layer, formed by (or surface-treated by): | HF plasma CVD | H$_2$ plasma treatment | Plasma doping |
| Semiconductor layer, formed of: (nm) | i-Type a-Si 20 | — | p-Type a-Si about 10 |

TABLE 38-continued

|  |  |  |  |  |
|---|---|---|---|---|
| Region length*: (cm) | | 60 | 20 | 100 |
| Material gases: (sccm) | | SiH$_4$ 150 H$_2$ 4,500 | H$_2$ 1,500 | BF$_3$ 3 H$_2$ 1,500 |
| Chamber internal pressure: (Pa) | | 135 | 130 | 130 |
| Belt substrate temp.: (°C.) | | 300 | 150 | 150 |
| Discharge power: (W) | | HF 3.56 MHz 450 | LF 75 kHz 600 | LF 75 kHz 3,000 |
| Bias power: (W) | | — | — | — |

*Length of region in which belt substrate is exposed to plasma

TABLE 39

| Film-forming conditions | Film-forming chambers ||||||
|---|---|---|---|---|---|---|
| | 2202C | 2212C | 2203C | 2204C | 2213C | 2205C |
| Semiconductor layer, formed by: | HF plasma CVD | HF plasma CVD | μW plasma CVD | HF plasma CVD | H$_2$ plasma treatment | Plasma doping |
| Semiconductor layer, formed of: (nm) | n-Type a-Si 20 | i-Type a-Si 10 | i-Type a-Si 100 | i-Type a-Si 20 | — | p-Type a-Si about 10 |
| Region length*: (cm) | 60 | 30 | 20 | 60 | 20 | 100 |
| Material gases: (sccm) | SiH$_4$ 450 PH$_3$ 9 H$_2$ 4,500 | SiH$_4$ 225 H$_2$ 2,250 | SiH$_4$ 450 H$_2$ 600 | SiH$_4$ 450 H$_2$ 4,500 | H$_2$ 1,500 | BF$_3$ 3 H$_2$ 1,500 |
| Chamber internal pressure: (Pa) | 130 | 135 | 1 | 135 | 130 | 130 |
| Belt substrate temp.: (°C.) | 250 | 250 | 250 | 250 | 150 | 150 |
| Discharge power: (W) | HF 13.56 MHz 450 | HF 13.56 MHz 225 | μW 2.45 GHz 450 × 2 | HF 13.56 MHz 450 | LF 75 kHz 600 | LF 75 kHz 3,000 |
| Bias power: (W) | — | — | HF 13.56 MHz 1,800 | — | — | — |

*Semiconductor layer forming region length in the direction of belt substrate transport

TABLE 40

| Film-forming conditions | Film-forming chambers ||||||
|---|---|---|---|---|---|---|
| | 2302A | 2303A(1) | 2303A | 2303A(3) | 2304A | 2305A |
| Semiconductor layer, formed by: | HF plasma CVD | μW plasma CVD | μW plasma CVD | μW plasma CVD | HF plasma CVD | Plasma doping |
| Semiconductor layer, formed of: (nm) | n-Type a-Si 20 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | SiH$_4$ 150 PH$_3$ 3 H$_2$ 1,500 | SiH$_4$ 125 GeH$_4$ 25 H$_2$ 200 | SiH$_4$ 100 GeH$_4$ 50 H$_2$ 200 | SiH$_4$ 125 GeH$_4$ 25 H$_2$ 200 | SiH$_4$ 150 H$_2$ 1,500 | BF$_3$ 1 H$_2$ 500 |
| Chamber internal pressure: (Pa) | 130 | 0.9 | 1 | 0.9 | 135 | 130 |
| Belt substrate temp.: (°C.) | 350 | 350 | 350 | 350 | 350 | 150 |
| Discharge power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 41

| Film-forming conditions | Film-forming chambers | | | | | |
|---|---|---|---|---|---|---|
| | 2102B | 2103B(1) | 2103B(2) | 2103B(3) | 2104B | 2105B |
| Semiconductor layer, formed by: | HF plasma CVD | μW plasma CVD | μW plasma CVD | μW plasma CVD | HF plasma CVD | Plasma doping |
| Semiconductor layer, formed of: (nm) | n-Type a-Si 20 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | $SiH_4$ 150<br>$PH_3$ 3<br>$H_2$ 1,500 | $SiH_4$ 140<br>$GeH_4$ 10<br>$H_2$ 200 | $SiH_4$ 120<br>$GeH_4$ 30<br>$H_2$ 200 | $SiH_4$ 140<br>$GeH_4$ 10<br>$H_2$ 200 | $SiH_4$ 150<br>$H_2$ 1,500 | $BF_3$ 1<br>$H_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 42

| Film-forming conditions | Film-forming chambers | | |
|---|---|---|---|
| | 2102C | 2104C | 2105C |
| Semiconductor layer, formed by: | HF plasma CVD | HF plasma CVD | Plasma doping |
| Semiconductor layer, formed of: (nm) | n-Type a-Si 20 | i-Type a-Si 80 | p-Type a-Si about 10 |
| Region length*: (cm) | 60 | 200 | 100 |
| Material gases: (sccm) | $SiH_4$ 150<br>$PH_3$ 3<br>$H_2$ 1,500 | $SiH_4$ 400<br>$H_2$ 4,000 | $BF_3$ 1<br>$H_2$ 500 |
| Chamber internal pressure: (Pa) | 130 | 135 | 130 |
| Belt substrate temp.: (°C.) | 250 | 250 | 150 |
| Discharge power: (W) | HF 13.56 MHz 150 | HF 13.56 MHz 400 | LF 75 kHz 1,000 |
| Bias power: (W) | — | — | — |

*Semiconductor layer forming region length in the direction of belt substrate transport

TABLE 43

| Film-forming conditions | Film-forming chambers | | | | |
|---|---|---|---|---|---|
| | 2302A | 2303A(1) | 2303A(2) | 2303A(3) | 2305A |
| Semiconductor layer, formed by: | HF plasma CVD | μW plasma CVD | μW plasma CVD | μW plasma CVD | HF plasma CVD |
| Semiconductor layer, formed of: (nm) | n-Type a-Si 20 | i-Type a-SiGe 50 | i-Type a-SiGe 100 | i-Type a-SiGe 25 | p-Type a-Si about 10 |
| Region length*: (cm) | 60 | 10 | 20 | 5 | 100 |
| Material gases: (sccm) | $SiH_4$ 150<br>$PH_3$ 3<br>$H_2$ 1,500 | $SiH_4$ 125<br>$GeH_4$ 25<br>$H_2$ 200 | $SiH_4$ 100<br>$GeH_4$ 50<br>$H_2$ 200 | $SiH_4$ 125<br>$GeH_4$ 25<br>$H_2$ 200 | $SiH_4$ 30<br>$BF_3$ 1<br>$H_2$ 500 |

TABLE 43-continued

| Film-forming conditions | Film-forming chambers | | | | |
|---|---|---|---|---|---|
| | 2302A | 2303A(1) | 2303A(2) | 2303A(3) | 2305A |
| Chamber internal pressure: (Pa) | 130 | 0.9 | 1 | 0.9 | 130 |
| Belt substrate temp.: (°C.) | 350 | 350 | 350 | 350 | 150 |
| Discharge power: (W) | HF 13.56 MHz 150 | μW 2.45 GHz 300 | μW 2.45 GHz 300 | μW 2.45 GHz 300 | HF 13.56 MHz 1,000 |
| Bias power: (W) | — | HF 13.56 MHz 600 | HF 13.56 MHz 600 | HF 13.56 MHz 600 | — |

*Semiconductor layer forming region length in the direction of belt substrate transport

TABLE 44

| Film-forming conditions | Film-forming chambers | | | | |
|---|---|---|---|---|---|
| | 2302B | 2303B(1) | 2303B(2) | 2303B(3) | 2305B |
| Semiconductor layer, formed by: | HF plasma CVD | μW plasma CVD | μW plasma CVD | μW plasma CVD | HF plasma CVD |
| Semiconductor layer, formed of: (nm) | n-Type a-Si 20 | i-Type a-SiGe 50 | i-Type a-SiGe 100 | i-Type a-SiGe 25 | p-Type a-Si about 10 |
| Region length*: (cm) | 60 | 10 | 20 | 5 | 100 |
| Material gases: (sccm) | SiH$_4$ 150 PH$_3$ 3 H$_2$ 1,500 | SiH$_4$ 140 GeH$_4$ 10 H$_2$ 200 | SiH$_4$ 120 GeH$_4$ 30 H$_2$ 200 | SiH$_4$ 145 GeH$_4$ 10 H$_2$ 200 | SiH$_4$ 30 BF$_3$ 1 H$_2$ 500 |
| Chamber internal pressure: (Pa) | 130 | 0.9 | 1 | 0.9 | 130 |
| Belt substrate temp.: (°C.) | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 1,000 |
| Bias power: (W) | — | HF 13.56 MHz 600 | HF 13.56 MHz 600 | HF 13.56 MHz 600 | — |

*Semiconductor layer forming region length in the direction of belt substrate transport

TABLE 45

| Film-forming conditions | Film-forming chambers | | |
|---|---|---|---|
| | 2302C | 2304C | 2305C |
| Semiconductor layer, formed by: | HF plasma CVD | HF plasma CVD | HF plasma CVD |
| Semiconductor layer, formed of: (nm) | n-Type a-Si 20 | i-Type a-Si 80 | p-Type a-Si about 10 |
| Region length*: (cm) | 60 | 200 | 100 |
| Material gases: (sccm) | SiH$_4$ 150 PH$_3$ 3 H$_2$ 1,500 | SiH$_4$ 400 H$_2$ 4,000 | SiH$_4$ 30 BF$_3$ 1 H$_2$ 500 |
| Chamber internal pressure: (Pa) | 130 | 135 | 130 |
| Belt substrate temp.: (°C.) | 250 | 250 | 150 |
| Discharge power: (W) | HF 13.56 MHz 150 | HF 13.56 MHz 400 | HF 13.56 MHz 1,000 |
| Bias power: (W) | — | — | — |

*Semiconductor layer forming region length in the direction of belt substrate transport

TABLE 46

| Film-forming conditions | Film-forming chambers | | | | | |
|---|---|---|---|---|---|---|
| | 2302A | 2303A(1) | 2303A(2) | 2303A(3) | 2304A | 2305A |
| Semiconductor layer, formed by: | HF plasma CVD | μW plasma CVD | μW plasma CVD | μW plasma CVD | HF plasma CVD | HF plasma CVD |
| Semiconductor layer, formed of: (nm) | n-Type a-Si 20 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | $SiH_4$ 150　$PH_3$ 3　$H_2$ 1,500 | $SiH_4$ 125　$GeH_4$ 25　$H_2$ 200 | $SiH_4$ 100　$GeH_4$ 50　$H_2$ 200 | $SiH_4$ 125　$GeH_4$ 25　$H_2$ 200 | $SiH_4$ 150　$H_2$ 1,500 | $SiH_4$ 30　$BF_3$ 1　$H_2$ 500 |
| Chamber internal pressure: (Pa) | 130 | 0.9 | 1 | 0.9 | 135 | 130 |
| Belt substrate temp.: (°C.) | 350 | 350 | 350 | 350 | 350 | 150 |
| Discharge power: (W) | HF 13.56 MHz 150 | μW 2.45 GHz 300 | μW 2.45 GHz 300 | μW 2.45 GHz 300 | HF 13.56 MHz 150 | HF 13.56 MHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 47

| Film-forming conditions | Film-forming chambers | | | | | |
|---|---|---|---|---|---|---|
| | 2302B | 2303B(1) | 2303B(2) | 2303B(3) | 2304B | 2305B |
| Semiconductor layer, formed by: | HF plasma CVD | μW plasma CVD | μW plasma CVD | μW plasma CVD | HF plasma CVD | HF plasma CVD |
| Semiconductor layer, formed of: (nm) | n-Type a-Si 20 | i-Type a-SiGe 50 | i-Type a-SiGe 100 | i-Type a-SiGe 25 | i-Type a-Si 20 | p-Type a-Si about 10 |
| Region length*: (cm) | 60 | 10 | 20 | 5 | 60 | 100 |
| Material gases: (sccm) | $SiH_4$ 150　$PH_3$ 3　$H_2$ 1,500 | $SiH_4$ 140　$GeH_4$ 10　$H_2$ 200 | $SiH_4$ 120　$GeH_4$ 30　$H_2$ 200 | $SiH_4$ 140　$GeH_4$ 10　$H_2$ 200 | $SiH_4$ 150　$H_2$ 1,500 | $SiH_4$ 30　$BF_3$ 1　$H_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 150 | HF 13.56 MHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 48

| Film-forming conditions | Film-forming chambers | | | | | |
|---|---|---|---|---|---|---|
| | 2302B | 2303B(1) | 2303B(2) | 2303B(3) | 2304B | 2305B |
| Semiconductor layer, formed by: | HF plasma CVD | μW plasma CVD | μW plasma CVD | μW plasma CVD | HF plasma CVD | Plasma doping |
| Semiconductor layer, formed of: (nm) | n-Type a-Si 20 | i-Type a-Si 100 | i-Type a-Si 100 | i-Type a-Si 100 | i-Type a-Si 20 | p-Type a-Si about 10 |
| Region length*: (cm) | 60 | 20 | 20 | 20 | 60 | 100 |
| Material gases: (sccm) | $SiH_4$ 150　$PH_3$ 3　$H_2$ 1,500 | $SiH_4$ 150　$H_2$ 200 | $SiH_4$ 150　$H_2$ 200 | $SiH_4$ 150　$H_2$ 200 | $SiH_4$ 150　$H_2$ 1,500 | $BF_3$ 1　$H_2$ 500 |

TABLE 48-continued

| Film-forming conditions | Film-forming chambers | | | | | |
|---|---|---|---|---|---|---|
| | 2302B | 2303B(1) | 2303B(2) | 2303B(3) | 2304B | 2305B |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 200 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 49

| Film-forming conditions | Film-forming chambers | | | | |
|---|---|---|---|---|---|
| | 2302B | 2303B(1) | 2303B(2) | 2303B(3) | 2305B |
| Semiconductor layer, formed by: | HF plasma CVD | μW plasma CVD | μW plasma CVD | μW plasma CVD | HF plasma CVD |
| Semiconductor layer, formed of: (nm) | n-Type a-Si 20 | i-Type a-Si 100 | i-Type a-Si 100 | i-Type a-Si 100 | p-Type a-Si about 10 |
| Region length*: (cm) | 60 | 20 | 20 | 20 | 100 |
| Material gases: (sccm) | SiH$_4$ 150 B$_2$H$_6$ 3 H$_2$ 1,500 | SiH$_4$ 150 H$_2$ 200 | SiH$_4$ 150 H$_2$ 200 | SiH$_4$ 150 H$_2$ 200 | SiH$_4$ 30 BF$_3$ 1 H$_2$ 500 |
| Chamber internal pressure: (Pa) | 130 | 0.9 | 1 | 0.9 | 130 |
| Belt substrate temp.: (°C.) | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 1,000 |
| Bias power: (W) | — | HF 13.56 MHz 600 | HF 13.56 MHz 600 | HF 13.56 MHz 600 | — |

*Semiconductor layer forming region length in the direction of belt substrate transport

TABLE 50

| Film-forming conditions | Film-forming chambers | | | | | |
|---|---|---|---|---|---|---|
| | 2302B | 2303B(1) | 2303B(2) | 2303B(3) | 2304B | 2305B |
| Semiconductor layer, formed by: | HF plasma CVD | μW plasma CVD | μW plasma CVD | μW plasma CVD | HF plasma CVD | HF plasma CVD |
| Semiconductor layer, formed of: (nm) | n-Type a-Si 20 | i-Type a-Si 100 | i-Type a-Si 100 | i-Type a-Si 100 | i-Type a-Si 20 | p-Type a-Si about 10 |
| Region length*: (cm) | 60 | 20 | 20 | 20 | 60 | 100 |
| Material gases: (sccm) | SiH$_4$ 150 PH$_3$ 3 H$_2$ 1,500 | SiH$_4$ 150 H$_2$ 200 | SiH$_4$ 150 H$_2$ 200 | SiH$_4$ 150 H$_2$ 200 | SiH$_4$ 150 H$_2$ 1,500 | SiH$_4$ 30 BF$_3$ 1 H$_2$ 500 |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 150 | HF 13.56 MHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 51

| Film-forming conditions | Film-forming chambers | | |
|---|---|---|---|
| | 2302C | 2304C | 2305C |
| Semiconductor layer, formed by: | HF plasma CVD | HF plasma CVD | Plasma doping |
| Semiconductor layer, formed of: (nm) | n-Type a-Si 20 | i-Type a-SiC 120 | p-Type a-Si about 10 |
| Region length*: (cm) | 60 | 300 | 100 |
| Material gases: (sccm) | $SiH_4$ 150 $PH_3$ 3 $H_2$ 1,500 | $SiH_4$ 400 $CH_4$ 200 $H_2$ 4,000 | $BF_3$ 1 $H_2$ 500 |
| Chamber internal pressure: (Pa) | 130 | 135 | 130 |
| Belt substrate temp.: (°C.) | 250 | 250 | 150 |
| Discharge power: (W) | HF 13.56 MHz 150 | HF 13.56 MHz 600 | LF 75 kHz 1,000 |
| Bias power: (W) | — | — | — |

*Semiconductor layer forming region length in the direction of belt substrate transport

TABLE 52

| Film-forming conditions | Film-forming chambers | | | | | |
|---|---|---|---|---|---|---|
| | 2302A | 2303A(1) | 2303A(2) | 2303A(3) | 2304A | 2305A |
| Semiconductor layer, formed by: | HF plasma CVD | μW plasma CVD | μW plasma CVD | μW plasma CVD | HF plasma CVD | Plasma doping |
| Semiconductor layer, formed of: (nm) | p-Type a-Si 20 | i-Type a-SiGe 50 | i-Type a-SiGe 100 | i-Type a-SiGe 25 | i-Type a-Si 20 | n-Type a-Si about 10 |
| Region length*: (cm) | 60 | 10 | 20 | 5 | 60 | 100 |
| Material gases: (sccm) | $SiH_4$ 150 $B_2H_6$ 3 $H_2$ 1,500 | $SiH_4$ 125 $GeH_4$ 25 $H_2$ 200 | $SiH_4$ 100 $GeH_4$ 50 $H_2$ 200 | $SiH_4$ 125 $GeH_4$ 25 $H_2$ 200 | $SiH_4$ 150 $H_2$ 1,500 | $PH_3$ 1 $H_2$ 500 |
| Chamber internal pressure: (Pa) | 130 | 0.9 | 1 | 0.9 | 135 | 130 |
| Belt substrate temp.: (°C.) | 350 | 350 | 350 | 350 | 350 | 150 |
| Discharge power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 53

| Film-forming conditions | Film-forming chambers | | | | | |
|---|---|---|---|---|---|---|
| | 102B | 103B(1) | 103B(2) | 103B(3) | 104B | 105B |
| Semiconductor layer, formed by: | HF plasma CVD | μW plasma CVD | μW plasma CVD | μW plasma CVD | HF plasma CVD | Plasma doping |
| Semiconductor layer, formed of: (nm) | p-Type a-Si 20 | i-Type a-SiGe 50 | i-Type a-SiGe 100 | i-Type a-SiGe 25 | i-Type a-Si 20 | n-Type a-Si about 10 |
| Region length*: (cm) | 60 | 10 | 20 | 5 | 60 | 100 |
| Material gases: (sccm) | $SiH_4$ 150 $B_2H_6$ 3 $H_2$ 1,500 | $SiH_4$ 140 $GeH_4$ 10 $H_2$ 200 | $SiH_4$ 120 $GeH_4$ 30 $H_2$ 200 | $SiH_4$ 140 $GeH_4$ 10 $H_2$ 200 | $SiH_4$ 150 $H_2$ 1,500 | $PH_3$ 1 $H_2$ 500 |

TABLE 53-continued

| Film-forming conditions | Film-forming chambers | | | | | |
|---|---|---|---|---|---|---|
| | 102B | 103B(1) | 103B(2) | 103B(3) | 104B | 105B |
| Chamber internal pressure: (Pa) | 130 | 0.9 | 1 | 0.9 | 135 | 130 |
| Belt substrate temp.: (°C.) | 300 | 300 | 300 | 300 | 300 | 150 |
| Discharge power: (W) | HF 13.56 MHz 150 | μW 2.45 GHz 300 | μW 2.45 GHz 300 | μW 2.45 GHz 300 | HF 13.56 MHz 150 | LF 75 kHz 1,000 |
| Bias power: (W) | — | HF 13.56 MHz 600 | HF 13.56 MHz 600 | HF 13.56 MHz 600 | — | — |

*Semiconductor layer forming region length in the direction of belt substrate transport

TABLE 54

| Film-forming conditions | Film-forming chambers | | |
|---|---|---|---|
| | 2302C | 2304C | 2305C |
| Semiconductor layer, formed by: | HF plasma CVD | HF plasma CVD | Plasma doping |
| Semiconductor layer, formed of: (nm) | p-Type a-Si 20 | i-Type a-Si 80 | n-Type a-Si about 10 |
| Region length*: (cm) | 60 | 200 | 100 |
| Material gases: (sccm) | SiH$_4$ 150 B$_2$H$_6$ 3 H$_2$ 1,500 | SiH$_4$ 400 H$_2$ 4,000 | PH$_3$ 1 H$_2$ 500 |
| Chamber internal pressure: (Pa) | 130 | 135 | 130 |
| Belt substrate temp.: (°C.) | 250 | 250 | 150 |
| Discharge power: (W) | HF 13.56 MHz 150 | HF 13.56 MHz 400 | LF 75 kHz 1,000 |
| Bias power: (W) | — | — | — |

*Semiconductor layer forming region length in the direction of belt substrate transport

TABLE 55

| Film-forming conditions | Film-forming chambers | | | | | |
|---|---|---|---|---|---|---|
| | 2411 | 2402A | 2412A | 2403A(1) | 2403A(2) | 2403A(3) |
| Semiconductor layer, formed by (or surface-treated by): | Glow-discharge cleaning | HF plasma CVD | HF plasma CVD | μW plasma CVD | μW plasma CVD | μW Plasma CVD |
| Semiconductor layer, formed of: (nm) | — | n-Type a-Si 20 | i-Type a-Si 10 | i-Type a-SiGe 50 | i-Type a-SiGe 100 | i-Type a-SiGe 25 |
| Region length*: (cm) | 20 | 60 | 60 | 10 | 20 | 5 |
| Material gases: (sccm) | He 500 | SiH$_4$ 150 PH$_3$ 3 H$_2$ 1,500 | SiH$_4$ 75 H$_2$ 750 | SiH$_4$ 125 GeH$_4$ 25 H$_2$ 200 | SiH$_4$ 100 GeH$_4$ 50 H$_2$ 200 | SiH$_4$ 125 GeH$_4$ 25 H$_2$ 200 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 200 | HF 13.56 MHz 150 | HF 13.56 MHz 75 | μW 2.45 GHz 300 | μW 2.45 GHz 300 | μW 2.45 GHz 300 |
| Bias power: (W) | — | — | — | HF 13.56 MHz 600 | HF 13.56 MHz 600 | HF 13.56 MHz 600 |

TABLE 55-continued

| Film-forming conditions | Film-forming chambers | | |
|---|---|---|---|
| | 2404A | 2413A | 2405A |
| Semiconductor layer, formed by (or surface-treated by): | HF plasma CVD | $H_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | $SiH_4$ 150 $H_2$ 1,500 | $H_2$ 500 | $BF_3$ 1 $H_2$ 500 |
| Chamber internal pressure: (Pa) | 135 | 130 | 130 |
| Belt substrate temp.: (°C.) | 300 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 56

| Film-forming conditions | Film-forming chambers | | | | |
|---|---|---|---|---|---|
| | 2402B | 2412B | 2403B(1) | 2403B(2) | 2403B(3) |
| Semiconductor layer, formed by (or surface-treated by): | HF plasma CVD | HF plasma CVD | µW plasma CVD | µW plasma CVD | µW Plasma CVD |
| Semiconductor layer, formed of: (nm) | n-Type a-Si 20 | i-Type a-Si 10 | i-Type a-SiGe 50 | i-Type a-SiGe 100 | i-Type a-SiGe 25 |
| Region length*: (cm) | 60 | 60 | 10 | 20 | 5 |
| Material gases: (sccm) | $SiH_4$ 150 $PH_3$ 3 $H_2$ 1,500 | $SiH_4$ 75 $H_2$ 750 | $SiH_4$ 140 $GeH_4$ 10 $H_2$ 200 | $SiH_4$ 120 $GeH_4$ 30 $H_2$ 200 | $SiH_4$ 140 $GeH_4$ 10 $H_2$ 200 |
| Chamber internal pressure: (Pa) | 130 | 135 | 0.9 | 1 | 0.9 |
| Belt substrate temp.: (°C.) | 300 | 300 | 300 | 300 | 300 |
| Discharge power: (W) | HF 13.56 MHz 150 | HF 13.56 MHz 75 | µW 2.45 GHz 300 | µW 2.45 GHz 300 | µW 2.45 GHz 300 |
| Bias power: (W) | — | — | HF 13.56 MHz 600 | HF 13.56 MHz 600 | HF 13.56 MHz 600 |

| Film-forming conditions | Film-forming chambers | | |
|---|---|---|---|
| | 2404B | 2413B | 2405B |
| Semiconductor layer, formed by (or surface-treated by): | HF plasma CVD | $H_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | $SiH_4$ 150 $H_2$ 1,500 | $H_2$ 500 | $BF_3$ 1 $H_2$ 500 |
| Chamber internal pressure: (Pa) | 135 | 130 | 130 |
| Belt substrate temp.: (°C.) | 300 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 57

| Film-forming conditions | Film-forming chambers | | | |
|---|---|---|---|---|
| | 2402C | 2404C | 2413C | 2405C |
| Semiconductor layer, formed by (or surface-treated by): | HF plasma CVD | HF plasma CVD | $H_2$ plasma treatment | Plasma doping |
| Semiconductor layer, formed of: (nm) | n-Type a-Si 20 | i-Type a-Si 80 | — | p-Type a-Si about 10 |
| Region length*: (cm) | 60 | 200 | 20 | 100 |
| Material gases: (sccm) | $SiH_4$ 150 $PH_3$ 3 $H_2$ 1,500 | $SiH_4$ 400 $H_2$ 4,000 | $H_2$ 500 | $BF_3$ 1 $H_2$ 500 |
| Chamber internal pressure: (Pa) | 130 | 135 | 130 | 130 |
| Belt substrate temp.: (°C.) | 250 | 250 | 150 | 150 |
| Discharge power: (W) | HF 13.56 MHz 150 | HF 13.56 MHz 400 | LF 75 kHz 200 | LF 75 kHz 1,000 |
| Bias power: (W) | — | — | — | — |

*Length of region in which belt substrate is exposed to plasma

TABLE 58

| Film-forming conditions | Film-forming chambers | | | | |
|---|---|---|---|---|---|
| | 2402B | 2412B | 2403B(1) | 2403B(2) | 2403B(3) |
| Semiconductor layer, formed by (or surface-treated by): | HF plasma CVD | HF plasma CVD | μW plasma CVD | μW plasma CVD | μW Plasma CVD |
| Semiconductor layer, formed of: (nm) | n-Type a-Si 20 | i-Type a-Si 10 | i-Type a-Si 100 | i-Type a-Si 100 | i-Type a-Si 100 |
| Region length*: (cm) | 60 | 60 | 20 | 20 | 20 |
| Material gases: (sccm) | $SiH_4$ 150 $PH_3$ 3 $H_2$ 1,500 | $SiH_4$ 75 $H_2$ 750 | $SiH_4$ 150 $H_2$ 200 | $SiH_4$ 150 $H_2$ 200 | $SiH_4$ 150 $H_2$ 200 |
| Chamber internal pressure: (Pa) | 130 | 135 | 0.9 | 1 | 0.9 |
| Belt substrate temp.: (°C.) | 300 | 300 | 300 | 300 | 300 |
| Discharge power: (W) | HF 13.56 MHz 150 | HF 13.56 MHz 75 | μW 2.45 GHz 300 | μW 2.45 GHz 300 | μW 2.45 GHz 300 |
| Bias power: (W) | — | — | HF 13.56 MHz 600 | HF 13.56 MHz 600 | HF 13.56 MHz 600 |

| Film-forming conditions | Film-forming chambers | | |
|---|---|---|---|
| | 2404B | 2413B | 2405B |
| Semiconductor layer, fromed by (or surface-treated by): | HF plasma CVD | $H_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | $SiH_4$ 150 $H_2$ 1,500 | $H_2$ 500 | $BF_3$ 1 $H_2$ 500 |
| Chamber internal pressure: (Pa) | 135 | 130 | 130 |
| Belt substrate temp.: (°C.) | 300 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 59

| Film-forming conditions | Film-forming chambers | | | |
|---|---|---|---|---|
| | 2402C | 2404C | 2413C | 2405C |
| Semiconductor layer, formed by (or surface-treated by): | HF plasma CVD | HF plasma CVD | H$_2$ plasma treatment | Plasma doping |
| Semiconductor layer, formed of: (nm) | n-Type a-Si 20 | i-Type a-SiC 120 | — | p-Type a-Si about 10 |
| Region length*: (cm) | 60 | 300 | 20 | 100 |
| Material gases: (sccm) | SiH$_4$ 150<br>PH$_3$ 3<br>H$_2$ 1,500 | SiH$_4$ 400<br>CH$_4$ 200<br>H$_2$ 4,000 | H$_2$ 500 | BF$_3$ 1<br>H$_2$ 500 |
| Chamber internal pressure: (Pa) | 130 | 135 | 130 | 130 |
| Belt substrate temp.: (°C.) | 250 | 250 | 150 | 150 |
| Discharge power: (W) | HF 13.56 MHz 150 | HF 13.56 MHz 600 | LF 75 kHz 200 | LF 75 kHz 1,000 |
| Bias power: (W) | — | — | — | — |

*Length of region in which belt substrate is exposed to plasma

TABLE 60

| Film-forming conditions | Film-forming chambers | | | | | |
|---|---|---|---|---|---|---|
| | 2411 | 2402A | 2412A | 2403A(1) | 2403A(2) | 2403A(3) |
| Semiconductor layer, formed by (or surface-treated by): | Glow-discharge cleaning | HF plasma CVD | HF plasma CVD | μW Plasma CVD | μW Plasma CVD | μW Plasma CVD |
| Semiconductor layer, formed of: (nm) | — | p-Type a-Si 10 | i-Type a-Si 50 | i-Type a-SiGe 100 | i-Type a-SiGe 25 | i-Type |
| Region length*: (cm) | 20 | 60 | 60 | 10 | 20 | 5 |
| Material gases: (sccm) | He 500 | SiH$_4$ 150<br>B$_2$H$_6$ 3<br>H$_2$ 1,500 | SiH$_4$ 150<br>H$_2$ 1,500 | SiH$_4$ 125<br>GeH$_4$ 25<br>H$_2$ 200 | SiH$_4$ 100<br>GeH$_4$ 50<br>H$_2$ 200 | SiH$_4$ 125<br>GeH$_4$ 25<br>H$_2$ 200 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 200 | HF 13.56 MHz 150 | HF 13.56 MHz 150 | μW 2.45 GHz 300 | μW 2.45 GHz 300 | μW 2.45 GHz 300 |
| Bias power: (W) | — | — | — | HF 13.56 MHz 600 | HF 13.56 MHz 600 | HF 13.56 MHz 600 |

| Film-forming conditions | Film-forming chambers | | |
|---|---|---|---|
| | 2404A | 2413A | 2405A |
| Semiconductor layer, formed by (or surface-treated by): | HF plasma CVD | H$_2$ plasma treatment | Plasma doping |
| Semiconductor layer, formed of: (nm) | i-Type a-Si 20 | — | n-Type a-Si about 10 |
| Region length*: (cm) | 60 | 20 | 100 |
| Material gases: (sccm) | SiH$_4$ 150<br>H$_2$ 1,500 | H$_2$ 500 | PH$_3$ 1<br>H$_2$ 500 |
| Chamber internal pressure: (Pa) | 135 | 130 | 130 |
| Belt substrate temp.: (°C.) | 350 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 61

| Film-forming conditions | Film-forming chambers | | | | |
|---|---|---|---|---|---|
| | 2402B | 2412B | 2403B(1) | 2403B(2) | 2403B(3) |
| Semiconductor layer, formed by (or surface-treated by): | HF plasma CVD | HF plasma CVD | μW plasma CVD | μW plasma CVD | μW Plasma CVD |
| Semiconductor layer, formed of: (nm) | p-Type a-Si 20 | i-Type a-Si 10 | i-Type a-SiGe 50 | i-Type a-SiGe 100 | i-Type a-SiGe 25 |
| Region length*: (cm) | 60 | 60 | 10 | 20 | 5 |
| Material gases: (sccm) | $SiH_4$ 150<br>$B_2H_6$ 3<br>$H_2$ 1,500 | $SiH_4$ 150<br>$H_2$ 1,500 | $SiH_4$ 140<br>$GeH_4$ 10<br>$H_2$ 200 | $SiH_4$ 120<br>$GeH_4$ 30<br>$H_2$ 200 | $SiH_4$ 140<br>$GeH_4$ 10<br>$H_2$ 200 |
| Chamber internal pressure: (Pa) | 130 | 135 | 0.9 | 1 | 0.9 |
| Belt substrate temp.: (°C.) | 300 | 300 | 300 | 300 | 300 |
| Discharge power: (W) | HF 13.56 MHz 150 | HF 13.56 MHz 150 | μW 2.45 GHz 300 | μW 2.45 GHz 300 | μW 2.45 GHz 300 |
| Bias power: (W) | — | — | HF 13.56 MHz 600 | HF 13.56 MHz 600 | HF 13.56 MHz 600 |

| Film-forming conditions | Film-forming chambers | | |
|---|---|---|---|
| | 2404B | 2413B | 2405B |
| Semiconductor layer, formed by (or surface-treated by): | HF plasma CVD | $H_2$ plasma treatment | Plasma doping |
| Semiconductor layer, formed of: (nm) | i-Type a-Si 20 | — | n-Type a-Si about 10 |
| Region length*: (cm) | 60 | 20 | 100 |
| Material gases: (sccm) | $SiH_4$ 150<br>$H_2$ 1,500 | $H_2$ 500 | $PH_3$ 1<br>$H_2$ 500 |
| Chamber internal pressure: (Pa) | 135 | 130 | 130 |
| Belt substrate temp.: (°C.) | 300 | 150 | 150 |
| Discharge power: (W) | HF 13.56 MHz 150 | LF 75 kHz 200 | LF 75 kHz 1,000 |
| Bias power: (W) | — | — | — |

*Length of region in which belt substrate is exposed to plasma

TABLE 62

| Film-forming conditions | Film-forming chambers | | | |
|---|---|---|---|---|
| | 2402C | 2404C | 2413C | 2405C |
| Semiconductor layer, formed by (or surface-treated by): | HF plasma CVD | HF plasma CVD | $H_2$ plasma treatment | Plasma doping |
| Semiconductor layer, formed of: (nm) | p-Type a-Si 20 | i-Type a-Si 80 | — | n-Type a-Si about 10 |
| Region length*: (cm) | 60 | 200 | 20 | 100 |
| Material gases: (sccm) | $SiH_4$ 150<br>$B_2H_6$ 3<br>$H_2$ 1,500 | $SiH_4$ 400<br>$H_2$ 4,000 | $H_2$ 500 | $PH_3$ 1<br>$H_2$ 500 |
| Chamber internal pressure: (Pa) | 130 | 135 | 130 | 130 |
| Belt substrate temp.: (°C.) | 250 | 250 | 150 | 150 |
| Discharge power: (W) | HF 13.56 MHz 150 | HF 13.56 MHz 400 | LF 75 kHz 200 | LF 75 kHz 1,000 |
| Bias power: (W) | — | — | — | — |

*Length of region in which belt substrate is exposed to plasma

TABLE 63

| Film-forming conditions | Film-forming chambers | | | | | |
|---|---|---|---|---|---|---|
| | 2411 | 2402A | 2412A | 2403A(1) | 2403A(2) | 2403A(3) |
| Semiconductor layer, formed by (or surface-treated by): | Glow-discharge cleaning | HF plasma CVD | HF plasma CVD | µW Plasma CVD | µW Plasma CVD | µW Plasma CVD |
| Semiconductor layer, formed of: (nm) | — | n-Type a-Si 20 | i-Type a-Si 10 | i-Type a-SiGe 50 | i-Type a-SiGe 100 | i-Type a-SiGe 25 |
| Region length*: (cm) | 20 | 60 | 60 | 10 | 20 | 5 |
| Material gases: (sccm) | He 1,500 | SiH$_4$ 450<br>PH$_3$ 9<br>H$_2$ 4,500 | SiH$_4$ 225<br>H$_2$ 2,250 | SiH$_4$ 375<br>GeH$_4$ 75<br>H$_2$ 600 | SiH$_4$ 300<br>GeH$_4$ 150<br>H$_2$ 600 | SiH$_4$ 375<br>GeH$_4$ 75<br>H$_2$ 600 |
| Chamber internal pressure: (Pa) | 125 | 130 | 135 | 0.9 | 1 | 0.9 |
| Belt substrate temp.: (°C.) | 350 | 350 | 350 | 350 | 350 | 350 |
| Discharge power: (W) | HF 13.56 MHz 600 | HF 13.56 MHz 450 | HF 13.56 MHz 225 | µW 2.45 GHz 450 × 2 | µW 2.45 GHz 450 × 2 | µW 2.45 GHz 450 × 2 |
| Bias power: (W) | — | — | — | HF 13.56 MHz 1,800 | HF 13.56 MHz 1,800 | HF 13.56 MHz 1,800 |

| Film-forming conditions | Film-forming chambers | | |
|---|---|---|---|
| | 2404A | 2413A | 2405A |
| Semiconductor layer, formed by (or surface-treated by): | HF plasma CVD | H$_2$ plasma treatment | Plasma doping |
| Semiconductor layer, formed of: (nm) | i-Type a-Si 20 | — | p-Type a-Si about 10 |
| Region length*: (cm) | 60 | 20 | 100 |
| Material gases: (sccm) | SiH$_4$ 450<br>H$_2$ 4,500 | H$_2$ 1,500 | BF$_3$ 3<br>H$_2$ 1,500 |
| Chamber internal pressure: (Pa) | 135 | 130 | 130 |
| Belt substrate temp.: (°C.) | 350 | 150 | 150 |
| Discharge power: (W) | HF 13.56 MHz 450 | LF 75 kHz 600 | LF 75 kHz 3,000 |
| Bias power: (W) | — | — | — |

*Length of region in which belt substrate is exposed to plasma

TABLE 64

| Film-forming conditions | Film-forming chambers | | | | | |
|---|---|---|---|---|---|---|
| | 2402B | 2412B | 2403B(1) | 2403B(2) | 2403B(3) | |
| Semiconductor layer, formed by (or surface-treated by): | HF plasma CVD | HF plasma CVD | µW plasma CVD | µW plasma CVD | µW Plasma CVD | |
| Semiconductor layer, formed of: (nm) | n-Type a-Si 20 | i-Type a-Si 10 | i-Type a-SiGe 50 | i-Type a-SiGe 100 | i-Type a-SiGe 25 | |
| Region length*: (cm) | 60 | 60 | 10 | 20 | 5 | |
| Material gases: (sccm) | SiH$_4$ 450<br>PH$_3$ 9<br>H$_2$ 4,500 | SiH$_4$ 225<br>H$_2$ 2,250 | SiH$_4$ 420<br>GeH$_4$ 30<br>H$_2$ 600 | SiH$_4$ 360<br>GeH$_4$ 90<br>H$_2$ 600 | SiH$_4$ 420<br>GeH$_4$ 30<br>H$_2$ 600 | |
| Chamber internal pressure: (Pa) | 130 | 135 | 0.9 | 1 | 0.9 | |
| Belt substrate temp.: (°C.) | 300 | 300 | 300 | 300 | 300 | |
| Discharge power: (W) | HF 13.56 MHz 450 | HF 13.56 MHz 225 | µW 2.45 GHz 450 × 2 | µW 2.45 GHz 450 × 2 | µW 2.45 GHz 450 × 2 | |
| Bias power: (W) | — | — | HF 13.56 MHz 1,800 | HF 13.56 MHz 1,800 | HF 13.56 MHz 1,800 | |

TABLE 64-continued

| Film-forming conditions | | Film-forming chambers | | |
|---|---|---|---|---|
| | | 2404B | 2413B | 2405B |
| Semiconductor layer, formed by (or surface-treated by): | | HF plasma CVD | H$_2$ plasma treatment | Plasma doping |
| Semiconductor layer, formed of: (nm) | | i-Type a-Si 20 | — | p-Type a-Si about 10 |
| Region length*: (cm) | | 60 | 20 | 100 |
| Material gases: (sccm) | | SiH$_4$ 450 H$_2$ 4,500 | H$_2$ 1,500 | BF$_3$ 3 H$_2$ 1,500 |
| Chamber internal pressure: (Pa) | | 135 | 130 | 130 |
| Belt substrate temp.: (°C.) | | 300 | 150 | 150 |
| Discharge power: (W) | | HF 13.56 MHz 450 | LF 75 kHz 600 | LF 75 kHz 3,000 |
| Bias power: (W) | | — | — | — |

*Length of region in which belt substrate is exposed to plasma

TABLE 65

| Film-forming conditions | Film-forming chambers | | | |
|---|---|---|---|---|
| | 2402C | 2404C | 2413C | 2405C |
| Semiconductor layer, formed by (or surface-treated by): | HF plasma CVD | HF plasma CVD | H$_2$ plasma treatment | Plasma doping |
| Semiconductor layer, formed of: (nm) | n-Type a-Si 20 | i-Type a-Si 80 | — | p-Type a-Si about 10 |
| Region length*: (cm) | 60 | 200 | 20 | 100 |
| Material gases: (sccm) | SiH$_4$ 450 PH$_3$ 9 H$_2$ 4,500 | SiH$_4$ 1,200 H$_2$ 12,000 | H$_2$ 1,500 | BF$_3$ 3 H$_2$ 1,500 |
| Chamber internal pressure: (Pa) | 130 | 135 | 130 | 130 |
| Belt substrate temp.: (°C.) | 250 | 250 | 150 | 150 |
| Discharge power: (W) | HF 13.56 MHz 450 | HF 13.56 MHz 1,200 | LF 75 kHz 600 | LF 75 kHz 3,000 |
| Bias power: (W) | — | — | — | — |

*Length of region in which belt substrate is exposed to plasma

What is claimed is:

1. A photovoltaic element comprising a first non-monocrystalline silicon-containing semiconductor layer of a first-conductivity type, a first i-type non-monocrystalline silicon-containing semiconductor layer formed by microwave plasma CVD, a second i-type non-monocrystalline silicon-containing semiconductor layer formed by high-frequency plasma CVD, and a second non-monocrystalline silicon-containing semiconductor layer of a conductivity type opposite to the first-conductivity type;

said second semiconductor layer of opposite conductivity type being formed by plasma doping.

2. A photovoltaic element formation process that forms a multi-layered silicon-containing non-monocrystalline semiconductor film on a substrate, comprising the sequential steps of:

forming an n- or p-type non-monocrystalline silicon-containing semiconductor layer by high-frequency plasma CVD;

forming an i-type non-monocrystalline silicon-containing semiconductor layer by microwave plasma CVD;

forming an i-type non-monocrystalline silicon-containing semiconductor layer by high-frequency plasma CVD; and forming a p- or n-type non-monocrystalline silicon-containing semiconductor layer by plasma doping.

3. A photovoltaic element formation apparatus capable of continuously forming a multi-layered silicon-containing non-monocrystalline semiconductor film on a belt-like substrate, comprising:

an unwind chamber from which said belt-like substrate is unwound;

a film-forming chamber in which an n- or p-type non-monocrystalline silicon-containing semiconductor layer is formed by high-frequency plasma CVD;

a film-forming chamber in which a first i-type non-monocrystalline silicon-containing semiconductor layer is formed by microwave plasma CVD;

a film-forming chamber in which a second i-type non-monocrystalline silicon-containing semiconductor layer is formed by high-frequency plasma CVD;

a film-forming chamber in which a non-monocrystalline silicon-containing p- or n- type semiconductor layer is formed by plasma doping; and a wind-up chamber in which said belt-like substrate is wound up;

all of said chambers being arranged in this order in the direction of transport of said belt-like substrate, each of said chambers being connected with its adjoining chamber via a gas gate, and said belt-like substrate being continuously transported through the respective film-forming chambers so that the multi-layered silicon-containing non-monocrystalline semiconductor film is continuously formed thereon.

4. The apparatus according to claim 3, wherein a film-forming chamber in which a third i-type non-monocrystalline silicon-containing semiconductor layer is formed by high-frequency plasma CVD is further provided via a gas gate, between the film-forming chamber in which the n- or p-type semiconductor layer is formed by high-frequency plasma CVD and the film-forming chamber in which the first i-type semiconductor layer is formed by microwave plasma CVD.

5. The apparatus according to claim 3, wherein a hydrogen plasma treatment chamber is further provided via a gas gate, between the film-forming chamber in which the second i-type semiconductor layer is formed by high-frequency plasma CVD and the film-forming chamber in which the p- or n-type semiconductor layer is formed by plasma doping.

6. The apparatus according to claim 3, wherein a glow discharge cleaning chamber is further provided via a gas gate, between the unwind chamber and the film-forming chamber in which the n- or p-type semiconductor layer is formed by high-frequency plasma CVD.

7. The apparatus according to claim 3, wherein the discharge frequency in the film-forming chamber in which the p- or n-type semiconductor layer is formed by plasma doping is from 5 kHz to 500 kHz.

8. A photovoltaic element comprising a first non-monocrystalline silicon-containing semiconductor layer of a first-conductivity type, a first i-type non-monocrystalline silicon-containing semiconductor layer formed by microwave plasma CVD, a second i-type non-monocrystalline silicon-containing semiconductor layer formed by high-frequency plasma CVD, a second non-monocrystalline silicon-containing semiconductor layer of a conductivity type opposite to the first-conductivity type, a third non-monocrystalline silicon-containing semiconductor layer of the first conductivity type, a third i-type non-monocrystalline silicon-containing semiconductor layer formed by microwave plasma CVD, a fourth i-type non-monocrystalline silicon-containing semiconductor layer formed by high-frequency plasma CVD, a fourth non-monocrystalline silicon-containing semiconductor layer of a conductivity type opposite to the first conductivity type, a fifth non-monocrystalline silicon-containing semiconductor layer of the first conductivity type, a fifth i-type non-monocrystalline silicon-containing semiconductor layer formed by microwave plasma CVD, a sixth i-type non-monocrystalline silicon-containing semiconductor layer formed by high-frequency plasma CVD, and a sixth non-monocrystalline silicon-containing semiconductor layer of a conductivity type opposite to the first conductivity type;

said second semiconductor layer, said fourth semiconductor layer and said sixth semiconductor layer, each of opposite conductivity type, being formed by plasma doping.

9. A photovoltaic element formation process that forms a multi-layered silicon-containing non-monocrystalline semiconductor film on a substrate, comprising the sequential steps of:

forming an n- or p-type non-monocrystalline silicon-containing semiconductor layer by high-frequency plasma CVD;

forming an i-type non-monocrystalline silicon-containing semiconductor layer by microwave plasma CVD;

forming an i-type non-monocrystalline silicon-containing semiconductor layer by high-frequency plasma CVD;

forming a p- or n-type non-monocrystalline silicon-containing semiconductor layer by plasma doping;

forming an n- or p-type non-monocrystalline silicon-containing semiconductor layer by high-frequency plasma CVD;

forming an i-type non-monocrystalline silicon-containing semiconductor layer by microwave plasma CVD;

forming an i-type non-monocrystalline silicon-containing semiconductor layer by high-frequency plasma CVD;

forming a p- or n-type non-monocrystalline silicon-containing semiconductor layer by plasma doping;

forming an n- or p-type non-monocrystalline silicon-containing semiconductor layer by high-frequency plasma CVD;

forming an i-type non-monocrystalline silicon-containing semiconductor layer by microwave plasma CVD;

forming an i-type non-monocrystalline silicon-containing semiconductor layer by high-frequency plasma CVD; and forming a p- or n-type non-monocrystalline silicon-containing semiconductor layer by plasma doping.

10. A photovoltaic element formation apparatus capable of continuously forming a multi-layered silicon-containing non-monocrystalline semiconductor film on a belt-like substrate, comprising:

an unwind chamber from which said belt-like substrate is unwound;

a film-forming chamber in which an n- or p-type non-monocrystalline silicon-containing semiconductor layer is formed by high-frequency plasma CVD;

a film-forming chamber in which an i-type non-monocrystalline silicon-containing semiconductor layer is formed by microwave plasma CVD;

a film-forming chamber in which an i-type non-monocrystalline silicon-containing semiconductor layer is formed by high-frequency plasma CVD;

a film-forming chamber in which a p- or n-type non-monocrystalline silicon-containing semiconductor layer is formed by plasma doping;

a film-forming chamber in which an n- or p-type non-monocrystalline silicon-containing semiconductor layer is formed by high-frequency plasma CVD;

a film-forming chamber in which an i-type non-monocrystalline silicon-containing semiconductor layer is formed by microwave plasma CVD;

a film-forming chamber in which an i-type non-monocrystalline silicon-containing semiconductor layer is formed by high-frequency plasma CVD;

a film-forming chamber in which a p- or n-type non-monocrystalline silicon-containing semiconductor layer is formed by plasma doping;

a film-forming chamber in which an n- or p-type non-monocrystalline silicon-containing semiconductor layer is formed by high-frequency plasma CVD;

a film-forming chamber in which an i-type non-monocrystalline silicon-containing semiconductor layer is formed by microwave plasma CVD;

a film-forming chamber in which an i-type non-monocrystalline silicon-containing semiconductor layer is formed by high-frequency plasma CVD;

a film-forming chamber in which a p- or n-type non-monocrystalline silicon-containing semiconductor layer is formed by plasma doping; and a wind-up chamber in which said belt-like substrate is wound up;

all of said chambers being arranged in this order in the direction of transport of said belt-like substrate, each of said chambers being connected with its adjoining chamber via a gas gate, and said belt-like substrate being continuously transported through the respective film-forming chambers so that the multi-layered silicon-containing non-monocrystalline semiconductor film is continuously formed thereon.

11. The apparatus according to claim 10, wherein a film-forming chamber in which an i-type non-monocrystalline silicon-containing semiconductor layer is formed by high-frequency plasma CVD is further provided via a gas gate, at one or more locations between a film-forming chamber in which an n- or p-type semiconductor layer is formed by high-frequency plasma CVD and a film-forming chamber in which an i-type semiconductor layer is formed by microwave plasma CVD.

12. The apparatus according to claim 10, wherein a hydrogen plasma treatment chamber is further provided via a gas gate, at one or more locations between a film-forming chamber in which an i-type semiconductor layer is formed by high-frequency plasma CVD and a film-forming chamber in which a p- or n-type semiconductor layer is formed by plasma doping.

13. The apparatus according to claim 10, wherein a glow discharge cleaning chamber is further provided via a gas gate, between the unwind chamber and the film-forming chamber in which an n- or p-type semiconductor layer is formed by high-frequency plasma CVD.

14. The apparatus according to claim 10, wherein the discharge frequency in the film-forming chambers in which the p- or n-type semiconductor layers are formed by plasma doping is from 5 kHz to 500 kHz.

15. A photovoltaic element comprising a first non-monocrystalline silicon-containing semiconductor layer of a first-conductivity type, a first i-type non-monocrystalline silicon-containing semiconductor layer formed by microwave plasma CVD, a second i-type non-monocrystalline silicon-containing semiconductor layer formed by high-frequency plasma CVD, a second non-monocrystalline silicon-containing semiconductor layer of a conductivity type opposite to the first-conductivity type, a third non-monocrystalline silicon-containing semiconductor layer of the first conductivity type, a third i-type non-monocrystalline silicon-containing semiconductor layer formed by microwave plasma CVD, a fourth i-type non-monocrystalline silicon-containing semiconductor layer formed by high-frequency plasma CVD, a fourth non-monocrystalline silicon-containing semiconductor layer of a conductivity type opposite to the first conductivity type, a fifth non-monocrystalline silicon-containing semiconductor layer of the first conductivity type, a fifth i-type non-monocrystalline silicon-containing semiconductor layer formed by high-frequency plasma CVD, and a sixth non-monocrystalline silicon-containing semiconductor layer of a conductivity type opposite to the first conductivity type;

said second semiconductor layer, said fourth semiconductor layer and said sixth semiconductor layer, each of opposite conductivity type, being formed by plasma doping.

16. A photovoltaic element formation process that forms a multi-layered silicon-containing non-monocrystalline semiconductor film on a substrate, comprising the sequential steps of:

forming an n- or p-type non-monocrystalline silicon-containing semiconductor layer by high-frequency plasma CVD;

forming an i-type non-monocrystalline silicon-containing semiconductor layer by microwave plasma CVD;

forming an i-type non-monocrystalline silicon-containing semiconductor layer by high-frequency plasma CVD;

forming a p- or n-type non-monocrystalline silicon-containing semiconductor layer by plasma doping;

forming an n- or p-type non-monocrystalline silicon-containing semiconductor layer by high-frequency plasma CVD;

forming an i-type non-monocrystalline silicon-containing semiconductor layer by microwave plasma CVD;

forming an i-type non-monocrystalline silicon-containing semiconductor layer by high-frequency plasma CVD;

forming a p- or n-type non-monocrystalline silicon-containing semiconductor layer by plasma doping;

forming an n- or p-type non-monocrystalline silicon-containing semiconductor layer by high-frequency plasma CVD;

forming an i-type non-monocrystalline silicon-containing semiconductor layer by high-frequency plasma CVD; and forming a p- or n-type non-monocrystalline silicon-containing semiconductor layer by plasma doping.

17. A photovoltaic element formation apparatus capable of continuously forming a multi-layered silicon-containing non-monocrystalline semiconductor film on a belt-like substrate, comprising:

an unwind chamber from which said belt-like substrate is unwound;

a film-forming chamber in which an n- or p-type non-monocrystalline silicon-containing semiconductor layer is formed by high-frequency plasma CVD;

a film-forming chamber in which an i-type non-monocrystalline silicon-containing semiconductor layer is formed by microwave plasma CVD;

a film-forming chamber in which an i-type non-monocrystalline silicon-containing semiconductor layer is formed by high-frequency plasma CVD;

a film-forming chamber in which a p- or n-type non-monocrystalline silicon-containing semiconductor layer is formed by plasma doping;

a film-forming chamber in which an n- or p-type non-monocrystalline silicon-containing semiconductor layer is formed by high-frequency plasma CVD;

a film-forming chamber in which an i-type non-monocrystalline silicon-containing semiconductor layer is formed by microwave plasma CVD;

a film-forming chamber in which an i-type non-monocrystalline silicon-containing semiconductor layer is formed by high-frequency plasma CVD;

a film-forming chamber in which a p- or n-type non-monocrystalline silicon-containing semiconductor layer is formed by plasma doping;

a film-forming chamber in which an n- or p-type non-monocrystalline silicon-containing semiconductor layer is formed by high-frequency plasma CVD;

a film-forming chamber in which an i-type non-monocrystalline silicon-containing semiconductor layer is formed by high-frequency plasma CVD;

a film-forming chamber in which a p- or n-type non-monocrystalline silicon-containing semiconductor layer is formed by plasma doping; and a wind-up chamber in which said belt-like substrate is wound up;

all of said chambers being arranged in this order in the direction of transport of said belt-like substrate, each of said chambers being connected with its adjoining chamber via a gas gate, and said belt-like substrate being continuously transported through the respective film-forming chambers so that the multi-layered silicon-containing non-monocrystalline semiconductor film is continuously formed thereon.

18. The apparatus according to claim 17, wherein a film-forming chamber in which an i-type non-monocrystalline silicon-containing semiconductor layer is formed by high-frequency plasma CVD is further provided via a gas gate, at one or more locations between a film-forming chamber in which an n- or p-type semiconductor layer is formed by high-frequency plasma CVD and a film-forming chamber in which an i-type semiconductor layer is formed by microwave plasma CVD.

19. The apparatus according to claim 17, wherein a hydrogen plasma treatment chamber is further provided via a gas gate, at one or more locations between a film-forming chamber in which an i-type semiconductor layer is formed by high-frequency plasma CVD and a film-forming chamber in which a p- or n-type semiconductor layer is formed by plasma doping.

20. The apparatus according to claim 17, wherein a glow discharge cleaning chamber is further provided via a gas gate, between the unwind chamber and the film-forming chamber in which an n- or p-type semiconductor layer is formed by high-frequency plasma CVD.

21. The apparatus according to claim 17, wherein the discharge frequency in the film-forming chambers in which the p- or n-type semiconductor layers are formed by plasma doping is from 5 kHz to 500 kHz.

* * * * *

UNITED STATES PATENT AND TRADEMARK OFFICE
CERTIFICATE OF CORRECTION

PATENT NO. : 5,589,007
DATED : December 31, 1996
INVENTORS : YASUSHI FUJIOKA ET AL.

It is certified that error appears in the above-identified patent and that said Letters Patent is hereby corrected as shown below:

<u>COLUMN 3</u>

Line 35,   "layer" should read --layer thickness--.

<u>COLUMN 5</u>

Line 21,   "wind-chamber" should read --wind-up chamber--.

<u>COLUMN 6</u>

Line 45,   "still" should read --a still--.

<u>COLUMN 7</u>

Line 27,   "is in" should read --in--;
   Line 61,   "is by" should read --by-- and "a" should read --as--.

<u>COLUMN 8</u>

Line 34,   "layer" should read --layers--.

<u>COLUMN 9</u>

Line 34,   "has-been" should read --has been--.

UNITED STATES PATENT AND TRADEMARK OFFICE
CERTIFICATE OF CORRECTION

PATENT NO. : 5,589,007

DATED : December 31, 1996

INVENTORS : YASUSHI FUJIOKA ET AL.

It is certified that error appears in the above-identified patent and that said Letters Patent is hereby corrected as shown below:

COLUMN 10

Line 1,   "frequency" should read --frequency f--;
   Line 9,   "frequencies" should read --low frequencies--;
   Line 10,  "4" should read --5--;
   Line 26,  "Hence, this change" should read --Hence,--;
   Line 41,  "problems" should read --problem--.

COLUMN 11

Line 16,  "mean" should read --means--;
   Line 36,  "microwaves" should read --microwave--.

COLUMN 20

Line 8,   "layered" should read --layer--.

COLUMN 21

Line 57,  "backend" should read --back end--.

COLUMN 25

Line 51,  "At" should read --A1--.

UNITED STATES PATENT AND TRADEMARK OFFICE
CERTIFICATE OF CORRECTION

PATENT NO.  : 5,589,007

DATED       : December 31, 1996

INVENTORS   : YASUSHI FUJIOKA ET AL.

It is certified that error appears in the above-identified patent and that said Letters Patent is hereby corrected as shown below:

COLUMN 31

Line 60,   "form" should read --from--.

COLUMN 33

Line 1,    "103A" should read --2103A--.

COLUMN 34

Line 33,   "203A" should read --2203A--.

COLUMN 36

Line 60,   "of" should read --or--.

COLUMN 42

Line 25,   "staring" should read --starting--;
  Line 31,   "staring" should read --starting--;
  Line 60,   "of pinpinpin" should read --or pinpinpin--.

UNITED STATES PATENT AND TRADEMARK OFFICE
CERTIFICATE OF CORRECTION

PATENT NO. : 5,589,007

DATED : December 31, 1996

INVENTORS : YASUSHI FUJIOKA ET AL.

It is certified that error appears in the above-identified patent and that said Letters Patent is hereby corrected as shown below:

COLUMN 44

Line 41, "use" should read --used--.

COLUMN 47

Line 16, "to" should be deleted.

COLUMN 59

Line 18, "insides the" should read --insides of the--.

COLUMN 66

Line 6, "wee" should read --were--.

COLUMN 70

Line 6, "If" should read --In--.

COLUMN 71

Line 51, "thereto" should read --thereto to--.

UNITED STATES PATENT AND TRADEMARK OFFICE
CERTIFICATE OF CORRECTION

PATENT NO. : 5,589,007

DATED : December 31, 1996

INVENTORS : YASUSHI FUJIOKA ET AL.

It is certified that error appears in the above-identified patent and that said Letters Patent is hereby corrected as shown below:

COLUMN 72

Line 5, "303A" should read --2303A--.

COLUMN 76

Line 10, "was" should read --were--;
   Line 48, "was" should read --were--.

COLUMN 77

Line 25, "was" should read --were--.

COLUMN 81

Line 56, "the semiconductor layers in the film-forming" should be deleted.

COLUMN 83

Line 34, "the semiconductor layers in the film-forming" should be deleted.

UNITED STATES PATENT AND TRADEMARK OFFICE
CERTIFICATE OF CORRECTION

PATENT NO. : 5,589,007

DATED : December 31, 1996

INVENTORS : YASUSHI FUJIOKA ET AL.

It is certified that error appears in the above-identified patent and that said Letters Patent is hereby corrected as shown below:

COLUMN 85

Table 4  "$PH_3$  5 $GeH_2$  25 $GeH_2$  50 $GeH_2$" should read
         --$PH_3$  5 $GeH_4$  25 $GeH_4$  50 $GeH_4$--.

COLUMN 87

Table 5  "$PH_3$  5 $GeH_2$  25 $GeH_2$  50 $GeH_2$" should read
         --$PH_3$  5 $GeH_4$  25 $GeH_4$  50 $GeH_4$--.

COLUMN 95

Table 12 "p-Type a-Si            --n-Type a-Si
            30        should read   30
            100"                    100--.

COLUMN 102

Table 20  "2105B                    --2105B
            HF plasma"  should read  HF plasma
                                     CVD--.

COLUMN 117

Table 37, "Glow discharge" should read --Glow-discharge--.

UNITED STATES PATENT AND TRADEMARK OFFICE
CERTIFICATE OF CORRECTION

PATENT NO. : 5,589,007

DATED : December 31, 1996

INVENTORS : YASUSHI FUJIOKA ET AL.

It is certified that error appears in the above-identified patent and that said Letters Patent is hereby corrected as shown below:

<u>COLUMN 140</u>

Table 60

"i-Type a-Si   i-Type       i-Type       i-Type
              a-SiGe 50    a-SiGe 100   a-SiGe 25"

should read

--i-Type a-Si   i-Type       i-Type       i-Type
 10             a-SiGe 50    a-SiGe 100   a-SiGe 25--.

UNITED STATES PATENT AND TRADEMARK OFFICE
CERTIFICATE OF CORRECTION

PATENT NO. : 5,589,007

DATED : December 31, 1996

INVENTORS : YASUSHI FUJIOKA ET AL.

It is certified that error appears in the above-identified patent and that said Letters Patent is hereby corrected as shown below:

<u>COLUMN 143</u>

```
Table 63,
"Glow-discharge
   cleaning
      -        n-Type a-Si  i-Type a-Si  i-Type      i-Type     i-Type"
      20         10           a-SiGe 50    a-SiGe 100  a-SiGe 25
   should read
--Glow-discharge
   cleaning
      -        n-Type a-Si   i-Type a-Si   i-Type      i-Type     i-Type
      20         10            a-SiGe 50   a-SiGe 100  a-SiGe 25--.
```

Signed and Sealed this

Sixteenth Day of September, 1997

Attest:

BRUCE LEHMAN

Attesting Officer

Commissioner of Patents and Trademarks